United States Patent [19]

Agrawal et al.

[11] Patent Number: 5,869,981

[45] Date of Patent: *Feb. 9, 1999

[54] HIGH DENSITY PROGRAMMABLE LOGIC DEVICE

[75] Inventors: Om P. Agrawal, San Jose; George H. Landers, Mountain View; Nicholas A. Schmitz, Cupertino, all of Calif.; Jerry D. Moench; Kerry A. Ilgenstein, both of Austin, Tex.

[73] Assignee: Advanced Micro Devices, Inc., Sunnyvale, Calif.

[ * ] Notice: The term of this patent shall not extend beyond the expiration date of Pat. No. 5,015,884.

[21] Appl. No.: 479,872

[22] Filed: Jun. 6, 1995

Related U.S. Application Data

[62] Division of Ser. No. 816,515, Dec. 31, 1991, Pat. No. 5,436,514, which is a continuation of Ser. No. 699,427, May 13, 1991, Pat. No. 5,225,719, which is a continuation-in-part of Ser. No. 490,808, Mar. 7, 1990, Pat. No. 5,015,884, which is a continuation-in-part of Ser. No. 243,574, Sep. 12, 1988, Pat. No. 4,963,768, which is a continuation-in-part of Ser. No. 178,707, Apr. 7, 1988, Pat. No. 4,931,671, which is a continuation of Ser. No. 717,640, Mar. 29, 1985, Pat. No. 4,742,252.

[51] Int. Cl.$^6$ .................................................. H03K 19/177
[52] U.S. Cl. .................................................. 326/39; 326/41
[58] Field of Search .................................. 326/37, 39–41, 326/47

[56] References Cited

U.S. PATENT DOCUMENTS

| | | |
|---|---|---|
| 3,566,153 | 2/1971 | Spencer . |
| 4,034,356 | 7/1977 | Howley et al. . |
| 4,207,556 | 6/1980 | Sugiyama et al. . |
| 4,328,565 | 5/1982 | Harari . |
| 4,361,847 | 11/1982 | Harari . |

(List continued on next page.)

FOREIGN PATENT DOCUMENTS 0 445 909   9/1991   European Pat. Off. .

OTHER PUBLICATIONS

Cole, Bernard, "Programmable Logic Devices: The Second Generation," Electronics, May 12, 1988, pp. 61–63.
Cole, Bernard, "Altera Pushes EPLDs to 5,000 Gates and 60 MHz," Electronics, May 12, 1988, pp. 66–67.
"TI's Erasable PLDs are Fast but Don't Need Much Power," Electronics, May 12, 1988, pp. 70–71.

(List continued on next page.)

*Primary Examiner*—Jon Santamauro
*Attorney, Agent, or Firm*—Skjerven, Morrill, MacPherson, Franklin & Friel, LLP; Forrest E. Gunnison

[57] ABSTRACT

Each programmable logic device in at least two families of high density segmented programmable array logic device utilizes a programmable switch interconnection matrix to couple an array of symmetric programmable logic blocks. Each programmable logic block includes programmable logic macrocells, programmable input/output macrocells, a logic allocator and a programmable product term array. The programmable switch matrix provides centralized global routing with a fixed path independent delay and decouples the logic macrocells from the product term array. The logic allocator decouples the product term array from the logic macrocells, and the I/O macrocells decouple the logic macrocells from the package I/O pins. The logic allocator steers product terms from the product term array to selected logic macrocells so that no product terms are permanently allocated to a specific logic macrocell. In a first PLD of each family, a first predetermined number of input lines couple the switch matrix to each programmable logic block. In a second PLD of each family, a second predetermined number of input lines couple the switch matrix to each programmable logic block. The number of input lines to each programmable logic block and to the switch matrix are selected to provide a predetermined routability factor. The second family of PLDs has a larger pin to logic ratio than the first family of PLDs.

72 Claims, 119 Drawing Sheets

U.S. PATENT DOCUMENTS

| | | |
|---|---|---|
| 4,366,393 | 12/1982 | Kasuya . |
| 4,409,723 | 10/1983 | Harari . |
| 4,415,818 | 11/1983 | Ogawa et al. . |
| 4,446,534 | 5/1984 | Smith . |
| 4,525,641 | 6/1985 | Cruz et al. . |
| 4,551,815 | 11/1985 | Moore et al. . |
| 4,554,640 | 11/1985 | Wong et al. . |
| 4,609,986 | 9/1986 | Hartmann et al. . |
| 4,617,479 | 10/1986 | Hartmann et al. . |
| 4,639,893 | 1/1987 | Eitan . |
| 4,649,520 | 3/1987 | Eitan . |
| 4,677,318 | 6/1987 | Veenstra . |
| 4,684,830 | 8/1987 | Tsui et al. . |
| 4,689,654 | 8/1987 | Brockmann . |
| 4,691,161 | 9/1987 | Kant et al. . |
| 4,703,206 | 10/1987 | Cavlan . |
| 4,713,792 | 12/1987 | Hartmann et al. . |
| 4,717,912 | 1/1988 | Harvey et al. . |
| 4,742,252 | 5/1988 | Agrawal . |
| 4,758,746 | 7/1988 | Birkner et al. . |
| 4,758,747 | 7/1988 | Young et al. . |
| 4,771,285 | 9/1988 | Agrawal et al. . |
| 4,772,811 | 9/1988 | Fujioka et al. ............................ 326/41 |
| 4,789,951 | 12/1988 | Birkner et al. . |
| 4,871,930 | 10/1989 | Wong et al. . |
| 4,872,137 | 10/1989 | Jennings, III ............................. 326/39 |
| 4,876,640 | 10/1989 | Shankar et al. . |
| 4,878,200 | 10/1989 | Asghar et al. . |
| 4,879,481 | 11/1989 | Pathak et al. ............................. 326/40 |
| 4,903,223 | 2/1990 | Norman et al. . |
| 4,912,342 | 3/1990 | Wong et al. . |
| 4,931,671 | 6/1990 | Agrawal . |
| 4,933,577 | 6/1990 | Wong et al. . |
| 4,963,768 | 10/1990 | Agrawal et al. . |
| 4,969,121 | 11/1990 | Chan et al. ................................ 326/39 |
| 5,015,884 | 5/1991 | Agrawal et al. . |

OTHER PUBLICATIONS

"Advanced Tools Tackle More Complex Chips in the New Generations of PLDs," Electronics, May 12, 1988, p. 111.

Wirbel, Lorin, "Altera Details Max Scheme, Software," Electronics Engineering Times, May 16, 1988, p. 82.

"Mentor Adds 80960 Simulation To Tool, Kit," Electronics, May 12, 1988.

"Design Kit Handles One–Chip Modems," Electronics, May 12, 1988.

Altera Databook, Jan. 1988, pp. 2–1 through 2–29.

S. Kassinidis, "Use FPGAs to Match A CPU to its Memory Subsystem," Electronic Design, 7 pages, Feb. 8, 1990.

"The Maximalist Handbook," Altera Corporation, San Jose, CA, Jan. 1990, pp. 23–82.

"Programmable Logic Device ATV5000," Atmel Corporation, San Jose, CA, Feb. 1990, pp. 1–3.

"Programmable Logic," Intel Corporation, Mt. Prospect, IL, (1990), pp. 2–43 to 2–49, 2–60 to 2–69.

PAL Device Data Book AMD/MMI, 1988, pp. 1 to 6–41.

PAL Device Handbook, 1988 AMD/MMI.

O. Agrawal, "Auf Geschwindigkeit und Flexibilität optimierte PLDs'," Elektronik, vol. 39, No. 17, 17 Aug. 1990, Munchen De, pp. 60–64.

O. Agrawal, "CAD Development Tools for the MACH Family of EEPLDs," Wescon/90 Conference Record, Nov. 13–15, 1990, IEEE New York US; pp. 357–365.

D. Bursky, "High Density PLDs Don't Forsake Speed," Electronic Design, vol. 38, No. 5, Mar. 1990, Hasbrouck Heights, New Jersey, pp. 105–107.

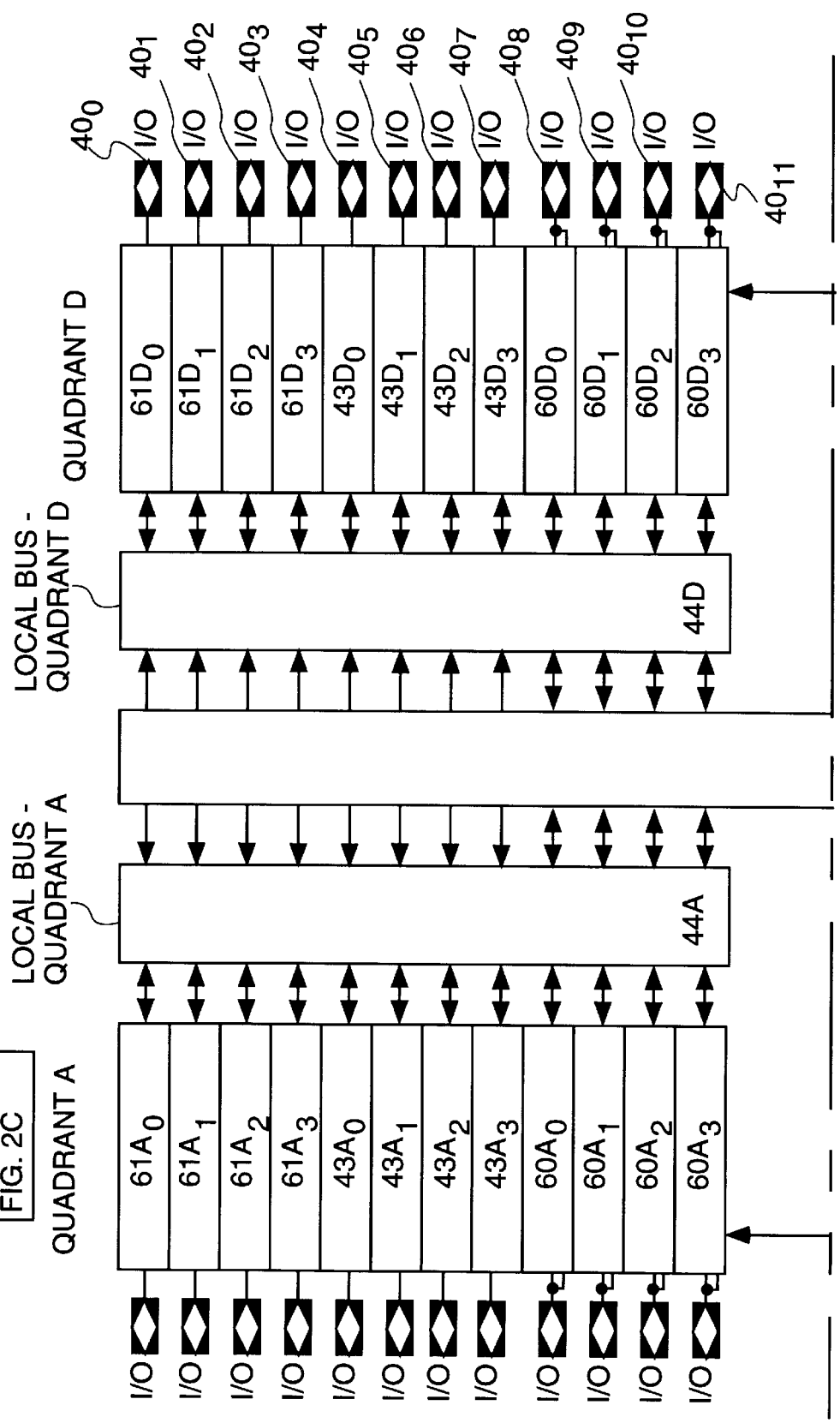

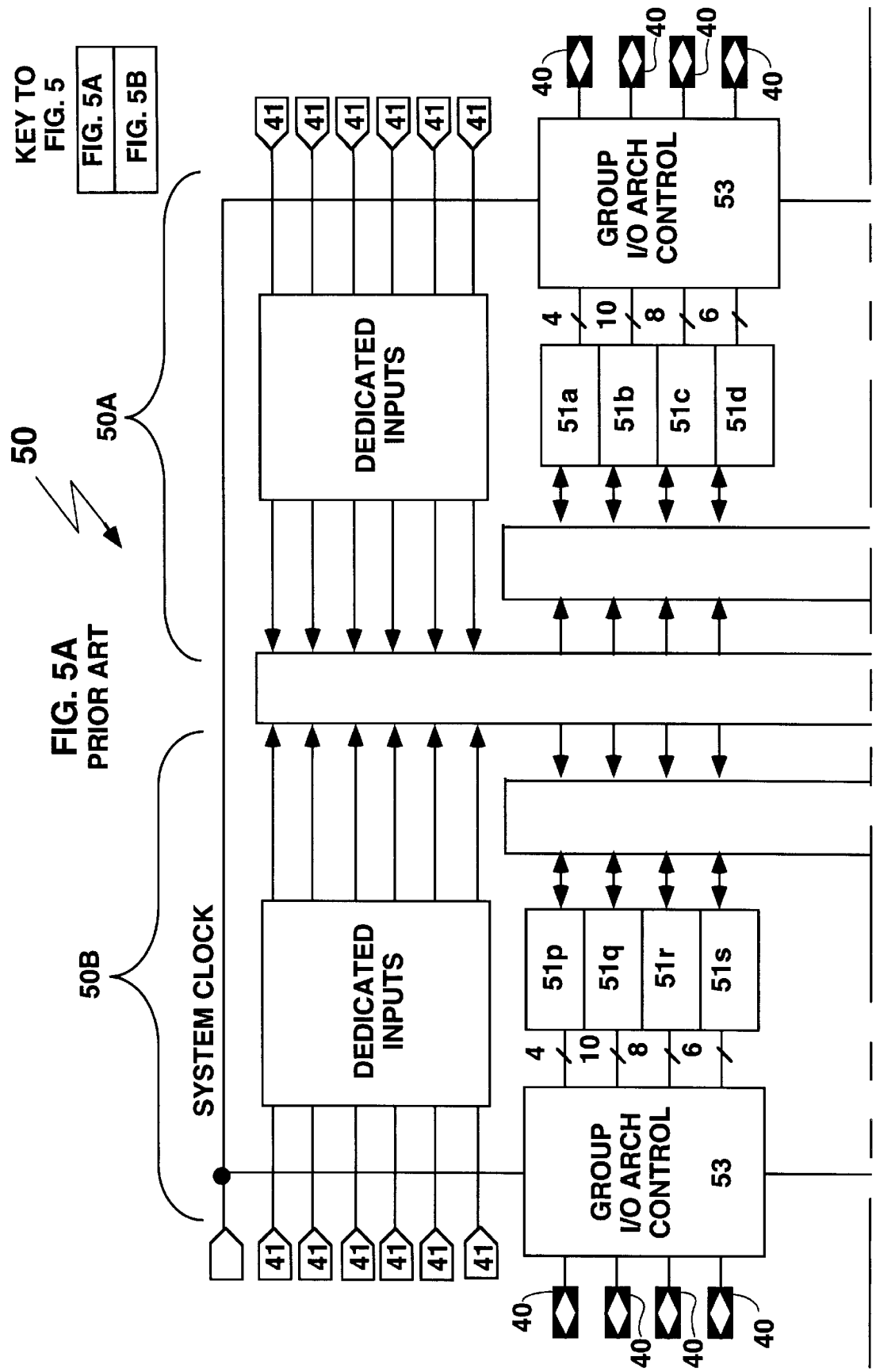

KEY TO FIG. 16

| FIG. 16A | FIG. 16B | FIG. 16C | FIG. 16D |

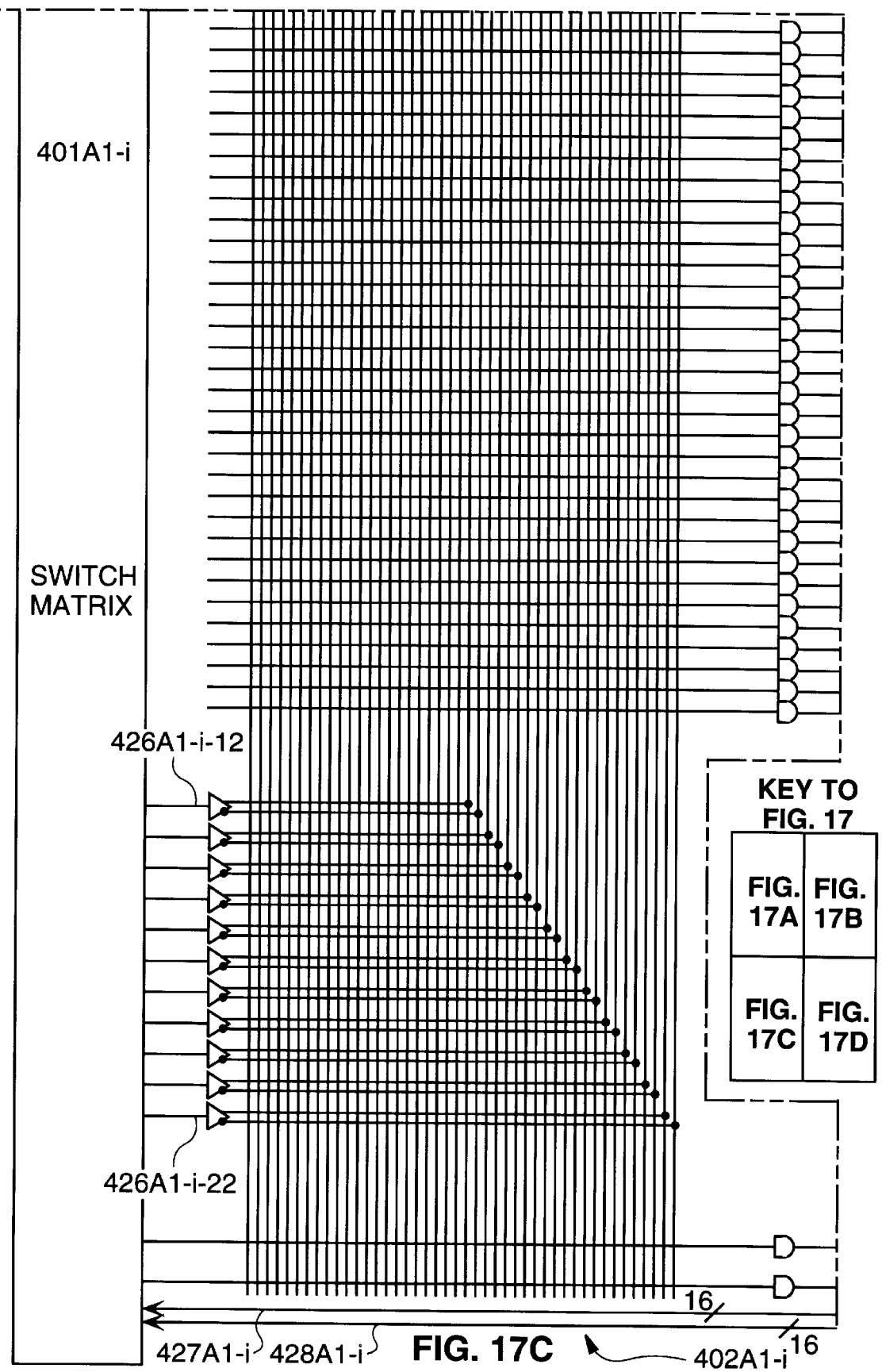

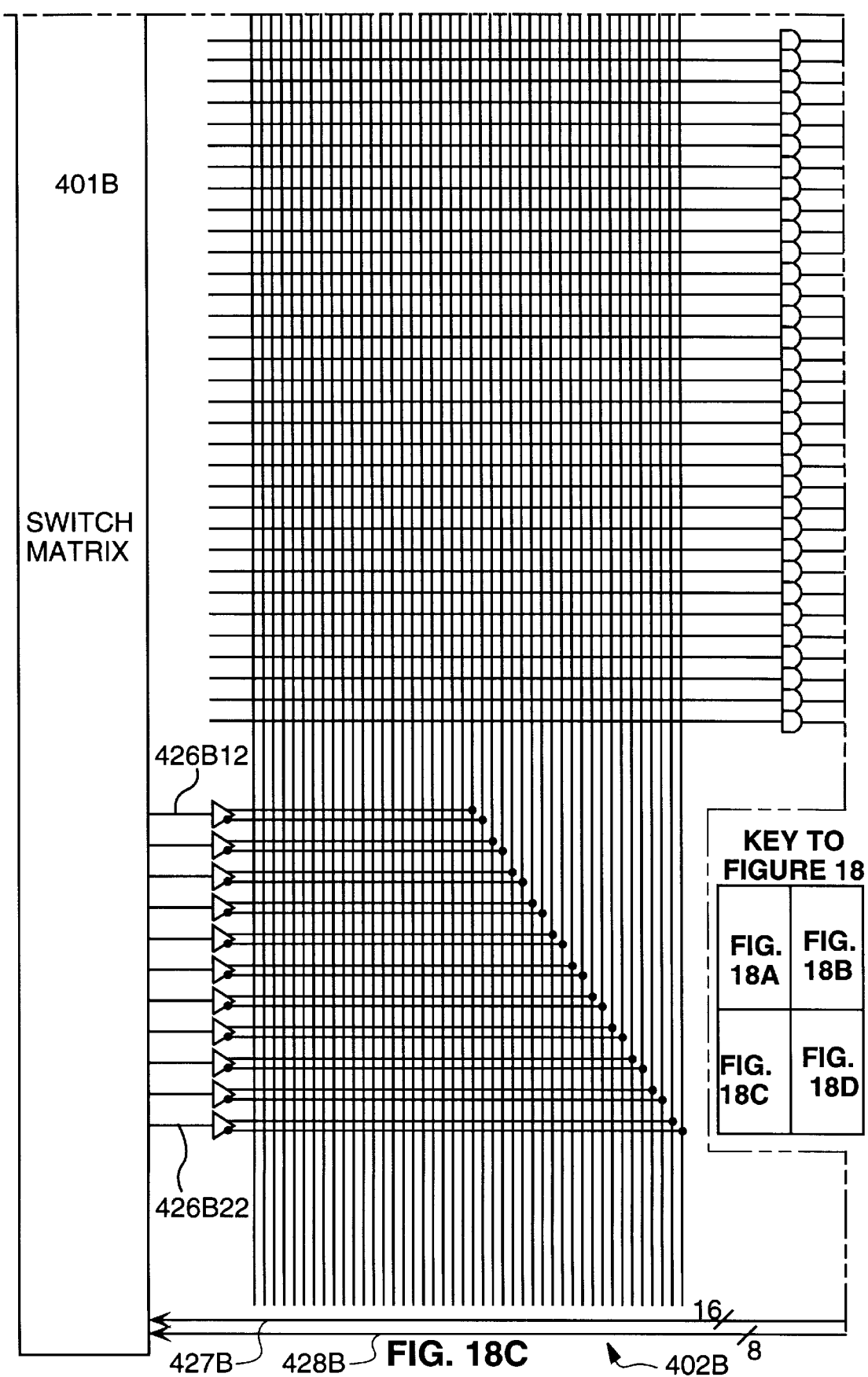

FIG. 26

| # OF POINTS | | | # OF POINTS | |
|---|---|---|---|---|
| L1 | 4 | FROM L1,L2,L3 | 12 | R1, R2 → I/O 0 |
| L2 | 4 | FROM L1,L2,L3,L4 | 16 | R3, R4 → I/O 1 |
| L3 | 4 | FROM L2,L3,L4,L5 | 16 | R5, R6 → I/O 2 |
| L4 | 4 | FROM L3,L4,L5,L6 | 16 | R7, R8 → I/O 3 |
| L5 | 4 | FROM L4,L5,L6,L7 | 16 | R9, R10 → I/O 4 |
| L6 | 4 | FROM L5,L6,L7,L8 | 16 | R11, R12 → I/O 5 |
| L7 | 4 | FROM L6,L7,L8,L9 | 16 | R13, R14 → I/O 6 |
| L8 | 4 | FROM L7,L8,L9,L10 | 16 | R15, R16 → I/O 7 |
| L9 | 4 | FROM L8,L9,L10,L11 | 16 | |
| L10 | 4 | FROM L9,L10,L11,L12 | 16 | |
| L11 | 4 | FROM L10,L11,L12,L13 | 16 | |
| L12 | 4 | FROM L11,L12,L13,L14 | 16 | |
| L13 | 4 | FROM L12,L13,L14,L15 | 16 | |
| L14 | 4 | FROM L13,L14,L15,L16 | 16 | |
| L15 | 4 | FROM L14,L15,L16 | 12 | |
| L16 | 4 | FROM L15,L16 | 8 | |

| | FROM | # OF POINTS | | |
|---|---|---|---|---|
| L1 | 4 | 12 | | I/O 0 |
| L2 | 4 | FROM L1,L2,L3 | 16 | R1 R2 |
| L3 | 4 | FROM L1,L2,L3,L4 | 16 | I/O 1 R3 R4 |
| L4 | 4 | FROM L2,L3,L4,L5 | 16 | I/O 2 R5 R6 |
| L5 | 4 | FROM L3,L4,L5,L6 | 16 | R7 R8 |
| L6 | 4 | FROM L4,L5,L6,L7 | 16 | I/O 3 |
| L7 | 4 | FROM L5,L6,L7,L8 | 16 | I/O 4 R9 R10 |
| L8 | 4 | FROM L6,L7,L8,L9 | 16 | R11 R12 |
| L9 | 4 | FROM L7,L8,L9,L10,L11 | 16 | I/O 5 |
| L10 | 4 | FROM L8,L9,L10,L11 | 16 | I/O 6 R13 R14 |
| L11 | 4 | FROM L9,L10,L11,L12,L13 | 16 | R15 R16 |
| L12 | 4 | FROM L10,L11,L12,L13 | 16 | I/O 7 |
| L13 | 4 | FROM L11,L12,L13,L14 | 16 | |
| L14 | 4 | FROM L12,L13,L14,L15 | 16 | |
| L15 | 4 | FROM L13,L14,L15,L16 | 12 | |
| L16 | 4 | FROM L14,L15,L16 | | |
| | FROM L15,L16 | 8 | | |

| Programmable Logic Block Input Line | Switch Matrix Multiplexer Input Lines | | | | |
|---|---|---|---|---|---|
| AIN1  | A1^  | A9   | B1^  | B9  | |
| AIN2  | A2^  | A10  | B2^  | B10 | |
| AIN3  | A3^  | A11  | B3^  | B11 | |
| AIN4  | A4^  | A12  | B4   | B12 | |
| AIN5  | A5^  | A13  | B5^  | B13 | |
| AIN6  | A6^  | A14  | B6^  | B14 | |
| AIN7  | A7^  | A15  | B7^  | B15 | |
| AIN8  | A8^  | A16  | B8^  | B16 | |
| AIN9  | A9^  | A1   | B9^  | B1  | |
| AIN10 | A10^ | A2   | B10^ | B2  | |
| AIN11 | A11^ | A3   | B11^ | B3  | |
| AIN12 | A12^ | A4   | B12^ | B4  | |
| AIN13 | A13^ | A5   | B13^ | B5  | |
| AIN14 | A14^ | A6   | B14^ | B6  | |
| AIN15 | A15^ | A7   | B15^ | B7  | |
| AIN16 | A16^ | A8   | B16^ | B8  | |
| AIN17 | I1   |      |      |     | |
| AIN18 | I2   |      |      |     | |
| AIN19 | A1^  | A9^  | A2   | A10 | I3 |
| AIN20 | A3^  | A11^ | A4   | A12 | I4 |
| AIN21 | A5^  | A13^ | A6   | A14 | I5 |
| AIN22 | A7^  | A15^ | A8   | A16 | I6 |

FIG. 35B

| Programmable Logic Block Input Line | Switch Matrix Multiplexer Input Lines | | | | |
|---|---|---|---|---|---|
| BIN1  | A1^  | A9  | B1^  | B9  |    |
| BIN2  | A2^  | A10 | B2^  | B10 |    |
| BIN3  | A3^  | A11 | B3^  | B11 |    |
| BIN4  | A4^  | A12 | B4^  | B12 |    |
| BIN5  | A5^  | A13 | B5^  | B13 |    |
| BIN6  | A6^  | A14 | B6^  | B14 |    |
| BIN7  | A7^  | A15 | B7^  | B15 |    |
| BIN8  | A8^  | A16 | B8^  | B16 |    |
| BIN9  | A9^  | A1  | B9^  | B1  |    |
| BIN10 | A10^ | A2  | B10^ | B2  |    |
| BIN11 | A11^ | A3  | B11^ | B3  |    |
| BIN12 | A12^ | A4  | B12^ | B4  |    |
| BIN13 | A13^ | A5  | B13^ | B5  |    |
| BIN14 | A14^ | A6  | BI4^ | B6  |    |
| BIN15 | A15^ | A7  | BI5^ | B7  |    |
| BIN16 | A16^ | A8  | B16^ | B8  |    |
| BIN17 | I1   |     |      |     |    |
| BIN18 | I2   |     |      |     |    |
| BIN19 | B1^  | B9^ | B2   | B10 | I3 |
| BIN20 | B3^  | B11^| B4   | B12 | I4 |
| BIN21 | B5^  | B13^| B6   | B14 | I5 |
| BIN22 | B7^  | B15^| B8   | B16 | I6 |

FIG. 36

Switch Matrix

Multiplexer Input Lines

| | | | | | | |
|---|---|---|---|---|---|---|
| Band 1 | A^0 | A^1 | A^2 | A^3 | A^4 | A^5 | IO0/CLK0 |
| Band 2 | B^0 | B^1 | B^2 | B^3 | B^4 | B^5 | IO0/CLK0 |
| Band 3 | A0 | A1 | A2 | A3 | A4 | A5 | IO1/CLK1 |
| Band 4 | B0 | B1 | B2 | B3 | B4 | B5 | IO1/CLK1 |
| Band 5 | A^6 | A^7 | A^8 | A^9 | A^10 | A^11 | IO4/CLK2 |
| Band 6 | B^6 | B^7 | B^8 | B^9 | B^10 | B^11 | IO4/CLK2 |
| Band 7 | A6 | A7 | A8 | A9 | A10 | A11 | IO5/CLK3 |
| Band 8 | B6 | B7 | B8 | B9 | B10 | B11 | IO5/CLK3 |
| Band 9 | C^0 | C^1 | C^2 | C^3 | C^4 | C^5 | IO2 |
| Band 10 | D^0 | D^1 | D^2 | D^3 | D^4 | D^5 | IO2 |
| Band 11 | C0 | C1 | C2 | C3 | C4 | C5 | IO3 |
| Band 12 | D0 | D1 | D2 | D3 | D4 | D5 | IO3 |
| Band 13 | C^6 | C^7 | C^8 | C^9 | C^10 | C^11 | IO6 |
| Band 14 | D^6 | D^7 | D^8 | D^9 | D^10 | D^11 | IO6 |
| Band 15 | C6 | C7 | C8 | C9 | C10 | C11 | IO7 |
| Band 16 | D6 | D7 | D8 | D9 | D10 | D11 | IO7 |

FIG. 38A

| Array Input Line | Band 1 | Band 2 | Band 3 | Band 4 |
| --- | --- | --- | --- | --- |
| Input 1 | IO0/CLK0 | B^01 | A00 | B02 |
| Input 2 | A^00 | B^02 | A01 | B03 |
| Input 3 | A^00 | IO0/CLK0 | A04 | B02 |
| Input 4 | A^01 | IO0CLK0 | A05 | B03 |
| Input 5 | A^02 | B^00 | A03 | B04 |
| Input 6 | A^03 | B^01 | IO1/CLK1 | B05 |
| Input 7 | A^04 | B^02 | A02 | IO1/CLK1 |
| Input 8 | A^05 | B^03 | A03 | IO1/CLK1 |
| Input 9 | A^00 | B^04 | A01 | B00 |
| Input 10 | A^01 | B^05 | A02 | B01 |
| Input 11 | A^02 | B^01 | A03 | B00 |
| Input 12 | A^03 | B^02 | A04 | B01 |
| Input 13 | A^04 | B^03 | A05 | B02 |
| Input 14 | A^05 | B^04 | A00 | B03 |
| Input 15 | A^00 | B^05 | A03 | B04 |
| Input 16 | A^01 | B^00 | A04 | B05 |
| Input 17 | A^02 | B^02 | A05 | B03 |
| Input 18 | A^03 | B^03 | A00 | B04 |
| Input 19 | A^04 | B^04 | A01 | B05 |
| Input 20 | A^05 | B^05 | A02 | B00 |
| Input 21 | A^00 | B^00 | A02 | B01 |
| Input 22 | A^01 | B^01 | A03 | B02 |
| Input 23 | A^02 | B^03 | A04 | B04 |
| Input 24 | A^03 | B^04 | A05 | B05 |
| Input 25 | A^04 | B^05 | A00 | B00 |
| Input 26 | A^05 | B^00 | A01 | B01 |

FIG. 38B

| Array Input Line | Band 5 | Band 6 | Band 7 | Band 8 |
| --- | --- | --- | --- | --- |
| Input 1 | A^07 | B^10 | A08 | B06 |
| Input 2 | A^08 | B^11 | A11 | B07 |
| Input 3 | A^09 | B^06 | A06 | B07 |
| Input 4 | A^10 | B^07 | A07 | B08 |
| Input 5 | A^11 | B^08 | A08 | B09 |
| Input 6 | A^06 | B^09 | A09 | B10 |
| Input 7 | A^07 | B^10 | A10 | B11 |
| Input 8 | A^08 | B^11 | A11 | B06 |
| Input 9 | IO4/CLK2 | B^07 | A06 | B10 |
| Input 10 | A^09 | IO4/CLK2 | A07 | B11 |
| Input 11 | A^10 | IO4/CLK2 | A08 | B06 |
| Input 12 | A^11 | B^08 | IO5/CLK3 | B07 |
| Input 13 | A^06 | B^09 | A09 | IO5/CLK3 |
| Input 14 | A^07 | B^10 | A10 | IO5/CLK3 |
| Input 15 | A^06 | B^11 | A07 | B08 |
| Input 16 | A^07 | B^06 | A08 | B09 |
| Input 17 | A^08 | B^07 | A09 | B06 |
| Input 18 | A^09 | B^08 | A10 | B07 |
| Input 19 | A^10 | B^09 | A11 | B08 |
| Input 20 | A^11 | B^10 | A06 | B09 |
| Input 21 | A^07 | B^11 | A06 | B10 |
| Input 22 | A^08 | B^06 | A07 | B11 |
| Input 23 | A^09 | B^06 | A08 | B08 |
| Input 24 | A^10 | B^07 | A09 | B09 |
| Input 25 | A^11 | B^08 | A10 | B10 |
| Input 26 | A^06 | B^09 | A11 | B11 |

FIG. 38C

| Array Input Line | Band 9 | Band 10 | Band 11 | Band 12 |
|---|---|---|---|---|
| Input 1 | C^00 | D^00 | C02 | D01 |
| Input 2 | C^01 | D^01 | C03 | D02 |
| Input 3 | C^02 | D^02 | C04 | D03 |
| Input 4 | C^03 | D^03 | C05 | D04 |
| Input 5 | C^04 | D^04 | C00 | D05 |
| Input 6 | C^05 | D^05 | C01 | D00 |
| Input 7 | C^01 | D^02 | C00 | D00 |
| Input 8 | C^02 | D^03 | C01 | D01 |
| Input 9 | C^03 | D^04 | C02 | D02 |
| Input 10 | C^04 | D^05 | C03 | D03 |
| Input 11 | C^05 | D^00 | C04 | D04 |
| Input 12 | C^00 | D^01 | C05 | D05 |
| Input 13 | C^02 | D^04 | C03 | D00 |
| Input 14 | C^03 | D^05 | C04 | D01 |
| Input 15 | IO2 | D^00 | C05 | D02 |
| Input 16 | IO2 | D^01 | C00 | D03 |
| Input 17 | C^04 | IO2 | C01 | D04 |
| Input 18 | C^05 | D^02 | IO3 | D05 |
| Input 19 | C^00 | D^03 | IO3 | D05 |
| Input 20 | C^01 | D^00 | C02 | IO3 |
| Input 21 | C^03 | D^01 | C00 | D00 |
| Input 22 | C^04 | D^02 | C01 | D01 |
| Input 23 | C^05 | D^03 | C02 | D02 |
| Input 24 | C^00 | D^04 | C03 | D03 |
| Input 25 | C^01 | D^05 | C04 | D04 |
| Input 26 | C^02 | D^05 | C05 | D04 |

FIG. 38D

| Array Input Line | Band 13 | Band 14 | Band 15 | Band 16 |
|---|---|---|---|---|
| Input 1 | C^06 | D^07 | C07 | D06 |
| Input 2 | C^07 | D^08 | C08 | D07 |
| Input 3 | C^08 | D^09 | C09 | D08 |
| Input 4 | C^09 | D^10 | C10 | D09 |
| Input 5 | C^10 | D^11 | C11 | D10 |
| Input 6 | C^11 | D^06 | C06 | D11 |
| Input 7 | C^08 | D^06 | C06 | D08 |
| Input 8 | C^09 | D^07 | C07 | D09 |
| Input 9 | C^10 | D^08 | C08 | D10 |
| Input 10 | C^11 | D^09 | C09 | D11 |
| Input 11 | C^06 | D^10 | C10 | D06 |
| Input 12 | C^07 | D^11 | C11 | D07 |
| Input 13 | C^07 | D^09 | C09 | D07 |
| Input 14 | C^08 | D^10 | C10 | D08 |
| Input 15 | C^09 | D^11 | C11 | D09 |
| Input 16 | C^10 | D^06 | C06 | D10 |
| Input 17 | C^11 | D^07 | C07 | D11 |
| Input 18 | C^06 | D^08 | C08 | D06 |
| Input 19 | C^08 | D^10 | C11 | D07 |
| Input 20 | C^09 | D^11 | C06 | D08 |
| Input 21 | IO6 | D^06 | C07 | D09 |
| Input 22 | IO6 | D^07 | C08 | D10 |
| Input 23 | C^10 | IO6 | C09 | D11 |
| Input 24 | C^11 | D^08 | IO7 | D06 |
| Input 25 | C^06 | D^09 | IO7 | D07 |
| Input 26 | C^07 | D^10 | C10 | IO7 |

FIG. 39

Switch Matrix

Multiplexer Input Lines

| Band 1  | A^0  | A^1  | A^2  | A^3  | A^4  | A^5  | A^6  | A^7  | IO0 |
|---------|------|------|------|------|------|------|------|------|-----|
| Band 2  | B^0  | B^1  | B^2  | B^3  | B^4  | B^5  | B^6  | B^7  | IO0 |
| Band 3  | A0   | A1   | A2   | A3   | A4   | A5   | A6   | A7   | IO1 |
| Band 4  | B0   | B1   | B2   | B3   | B4   | B5   | B6   | B7   | IO1 |
| Band 5  | A^8  | A^9  | A^10 | A^11 | A^12 | A^13 | A^14 | A^15 | IO2 |
| Band 6  | B^8  | B^9  | B^10 | B^11 | B^12 | B^13 | B^14 | B^15 | IO2 |
| Band 7  | A8   | A9   | A10  | A11  | A12  | A13  | A14  | A15  | IO5 |
| Band 8  | B8   | B9   | B10  | B11  | B12  | B13  | B14  | B15  | IO5 |
| Band 9  | C^0  | C^1  | C^2  | C^3  | C^4  | C^5  | C^6  | C^7  | IO3 |
| Band 10 | D^0  | D^1  | D^2  | D^3  | D^4  | D^5  | D^6  | D^7  | IO3 |
| Band 11 | C0   | C1   | C2   | C3   | C4   | C5   | C6   | C7   | IO4 |
| Band 12 | D0   | D1   | D2   | D3   | D4   | D5   | D6   | D7   | IO4 |
| Band 13 | C^8  | C^9  | C^10 | C^11 | C^12 | C^13 | C^14 | C^15 | IO2 |
| Band 14 | D^8  | D^9  | D^10 | D^11 | D^12 | D^13 | D^14 | D^15 | IO2 |
| Band 15 | C8   | C9   | C10  | C11  | C12  | C13  | C14  | C15  | IO5 |
| Band 16 | D8   | D9   | D10  | D11  | D12  | D13  | D14  | D15  | IO5 |

FIG. 41A

| Array Input Line | Band 1 | Band 2 | Band 3 | Band 4 |
|---|---|---|---|---|
| Input 1 | A^00 | B^00 | IO1/CLK1 | B06 |
| Input 2 | A^01 | B^01 | IO1/CLK1 | B07 |
| Input 3 | A^02 | B^02 | A00 | B00 |
| Input 4 | A^03 | B^03 | A01 | B01 |
| Input 5 | A^04 | B^04 | A02 | B02 |
| Input 6 | A^05 | B^05 | A03 | B03 |
| Input 7 | A^06 | B^06 | A04 | B04 |
| Input 8 | A^07 | B^07 | A05 | B05 |
| Input 9 | A^00 | IO0/CLK0 | A06 | B06 |
| Input 10 | A^01 | IO0/CLK0 | A07 | B07 |
| Input 11 | A^02 | B^00 | A01 | IO1/CLK1 |
| Input 12 | A^03 | B^01 | A02 | IO1/CLK1 |
| Input 13 | A^04 | B^02 | A03 | B01 |
| Input 14 | A^05 | B^03 | A04 | B02 |
| Input 15 | A^06 | B^04 | A05 | B03 |
| Input 16 | A^07 | B^05 | A06 | B04 |
| Input 17 | A^00 | B^06 | A07 | B05 |
| Input 18 | A^01 | B^07 | A00 | B06 |
| Input 19 | A^02 | B^01 | A03 | B07 |
| Input 20 | A^03 | B^02 | A04 | B00 |
| Input 21 | A^04 | B^03 | A05 | B00 |
| Input 22 | A^05 | B^04 | A06 | B01 |
| Input 23 | A^06 | B^05 | A07 | B02 |
| Input 24 | A^07 | B^06 | A00 | B03 |
| Input 25 | IO0/CLK0 | B^07 | A01 | B04 |
| Input 26 | IO0/CLK0 | B^00 | A02 | B05 |

FIG. 41B

| Array Input Line | Band 5 | Band 6 | Band 7 | Band 8 |
| --- | --- | --- | --- | --- |
| Input 1 | A^08 | B^08 | A12 | B12 |
| Input 2 | A^09 | B^09 | A13 | B13 |
| Input 3 | A^10 | IO2 | A14 | B14 |
| Input 4 | A^11 | IO2 | A15 | B15 |
| Input 5 | A^12 | B^10 | IO5 | B08 |
| Input 6 | A^13 | B^11 | IO5 | B09 |
| Input 7 | A^14 | B^12 | A08 | IO5 |
| Input 8 | A^15 | B^13 | A09 | IO5 |
| Input 9 | A^09 | B^14 | A10 | B08 |
| Input 10 | A^10 | B^15 | A11 | B09 |
| Input 11 | A^11 | B^09 | A12 | B10 |
| Input 12 | A^12 | B^10 | A13 | B11 |
| Input 13 | A^13 | B^11 | A14 | B12 |
| Input 14 | A^14 | B^12 | A15 | B13 |
| Input 15 | A^15 | B^13 | A09 | B14 |
| Input 16 | A^08 | B^14 | A10 | B15 |
| Input 17 | IO2 | B^15 | A11 | B09 |
| Input 18 | IO2 | B^08 | A12 | B10 |
| Input 19 | A^08 | B^10 | A13 | B11 |
| Input 20 | A^09 | B^11 | A14 | B12 |
| Input 21 | A^10 | B^12 | A15 | B13 |
| Input 22 | A^11 | B^13 | A08 | B14 |
| Input 23 | A^12 | B^14 | A08 | B15 |
| Input 24 | A^13 | B^15 | A09 | B08 |
| Input 25 | A^14 | B^08 | A10 | B10 |
| Input 26 | A^15 | B^09 | A11 | B11 |

FIG. 41C

| Array Input Line | Band 9 | Band 10 | Band 11 | Band 12 |
|---|---|---|---|---|
| Input 1 | C^00 | D^00 | C04 | D04 |
| Input 2 | C^01 | D^01 | C05 | D05 |
| Input 3 | C^02 | D^02 | C06 | D06 |
| Input 4 | C^03 | D^03 | C07 | D07 |
| Input 5 | C^04 | D^04 | C00 | D00 |
| Input 6 | C^05 | D^05 | C01 | D01 |
| Input 7 | C^06 | D^06 | C02 | D02 |
| Input 8 | C^07 | D^07 | C03 | D03 |
| Input 9 | C^01 | D^02 | C00 | D00 |
| Input 10 | C^02 | D^03 | C01 | D01 |
| Input 11 | C^03 | D^04 | C02 | D02 |
| Input 12 | C^04 | D^05 | C03 | D03 |
| Input 13 | IO3/CLK2 | D^06 | C04 | D04 |
| Input 14 | IO3/CLK2 | D^07 | C05 | D05 |
| Input 15 | C^05 | IO3/CLK2 | C06 | D06 |
| Input 16 | C^06 | IO3/CLK2 | C07 | D07 |
| Input 17 | C^07 | D^00 | C03 | D01 |
| Input 18 | C^00 | D^01 | C04 | D02 |
| Input 19 | C^02 | D^04 | IO4/CLK3 | D03 |
| Input 20 | C^03 | D^05 | IO4/CLK3 | D04 |
| Input 21 | C^04 | D^05 | C05 | IO4/CLK3 |
| Input 22 | C^05 | D^07 | C06 | IO4/CLK3 |
| Input 23 | C^06 | D^00 | C07 | D05 |
| Input 24 | C^07 | D^01 | C00 | D06 |
| Input 25 | C^00 | D^02 | C01 | D07 |
| Input 26 | C^01 | D^03 | C02 | D00 |

FIG. 41D

| Array Input Line | Band 13 | Band 14 | Band 15 | Band 16 |
| --- | --- | --- | --- | --- |
| Input 1 | C^08 | D^08 | C12 | D12 |
| Input 2 | C^09 | D^09 | C13 | D13 |
| Input 3 | C^10 | D^10 | C14 | D14 |
| Input 4 | C^11 | D^11 | C15 | D15 |
| Input 5 | C^12 | D^12 | C08 | D08 |
| Input 6 | C^13 | D^13 | C09 | D09 |
| Input 7 | C^14 | D^14 | C10 | D10 |
| Input 8 | C^15 | D^15 | C11 | D11 |
| Input 9 | C^10 | D^09 | C09 | D09 |
| Input 10 | C^11 | D^10 | C10 | D10 |
| Input 11 | C^12 | D^11 | C11 | D11 |
| Input 12 | C^13 | D^12 | C12 | D12 |
| Input 13 | C^14 | D^13 | C13 | D13 |
| Input 14 | C^15 | D^14 | C14 | D14 |
| Input 15 | C^08 | D^15 | C15 | D15 |
| Input 16 | C^09 | D^08 | C08 | D08 |
| Input 17 | C^10 | D^10 | C10 | D08 |
| Input 18 | C^11 | D^11 | C11 | D09 |
| Input 19 | C^12 | D^12 | C12 | D10 |
| Input 20 | C^13 | D^13 | C13 | D11 |
| Input 21 | C^14 | D^14 | C14 | D12 |
| Input 22 | C^15 | D^15 | C15 | D13 |
| Input 23 | C^08 | D^08 | C08 | D14 |
| Input 24 | C^09 | D^09 | C09 | D15 |
| Input 25 | C^10 | D^10 | C08 | D09 |
| Input 26 | C^11 | D^11 | C10 | D10 |

FIG. 42

Switch Matrix

Multiplexer Input Lines

| Band 1  | A08  | A09  | A10  | A11  | A12  | A13  | A14  | A15  | IO0 |
| Band 7  | B08  | B09  | B10  | B11  | B12  | B13  | B14  | B15  | IO0 |
| Band 2  | A0   | A1   | A2   | A3   | A4   | A5   | A6   | A7   | IO2 |
| Band 8  | B0   | B1   | B2   | B3   | B4   | B5   | B6   | B7   | IO2 |
| Band 3  | C0   | C1   | C2   | C3   | C4   | C5   | C6   | C7   | IO4 |
| Band 9  | D0   | D1   | D2   | D3   | D4   | D5   | D6   | D7   | IO4 |
| Band 4  | C08  | C09  | C10  | C11  | C12  | C13  | C14  | C15  | IO5 |
| Band 10 | D08  | D09  | D10  | D11  | D12  | D13  | D14  | D15  | IO5 |
| Band 5  | A^0  | A^2  | A^4  | A^6  | A^8  | A^10 | A^12 | A^14 | IO1 |
| Band 11 | B^0  | B^2  | B^4  | B^6  | B^8  | B^10 | B^12 | B^14 | IO1 |
| Band 6  | C^0  | C^2  | C^4  | C^6  | C^8  | C^10 | C^12 | C^14 | IO3 |
| Band 12 | D^0  | D^2  | D^4  | D^6  | D^8  | D^10 | D^12 | D^14 | IO3 |

FIG. 44A

| Array Input Line | Band 1 | Band 2 | Band 3 | Band 4 |
| --- | --- | --- | --- | --- |
| Input 1  | A12 | A00 | C04 | C11 |
| Input 2  | A14 | A00 | C05 | C12 |
| Input 3  | A08 | A01 | C06 | C13 |
| Input 4  | A09 | A02 | C07 | C14 |
| Input 5  | A10 | A03 | IO4 | C15 |
| Input 6  | A11 | A04 | C00 | IO5 |
| Input 7  | A12 | A05 | C02 | C08 |
| Input 8  | A13 | A06 | C00 | C10 |
| Input 9  | A14 | A07 | C01 | C08 |
| Input 10 | A15 | IO2 | C02 | C09 |
| Input 11 | IO0 | A02 | C03 | C10 |
| Input 12 | A15 | A04 | IO4 | C14 |
| Input 13 | IO0 | A06 | C04 | C15 |
| Input 14 | A08 | A00 | C06 | IO5 |
| Input 15 | A09 | A01 | C00 | C12 |
| Input 16 | A08 | A02 | C01 | C14 |
| Input 17 | A09 | A03 | C02 | C08 |
| Input 18 | A10 | A04 | C03 | C09 |
| Input 19 | A11 | A05 | C04 | C10 |
| Input 20 | A12 | A06 | C05 | C11 |
| Input 21 | A13 | A07 | C06 | C12 |
| Input 22 | A14 | IO2 | C07 | C13 |

FIG. 44B

| Array Input Line | Band 5 | Band 6 | Band 7 | Band 8 |
| --- | --- | --- | --- | --- |
| Input 1 | A^00 | C^10 | B14 | B07 |
| Input 2 | A^02 | C^12 | B15 | IO2 |
| Input 3 | A^04 | C^14 | IO0 | B00 |
| Input 4 | A^06 | IO3 | B08 | B02 |
| Input 5 | A^08 | C^00 | B10 | B00 |
| Input 6 | A^10 | C^02 | B08 | B01 |
| Input 7 | A^12 | C^00 | B09 | B02 |
| Input 8 | A^14 | C^02 | B10 | B03 |
| Input 9 | IO1 | C^04 | B11 | B04 |
| Input 10 | A^00 | C^06 | B12 | B05 |
| Input 11 | A^02 | C^08 | B13 | B06 |
| Input 12 | A^00 | C^04 | B09 | B03 |
| Input 13 | A^02 | C^00 | B10 | B04 |
| Input 14 | A^04 | C^02 | B11 | B05 |
| Input 15 | A^06 | C^04 | B12 | B06 |
| Input 16 | A^08 | C^06 | B13 | B07 |
| Input 17 | A^10 | C^08 | B14 | B05 |
| Input 18 | A^12 | C^10 | B15 | B04 |
| Input 19 | A^14 | C^12 | B12 | B06 |
| Input 20 | A^04 | C^14 | B14 | B00 |
| Input 21 | A^12 | C^12 | B09 | B01 |
| Input 22 | A^14 | C^14 | B08 | B02 |

FIG. 44C

| Array Input Line | Band 9 | Band 10 | Band 11 | Band 12 |
|---|---|---|---|---|
| Input 1 | D01 | D08 | IO1 | D^04 |
| Input 2 | D02 | D09 | B^00 | D^06 |
| Input 3 | D03 | D10 | B^02 | D^08 |
| Input 4 | D04 | D11 | B^00 | D^10 |
| Input 5 | D05 | D12 | B^02 | D^12 |
| Input 6 | D06 | D13 | B^04 | D^14 |
| Input 7 | D07 | D14 | B^06 | IO3 |
| Input 8 | IO4 | D15 | B^08 | D^00 |
| Input 9 | D00 | IO5 | B^10 | D^02 |
| Input 10 | D02 | D08 | B^12 | D^00 |
| Input 11 | D00 | D10 | B^14 | D^02 |
| Input 12 | D02 | D12 | B^10 | D^08 |
| Input 13 | D03 | D14 | B^12 | D^10 |
| Input 14 | D04 | D08 | B^14 | D^12 |
| Input 15 | D05 | D14 | B^04 | D^14 |
| Input 16 | D06 | D14 | B^12 | IO3 |
| Input 17 | D07 | D13 | IO1 | D^12 |
| Input 18 | D03 | D12 | B^00 | D^14 |
| Input 19 | D04 | D11 | B^02 | D^00 |
| Input 20 | D05 | D10 | B^04 | D^02 |
| Input 21 | D00 | D09 | B^06 | D^04 |
| Input 22 | D01 | D08 | B^08 | D^06 |

FIG. 45

Switch Matrix

Multiplexer Input Lines

| | | | | | | | | | |
|---|---|---|---|---|---|---|---|---|---|
| Band 1  | A^0  | A^2  | A^4  | A^6  | A^8  | A^10 | C01 | C03 | C05 | IO0/CLK0 |
| Band 2  | B^0  | B^2  | B^4  | B^6  | B^8  | B^10 | D01 | D03 | D05 | IO0/CLK0 |
| Band 3  | A0   | A2   | A4   | A6   | A8   | A10  | C07 | C09 | C11 | IO1/CLK1 |
| Band 4  | B0   | B2   | B4   | B6   | B8   | B10  | D07 | D09 | D11 | IO1/CLK1 |
| Band 5  | C^0  | C^2  | C^4  | C^6  | C^8  | C^10 | A01 | A03 | A05 | IO2 |
| Band 6  | D^0  | D^2  | D^4  | D^6  | D^8  | D^10 | B01 | B03 | B05 | IO2 |
| Band 7  | C0   | C2   | C4   | C6   | C8   | C10  | A07 | A09 | A11 | IO3 |
| Band 8  | D0   | D2   | D4   | D6   | D8   | D10  | B07 | B09 | B11 | IO3 |
| Band 9  | E^0  | E^2  | E^4  | E^6  | E^8  | E^10 | G01 | G03 | G05 | IO4/CLK2 |
| Band 10 | F^0  | F^2  | F^4  | F^6  | F^8  | F^10 | H01 | H03 | H05 | IO4/CLK2 |
| Band 11 | E0   | E2   | E4   | E6   | E8   | E10  | G07 | G09 | G11 | IO5/CLK3 |
| Band 12 | F0   | F2   | F4   | F6   | F8   | F10  | H07 | H09 | H11 | IO5/CLK3 |
| Band 13 | G^00 | G^02 | G^04 | G^06 | G^08 | G^10 | E01 | E03 | E05 | IO6 |
| Band 14 | H^00 | H^02 | H^04 | H^06 | H^08 | H^10 | F01 | F03 | F05 | IO6 |
| Band 15 | G00  | G02  | G04  | G06  | G08  | G10  | E07 | E09 | E11 | IO7 |
| Band 16 | H00  | H02  | H04  | H06  | H08  | H10  | F07 | F09 | F11 | IO7 |

FIG. 47A

| Array Input Line | Band 1 | Band 2 | Band 3 | Band 4 |
|---|---|---|---|---|
| Input 1 | A^00 | IO0/CLK0 | C07 | D07 |
| Input 2 | A^02 | IO0/CLK0 | C09 | D09 |
| Input 3 | A^04 | B^00 | C11 | D11 |
| Input 4 | A^06 | B^02 | A00 | IO0/CLK1 |
| Input 5 | A^08 | B^04 | A02 | IO1/CLK1 |
| Input 6 | A^10 | B^06 | A04 | B00 |
| Input 7 | C01 | B^08 | A06 | B02 |
| Input 8 | C03 | B^10 | A08 | B04 |
| Input 9 | C05 | IO0/CLK0 | A10 | B06 |
| Input 10 | A^00 | D01 | C09 | B08 |
| Input 11 | A^02 | D03 | C11 | B10 |
| Input 12 | A^04 | D05 | C07 | IO1/CLK1 |
| Input 13 | A^06 | B^00 | A02 | D09 |
| Input 14 | A^08 | B^02 | A04 | D11 |
| Input 15 | A^10 | B^04 | A06 | B00 |
| Input 16 | C03 | B^06 | A08 | B02 |
| Input 17 | C05 | B^08 | A10 | B04 |
| Input 18 | A^02 | B^10 | A00 | B06 |
| Input 19 | A^04 | D03 | C09 | B08 |
| Input 20 | A^06 | D05 | C11 | B10 |
| Input 21 | A^08 | B^00 | A00 | B02 |
| Input 22 | A^10 | B^02 | A02 | B04 |
| Input 23 | A^00 | B^04 | A04 | B06 |
| Input 24 | C01 | B^06 | A06 | B08 |
| Input 25 | C03 | B^08 | A08 | B10 |
| Input 26 | C05 | B^10 | A10 | B00 |

FIG. 47B

| Array Input Line | Band 5 | Band 6 | Band 7 | Band 8 |
|---|---|---|---|---|
| Input 1  | C^00 | D^00 | A07 | D08 |
| Input 2  | C^02 | D^02 | A09 | D10 |
| Input 3  | C^04 | D^04 | A11 | B11 |
| Input 4  | C^06 | D^06 | C00 | B07 |
| Input 5  | C^08 | D^08 | C02 | B09 |
| Input 6  | C^10 | D^10 | C04 | B11 |
| Input 7  | IO2  | B01  | C06 | D00 |
| Input 8  | IO2  | B03  | C08 | D02 |
| Input 9  | A01  | B05  | C10 | D04 |
| Input 10 | A03  | D^02 | IO3 | D06 |
| Input 11 | A05  | D^04 | IO3 | D08 |
| Input 12 | C^00 | D^04 | A07 | D10 |
| Input 13 | C^02 | D^08 | A09 | D00 |
| Input 14 | C^04 | D^10 | IO3 | D02 |
| Input 15 | C^06 | B03  | C02 | D04 |
| Input 16 | C^08 | B05  | C04 | D06 |
| Input 17 | C^10 | B01  | C06 | D08 |
| Input 18 | IO2  | D^00 | C08 | D10 |
| Input 19 | A03  | D^02 | C10 | B07 |
| Input 20 | A05  | D^04 | C00 | B09 |
| Input 21 | C^04 | D^06 | C02 | B11 |
| Input 22 | C^06 | D^08 | C04 | B09 |
| Input 23 | C^08 | D^10 | C06 | B07 |
| Input 24 | C^10 | B03  | C08 | D02 |
| Input 25 | C^00 | B05  | C10 | D04 |
| Input 26 | C^02 | B01  | C00 | D06 |

FIG. 47C

| Array Input Line | Band 9 | Band 10 | Band 11 | Band 12 |
| --- | --- | --- | --- | --- |
| Input 1 | E^00 | F^00 | G07 | F06 |
| Input 2 | E^02 | F^02 | G09 | F08 |
| Input 3 | E^04 | F^04 | G11 | F10 |
| Input 4 | E^06 | F^06 | E00 | H07 |
| Input 5 | E^08 | F^08 | E02 | H09 |
| Input 6 | E^10 | F^10 | E04 | H11 |
| Input 7 | G01 | F^02 | E06 | F00 |
| Input 8 | G03 | F^04 | E08 | F02 |
| Input 9 | G05 | F^06 | E10 | F04 |
| Input 10 | E^00 | F^08 | E00 | F06 |
| Input 11 | E^02 | F^10 | E02 | F08 |
| Input 12 | E^04 | H01 | E04 | F10 |
| Input 13 | E^06 | H03 | E06 | F00 |
| Input 14 | E^08 | H05 | E08 | F02 |
| Input 15 | E^10 | F^00 | E10 | F04 |
| Input 16 | IO4/CKL2 | F^02 | G07 | F06 |
| Input 17 | G05 | IO4/CKL2 | G09 | F08 |
| Input 18 | G01 | IO4/CKL2 | G11 | F10 |
| Input 19 | G03 | F^04 | G07 | H07 |
| Input 20 | G05 | F^06 | IO5/CKL3 | H09 |
| Input 21 | E^00 | F^08 | E02 | IO5/CKL3 |
| Input 22 | E^02 | F^10 | E04 | IO5/CKL3 |
| Input 23 | E^04 | F^00 | E06 | H11 |
| Input 24 | E^06 | H01 | E08 | F00 |
| Input 25 | E^08 | H03 | E10 | F02 |
| Input 26 | E^10 | H05 | E00 | F04 |

FIG. 47D

| Array Input Line | Band 13 | Band 14 | Band 15 | Band 16 |
| --- | --- | --- | --- | --- |
| Input 1  | G^00 | H^00 | G06 | H06 |
| Input 2  | G^02 | H^02 | G08 | H08 |
| Input 3  | G^04 | H^04 | I07 | H10 |
| Input 4  | G^06 | H^06 | E07 | F07 |
| Input 5  | G^08 | H^08 | E09 | F09 |
| Input 6  | G^10 | H^10 | E11 | F11 |
| Input 7  | E01  | F01  | G00 | H00 |
| Input 8  | E03  | F03  | G02 | H02 |
| Input 9  | E05  | F05  | G04 | H04 |
| Input 10 | G^00 | H^00 | E07 | H06 |
| Input 11 | G^02 | H^02 | E09 | H08 |
| Input 12 | G^04 | H^04 | E11 | H10 |
| Input 13 | G^06 | H^06 | I07 | H00 |
| Input 14 | G^08 | H^08 | G10 | H02 |
| Input 15 | G^10 | H^10 | G00 | H04 |
| Input 16 | E01  | F01  | G02 | H06 |
| Input 17 | E03  | F03  | G04 | H08 |
| Input 18 | E05  | F05  | G06 | H10 |
| Input 19 | G^02 | H^00 | G08 | F09 |
| Input 20 | E01  | H^02 | G10 | F11 |
| Input 21 | E03  | H^04 | E07 | H02 |
| Input 22 | E05  | H^06 | E09 | H04 |
| Input 23 | I06  | H^08 | E11 | H06 |
| Input 24 | I06  | H^10 | G00 | H08 |
| Input 25 | I06  | F03  | G02 | H10 |
| Input 26 | G^04 | F05  | I07 | H00 |

FIG. 48A

| Array Input Line | Band 1 | Band 2 | Band 3 | Band 4 |
| --- | --- | --- | --- | --- |
| Input 1 | IO0/CLK0 | D01 | C07 | D07 |
| Input 2 | IO0/CLK0 | D03 | C09 | D09 |
| Input 3 | A^00 | B^00 | C11 | D11 |
| Input 4 | A^02 | B^02 | IO1/CLK1 | D09 |
| Input 5 | A^04 | B^04 | IO1/CLK1 | D11 |
| Input 6 | A^06 | B^06 | A04 | B00 |
| Input 7 | A^08 | B^08 | A06 | B02 |
| Input 8 | A^10 | B^10 | A08 | B04 |
| Input 9 | IO0/CLK0 | D05 | A10 | B06 |
| Input 10 | A^00 | D01 | C09 | B08 |
| Input 11 | A^02 | D03 | C11 | B10 |
| Input 12 | A^04 | D05 | IO1/CLK1 | D07 |
| Input 13 | A^06 | B^00 | A02 | D09 |
| Input 14 | A^08 | B^02 | A04 | D11 |
| Input 15 | A^10 | B^04 | A06 | B00 |
| Input 16 | C03 | B^06 | A08 | B02 |
| Input 17 | C05 | B^08 | A10 | B04 |
| Input 18 | A^02 | B^10 | A00 | B06 |
| Input 19 | A^04 | D03 | C09 | B08 |
| Input 20 | A^06 | D05 | C11 | B10 |
| Input 21 | A^08 | B^00 | A00 | B02 |
| Input 22 | A^10 | B^02 | A02 | B04 |
| Input 23 | A^00 | B^04 | A04 | B06 |
| Input 24 | C01 | B^06 | A06 | B08 |
| Input 25 | C03 | B^08 | A08 | B10 |
| Input 26 | C05 | B^10 | A10 | B00 |

FIG. 48B

| Array Input Line | Band 5 | Band 6 | Band 7 | Band 8 |
| --- | --- | --- | --- | --- |
| Input 1 | C^00 | D^00 | A07 | D08 |
| Input 2 | C^02 | D^02 | A09 | D10 |
| Input 3 | C^04 | D^04 | A11 | B11 |
| Input 4 | C^06 | D^06 | C00 | B07 |
| Input 5 | C^08 | D^08 | C02 | B09 |
| Input 6 | C^10 | D^10 | C04 | B11 |
| Input 7 | IO2 | B01 | C06 | D00 |
| Input 8 | IO2 | B03 | C08 | D02 |
| Input 9 | A01 | B05 | C10 | D04 |
| Input 10 | A03 | D^02 | IO3 | D06 |
| Input 11 | A05 | D^04 | IO3 | D08 |
| Input 12 | C^00 | D^06 | IO3 | D10 |
| Input 13 | C^02 | D^08 | A07 | D00 |
| Input 14 | C^04 | D^10 | A09 | D02 |
| Input 15 | C^06 | B03 | C02 | D04 |
| Input 16 | C^08 | B05 | C04 | D06 |
| Input 17 | C^10 | B01 | C06 | D08 |
| Input 18 | IO2 | D^00 | C08 | D10 |
| Input 19 | A03 | D^02 | C10 | B07 |
| Input 20 | A05 | D^04 | C00 | B09 |
| Input 21 | C^04 | D^06 | C02 | B11 |
| Input 22 | C^06 | D^08 | C04 | B09 |
| Input 23 | C^08 | D^10 | C06 | B07 |
| Input 24 | C^10 | B03 | C08 | D02 |
| Input 25 | C^00 | B05 | C10 | D04 |
| Input 26 | C^02 | B01 | C00 | D06 |

FIG. 48C

| Array Input Line | Band 9 | Band 10 | Band 11 | Band 12 |
| --- | --- | --- | --- | --- |
| Input 1 | E^00 | F^00 | G07 | F06 |
| Input 2 | E^02 | F^02 | G09 | F08 |
| Input 3 | E^04 | F^04 | G11 | F10 |
| Input 4 | E^06 | F^06 | E00 | H07 |
| Input 5 | E^08 | F^08 | E02 | H09 |
| Input 6 | E^10 | F^10 | E04 | H11 |
| Input 7 | G01 | F^02 | E06 | F00 |
| Input 8 | G03 | F^04 | E08 | F02 |
| Input 9 | G05 | F^06 | E10 | F04 |
| Input 10 | E^00 | F^08 | E00 | F06 |
| Input 11 | E^02 | F^10 | E02 | F08 |
| Input 12 | E^04 | H01 | E04 | F10 |
| Input 13 | E^06 | H03 | E06 | F00 |
| Input 14 | E^08 | H05 | E08 | F02 |
| Input 15 | E^10 | F^00 | E10 | F04 |
| Input 16 | IO4/CLK2 | F^02 | G07 | F06 |
| Input 17 | G05 | IO4/CLK2 | G09 | F08 |
| Input 18 | G01 | IO4/CLK2 | G11 | F10 |
| Input 19 | G03 | F^04 | G07 | H07 |
| Input 20 | G05 | F^06 | IO5/CLK3 | H09 |
| Input 21 | E^00 | F^08 | E02 | IO5/CLK3 |
| Input 22 | E^02 | F^10 | E04 | IO5/CLK3 |
| Input 23 | E^04 | F^00 | E06 | H11 |
| Input 24 | E^06 | H01 | E08 | F00 |
| Input 25 | E^08 | H03 | E10 | F02 |
| Input 26 | E^10 | H05 | E00 | F04 |

FIG. 48D

| Array Input Line | Band 13 | Band 14 | Band 15 | Band 16 |
| --- | --- | --- | --- | --- |
| Input 1 | G^00 | H^00 | G06 | H06 |
| Input 2 | G^02 | H^02 | G08 | H08 |
| Input 3 | G^04 | H^04 | G10 | I07 |
| Input 4 | G^06 | H^06 | E07 | F07 |
| Input 5 | G^08 | H^08 | E09 | F09 |
| Input 6 | G^10 | H^10 | E11 | F11 |
| Input 7 | E01 | F01 | G00 | H00 |
| Input 8 | E03 | F03 | G02 | H02 |
| Input 9 | E05 | F05 | G04 | H04 |
| Input 10 | G^00 | H^00 | G06 | H06 |
| Input 11 | G^02 | H^02 | G08 | H08 |
| Input 12 | G^04 | H^04 | G10 | H10 |
| Input 13 | G^06 | H^06 | E07 | I07 |
| Input 14 | G^08 | H^08 | E09 | H02 |
| Input 15 | G^10 | H^10 | E11 | H04 |
| Input 16 | E01 | F01 | G02 | H06 |
| Input 17 | E03 | F03 | G04 | H08 |
| Input 18 | E05 | F05 | G06 | H10 |
| Input 19 | G^02 | H^00 | G08 | F09 |
| Input 20 | G^04 | H^02 | G10 | F11 |
| Input 21 | G^06 | H^04 | G00 | H02 |
| Input 22 | G^08 | H^06 | E09 | H04 |
| Input 23 | G^10 | I06 | E11 | H06 |
| Input 24 | G^00 | I06 | G00 | H08 |
| Input 25 | E03 | I06 | G02 | H10 |
| Input 26 | E05 | F05 | G04 | I07 |

FIG. 49A

| Array Input Line | Band 1 | Band 2 | Band 3 | Band 4 |
| --- | --- | --- | --- | --- |
| Input 1 | IO0/CLK0 | D01 | C07 | D07 |
| Input 2 | IO0/CLK0 | D03 | C09 | D09 |
| Input 3 | A^00 | B^00 | C11 | D11 |
| Input 4 | A^02 | B^02 | IO1/CLK1 | B00 |
| Input 5 | A^04 | B^04 | IO1/CLK1 | B02 |
| Input 6 | A^06 | B^06 | A04 | B04 |
| Input 7 | A^08 | B^08 | A06 | B06 |
| Input 8 | A^10 | B^10 | A08 | B08 |
| Input 9 | IO0/CLK0 | D05 | A10 | B10 |
| Input 10 | A^00 | D01 | C09 | B00 |
| Input 11 | A^02 | D03 | C11 | B02 |
| Input 12 | A^04 | D05 | IO1/CLK1 | B04 |
| Input 13 | A^06 | B^00 | A02 | D07 |
| Input 14 | A^08 | B^02 | A04 | D09 |
| Input 15 | A^10 | B^04 | A06 | D11 |
| Input 16 | C03 | B^06 | A08 | B06 |
| Input 17 | C05 | B^08 | A10 | B08 |
| Input 18 | A^02 | B^10 | A00 | B10 |
| Input 19 | A^04 | D03 | C09 | B02 |
| Input 20 | A^06 | D05 | C11 | B04 |
| Input 21 | A^08 | D01 | A00 | B06 |
| Input 22 | A^10 | B^02 | A02 | B08 |
| Input 23 | A^00 | B^04 | A04 | B10 |
| Input 24 | C01 | B^06 | A06 | D07 |
| Input 25 | C03 | B^08 | A08 | D09 |
| Input 26 | C05 | B^10 | A10 | D11 |

FIG. 49B

| Array Input Line | Band 5 | Band 6 | Band 7 | Band 8 |
| --- | --- | --- | --- | --- |
| Input 1 | C^00 | D^00 | A07 | B07 |
| Input 2 | C^02 | D^02 | A09 | B09 |
| Input 3 | C^04 | D^04 | A11 | B11 |
| Input 4 | C^06 | D^06 | C00 | B07 |
| Input 5 | C^08 | D^08 | C02 | B09 |
| Input 6 | C^10 | D^10 | C04 | B11 |
| Input 7 | A03 | IO2 | C06 | D00 |
| Input 8 | A05 | IO2 | C08 | D02 |
| Input 9 | A01 | B05 | C10 | D04 |
| Input 10 | A03 | D^00 | IO3 | D06 |
| Input 11 | A05 | D^02 | IO3 | D08 |
| Input 12 | C^00 | D^04 | IO3 | D10 |
| Input 13 | C^02 | D^06 | A07 | D00 |
| Input 14 | C^04 | D^08 | A09 | D02 |
| Input 15 | C^06 | D^10 | C02 | D04 |
| Input 16 | C^08 | B03 | C04 | D06 |
| Input 17 | C^10 | B05 | C06 | D08 |
| Input 18 | A05 | IO2 | C08 | D10 |
| Input 19 | A01 | D^02 | C10 | B09 |
| Input 20 | A03 | D^04 | C00 | B11 |
| Input 21 | C^00 | D^06 | C02 | D00 |
| Input 22 | C^02 | D^08 | C04 | D02 |
| Input 23 | C^04 | D^10 | C06 | D04 |
| Input 24 | C^06 | B03 | C08 | D06 |
| Input 25 | C^08 | B05 | C10 | D08 |
| Input 26 | C^10 | B01 | C00 | D10 |

FIG. 49C

| Array Input Line | Band 9 | Band 10 | Band 11 | Band 12 |
| --- | --- | --- | --- | --- |
| Input 1 | E^00 | F^00 | G07 | F06 |
| Input 2 | E^02 | F^02 | G09 | F08 |
| Input 3 | E^04 | F^04 | G11 | F10 |
| Input 4 | E^06 | F^06 | E00 | H07 |
| Input 5 | E^08 | F^08 | E02 | H09 |
| Input 6 | E^10 | F^10 | E04 | H11 |
| Input 7 | G01 | F^02 | E06 | F00 |
| Input 8 | G03 | F^04 | E08 | F02 |
| Input 9 | G05 | F^06 | E10 | F04 |
| Input 10 | E^00 | F^08 | E00 | F06 |
| Input 11 | E^02 | F^10 | E02 | F08 |
| Input 12 | E^04 | F^00 | E04 | F10 |
| Input 13 | E^06 | H01 | E06 | F00 |
| Input 14 | E^08 | H03 | E08 | F02 |
| Input 15 | E^10 | H05 | E10 | F04 |
| Input 16 | IO4/CLK2 | F^04 | G07 | F06 |
| Input 17 | IO4/CLK2 | F^06 | G09 | F08 |
| Input 18 | IO4/CLK2 | F^08 | G11 | F10 |
| Input 19 | G05 | F^10 | G07 | H07 |
| Input 20 | C01 | F^00 | IO5/CLK3 | H09 |
| Input 21 | G03 | F^02 | IO5/CLK3 | H11 |
| Input 22 | G05 | H03 | IO5/CLK3 | H09 |
| Input 23 | G01 | H05 | E10 | H11 |
| Input 24 | G03 | H01 | E00 | F00 |
| Input 25 | G05 | H03 | G09 | F02 |
| Input 26 | E^02 | H05 | G11 | F04 |

FIG. 49D

| Array Input Line | Band 13 | Band 14 | Band 15 | Band 16 |
| --- | --- | --- | --- | --- |
| Input 1 | G^00 | H^00 | G06 | H06 |
| Input 2 | G^02 | H^02 | G08 | H08 |
| Input 3 | G^04 | H^04 | G10 | I07 |
| Input 4 | G^06 | H^06 | E07 | F07 |
| Input 5 | G^08 | H^08 | E09 | F09 |
| Input 6 | G^10 | H^10 | E11 | F11 |
| Input 7 | E01 | F01 | G00 | H00 |
| Input 8 | E03 | F03 | G02 | H02 |
| Input 9 | E05 | F05 | G04 | H04 |
| Input 10 | G^00 | H^00 | G06 | H06 |
| Input 11 | G^02 | H^02 | G08 | H08 |
| Input 12 | G^04 | H^04 | G10 | H10 |
| Input 13 | G^06 | H^06 | E07 | I07 |
| Input 14 | G^08 | H^08 | E09 | H02 |
| Input 15 | G^10 | H^10 | E11 | H04 |
| Input 16 | E01 | F01 | G02 | H06 |
| Input 17 | E03 | F03 | G04 | H08 |
| Input 18 | E05 | F05 | G06 | H10 |
| Input 19 | G^02 | H^00 | G08 | F09 |
| Input 20 | G^04 | H^02 | G10 | F11 |
| Input 21 | G^06 | H^04 | G00 | H02 |
| Input 22 | G^08 | H^06 | E09 | H04 |
| Input 23 | G^10 | I06 | E11 | H06 |
| Input 24 | G^00 | I06 | G00 | H08 |
| Input 25 | E03 | I06 | G02 | H10 |
| Input 26 | E05 | F05 | G04 | I07 |

FIG. 50A

| Array Input Line | Band 1 | Band 2 | Band 3 | Band 4 |
| --- | --- | --- | --- | --- |
| Input 1 | IO0/CLK0 | D01 | C07 | D07 |
| Input 2 | IO0/CLK0 | D03 | C09 | D09 |
| Input 3 | A^00 | B^00 | C11 | D11 |
| Input 4 | A^02 | B^02 | IO1/CLK1 | D09 |
| Input 5 | A^04 | B^04 | IO1/CLK1 | D11 |
| Input 6 | A^06 | B^06 | A04 | B00 |
| Input 7 | A^08 | B^08 | A06 | B02 |
| Input 8 | A^10 | B^10 | A08 | B04 |
| Input 9 | IO0/CLK0 | D05 | A10 | B06 |
| Input 10 | A^00 | D01 | C09 | B08 |
| Input 11 | A^02 | D03 | C11 | B10 |
| Input 12 | A^04 | D05 | IO1/CLK1 | D07 |
| Input 13 | A^06 | B^00 | A02 | D09 |
| Input 14 | A^08 | B^02 | A04 | D11 |
| Input 15 | A^10 | B^04 | A06 | B00 |
| Input 16 | C03 | B^06 | A08 | B02 |
| Input 17 | C05 | B^08 | A10 | B04 |
| Input 18 | A^02 | B^10 | A00 | B06 |
| Input 19 | A^04 | D03 | C09 | B08 |
| Input 20 | A^06 | D05 | C11 | B10 |
| Input 21 | A^08 | B^00 | A00 | B02 |
| Input 22 | A^10 | B^02 | A02 | B04 |
| Input 23 | A^00 | B^04 | A04 | B06 |
| Input 24 | C01 | B^06 | A06 | B08 |
| Input 25 | C03 | B^08 | A08 | B10 |
| Input 26 | C05 | B^10 | A10 | B00 |

FIG. 50B

| Array Input Line | Band 5 | Band 6 | Band 7 | Band 8 |
| --- | --- | --- | --- | --- |
| Input 1 | C^00 | D^00 | A07 | B07 |
| Input 2 | C^02 | D^02 | A09 | B09 |
| Input 3 | C^04 | D^04 | A11 | B11 |
| Input 4 | C^06 | D^06 | C00 | B07 |
| Input 5 | C^08 | D^08 | C02 | B09 |
| Input 6 | C^10 | D^10 | C04 | B11 |
| Input 7 | IO2 | B01 | C06 | D00 |
| Input 8 | IO2 | B03 | C08 | D02 |
| Input 9 | A01 | B05 | C10 | D04 |
| Input 10 | A03 | D^00 | IO3 | D06 |
| Input 11 | A05 | D^02 | IO3 | D08 |
| Input 12 | C^00 | D^04 | IO3 | D10 |
| Input 13 | C^02 | D^06 | A07 | D00 |
| Input 14 | C^04 | D^08 | A09 | D02 |
| Input 15 | C^06 | D^10 | C02 | D04 |
| Input 16 | C^08 | B03 | C04 | D06 |
| Input 17 | C^10 | B05 | C06 | D08 |
| Input 18 | IO2 | D^00 | C08 | D10 |
| Input 19 | A01 | D^02 | C10 | B09 |
| Input 20 | A03 | D^04 | C00 | B11 |
| Input 21 | A05 | D^06 | C02 | D00 |
| Input 22 | A01 | D^08 | C04 | D02 |
| Input 23 | A03 | D^10 | C06 | D04 |
| Input 24 | A05 | B03 | C08 | D06 |
| Input 25 | C^08 | B05 | C10 | D08 |
| Input 26 | C^10 | B01 | C00 | D10 |

FIG. 50C

| Array Input Line | Band 9 | Band 10 | Band 11 | Band 12 |
| --- | --- | --- | --- | --- |
| Input 1 | E^00 | F^00 | G07 | F06 |
| Input 2 | E^02 | F^02 | G09 | F08 |
| Input 3 | E^04 | F^04 | G11 | F10 |
| Input 4 | E^06 | F^06 | E00 | H07 |
| Input 5 | E^08 | F^08 | E02 | H09 |
| Input 6 | E^10 | F^10 | E04 | H11 |
| Input 7 | G01 | F^02 | E06 | F00 |
| Input 8 | G03 | F^04 | E08 | F02 |
| Input 9 | G05 | F^06 | E10 | F04 |
| Input 10 | E^00 | F^08 | E00 | F06 |
| Input 11 | E^02 | F^10 | E02 | F08 |
| Input 12 | E^04 | F^00 | E04 | F10 |
| Input 13 | E^06 | H01 | E06 | F00 |
| Input 14 | E^08 | H03 | E08 | F02 |
| Input 15 | E^10 | H05 | E10 | F04 |
| Input 156 | G01 | IO4/CKL2 | G07 | F06 |
| Input 17 | G03 | IO4/CKL2 | G09 | F08 |
| Input 18 | G05 | IO4/CLK2 | G11 | F10 |
| Input 19 | E^02 | F^04 | E02 | IO5/CLK3 |
| Input 20 | E^04 | F^06 | E04 | IO5/CLK3 |
| Input 21 | E^06 | F^08 | E06 | IO5/CLK3 |
| Input 22 | E^08 | F^10 | E08 | H09 |
| Input 23 | E^10 | F^00 | E10 | H11 |
| Input 24 | E^00 | H01 | E00 | F00 |
| Input 25 | G03 | H03 | G09 | F02 |
| Input 26 | G05 | H05 | G11 | F04 |

FIG. 50D

| Array Input Line | Band 13 | Band 14 | Band 15 | Band 16 |
|---|---|---|---|---|
| Input 1 | G^00 | H^00 | G06 | H06 |
| Input 2 | G^02 | H^02 | G08 | H08 |
| Input 3 | G^04 | H^04 | G10 | I07 |
| Input 4 | G^06 | H^06 | E07 | F07 |
| Input 5 | G^08 | H^08 | E09 | F09 |
| Input 6 | G^10 | H^10 | E11 | F11 |
| Input 7 | E01 | F01 | G00 | H00 |
| Input 8 | E03 | F03 | G02 | H02 |
| Input 9 | E05 | F05 | G04 | H04 |
| Input 10 | G^00 | H^00 | G06 | H06 |
| Input 11 | G^02 | H^02 | G08 | H08 |
| Input 12 | G^04 | H^04 | G10 | H10 |
| Input 13 | G^06 | H^06 | E07 | I07 |
| Input 14 | G^08 | H^08 | E09 | H02 |
| Input 15 | G^10 | H^10 | E11 | H04 |
| Input 16 | E01 | F01 | G02 | H06 |
| Input 17 | E03 | F03 | G04 | H08 |
| Input 18 | E05 | F05 | G06 | H10 |
| Input 19 | G^02 | H^00 | G08 | F09 |
| Input 20 | G^04 | H^02 | G10 | F11 |
| Input 21 | G^06 | H^04 | G00 | H02 |
| Input 22 | G^08 | H^06 | E09 | H04 |
| Input 23 | G^10 | I06 | E11 | H06 |
| Input 24 | G^00 | I06 | G00 | H08 |
| Input 25 | E03 | I06 | G02 | H10 |
| Input 26 | E05 | F05 | G04 | I07 |

FIG. 51A

Switch Matrix

Multiplexer Input Lines

| Band 1  | A^0  | A^2  | A^4  | A^6  | A^8  | A^10  | A^12  | A^14  | IO0 | A03 |
|---------|------|------|------|------|------|-------|-------|-------|-----|-----|
| Band 2  | B^0  | B^2  | B^4  | B^6  | B^8  | B^10  | B^12  | B^14  | IO0 | A05 |
| Band 3  | A0   | A2   | A4   | A6   | A8   | A10   | A12   | A14   | IO3 | A07 |
| Band 4  | B0   | B2   | B4   | B6   | B8   | B10   | B12   | B14   | IO3 | A09 |
| Band 5  | C^0  | C^2  | C^4  | C^6  | C^8  | C^10  | C^12  | C^14  | IO1 | A11 |
| Band 6  | D^0  | D^2  | D^4  | D^6  | D^8  | D^10  | D^12  | D^14  | IO1 | A13 |
| Band 7  | C0   | C2   | C4   | C6   | C8   | C10   | C12   | C14   | IO5 | A15 |
| Band 8  | D0   | D2   | D4   | D6   | D8   | D10   | D12   | D14   | IO5 | A01 |
| Band 9  | E^0  | E^2  | E^4  | E^6  | E^8  | E^10  | E^12  | E^14  | IO4 | H03 |
| Band 10 | F^0  | F^2  | F^4  | F^6  | F^8  | F^10  | F^12  | F^14  | IO4 | H05 |
| Band 11 | E0   | E2   | E4   | E6   | E8   | E10   | E12   | E14   | IO2 | H07 |
| Band 12 | F0   | F2   | F4   | F6   | F8   | F10   | F12   | F14   | IO2 | H09 |
| Band 13 | G^0  | G^2  | G^4  | G^6  | G^8  | G^10  | G^12  | G^14  | IO1 | H11 |
| Band 14 | H^0  | H^2  | H^4  | H^6  | H^8  | H^10  | H^12  | H^14  | IO1 | H13 |
| Band 15 | G0   | G2   | G4   | G6   | G8   | G10   | G12   | G14   | IO5 | H15 |
| Band 16 | H0   | H2   | H4   | H6   | H8   | H10   | H12   | H14   | IO5 | H01 |

FIG. 51B

Switch Matrix

Multiplexer Input Lines

| | | | | | | | | | |
|---|---|---|---|---|---|---|---|---|---|
| Band 1 | A^0 | A^2 | A^4 | A^6 | A^8 | A^10 | A^12 | A^14 | IO0 | B03 |
| Band 2 | B^0 | B^2 | B^4 | B^6 | B^8 | B^10 | B^12 | B^14 | IO0 | B05 |
| Band 3 | A0 | A2 | A4 | A6 | A8 | A10 | A12 | A14 | IO3 | B07 |
| Band 4 | B0 | B2 | B4 | B6 | B8 | B10 | B12 | B14 | IO3 | B09 |
| Band 5 | C^0 | C^2 | C^4 | C^6 | C^8 | C^10 | C^12 | C^14 | IO1 | B11 |
| Band 6 | D^0 | D^2 | D^4 | D^6 | D^8 | D^10 | D^12 | D^14 | IO1 | B13 |
| Band 7 | C0 | C2 | C4 | C6 | C8 | C10 | C12 | C14 | IO5 | B15 |
| Band 8 | D0 | D2 | D4 | D6 | D8 | D10 | D12 | D14 | IO5 | B01 |
| Band 9 | E^0 | E^2 | E^4 | E^6 | E^8 | E^10 | E^12 | E^14 | IO4 | G03 |
| Band 10 | F^0 | F^2 | F^4 | F^6 | F^8 | F^10 | F^12 | F^14 | IO4 | G05 |
| Band 11 | E0 | E2 | E4 | E6 | E8 | E10 | E12 | E14 | IO2 | G07 |
| Band 12 | F0 | F2 | F4 | F6 | F8 | F10 | F12 | F14 | IO2 | G09 |
| Band 13 | G^0 | G^2 | G^4 | G^6 | G^8 | G^10 | G^12 | G^14 | IO1 | G11 |
| Band 14 | H^0 | H^2 | H^4 | H^6 | H^8 | H^10 | H^12 | H^14 | IO1 | G13 |
| Band 15 | G0 | G2 | G4 | G6 | G8 | G10 | G12 | G14 | IO5 | G15 |
| Band 16 | H0 | H2 | H4 | H6 | H8 | H10 | H12 | H14 | IO5 | G01 |

FIG. 51C

Switch Matrix

Multiplexer Input Lines

| Band 1  | A^0  | A^2  | A^4  | A^6  | A^8  | A^10  | A^12  | A^14  | IO4 | C03 |
|---------|------|------|------|------|------|-------|-------|-------|-----|-----|
| Band 2  | B^0  | B^2  | B^4  | B^6  | B^8  | B^10  | B^12  | B^14  | IO4 | C05 |
| Band 3  | A0   | A2   | A4   | A6   | A8   | A10   | A12   | A14   | IO2 | C07 |
| Band 4  | B0   | B2   | B4   | B6   | B8   | B10   | B12   | B14   | IO2 | C09 |
| Band 5  | C^0  | C^2  | C^4  | C^6  | C^8  | C^10  | C^12  | C^14  | IO0 | C11 |
| Band 6  | D^0  | D^2  | D^4  | D^6  | D^8  | D^10  | D^12  | D^14  | IO0 | C13 |
| Band 7  | C0   | C2   | C4   | C6   | C8   | C10   | C12   | C14   | IO3 | C15 |
| Band 8  | D0   | D2   | D4   | D6   | D8   | D10   | D12   | D14   | IO3 | C01 |
| Band 9  | E^0  | E^2  | E^4  | E^6  | E^8  | E^10  | E^12  | E^14  | IO4 | F03 |
| Band 10 | F^0  | F^2  | F^4  | F^6  | F^8  | F^10  | F^12  | F^14  | IO4 | F05 |
| Band 11 | E0   | E2   | E4   | E6   | E8   | E10   | E12   | E14   | IO2 | F07 |
| Band 12 | F0   | F2   | F4   | F6   | F8   | F10   | F12   | F14   | IO2 | F09 |
| Band 13 | G^0  | G^2  | G^4  | G^6  | G^8  | G^10  | G^12  | G^14  | IO1 | F11 |
| Band 14 | H^0  | H^2  | H^4  | H^6  | H^8  | H^10  | H^12  | H^14  | IO1 | F13 |
| Band 15 | G0   | G2   | G4   | G6   | G8   | G10   | G12   | G14   | IO5 | F15 |
| Band 16 | H0   | H2   | H4   | H6   | H8   | H10   | H12   | H14   | IO5 | F01 |

FIG. 51D

Switch Matrix

<u>Multiplexer Input Lines</u>

| | | | | | | | | | |
|---|---|---|---|---|---|---|---|---|---|
| Band 1  | A^0 | A^2 | A^4 | A^6 | A^8 | A^10 | A^12 | A^14 | IO4 | D03 |
| Band 2  | B^0 | B^2 | B^4 | B^6 | B^8 | B^10 | B^12 | B^14 | IO4 | D05 |
| Band 3  | A0  | A2  | A4  | A6  | A8  | A10  | A12  | A14  | IO2 | D07 |
| Band 4  | B0  | B2  | B4  | B6  | B8  | B10  | B12  | B14  | IO2 | D09 |
| Band 5  | C^0 | C^2 | C^4 | C^6 | C^8 | C^10 | C^12 | C^14 | IO0 | D11 |
| Band 6  | D^0 | D^2 | D^4 | D^6 | D^8 | D^10 | D^12 | D^14 | IO0 | D13 |
| Band 7  | C0  | C2  | C4  | C6  | C8  | C10  | C12  | C14  | IO3 | D15 |
| Band 8  | D0  | D2  | D4  | D6  | D8  | D10  | D12  | D14  | IO3 | D01 |
| Band 9  | E^0 | E^2 | E^4 | E^6 | E^8 | E^10 | E^12 | E^14 | IO4 | E03 |
| Band 10 | F^0 | F^2 | F^4 | F^6 | F^8 | F^10 | F^12 | F^14 | IO4 | E05 |
| Band 11 | E0  | E2  | E4  | E6  | E8  | E10  | E12  | E14  | IO2 | E07 |
| Band 12 | F0  | F2  | F4  | F6  | F8  | F10  | F12  | F14  | IO2 | E09 |
| Band 13 | G^0 | G^2 | G^4 | G^6 | G^8 | G^10 | G^12 | G^14 | IO1 | E11 |
| Band 14 | H^0 | H^2 | H^4 | H^6 | H^8 | H^10 | H^12 | H^14 | IO1 | E13 |
| Band 15 | G0  | G2  | G4  | G6  | G8  | G10  | G12  | G14  | IO5 | E15 |
| Band 16 | H0  | H2  | H4  | H6  | H8  | H10  | H12  | H14  | IO5 | E01 |

FIG. 53A

| Array Input Line | Band 1 | Band 2 | Band 3 | Band 4 |
| --- | --- | --- | --- | --- |
| Input 1 | A03 | B^10 | A04 | B00 |
| Input 2 | A^00 | A05 | A06 | B02 |
| Input 3 | A^02 | B^00 | A07 | B04 |
| Input 4 | A^04 | B^02 | A00 | A09 |
| Input 5 | A^06 | B^04 | A02 | B06 |
| Input 6 | A^08 | B^06 | A04 | B08 |
| Input 7 | A^10 | B^08 | A06 | B10 |
| Input 8 | A^12 | B^10 | A08 | B12 |
| Input 9 | A^14 | B^12 | A10 | B14 |
| Input 10 | A03 | B^14 | A12 | IO3/CLK2 |
| Input 11 | A^00 | A05 | A14 | IO3/CLK2 |
| Input 12 | A^02 | B^02 | A07 | B08 |
| Input 13 | A^04 | B^04 | A02 | A09 |
| Input 14 | A^06 | B^06 | A04 | B10 |
| Input 15 | A^08 | B^08 | A06 | B12 |
| Input 16 | A^10 | B^10 | A08 | B14 |
| Input 17 | A^12 | B^12 | A10 | B00 |
| Input 18 | A^14 | B^14 | A12 | B02 |
| Input 19 | A03 | B^00 | A14 | B04 |
| Input 20 | A^02 | A05 | A00 | B06 |
| Input 21 | A^04 | IO0/CLK0 | A07 | B08 |
| Input 22 | A^06 | IO0/CLK0 | A08 | A09 |
| Input 23 | A^08 | B^02 | A10 | B10 |
| Input 24 | A^10 | B^04 | A12 | B12 |
| Input 25 | A^12 | B^06 | A14 | B14 |
| Input 26 | A^14 | B^08 | A02 | B06 |

FIG. 53B

| Array Input Line | Band 5 | Band 6 | Band 7 | Band 8 |
| --- | --- | --- | --- | --- |
| Input 1 | C^08 | D^06 | C10 | D08 |
| Input 2 | C^10 | D^08 | C12 | D10 |
| Input 3 | C^12 | D^10 | C14 | D12 |
| Input 4 | C^14 | D^12 | C04 | D02 |
| Input 5 | A11 | IO1/CLK1 | C06 | D04 |
| Input 6 | C^00 | A13 | IO5 | D06 |
| Input 7 | C^02 | D^00 | A15 | IO5 |
| Input 8 | C^04 | D^02 | C00 | A01 |
| Input 9 | C^06 | D^04 | C02 | D00 |
| Input 10 | C^08 | D^06 | C04 | D02 |
| Input 11 | C^10 | D^08 | C06 | D04 |
| Input 12 | C^12 | D^10 | C08 | D06 |
| Input 13 | C^14 | D^12 | C10 | D08 |
| Input 14 | A11 | D^14 | C12 | D10 |
| Input 15 | C^02 | A13 | C14 | D12 |
| Input 16 | C^04 | D^02 | A15 | D14 |
| Input 17 | C^06 | D^04 | C04 | A01 |
| Input 18 | C^08 | D^06 | C06 | D02 |
| Input 19 | C^10 | D^08 | C08 | D04 |
| Input 20 | C^12 | D^10 | C10 | D06 |
| Input 21 | C^14 | D^12 | C12 | D08 |
| Input 22 | C^00 | D^14 | C14 | D10 |
| Input 23 | A11 | D^00 | C00 | D12 |
| Input 24 | IO1/CLK1 | A13 | C02 | D14 |
| Input 25 | C^04 | D^02 | A15 | D00 |
| Input 26 | C^06 | D^04 | C08 | A01 |

FIG. 53C

| Array Input Line | Band 9 | Band 10 | Band 11 | Band 12 |
|---|---|---|---|---|
| Input 1 | H03 | F^14 | IO2 | F06 |
| Input 2 | E^00 | H05 | E06 | IO2 |
| Input 3 | E^02 | F^00 | H07 | IO2 |
| Input 4 | E^04 | F^02 | E00 | H09 |
| Input 5 | E^06 | F^04 | E02 | F00 |
| Input 6 | E^08 | F^06 | E04 | F02 |
| Input 7 | E^10 | F^08 | E06 | F04 |
| Input 8 | E^12 | F^10 | E08 | F06 |
| Input 9 | D^14 | F^12 | E10 | F08 |
| Input 10 | H03 | F^14 | E12 | F10 |
| Input 11 | E^02 | H05 | E14 | F12 |
| Input 12 | E^04 | IO4/CLK3 | H07 | F14 |
| Input 13 | E^06 | IO4/CLK3 | E00 | H09 |
| Input 14 | E^08 | F^02 | E02 | F00 |
| Input 15 | E^10 | F^04 | E04 | F02 |
| Input 16 | E^12 | F^06 | E06 | F04 |
| Input 17 | E^14 | F^08 | E08 | F06 |
| Input 18 | E^00 | F^10 | E10 | F08 |
| Input 19 | H03 | F^12 | E12 | IO2 |
| Input 20 | E^06 | H05 | E14 | F10 |
| Input 21 | E^08 | F^14 | H07 | F12 |
| Input 22 | E^10 | F^00 | E08 | H09 |
| Input 23 | E^12 | F^06 | IO2 | F08 |
| Input 24 | E^14 | F^08 | E12 | F10 |
| Input 25 | IO4/CLK3 | F^10 | E14 | F12 |
| Input 26 | IO4/CLK3 | F^12 | E10 | F14 |

FIG. 53D

| Array Input Line | Band 13 | Band 14 | Band 15 | Band 16 |
| --- | --- | --- | --- | --- |
| Input 1 | G^08 | H^06 | G06 | H14 |
| Input 2 | G^10 | H^08 | G08 | H06 |
| Input 3 | G^12 | H^10 | G10 | H08 |
| Input 4 | G^14 | H^12 | IO5 | H02 |
| Input 5 | H11 | H^14 | G12 | H10 |
| Input 6 | G^00 | H13 | G14 | H12 |
| Input 7 | G^02 | H^00 | H15 | H04 |
| Input 8 | G^04 | H^02 | G00 | H01 |
| Input 9 | G^06 | H^04 | G02 | H00 |
| Input 10 | G^08 | H^06 | G04 | H02 |
| Input 11 | G^10 | H^08 | G06 | H04 |
| Input 12 | G^12 | H^10 | G08 | H06 |
| Input 13 | G^14 | H^12 | G10 | H08 |
| Input 14 | H11 | H^14 | G12 | H10 |
| Input 15 | IO1/CLK3 | H13 | G14 | H12 |
| Input 16 | IO1/CLK3 | H^00 | H15 | H14 |
| Input 17 | G^00 | H^02 | IO5 | H01 |
| Input 18 | G^02 | H^04 | G00 | H14 |
| Input 19 | G^04 | H^06 | G02 | H00 |
| Input 20 | G^06 | H^08 | G04 | H02 |
| Input 21 | G^08 | H^10 | G06 | H04 |
| Input 22 | G^10 | H^12 | G08 | H06 |
| Input 23 | H11 | H^14 | G10 | H08 |
| Input 24 | G^12 | H13 | G12 | H10 |
| Input 25 | G^14 | H^02 | H15 | H12 |
| Input 26 | G^06 | H^04 | G14 | H01 |

FIG. 54A

| Array Input Line | Band 1 | Band 2 | Band 3 | Band 4 |
|---|---|---|---|---|
| Input 1 | B03 | B^10 | A04 | B00 |
| Input 2 | A^00 | B05 | A06 | B02 |
| Input 3 | A^02 | B^00 | B07 | B04 |
| Input 4 | A^04 | B^02 | A00 | B09 |
| Input 5 | A^06 | B^04 | A02 | B06 |
| Input 6 | A^08 | B^06 | A04 | B08 |
| Input 7 | A^10 | B^08 | A06 | B10 |
| Input 8 | A^12 | B^10 | A08 | B12 |
| Input 9 | A^14 | B^12 | A10 | B14 |
| Input 10 | B03 | B^14 | IO3/CLK2 | B02 |
| Input 11 | A^00 | B05 | IO3/CLK2 | B00 |
| Input 12 | A^02 | B^02 | B07 | B08 |
| Input 13 | A^04 | B^04 | A02 | B09 |
| Input 14 | A^06 | B^06 | A04 | B10 |
| Input 15 | A^08 | B^08 | A06 | B12 |
| Input 16 | A^10 | B^10 | A08 | B14 |
| Input 17 | A^12 | B^12 | A10 | B00 |
| Input 18 | A^14 | B^14 | A12 | B02 |
| Input 19 | B03 | B^00 | A14 | B04 |
| Input 20 | A^06 | B05 | A00 | B06 |
| Input 21 | IO0/CLK0 | B^12 | B07 | B08 |
| Input 22 | IO0/CLK0 | B^14 | A08 | B09 |
| Input 23 | A^08 | B^02 | A10 | B10 |
| Input 24 | A^10 | B^04 | A12 | B12 |
| Input 25 | A^12 | B^06 | A14 | B14 |
| Input 26 | A^14 | B^08 | A02 | B06 |

FIG. 54B

| Array Input Line | Band 5 | Band 6 | Band 7 | Band 8 |
| --- | --- | --- | --- | --- |
| Input 1 | C^08 | D^06 | C10 | D08 |
| Input 2 | C^10 | D^08 | C12 | D10 |
| Input 3 | C^12 | D^10 | C14 | D12 |
| Input 4 | C^14 | D^12 | C04 | D02 |
| Input 5 | B11 | IO1/CLK1 | C06 | D04 |
| Input 6 | C^00 | B13 | IO5 | D06 |
| Input 7 | C^02 | D^00 | B15 | IO5 |
| Input 8 | C^04 | D^02 | C00 | B01 |
| Input 9 | C^06 | D^04 | C02 | D00 |
| Input 10 | C^08 | D^06 | C04 | D02 |
| Input 11 | C^10 | D^08 | C06 | D04 |
| Input 12 | C^12 | D^10 | C08 | D06 |
| Input 13 | C^14 | D^12 | C10 | D08 |
| Input 14 | B11 | D^14 | C12 | D10 |
| Input 15 | C^02 | B13 | C14 | D12 |
| Input 16 | C^04 | D^02 | B15 | D14 |
| Input 17 | C^06 | D^04 | C04 | B01 |
| Input 18 | C^08 | D^06 | C06 | D02 |
| Input 19 | C^10 | D^08 | C08 | D04 |
| Input 20 | C^12 | D^10 | C10 | D06 |
| Input 21 | C^14 | D^12 | C12 | D08 |
| Input 22 | C^00 | D^14 | C14 | D10 |
| Input 23 | B11 | D^00 | C00 | D12 |
| Input 24 | IO1/CLK1 | B13 | C02 | D14 |
| Input 25 | C^04 | D^02 | B15 | D00 |
| Input 26 | C^06 | D^04 | C08 | B01 |

FIG. 54C

| Array Input Line | Band 9 | Band 10 | Band 11 | Band 12 |
| --- | --- | --- | --- | --- |
| Input 1 | G03 | F^14 | IO2 | F06 |
| Input 2 | E^00 | G05 | E06 | IO2 |
| Input 3 | E^02 | F^00 | G07 | IO2 |
| Input 4 | E^04 | F^02 | E00 | G09 |
| Input 5 | E^06 | F^04 | E02 | F00 |
| Input 6 | E^08 | F^06 | E04 | F02 |
| Input 7 | E^10 | F^08 | E06 | F04 |
| Input 8 | E^12 | F^10 | E08 | F06 |
| Input 9 | E^14 | F^12 | E10 | F08 |
| Input 10 | G03 | F^14 | E12 | F10 |
| Input 11 | E^02 | G05 | E14 | F12 |
| Input 12 | E^04 | IO4/CLK3 | G07 | F14 |
| Input 13 | E^06 | IO4/CLK3 | E00 | G09 |
| Input 14 | E^08 | F^02 | E02 | F00 |
| Input 15 | E^10 | F^04 | E04 | F02 |
| Input 16 | E^12 | F^06 | E06 | F04 |
| Input 17 | E^14 | F^08 | E08 | F06 |
| Input 18 | E^00 | F^10 | E10 | F08 |
| Input 19 | G03 | F^12 | E12 | F10 |
| Input 20 | E^06 | G05 | E14 | F12 |
| Input 21 | E^08 | F^14 | G07 | F14 |
| Input 22 | E^10 | F^00 | E08 | G09 |
| Input 23 | E^12 | F^06 | IO2 | F08 |
| Input 24 | E^14 | F^08 | E12 | F10 |
| Input 25 | IO4/CLK3 | F^10 | E14 | F12 |
| Input 26 | IO4/CLK3 | F^12 | E10 | F14 |

FIG. 54D

| Array Input Line | Band 13 | Band 14 | Band 15 | Band 16 |
| --- | --- | --- | --- | --- |
| Input 1 | G^08 | H^06 | G06 | H14 |
| Input 2 | G^10 | H^08 | G08 | H06 |
| Input 3 | G^12 | H^10 | G10 | H08 |
| Input 4 | G^14 | H^12 | G04 | IO5 |
| Input 5 | G11 | H^14 | G12 | H10 |
| Input 6 | G^00 | G13 | G14 | H12 |
| Input 7 | G^02 | H^00 | G15 | H04 |
| Input 8 | G^04 | H^02 | G00 | G01 |
| Input 9 | G^06 | H^04 | G02 | H00 |
| Input 10 | G^08 | H^06 | G04 | H02 |
| Input 11 | G^10 | H^08 | G06 | H04 |
| Input 12 | G^12 | H^10 | G08 | H06 |
| Input 13 | G^14 | H^12 | G10 | H08 |
| Input 14 | G11 | H^14 | G12 | H10 |
| Input 15 | G^02 | G13 | G14 | H12 |
| Input 16 | G^04 | IO1/CLK1 | G15 | H14 |
| Input 17 | G^00 | IO1/CLK1 | G14 | G01 |
| Input 18 | G^02 | H^04 | G00 | IO5 |
| Input 19 | G^04 | H^06 | G02 | H00 |
| Input 20 | G^06 | H^08 | G04 | H02 |
| Input 21 | G^08 | H^10 | G06 | H04 |
| Input 22 | G^10 | H^12 | G08 | H06 |
| Input 23 | G11 | H^14 | G10 | H08 |
| Input 24 | G^12 | G13 | G12 | H10 |
| Input 25 | G^14 | H^02 | G15 | H12 |
| Input 26 | G^06 | H^00 | G14 | G01 |

FIG. 55A

| Array Input Line | Band 1 | Band 2 | Band 3 | Band 4 |
|---|---|---|---|---|
| Input 1 | C03 | B^12 | A06 | B04 |
| Input 2 | A^00 | C05 | A04 | B06 |
| Input 3 | A^02 | B^00 | C07 | B08 |
| Input 4 | A^04 | B^02 | A00 | C09 |
| Input 5 | A^06 | B^04 | A02 | B00 |
| Input 6 | A^08 | B^06 | A04 | B02 |
| Input 7 | A^10 | B^08 | A06 | B04 |
| Input 8 | A^12 | B^10 | A08 | B06 |
| Input 9 | A^14 | B^12 | A10 | B08 |
| Input 10 | C03 | B^14 | A12 | B10 |
| Input 11 | A^00 | C05 | A14 | B12 |
| Input 12 | A^02 | B^00 | C07 | B14 |
| Input 13 | A^04 | B^02 | A02 | C09 |
| Input 14 | A^06 | B^04 | A04 | B02 |
| Input 15 | A^08 | B^06 | A06 | B04 |
| Input 16 | A^10 | B^08 | A08 | B06 |
| Input 17 | A^12 | B^10 | A10 | B08 |
| Input 18 | A^14 | B^12 | A12 | B10 |
| Input 19 | C03 | B^14 | A14 | B12 |
| Input 20 | A^02 | C05 | A00 | B14 |
| Input 21 | A^04 | B^02 | C07 | B00 |
| Input 22 | A^06 | B^04 | A14 | C09 |
| Input 23 | A^08 | B^06 | A12 | IO2 |
| Input 24 | A^10 | B^08 | IO2 | B10 |
| Input 25 | A^12 | IO4/CLK3 | A10 | B12 |
| Input 26 | IO4/CLK3 | B^10 | A08 | B14 |

FIG. 55B

| Array Input Line | Band 5 | Band 6 | Band 7 | Band 8 |
|---|---|---|---|---|
| Input 1 | C^08 | IO0/CLK0 | C10 | D08 |
| Input 2 | C^10 | IO0/CLK0 | C12 | D10 |
| Input 3 | C^12 | D^10 | C14 | IO3/CLK2 |
| Input 4 | C^14 | D^12 | C02 | IO3/CLK2 |
| Input 5 | C11 | D^14 | C04 | D02 |
| Input 6 | C^00 | C13 | C06 | D04 |
| Input 7 | C^02 | D^00 | C15 | D06 |
| Input 8 | C^04 | D^02 | C00 | C01 |
| Input 9 | C^06 | D^04 | C02 | D00 |
| Input 10 | C^08 | D^06 | C04 | D02 |
| Input 11 | C^10 | D^08 | C06 | D04 |
| Input 12 | C^12 | D^10 | C08 | D06 |
| Input 13 | C^14 | D^12 | C10 | D08 |
| Input 14 | C11 | D^14 | C12 | D10 |
| Input 15 | C^00 | C13 | C14 | D12 |
| Input 16 | C^02 | D^04 | C15 | D14 |
| Input 17 | C^04 | D^06 | C02 | C01 |
| Input 18 | C^06 | D^08 | C04 | D02 |
| Input 19 | C^08 | D^10 | C06 | D04 |
| Input 20 | C^10 | D^12 | C08 | D06 |
| Input 21 | C^12 | D^14 | C10 | D08 |
| Input 22 | C^14 | D^00 | C12 | D10 |
| Input 23 | C11 | D^02 | C14 | D12 |
| Input 24 | C^02 | C13 | C00 | D14 |
| Input 25 | C^04 | D^02 | C15 | D00 |
| Input 26 | C^06 | D^04 | C08 | C01 |

FIG. 55C

| Array Input Line | Band 9 | Band 10 | Band 11 | Band 12 |
|---|---|---|---|---|
| Input 1 | F03 | F^12 | E04 | F02 |
| Input 2 | E^00 | F05 | E06 | F04 |
| Input 3 | E^02 | F^14 | F07 | F06 |
| Input 4 | E^04 | F^02 | E00 | F09 |
| Input 5 | IO4/CLK3 | F^04 | E02 | F00 |
| Input 6 | IO4/CLK4 | F^06 | E04 | F02 |
| Input 7 | E^10 | F^08 | IO2 | F04 |
| Input 8 | E^12 | F^10 | IO2 | F06 |
| Input 9 | E^14 | F^12 | E10 | F08 |
| Input 10 | F03 | F^14 | E12 | F10 |
| Input 11 | E^00 | F05 | E14 | F12 |
| Input 12 | E^02 | F^00 | F07 | F14 |
| Input 13 | E^04 | F^02 | E02 | F09 |
| Input 14 | E^06 | F^04 | E04 | F02 |
| Input 15 | E^08 | F^06 | E06 | F04 |
| Input 16 | E^10 | F^08 | E08 | F06 |
| Input 17 | E^12 | F^10 | E10 | F08 |
| Input 18 | E^14 | F^12 | E12 | F10 |
| Input 19 | F03 | F^14 | E14 | F12 |
| Input 20 | E^02 | F05 | E00 | F14 |
| Input 21 | E^04 | F^00 | F07 | F00 |
| Input 22 | E^06 | F^02 | E08 | F09 |
| Input 23 | E^08 | F^04 | E10 | F08 |
| Input 24 | E^10 | F^06 | E12 | F10 |
| Input 25 | E^12 | F^08 | E14 | F12 |
| Input 26 | E^14 | F^10 | E02 | F14 |

FIG. 55D

| Array Input Line | Band 13 | Band 14 | Band 15 | Band 16 |
| --- | --- | --- | --- | --- |
| Input 1 | G^12 | H^06 | G00 | H00 |
| Input 2 | G^14 | H^08 | G02 | H02 |
| Input 3 | G^00 | H^10 | G04 | H04 |
| Input 4 | G^02 | H^12 | G06 | H06 |
| Input 5 | F11 | H^14 | G08 | H08 |
| Input 6 | G^04 | F13 | G10 | H10 |
| Input 7 | G^06 | H^00 | F15 | H12 |
| Input 8 | G^08 | H^02 | G12 | F01 |
| Input 9 | IO1/CLK1 | H^04 | G14 | H14 |
| Input 10 | IO1/CLK1 | H^06 | G02 | H02 |
| Input 11 | G^10 | H^08 | G04 | H04 |
| Input 12 | G^12 | H^10 | G06 | H06 |
| Input 13 | G^14 | H^12 | G08 | H08 |
| Input 14 | F11 | H^14 | IO5 | H10 |
| Input 15 | G^00 | F13 | IO5 | H12 |
| Input 16 | G^02 | IO1/CLK1 | F15 | H14 |
| Input 17 | G^04 | IO1/CLK1 | G10 | F01 |
| Input 18 | G^06 | H^02 | G12 | H00 |
| Input 19 | G^08 | H^04 | G14 | H06 |
| Input 20 | G^10 | H^06 | G00 | IO5 |
| Input 21 | G^12 | H^08 | G02 | IO5 |
| Input 22 | G^14 | H^10 | G04 | H08 |
| Input 23 | F11 | H^12 | G06 | H10 |
| Input 24 | G^06 | F13 | G08 | H12 |
| Input 25 | G^08 | H^14 | F15 | H14 |
| Input 26 | G^10 | H^00 | G10 | F01 |

FIG. 56A

| Array Input Line | Band 1 | Band 2 | Band 3 | Band 4 |
|---|---|---|---|---|
| Input 1 | D03 | B^12 | A06 | B04 |
| Input 2 | A^00 | D05 | A04 | B06 |
| Input 3 | A^02 | B^00 | D07 | B08 |
| Input 4 | A^04 | B^02 | A00 | D09 |
| Input 5 | A^06 | B^04 | A02 | B00 |
| Input 6 | A^08 | B^06 | A04 | B02 |
| Input 7 | A^10 | B^08 | A06 | B04 |
| Input 8 | A^12 | B^10 | A08 | B06 |
| Input 9 | A^14 | B^12 | A10 | B08 |
| Input 10 | D03 | B^14 | A12 | B10 |
| Input 11 | A^00 | D05 | A14 | B12 |
| Input 12 | A^02 | B^00 | D07 | B14 |
| Input 13 | A^04 | B^02 | A02 | D09 |
| Input 14 | A^06 | B^04 | A04 | B02 |
| Input 15 | A^08 | B^06 | A06 | B04 |
| Input 16 | A^10 | B^08 | A08 | B06 |
| Input 17 | A^12 | B^10 | A10 | B08 |
| Input 18 | A^14 | B^12 | A12 | B10 |
| Input 19 | D03 | B^14 | A14 | B12 |
| Input 20 | A^02 | D05 | A00 | B14 |
| Input 21 | A^04 | B^02 | D07 | B00 |
| Input 22 | A^06 | B^04 | A14 | D09 |
| Input 23 | A^08 | B^06 | A12 | IO2 |
| Input 24 | A^10 | B^08 | IO2 | B10 |
| Input 25 | A^12 | IO4/CLK3 | A10 | B12 |
| Input 26 | IO4/CLK3 | B^10 | A08 | B14 |

FIG. 56B

| Array Input Line | Band 5 | Band 6 | Band 7 | Band 8 |
| --- | --- | --- | --- | --- |
| Input 1 | IO0/CLK0 | D^06 | C08 | D08 |
| Input 2 | IO0/CLK0 | D^08 | C10 | D10 |
| Input 3 | C^12 | D^10 | IO3/CLK2 | D12 |
| Input 4 | C^14 | D^12 | IO3/CLK2 | D14 |
| Input 5 | D11 | D^14 | C12 | D02 |
| Input 6 | C^00 | D13 | C14 | D04 |
| Input 7 | C^02 | D^00 | D15 | D06 |
| Input 8 | C^04 | D^02 | C00 | D01 |
| Input 9 | C^06 | D^04 | C02 | D00 |
| Input 10 | C^08 | D^06 | C04 | D02 |
| Input 11 | C^10 | D^08 | C06 | D04 |
| Input 12 | C^12 | D^10 | C08 | D06 |
| Input 13 | C^14 | D^12 | C10 | D08 |
| Input 14 | D11 | D^14 | C12 | D10 |
| Input 15 | C^00 | D13 | C14 | D12 |
| Input 16 | C^02 | D^04 | D15 | D14 |
| Input 17 | C^04 | D^06 | C02 | D01 |
| Input 18 | C^06 | D^08 | C04 | D02 |
| Input 19 | C^08 | D^10 | C06 | D04 |
| Input 20 | C^10 | D^12 | C08 | D06 |
| Input 21 | C^12 | D^14 | C10 | D08 |
| Input 22 | C^14 | D^00 | C12 | D10 |
| Input 23 | D11 | D^02 | C14 | D12 |
| Input 24 | C^02 | D13 | C00 | D14 |
| Input 25 | C^04 | D^02 | D15 | D00 |
| Input 26 | C^06 | D^04 | C06 | D01 |

FIG. 56C

| Array Input Line | Band 9 | Band 10 | Band 11 | Band 12 |
|---|---|---|---|---|
| Input 1 | E03 | F^12 | E04 | F02 |
| Input 2 | E^00 | E05 | E06 | F04 |
| Input 3 | E^02 | F^14 | E07 | F06 |
| Input 4 | E^04 | F^02 | E00 | E09 |
| Input 5 | E^06 | IO4/CLK3 | E02 | F00 |
| Input 6 | E^08 | 1O4/CLK3 | E04 | F02 |
| Input 7 | E^10 | F^08 | E06 | IO2 |
| Input 8 | E^12 | F^10 | E08 | IO2 |
| Input 9 | E^14 | F^12 | E10 | F08 |
| Input 10 | E03 | F^14 | E12 | F10 |
| Input 11 | E^00 | E05 | E14 | F12 |
| Input 12 | E^02 | F^00 | E07 | F14 |
| Input 13 | E^04 | F^02 | E02 | E09 |
| Input 14 | E^06 | F^04 | E04 | F02 |
| Input 15 | E^08 | F^06 | E06 | F04 |
| Input 16 | E^10 | F^08 | E08 | F06 |
| Input 17 | E^12 | F^10 | E10 | F08 |
| Input 18 | E^14 | F^12 | E12 | F10 |
| Input 19 | E03 | F^14 | E14 | F12 |
| Input 20 | E^02 | E05 | E00 | F14 |
| Input 21 | E^04 | F^00 | E07 | F00 |
| Input 22 | E^06 | F^02 | E08 | E09 |
| Input 23 | E^08 | F^04 | E10 | F08 |
| Input 24 | E^10 | F^06 | E12 | F10 |
| Input 25 | E^12 | F^08 | E14 | F12 |
| Input 26 | E^14 | F^10 | E02 | F14 |

FIG. 56D

| Array Input Line | Band 13 | Band 14 | Band 15 | Band 16 |
| --- | --- | --- | --- | --- |
| Input 1 | G^12 | H^06 | G00 | H00 |
| Input 2 | G^14 | H^08 | G02 | H02 |
| Input 3 | G^00 | H^10 | G04 | H04 |
| Input 4 | G^02 | H^12 | G06 | H06 |
| Input 5 | E11 | H^14 | G08 | H08 |
| Input 6 | G^04 | E13 | G10 | H10 |
| Input 7 | G^06 | H^00 | E15 | H12 |
| Input 8 | G^08 | H^02 | G12 | E01 |
| Input 9 | IO1/CLK1 | H^04 | G14 | H14 |
| Input 10 | IO1/CLK1 | H^06 | G02 | H02 |
| Input 11 | G^10 | H^08 | G04 | H04 |
| Input 12 | G^12 | H^10 | G06 | H06 |
| Input 13 | G^14 | H^12 | G08 | H08 |
| Input 14 | E11 | H^14 | IO5 | H10 |
| Input 15 | G^00 | E13 | IO5 | H12 |
| Input 16 | G^02 | IO1/CLK1 | E15 | H14 |
| Input 17 | G^04 | IO1/CLK1 | G10 | E01 |
| Input 18 | G^06 | H^02 | G12 | H00 |
| Input 19 | G^08 | H^04 | G14 | H06 |
| Input 20 | G^10 | H^06 | G00 | IO5 |
| Input 21 | G^12 | H^08 | G02 | IO5 |
| Input 22 | G^14 | H^10 | G04 | H08 |
| Input 23 | E11 | H^12 | G06 | H10 |
| Input 24 | G^06 | E13 | G08 | H12 |
| Input 25 | G^08 | H^14 | E15 | H14 |
| Input 26 | G^10 | H^00 | G10 | E01 |

HIGH DENSITY PROGRAMMABLE LOGIC DEVICE

CROSS REFERENCE

This application is a divisional of commonly assigned U.S. patent application Ser. No. 07/816,515 entitled "A High Speed Centralized Switch Matrix For a Programmable Logic Device" of Mr. Om Agrawal et al. filed on Dec. 31, 1991, which issued as U.S. Pat. No. 5,436,514 on Jul. 25, 1995, and which is a continuation of commonly assigned U.S. patent application Ser. No. 07/699,427 entitled "A Family of Multiple Segmented Programmable Logic Blocks Interconnected by a High Speed Centralized Switch Matrix" of Mr. Om Agrawal et al. filed on May 13, 1991, which issued as U.S. Pat. No. 5,225,719 on Jul. 6, 1993, and which is a continuation-in-part of commonly assigned U.S. patent application Ser. No. 07/490,808 entitled "Multiple Array High Performance Programmable Logic Device Family" of Mr. Om Agrawal et al. filed on Mar. 7, 1990, which issued as U.S. Pat. No. 5,015,884 on May 14, 1991 and which was a continuation-in-part of commonly assigned U.S. patent application Ser. No. 07/243,574 entitled "Flexible, Programmable Cell Array Interconnected By A Programmable Switch Matrix," of Mr. Om Agrawal, et al. filed on Sep. 12, 1988, which issued as U.S. Pat. No. 4,963,768 on Oct. 16, 1990 and which was a continuation-in-part of U.S. patent application Ser. No. 07/178,707, entitled "Multiple Array Customizable Logic Array," of Mr. Om Agrawal filed on Apr. 7, 1988, which issued as U.S. Pat. No. 4,931,671 on Jun. 5, 1990 and which was a continuation of U.S. patent application Ser. No. 06/717,640, entitled "Multiple Array Customizable Logic Array," of Mr. Om Agrawal, filed on Mar. 29, 1985, which issued as U.S. Pat. No. 4,742,252 on May 3, 1988.

BACKGROUND OF THE INVENTION

1. Field of the Invention

This invention relates to programmable, integrated circuit logic devices arranged in interrelating groups or cells of logic components and interconnectable by a user-programmable switch matrix.

2. Description of the Prior Art

Several integrated circuit packages containing a programmable chip, which permits alternative implementation of logic functions, are available. These integrated circuit packages include a plurality of pins, an architecture for interfacing the pins with the input and output leads of the circuit on the programmable chip, and another architecture for interfacing the pins and auxiliary circuits on the chip which are used to configure the programmable chip into a user selected circuit. Thus, these field programmable logic devices permit the user to program or modify the functions on an integrated circuit chip with readily available equipment so as to configure the logic function performed by the chip to that desired by the user. However, the prior art programmable logic arrays (PLAs), programmable logic devices (PLDs) and programmable gate arrays, impose constraints on the user in exchange for field programmability.

In programmable logic arrays, which are often employed for random logic networks, data routing, code converters, instruction decoders, state machines, and other functions, an array of logic AND gates and logic OR gates is provided which can be programmed for a user specified function. Each output function (output signal) of a programmable logic array is the sum (OR gate output signal) of selected products (AND gate output signals) and each product (AND gate output signal) is the product of selected input signals. Programming is accomplished by providing a programmable array or matrix between the circuit input lines and the AND gate input lines and between the output lines of the AND gates and the input lines of the OR gates, respectively. The PLA is programmed by blowing or not blowing fusible links interconnecting the conductors of the arrays.

In another embodiment, the output lines from subgroups of AND gates of the PLA are non-programmably connected to the input lines of an OR gate. A programmable array logic (PAL) device such as this is disclosed in U.S. Pat. No. 4,124,899 and incorporated herein by reference. The PAL design affords a reduction in the size of the integrated circuit chip which allows an increase in production yields and a lowering of production costs over a conventional PLA.

To further enhance the flexibility of a PAL device or a PLA device, each output signal from the OR gate array is processed by a programmable means which lets the user select either a registered output signal or a combinatorial output signal. Further, the output signal can be configured as either an active high or an active low signal. An example of an output macrocell 10, used in the prior art on an output line 11 of either a PLA or a PAL circuit, is shown in FIG. 1. Output line 11 from a programmable logic circuit is connected to a D input terminal of register 12 as well as a first input line 13 of a programmable multiplexer 19. The Q output terminal of register 12 drives a second input line 14 of multiplexer 19. The output signal from multiplexer 19, which is determined by the state of fuse 20 on line 21, drives a first input terminal of an exclusive OR gate 25. The power supply voltage is provided through a resistor 31 to the input select line 21 of multiplexer 19 and to a first end of fuse 20. The second end of fuse 20 is grounded. Accordingly, if fuse 20 is left intact, a logical zero signal is applied to input select line 21. However, if fuse 20 is blown, the signal on the input select line 21 is a logical one. Therefore, multiplexer 19 couples either the signal on line 13 or the signal on line 14 to output line 26.

The output signal from exclusive OR gate 25 is determined by fuse 23. If fuse 23 is left intact, then a logical zero is supplied to the second input terminal of exclusive OR gate 25 and the signal on line 26 is not inverted by gate 25. Conversely, if fuse 23 is blown, a logical one is provided to the second input terminal of exclusive OR gate 25 and exclusive OR gate 25 inverts the signal on line 26. Line 27 is used to tristate exclusive OR gate 25.

Output macrocell 10 also has means to provide a feedback signal to a logic circuit on line 17 of programmable multiplexer 18. Programmable multiplexer 18 has a first input line 22 connected to output line 25 of Exclusive OR gate 25 and a second input line 15 connected to $\overline{Q}$ output terminal of register 12. The signal on input select line 16 of multiplexer 18 is controlled by fuse 20, as previously described for multiplexer 19. Multiplexer 18 has three signal sources: (1) an inverted registered output signal from register 12; (2) an input signal on pin 30; or, (3) a signal from exclusive OR gate 25. If the signal on line 27 tristates exclusive OR gate 25, then an input signal on pin 30 is passed over lines 29, 22 to the first input terminal of multiplexer 18. Alternatively, the output signal of exclusive OR gate 25 is passed over lines 28, 22 to the first input terminal of multiplexer 18. Output line 17 of multiplexer 18 thus provides either an inverted or uninverted registered feedback signal, an inverted or uninverted combinatorial feedback signal, or an input signal to the logic circuit to which output macrocell 10 is connected. Output macrocell 10 is discussed in further detail in U.S. Pat. No. 4,717,912, which is incorporated herein by reference.

A disadvantage of monolithic PAL circuits is that to increase the number of input lines to the programmable AND logic array requires increasing the array size in proportion to the number of input lines. Accordingly, the size of a PAL circuit is limited by both integrated circuit technology and the cost of producing such a circuit. Also, the fuses used to program a bipolar logic array can only be programmed once and so the logic array cannot be fully tested prior to programming by the user.

The functionality of a conventional PAL device is determined by the input/output capability, the number of registers and the distribution of products terms of the device. A conventional PAL device suitable for both wide gating combinational functions, such as address decoding, multiplexing and demultiplexing, and sequential functions such as wide state machines and shift-register type functions, requires both wide input capability, i.e., a number of input lines, and a reasonably large register capability. Increasing the input capability of a conventional monolithic PAL device results in a larger array size, as described previously, which in turn results in a larger silicon die, higher cost, slower performance, and ineffective array utilization.

Erasable programmable logic devices (EPLDs) overcome the one time programmability limitation of fused logic arrays and typically use a segmented structure to enhance performance. One prior art EPLD is shown as a block diagram in FIGS. 2A, 2B and 2C (FIG. 2). The device has forty-eight input/output (I/O) pins 40, twelve dedicated input pins 41, and four pins 42 which may be used either as clock input pins or additional dedicated input pins. The signal on each I/O pin 40 is either provided to a macrocell 43 as an input signal or generated by a macrocell 43 as an output signal. Macrocells 43 are divided into three general types, a general macrocell 43, a global macrocell 60, and an enhanced macrocell 61.

General macrocell 43, as illustrated in FIG. 4, provides an input signal from I/O pin 40 to local bus 44 and programmable AND array 46 through feedback select element 47. Alternatively, a signal generated from the eight product signals on lines 49a–49h from programmable AND array 46 by I/O architecture control cell 48 is passed through buffer 49 to I/O pin 40 and through feedback select element 47 to local bus 44 and programmable AND array 46. Thus, AND array 46 is provided with either local feedback or an input signal on pin 40, but not both. In addition, programmable AND array 46 receives (1) input signals from the macrocells on the local quadrant bus 44, (2) feedback signals from global bus 45 from macrocells $60A_0$–$60A_3$, $60B_0$–$60B_3$, $60C_0$–$60C_3$ and $60D_0$–$60D_3$, and (3) signals on the sixteen dedicated input pins 41, 42 as described previously. Local macrocell programmable AND array 46 is limited to eight product terms and I/O architecture control cell 48 provides a means for generating either combinatorial or registered output signals, as previously described.

A global macrocell 60 is shown in FIG. 3. The programmable AND array 46 of global macrocell 60 is identical to programmable AND array 46 of general macrocell 43. However, the input signals to programmable AND array 46 of global macrocell 60 include both the signal from I/O pin 40, which is provided directly to global bus 45, and the signal from I/O architecture control cell 48, which is provided to local bus 44. Enhanced macrocells 61 (not shown) are utilized for critical combinatorial logic delay paths since these cells have increased speed performance through the logic array.

In another EPLD (FIGS. 5A and 5B) a programmable logic array 50 is configured as two symmetrical parts 50A, 50B with each half having 14 macrocells 51, three I/O architecture control cells 53 and one buried macrocell 52. Buried macrocell 52 is similar to group I/O architecture control cells 51 except buried macrocell 52 is not connected to an I/O pin 40 and therefore is used only to interface two macrocells with a global bus and a local bus.

In this embodiment, a selected group of macrocells, 51h–51k, 51x–51aa can share a total of sixteen additional product terms from the logic array. However, the sharing must occur between adjacent pairs of macrocells so that the additional product terms are available only to one side of the device at a given time.

The electrical programmable logic devices are implemented using CMOS technology. Also, the EPLD technology permits factory testing of all elements within the EPLD, unlike a fuse blown programmable device which can only be tested for certain configurations in the factory. The programmable connections in an EPLD typically use a CMOS floating gate architecture that is erased using a short wavelength ultraviolet (UV) light.

While an EPLD offers advantages over fuse programmable devices, the UV EPLD can be inadvertently erased if the device is left in either sunlight or fluorescent lighting. Further, the number of programmable gates, the utilization of the components in the device, and the flexibility of the device are limited by the architecture of the device. Specifically, while the devices illustrated in FIGS. 2 and 3 utilize a segmented PAL approach, each of the PAL structures is relatively large. The size of the structure results in lower performance in comparison to a smaller structure and also inefficient utilization of the array. In larger arrays, if only one or two input lines of a particular product term are used or if only one or two product terms of a particular output macrocell are used, then the remaining input lines or the remaining product terms are essentially wasted or unused.

The EPLD in FIG. 2 has 48 registers in a 68-pin package and the EPLD in FIGS. 5A and 5B has 28 registers in a 40-pin package. Therefore, the number of registers in comparison to the number of package pins is limited and consequently the functionality of these devices for registered applications is limited. Hence, both the speed and the functionality of these EPLDs are compromised by the architecture of the devices.

An alternative to a monolithic or a segmented programmable logic array is a programmable gate array wherein configurable logic blocks 70, as shown in FIG. 6A, are interfaced through switch matrices, as shown in FIG. 6B. Each configurable logic block 70 has a combinatorial logic cell 73 with four input lines 70A, 70B, 70C, 70D and two output lines 70G, 70H, a clock input line 70K, a storage element 71, and several programmable multiplexers for signal routing within the logic block. Combinational logic cell 73 uses a table look-up memory to implement Boolean logic functions of up to four variables. The programmable multiplexers utilize volatile memory cells in conjunction with pass transistors to provide configuration signals for the multiplexer. Each switch matrix 72 interfaces four horizontal metal segments with five vertical metal segments. The switches in the switch matrices are pass transistors that are controlled by a configuration bit in a volatile memory cell.

The programmable gate array circuit provides 112 flip-flops in a 68-pin PLCC package and 174 flip-flops in an 84-pin PGA package. Thus, while these devices significantly increase the number of registers over the EPLDs, described above, the devices are inefficient for wide gating applications because each configurable logic block 73 is relatively small. Therefore, an application, which requires wide gating, requires cascading in series of multiple configurable logic blocks which in turn results in reduced performance.

The semiconductor industry is consistently driven to offer higher integration, higher speed silicon devices for increased performance, lower cost system applications. For a high density PAL-like device achieving higher speed is extremely critical. However, a high density PAL device which provides a high speed programmable array and a large register capability is presently unavailable. Further, as described above, the available prior art programmable logic devices fail to achieve an optimum balance of functionality, silicon die size and performance.

SUMMARY OF THE INVENTION

The programmable logic device (PLD) of this invention is a high density segmented PAL-like device which gives an optimum balance between functionality, silicon die size, and performance. The high density programmable logic device has two or more programmable logic circuits (blocks) interconnected by a switch matrix. In one embodiment, four programmable logic blocks contained in a single integrated circuit are interconnected by a switch matrix while in another embodiment two programmable logic blocks are interconnected by a switch matrix. This segmented logic structure provides high speed performance while maintaining greater functionality than was available in prior art programmable logic devices.

The switch matrix has a bank of programmable multiplexers for each programmable logic block in the PLD. The input signals to the multiplexers in each bank are selected from input signals on the pins of the integrated circuit package containing the integrated circuit of this invention and output signals from the programmable logic blocks. Hence, the switch matrix functions as both an input means and a feedback means to the various logic circuits.

Each of the multiplexers in the switch matrix has configuration architecture cells which provide input select signals to the multiplexer. The input select signals configure the multiplexer so that one of the signals on an input line to the multiplexer is passed through the multiplexer to an output line of the multiplexer and the other signals on the remaining input lines are disconnected from the output line.

The programmable logic blocks of this invention communicate with each other only through the switch matrix. Moreover, the programmable logic blocks receive all input signals from the switch matrix. Thus, the programmable logic blocks may be viewed as independent programmable logic devices on the same integrated circuit chip.

In one embodiment, each programmable logic block of this invention includes a programmable logic array, a programmable logic allocator, programmable logic macrocells, and programmable I/O macrocells. The input lines to the programmable logic block from the switch matrix drive the programmable logic array. The logic allocator is programmable so that signals from the programmable logic array are distributed to logic macrocells as required by the user of the programmable logic device. In one embodiment, the logic macrocells configure the signals from the logic allocator either as registered signals or combinatorial signals. The output signal from a logic macrocell is provided to an I/O macrocell and fed back to the switch matrix. The I/O macrocell selectively delivers the logic macrocell signal to an I/O pin. Alternatively, the I/O macrocell can be configured using an output enable signal so that the I/O pin provides an input signal to the switch matrix array and the logic macrocell is decoupled from the I/O pin.

The logic allocator includes a multiplicity of programmable router elements. Each router element is connected to a selected number of output lines from the programmable logic array. These output lines are input lines to a logic gate. The output line from the logic gate drives the input terminal of a programmable demultiplexer. The programmable demultiplexer has a plurality of output lines, each of which is connected to the input line of one of the programmable logic macrocells. In response to an input select signal, the programmable demultiplexer passes the signal on the input line therethrough to the selected output line. Accordingly, none of the output lines from the programmable logic array are permanently connected to a logic macrocell. Accordingly, when an I/O pin is used for an input pin, the programmable logic macrocell associated with that pin may be used as a buried register, or alternatively, if the macrocell is not used, the signals from the programmable logic array are routed to other logic macrocells so that no product terms are wasted.

While the decoupling of the logic macrocells from the I/O pins restores the usage of the logic macrocells as buried registers, such decoupling does not address scalability of the user design to higher density devices. The more important problem for scalability is decoupling the product term array from the macrocells so that as the number of macrocells increases, the product term array size does not increase proportionally.

The logic allocator allocates product term resources in a variable distribution among all macrocells in a programmable logic block. Thus, the logic allocator essentially decouples unused macrocells from the product term array and in one embodiment allocates up to twelve to sixteen product terms per logic macrocell with minimum speed penalty.

The high speed switch matrix of this invention provides a fixed, uniform, predictable and path independent time delay for all signals that are passed through the switch matrix. Further, since the programmable logic array only receives signals from the switch matrix, the switch matrix effectively decouples the product term array from the logic macrocells, the I/O macrocells and array size.

Thus, programmable interconnections within the switch matrix and within each programmable logic block are used to decouple the product-term array from the switch matrix, macrocells and I/O pins. This decoupling provides greater flexibility than was available in the prior art programmable logic devices and allows the PLD of this invention to be efficiently and quickly configured for a user application. Further, the complete decoupling of the internal resources within a programmable logic block is in sharp contrast to the prior art programmable logic device families.

In one embodiment of this invention, a plurality of PLDs having a switch matrix and programmable logic blocks that include the programmable logic array, programmable logic macrocells and programmable I/O macrocells, as described above, are divided into two families of PLDs. In the first family of PLDs, each programmable logic macrocell is coupled to an input/output pin of the PLD by a programmable logic macrocell. In the second family of PLDs, only a subset of the plurality of programmable logic macrocells in a programmable logic block are coupled to the I/O pins by the plurality of I/O macrocells in the programmable logic block. The remaining macrocells in the plurality of programmable logic macrocells function as buried logic macrocells.

Thus, for a PLD in the first family with a predetermined number of programmable logic macrocells and a PLD in the second family with the same predetermined number of logic macrocells, the second family PLD has a greater logic to pin ratio than the logic to pin ratio of the first family PLD. Here, the logic to pin ratio is the number of logic macrocells per I/O pin of the PLD. In general, for the two families the second family has a greater logic to pin ratio than the first family.

Within a family of PLDs, a first PLD is a high density PLD, a second PLD is a higher density PLD, and a third PLD is a highest density PLD. Irrespective of the PLD density, the routability of signals through the switch matrix is preferably at least 2.5, i.e., the PLD has a routability factor of at least 2.5. Further, in one embodiment, for each PLD the delay time through the PLD is preferably maintained at about 15 nanoseconds. To provide the necessary routability while maintaining the PLD speed performance, the number of input lines to the programmable logic array in the second and third PLDs of a family is preferably greater than the number of input lines to the programmable logic array in the first PLD. After the number of input lines to the programmable logic array is fixed, the number of input lines to a multiplexer within the switch matrix, i.e., the size of the programmable multiplexer in the switch matrix, is determined from the total number of routable signals in the PLD and the number of array input lines so that the routability factor is at least 2.5.

Another input aspect of this invention is that in the higher density PLDs within a family, four dedicated input pins may function as either input signal sources or clock signal sources. Preferably, the four dedicated pins are, tied to each logic macrocell in the PLD.

BRIEF DESCRIPTION OF THE DRAWINGS

FIGS. 2A, 2B and 2C illustrate a prior art erasable programmable logic device.

FIGS. 5A and 5B are a block diagram of another prior art erasable programmable logic device.

FIGS. 17A to 17D are a schematic diagram of the programmable logic block of the first embodiment in the first family of programmable logic devices according to the principles of this invention.

FIGS. 18A to 18D are a schematic diagram of the programmable logic block of the first embodiment in the second family of programmable logic devices according to the principles of this invention.

FIG. 26 illustrates the product term steering of the logic allocator 411B1 of this invention.

FIG. 27 illustrates the product term steering of the logic allocator 411B2 of this invention.

FIG. 28 illustrates the product term steering of the logic allocator 411B3 of this invention.

FIGS. 35A and 35B are an alternative representation of the input lines and the output lines to the programmable multiplexers in switch matrix 401A1 according to the principles of this invention.

FIG. 36 illustrates the signals in the 16 bands for programmable logic device 120 of this invention.

FIGS. 38A to 38D illustrate the input lines for each programmable 16:1 multiplexer in switch matrix 401A2.

FIG. 39 illustrates the signals in the 16 bands for programmable logic device 130 of this invention.

FIGS. 41A to 41D illustrate the input lines for each programmable 16:1 multiplexer in switch matrix 401A3.

FIG. 42 illustrates the signals in the 12 bands for programmable logic device 210 of this invention.

FIGS. 44A to 44C illustrate the input lines for each programmable 12:1 multiplexer in switch matrix 401B1.

FIG. 45 illustrates the signals in the 16 bands for programmable logic device 220 of this invention.

FIGS. 47A to 47D illustrate the input lines for each programmable 16:1 multiplexer in portions of switch matrix 401B2 for programmable logic blocks 402B2-1 and 402B2-8.

FIGS. 48A to 48D illustrate the input lines for each programmable 16:1 multiplexer-in portions of switch matrix 401B2 for programmable logic blocks 402B2-2 and 402B2-7.

FIGS. 49A to 49D illustrate the input lines for each programmable 16:1 multiplexer in portions of switch matrix 401B2 for programmable logic blocks 402B2-3 and 402B2-6.

FIGS. 50A to 50D illustrate the input lines for each programmable 16:1 multiplexer in portions of switch matrix 401B2 for programmable logic blocks 402B2-4 and 402B2-5.

FIGS. 51A to 51D illustrate the signals in the 16 bands for each pair of programmable logic blocks in programmable logic device 230 of this invention.

FIGS. 53A to 53D illustrate the input lines for each programmable 16:1 multiplexer in portions of switch matrix 401B3 for programmable logic blocks 402B3-1 and 402B3-8.

FIGS. 54A to 54D illustrate the input lines for each programmable 16:1 multiplexer in portions of switch matrix 401B3 for programmable logic blocks 402B3-2 and 402B3-7.

FIGS. 55A to 55D illustrate the input lines for each programmable 16:1 multiplexer in portions of switch matrix 401B3 for programmable logic blocks 402B3-3 and 402B3-6.

FIGS. 56A to 56D illustrate the input lines for each programmable 16:1 multiplexer in portions of switch matrix 401B3 for programmable logic blocks 402B3-4 and 402B3-5.

Figure 1:
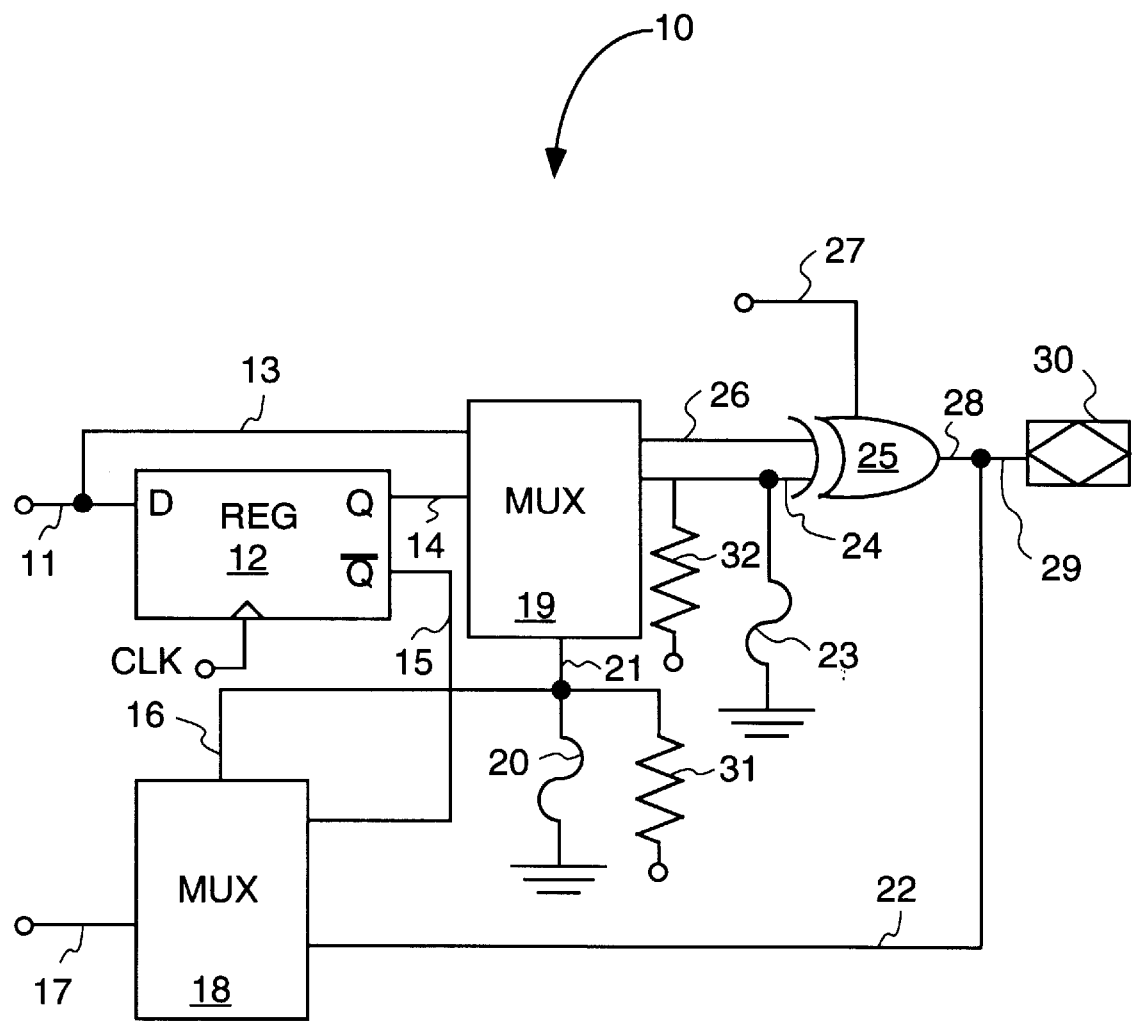
FIG. 1 is a block diagram of a prior art input/output macrocell for use with a PLA or a PAL circuit.

In the drawings, similar items have the same number. Further, a number may represent several similar devices. For example, the base number 412 represents a group of macrocells of this invention. The number 412A1 represents a specific set of macrocells. The same component in different parts of the invention has the same base number, a dash, and then a number that differentiates the parts. Thus, macrocells 412A1-1 are macrocells in a first programmable logic block and macrocells 412A1-2 are equivalent macrocells in a second programmable logic block. Macrocell 412A1-1-6 is the sixth macrocell in the group of macrocells 412A1-1. Accordingly, a base number is a shorthand notation representing several similar devices, lines, components or other related objects.

DETAILED DESCRIPTION

Figure 7:
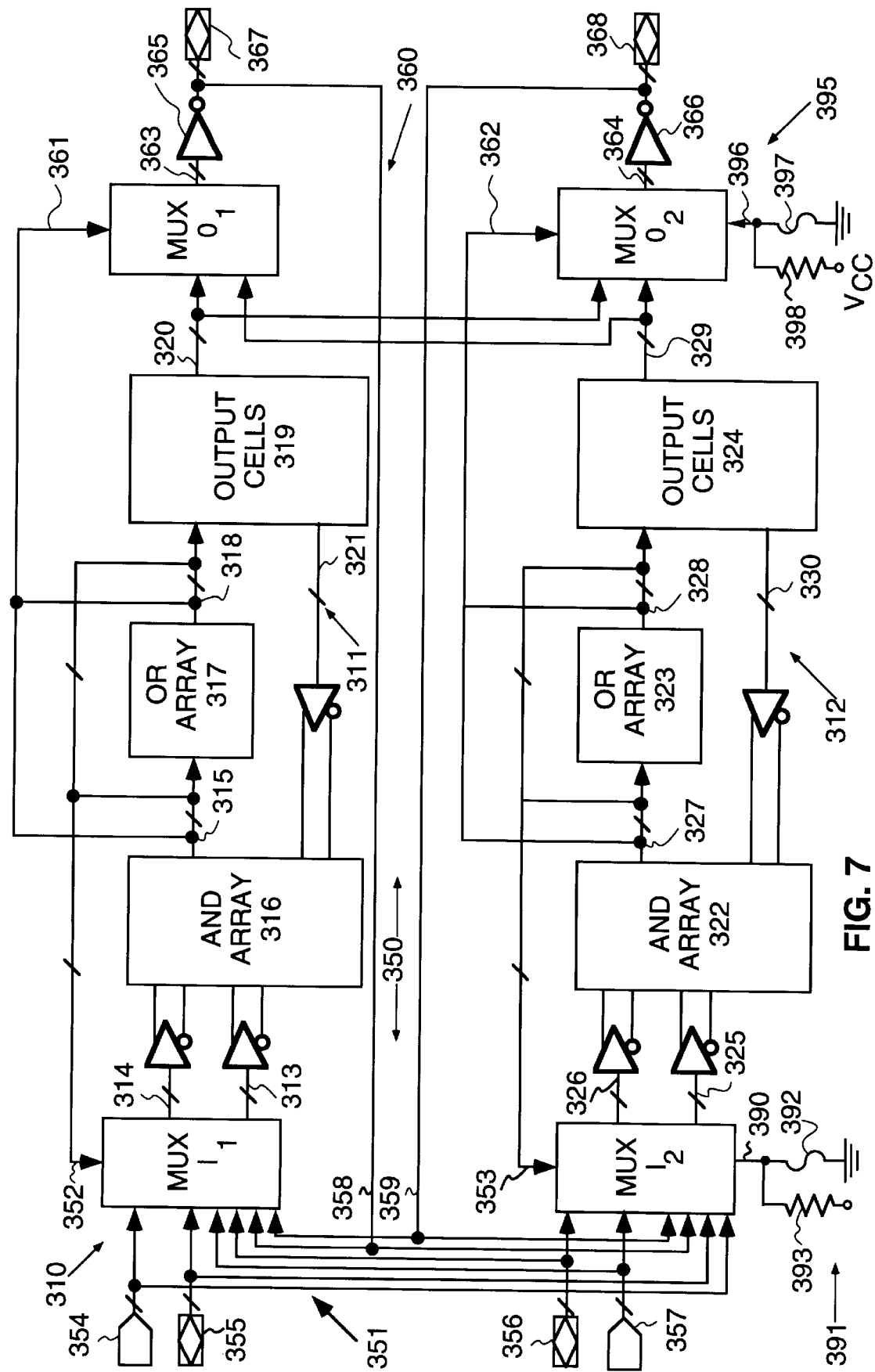
FIG. 7 is a block diagram of an integrated circuit according to one embodiment of the present invention.

FIG. 7 shows a diagram of the architecture of a multiple array programmable logic device 310 according to the present invention. The device 310 includes a first programmable array means 311 for receiving a plurality of first input terms (signals) and generating a plurality of first output terms (signals) and a second programmable array means 312 for receiving a plurality of second input terms and generating a plurality of second output terms.

First programmable array means 311 includes an AND array 316 that receives the plurality of first input terms across line 313 and preferably one clock input term across line 314 for sequential state machine functions and generates a plurality of first product terms across line 315 in response to the first input terms and the clock terms as programmed by the user. AND array 316 is preferably a field programmable AND array such as those described in the publication entitled *Programmable Array Logic Handbook*, published by Advanced Micro Devices, Inc. (1988), and available through Advanced Micro Devices, Inc., Sunnyvale, Calif. Of course, other embodiments of the AND array including a fixed AND array may be utilized as desired.

In first programmable array means 311, the first product terms on line 315 are supplied to an OR array 317. The OR array 317 generates a plurality of first sum-of-products terms on line 318 in response to the first product terms on line 315. The OR array may be a fixed OR array or a programmable OR array as described in the above-mentioned *Programmable Array Logic Handbook*.

The first sum-of-products terms on line 318 are supplied to a plurality of output cells 319 which generate output logic terms on line 320 for first programmable array means 311. Further, output cells 319 may generate feedback terms on line 321 which are fed back to the AND array 316 and utilized in the generation of the first product terms 315 as programmed by the user.

Second programmable array means 312 consists of components similar to first programmable array means 311. Thus, second programmable array means 312 includes AND array 322, which may be either fixed or programmable, and OR array 323, either fixed or programmable, and a plurality of output cells 324. Second programmable array means 312 receives as input a plurality of second input terms on line 325 and preferably one clock input term on line 326 for sequential state machine functions. The output signal of AND array 322 of second programmable array means 312 includes a plurality of second product terms 327. The output signal of OR array 323 includes a plurality of second sum-of-products terms on line 328. The plurality of second sum-of-products terms is passed through the output cells 324 and supplied as a plurality of second output terms on line 329. The output cells 324 may generate feedback terms across line 330 for supply back to AND array 322 for use in generation of the second product terms on line 327 as programmed by the user.

It should be appreciated that first programmable array means 311 and second programmable array means 312 may preferably be individually configured to include a programmable AND array with a fixed OR array, a fixed AND array with a programmable OR array, a programmable AND array with a programmable OR array or other programmable array configuration generating sum-of-products terms to facilitate conventional sum-of-products logic design.

Output cells 319 and output cells 324 for first and second programmable arrays means 311, 312, respectively, consist preferably of output cells such as those disclosed in the prior U.S. patent application entitled DYNAMICALLY CONTROLLABLE OUTPUT LOGIC CIRCUIT, Ser. No. 656,109, filed Sep. 28, 1984, or any of the output configurations disclosed in the *Programmable Array Logic Handbook* referred to above.

Device 310 includes a means 350 for selectively interconnecting at least subsets of the plurality of first input terms from lines 313, 314, the plurality of first output terms from lines 320, the plurality of second input terms from lines 325, 326 and the plurality of second output terms from lines 329. Means 350 for selectively interconnecting allows device 310 to be configured so that first programmable array means 311 is connected in series with second programmable array means 312, or first programmable array means 311 is connected in parallel with second programmable array means 312 or any combination of interconnections. A particular embodiment may interconnect subsets of the input and output terms, so that all or any portion of the plurality of first input terms, plurality of first output terms, plurality of second input terms, and plurality of second output terms may be routed as desired to provide the flexibility desired by a manufacturer.

In the embodiment shown in FIG. 7, means 350 for selectively interconnecting includes an input multiplexing means 351 (MUX $I_1$, MUX $I_2$), responsive to an input select signal on lines 352, 353, for selecting and supplying a set of signals as the plurality of first input terms or as the plurality of second input terms, from a plurality of signals. Input multiplexing means 351 (FIG. 7) selects from the plurality of signals including a first set of clock signals supplied from input pins 354, a first set of input signals externally supplied to the chip from a first set of input/output pins 355, a second set of input signals supplied from a second set of input/output pins 356 (these I/O pins are typically driven by an output signal from another device (not shown) which is similar to device 310), a second set of clock signals supplied from input pins 357, and a set of output signals, generated in response to at least a subset of the plurality of first output terms from line 320 and the plurality of second output terms from lines 329, supplied across lines 358 and 359 respectively.

The input select signal on lines 352 and 353 in the preferred embodiment is supplied as at least a subset of the first and second product terms from lines 315 and 327, respectively, or at least a subset of the first and second sum-of-products terms from lines 318 and 328, respectively, or any combination of the product terms and sum-of-products terms generated by first programmable array means 311 and second programmable array means 312.

Also, as shown in FIG. 7, the input select signal may be field programmable. Thus, FIG. 7 shows an input select signal supplied on line 390 to input multiplexer MUX $I_2$ from a fuse programmable signal generator 391. The fuse programmable signal generator 391 includes a fuse 392 connected from line 390 to ground and a resistor 393 connected from line 390 to a power supply voltage $V_{cc}$. Fuse 392 is a field programmable fuse such as those described in the *Programmable Array Logic Handbook*, referred to above.

Input multiplexing means 351 in the preferred embodiment consists of a first input multiplexer MUX $I_1$, responsive to the input select signal on lines 352, for selecting a set of signals for supply as input signals on lines 313, 314, and a second input multiplexer MUX $I_2$, responsive to the input select signal on lines 353 or 390, for selecting a set of signals for supply as input term signals on lines 325, 326. In the embodiment shown, both first input multiplexer MUX $I_1$ and second input multiplexer MUX $I_2$ are supplied the same sets of signals from pins 354, 355, 356 and 357 for selection and supplying as input terms. The first input multiplexer MUX $I_1$ supplies the plurality of first input terms on lines 313, 314. The second input multiplexer MUX $I_2$ supplies the plurality of second input terms on lines 325, 326.

Means 350 for selectively interconnecting also includes an output multiplexing means 360, responsive to an output select signal on lines 361, 362, for selecting and supplying as output signals on lines 363 and 364, respectively, a set of signals selected from the plurality of signals selected from at least a subset of the plurality of first output terms from lines 320 and the plurality of second output terms from lines 329. The output signals on lines 363, 364 are supplied from integrated circuit device 310 externally through output drivers 365, 366 to sets of I/O pins 367, 368.

The output select signals on lines 361 and 362 can be generated from the first set of product terms on lines 315, second set of product terms on lines 327, first set of sum-of-products terms on lines 318, second set of sum-of-products terms on lines 328 or any combination of product terms and sum-of-product terms as suits the user.

Also, as shown in FIG. 7, the output select signal may be fuse programmable. Thus, FIG. 7 shows a fuse programmable signal generator 395 supplying an output select signal on line 396. The fuse programmable signal generator 395 includes a fuse 397 connected from line 396 to ground and a resistor 398 connected from line 396 to power supply voltage $V_{cc}$. Fuse 396 is programmable as described in the above mentioned *Programmable Array Logic Handbook*.

Output multiplexing means 360 in the embodiment shown in FIG. 7 consists of a first output multiplexer MUX $O_1$ and a second output multiplexer MUX $O_2$. First output multiplexer MUX $O_1$, responsive to the output select signal on lines 361, selects a set of signals for supply as output signals on lines 363, while the second output multiplexer MUX $O_2$, responsive to the output select signal on lines 362 or 396, selects a set of signals for supply as output signals on lines 364.

The diagram of FIG. 7 shows four sets of I/O pins, designated 355, 356, 367 and 368. Each of these sets of I/O pins may include any number of I/O pins corresponding to the number of output signals generated on lines 363 and 364 and the number of input signals supplied from the I/O pins 355, 356 as desired. It should be noted, that the four sets of I/O pins, 355, 356, 367 and 368, are not necessarily exclusive. For instance, the set of I/O pins 367 receiving output signals across line 363 from the output multiplexer MUX $O_1$ is also connected to provide input signals to the input multiplexers MUX $I_1$ and MUX $I_2$ across line 358. Thus, an architecture for a device 310 according to the present invention may be laid out in which all or any subset of the I/O pins are configured to receive output signals and/or supply input signals.

Furthermore, in the preferred embodiment, the set of clock input pins 354 and the set of clock input pins 357 may include any number of clock inputs.

In one preferred embodiment, there are two clock input pins in the first set of clock input pins 354, two clock input pins in the second set of clock input pins 357, and forty I/O pins configured to provide sets of I/O pins such as those designated 355, 356, 367 and 368.

Thus it can be seen that device 310 provides total interconnectivity of the available signals and logic terms as input terms or as output terms. This allows the user the ability to configure the device 310 such that the first programmable array means 311 operates in series with the second programmable array means 312, such as by providing the output signals from line 363 as one of the sets of signals across line 358 that is selectable by the second input multiplexer MUX $I_2$ as at least a subset of the plurality of second input terms on line 325, 326. Of course, the second programmable array means 312 may be connected in the same manner with respect to the first programmable array means 311. Alternatively, the first programmable array means 311 and the second programmable array means 312 may be connected in parallel such that each receives the same input signals as input terms on lines 313, 314 and 325, 326, respectively, such as the input signals supplied by the set of input pins 356, and each generates a plurality of output terms across lines 320 and 329, respectively, that are selectively supplied to a set of I/O pins 367, 368.

A wide variety of other interconnection architectures can be made utilizing the means 350 for selectively interconnecting according to the present invention. For instance, a subset of the output signals from lines 363 might be supplied as a part of the set of input signals selectable by second input multiplexer MUX $I_2$ across line 358. Thus, a portion of the logic terms generated by second programmable logic array means 312 would be generated in response to a series connection of first programmable logic array means 311 and second programmable logic array means 312 while others of the logic terms generated by a second programmable array means 312 would be generated in parallel with or independently from logic terms generated by first programmable array means 311. In this embodiment, for instance the I/O pins 367 receiving output terms from the first programmable array means 311 might include a fewer number of pins than I/O pins 368 supplying output signals from the second programmable array means 312. As can be seen, flexibility of the present invention is extremely valuable.

Figure 2B:
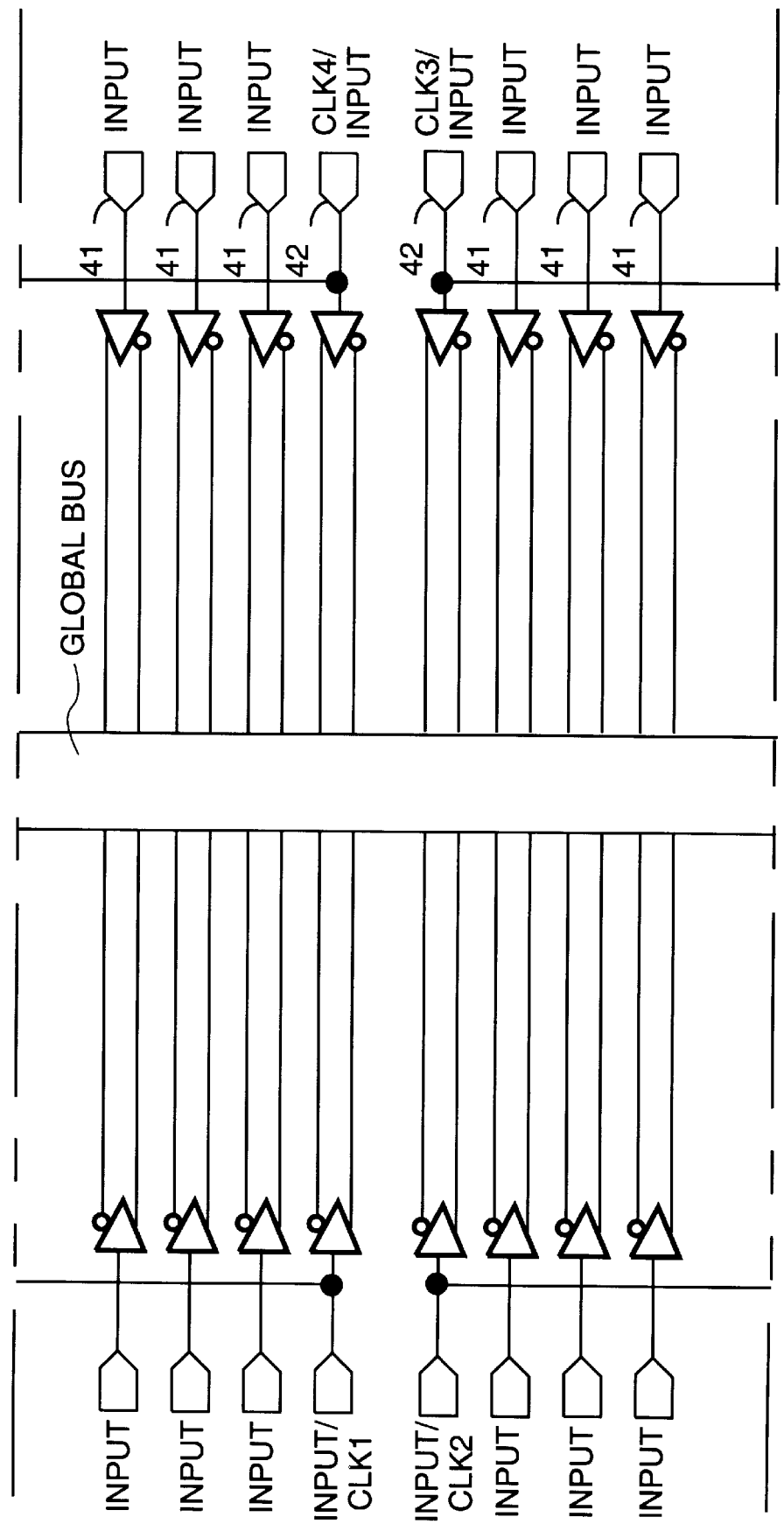
Figure 2C:
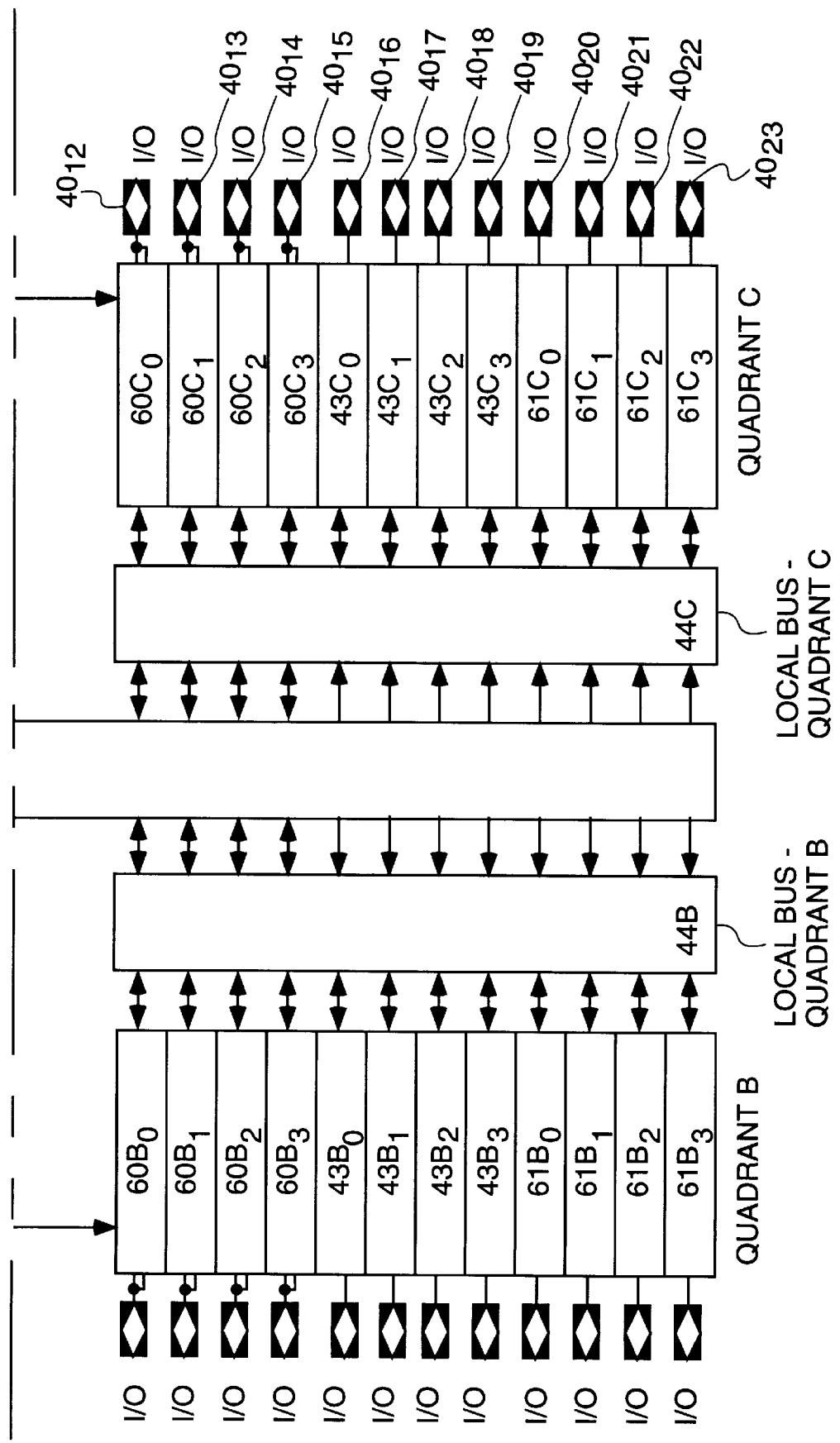
Figure 3:
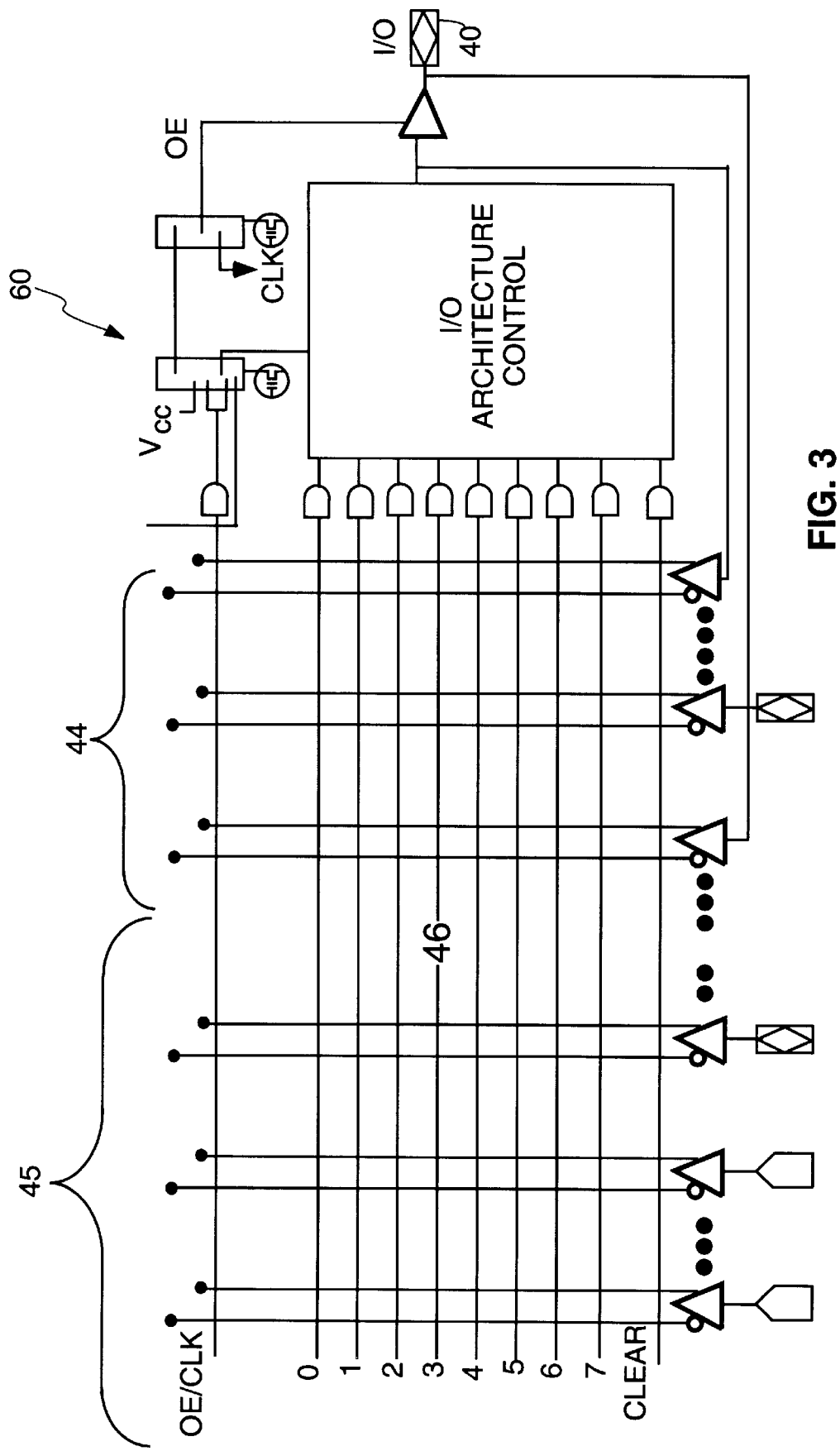
FIG. 3 is a block diagram of a global macrocell in the prior art device illustrated in FIGS. 2A, 2B and 2C.
Figure 4:
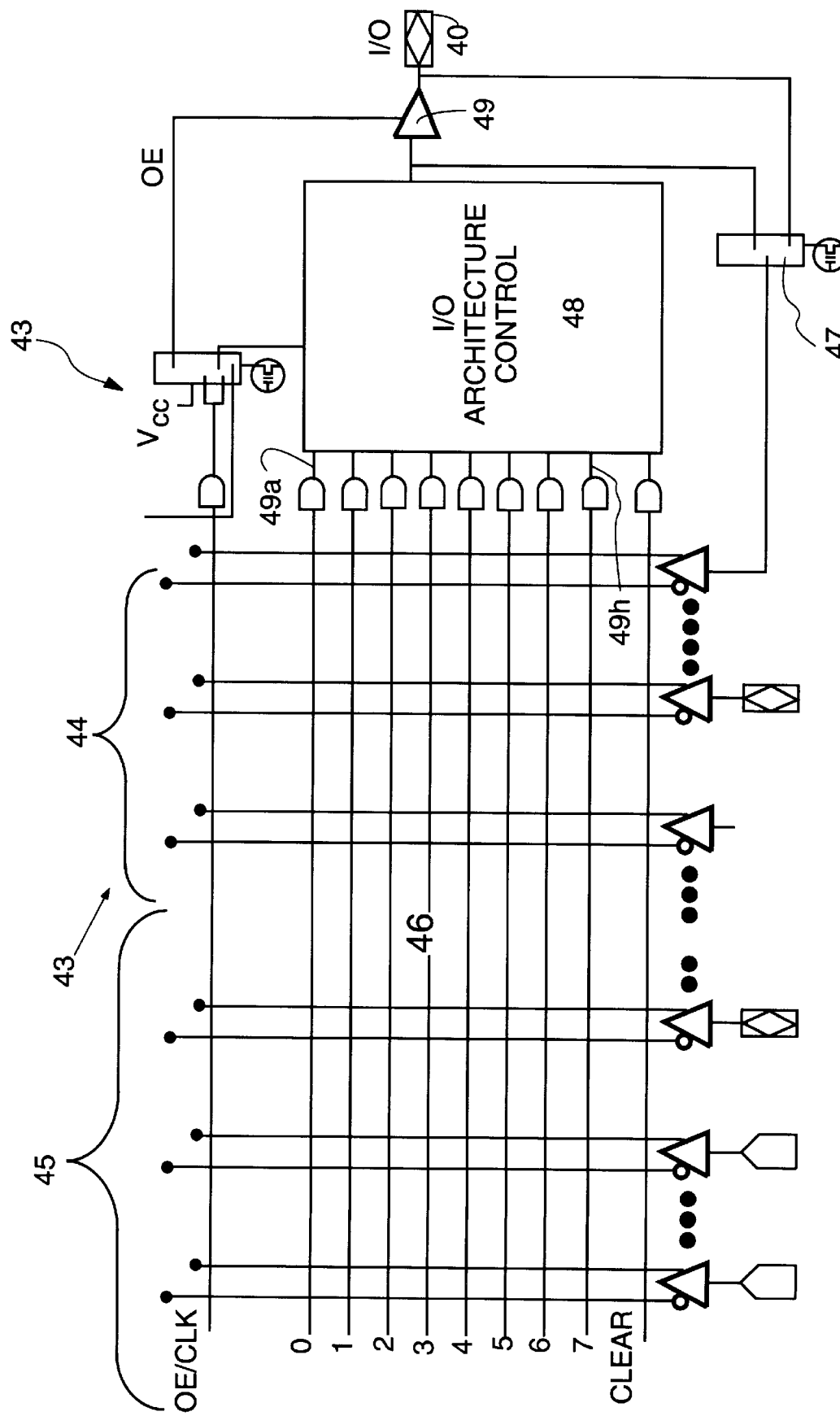
FIG. 4 is a block diagram of a general macrocell in the prior art device illustrated in FIGS. 2A, 2B and 2C.

An alternate preferred embodiment of a customizable logic device 310 according to the present invention is discussed in the parent U.S. Pat. No. 4,742,252 (FIG. 2 of U.S. Pat. No. 4,742,252) and incorporated herein by reference.

Figure 5B:
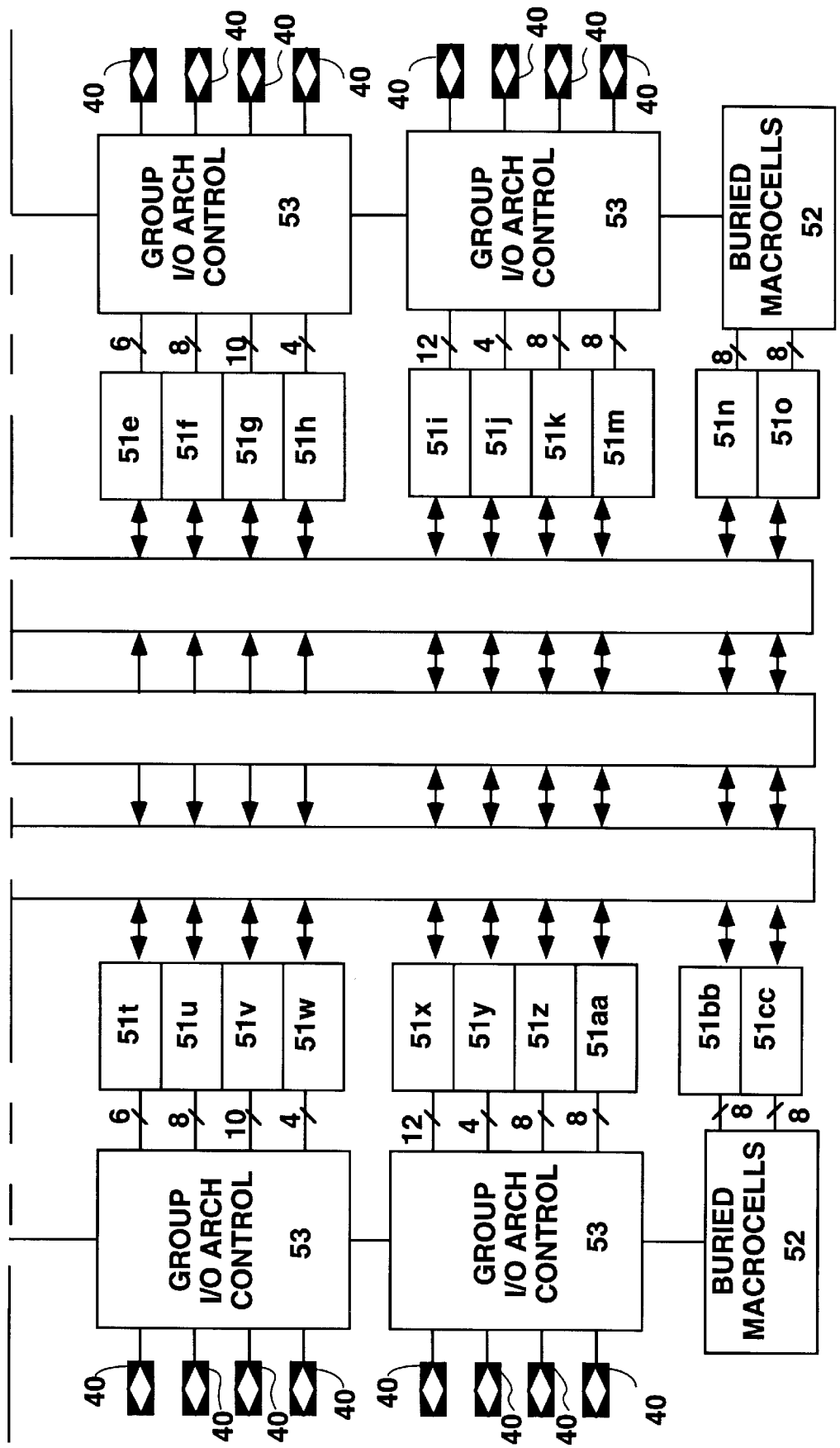
Figure 6A:
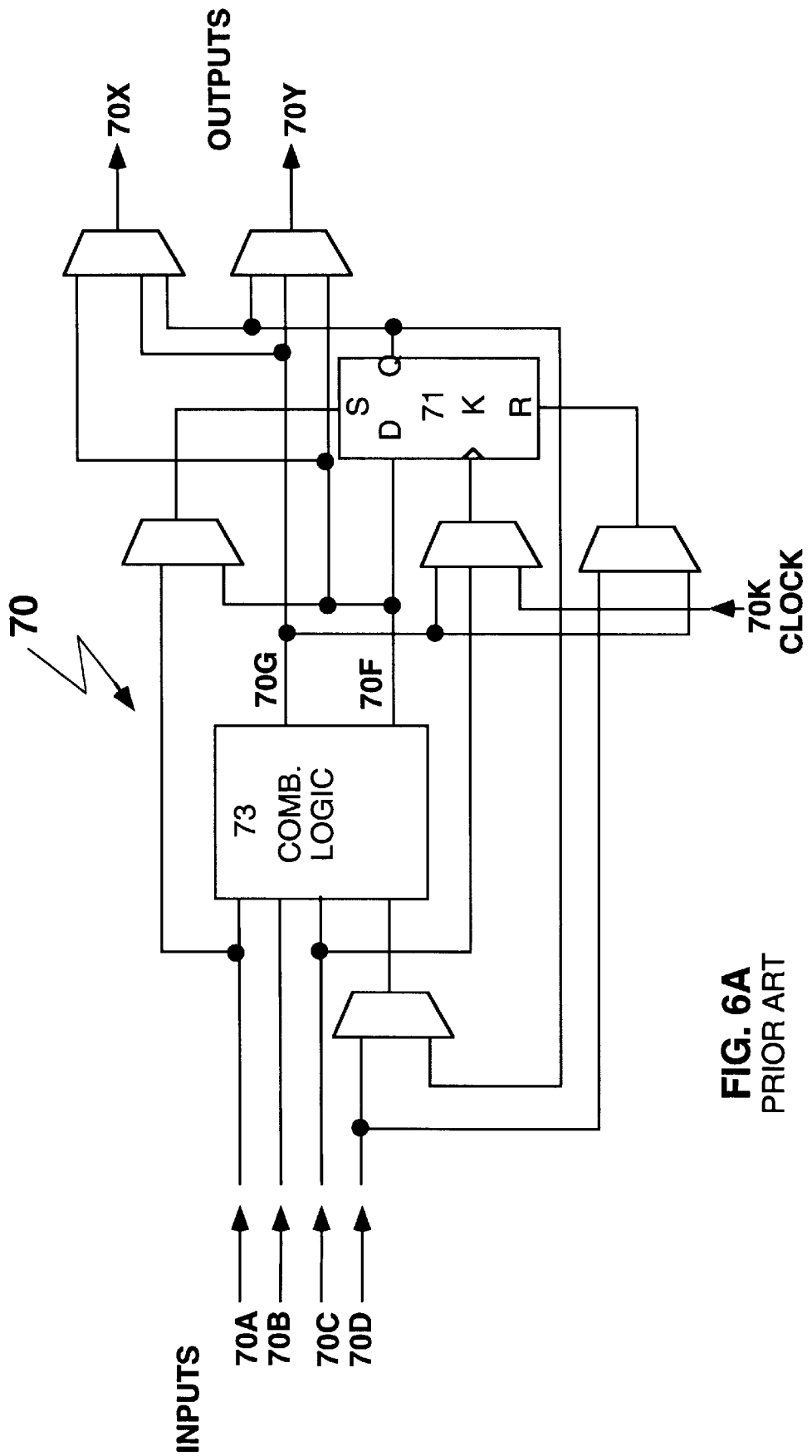
FIGS. 6A and 6B are block diagrams of a prior art configurable logic block and a prior art switch matrix.
Figure 6B:
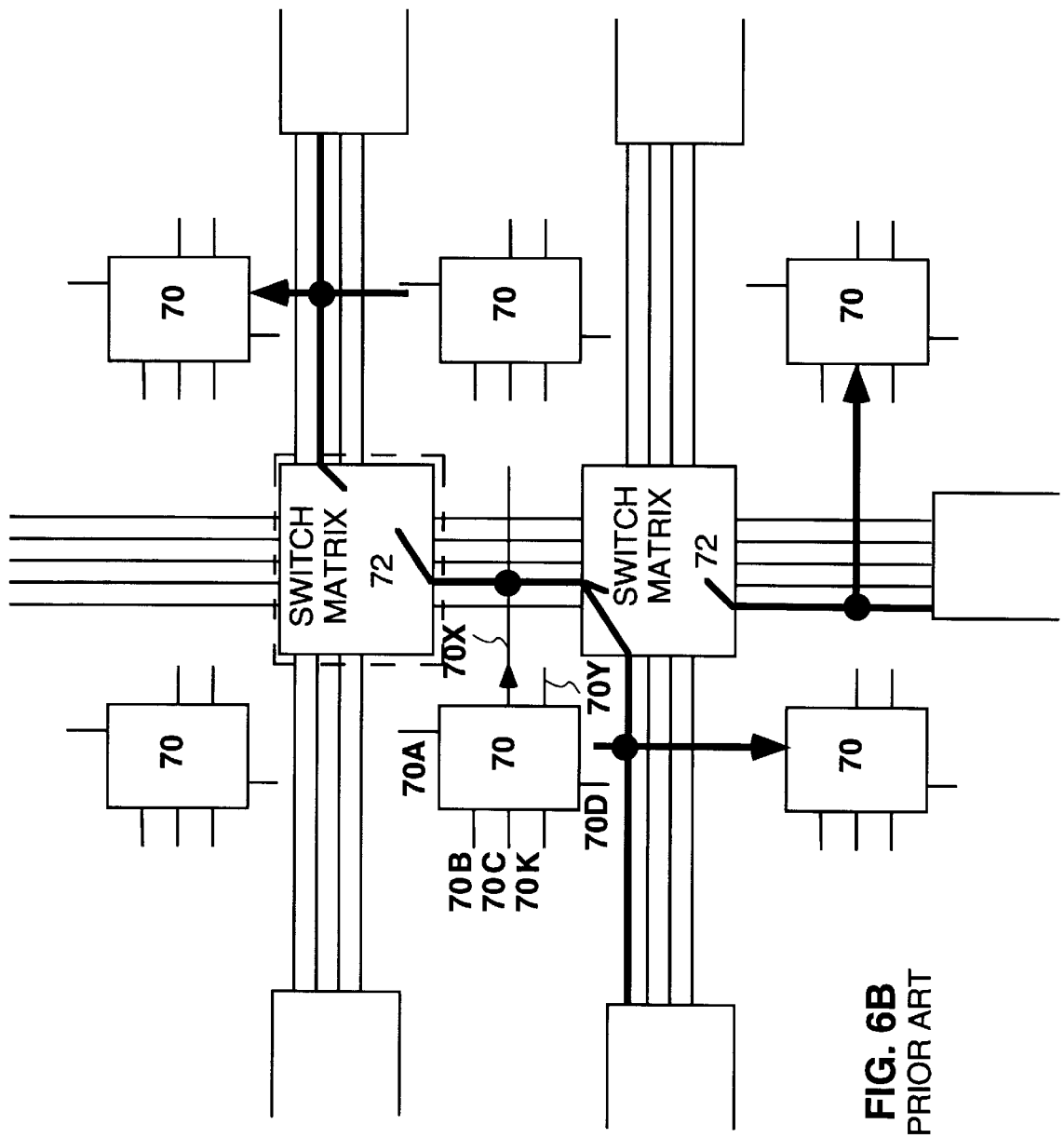
Figure 8:
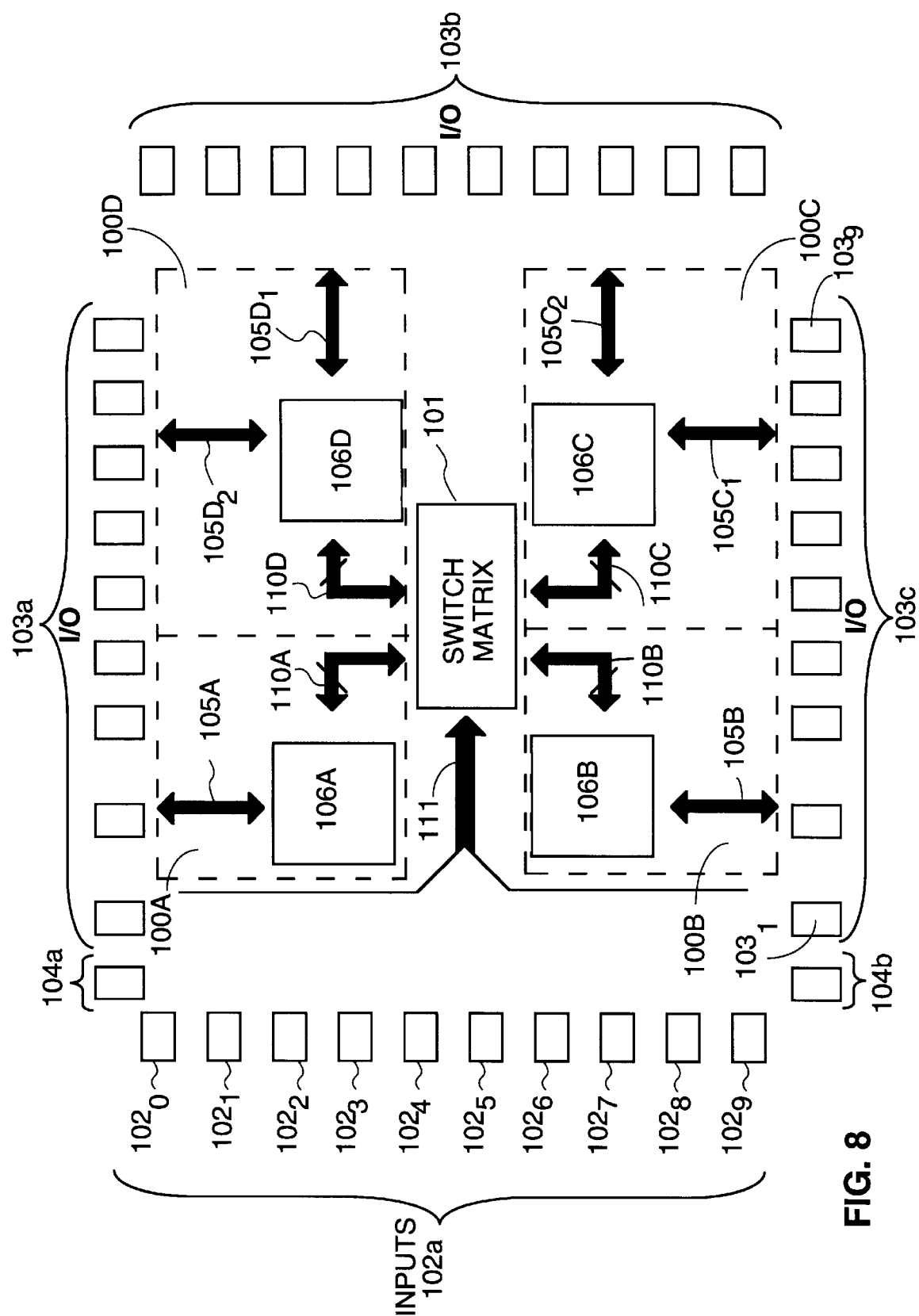
FIG. 8 is a conceptual block diagram of another embodiment of a programmable logic device according to the principles of this invention.

In FIG. 8, an integrated circuit package containing an integrated circuit chip with four programmable logic quadrants (cells) 100A, 10B, 100C, 100D and a programmable switch matrix 101 is conceptually illustrated. Each logic quadrant 10A, 10B, 100C, 100D, contains a programmable logic circuit 106A, 106B, 106C, 106D and means for coupling 105A, 105B, $105C_1$, $105C_2$, $105D_1$, $105D_2$ each logic circuit to the integrated circuit package pins. Hence, in this embodiment, as in FIG. 5, a means for coupling input signals and feedback signals, programmable switch matrix 101 (FIG. 8), with multiple programmable logic circuits is provided.

Specifically, a first selected group of integrated circuit package pins 102A are dedicated input pins 102 that are coupled by a first coupling means 111 to switch matrix 101. Coupling means 111 has programmable combinatorial and registered/latched (registered) circuit paths from input pins 102A to switch matrix 101. A second selected group of the package pins 103A, 103B, 103C are bidirectional I/O pins 103, which are coupled to four programmable logic circuits 106A, 106B, 106C, 106D by second coupling means 105A, 105B, $105C_1$, $105C_2$, $105D_1$, $105D_2$. Each of the second coupling means is programmable such that I/O pin 103 either provides an input signal to a logic quadrant or receives an output signal from a logic quadrant.

Each coupling means 105 has programmable circuitry such that either a combinatorial input path or a registered/latched input path can be established between a package pin and a logic quadrant. The combinatorial input path passes the input signal to the input line of a logic quadrant, while the registered/latched input path passes the input signal to the input terminal of a programmable storage element, and the programmable storage element, subsequently passes a signal to the input line of a logic quadrant. Similarly, each coupling means 105 includes programmable circuitry so that selected output lines from a logic circuit are coupled to an I/O pin by either a combinatorial output path or a registered/latched output path. A third group of the integrated circuit package pins 104A, 104B are global clock input pins. The global clock input pins provide synchronous clock signals to coupling means 105, 111.

Each of the four logic circuits 106A, 106B, 106C, 106D may be a PLA circuit, a PAL circuit, a NAND.NAND circuit, or a NOR.NOR circuit for example. In one embodiment, circuits 106A, 106B, 106C, 106D are programmable AND/OR logic array based PAL circuits. Each programmable AND/OR array based circuit provides 3,200 (80×40) programmable $E^2$ cells for logic flexibility. Each quadrant has twenty input lines which drive eighty product terms. Seventy-six of the product terms are used for logic functions and the other four are used for control functions, as described more completely in U.S. Pat. No. 4,963,768, entitled "Flexible, Programmable Cell Array Interconnected by A Programmable Switch Matrix," issued to Mr. Om Agrawal et al. on Oct. 16, 1990, which is incorporated herein by reference in its entirety. This segmented structure retains the benefits of a traditional PAL such as the wide input decoding, multiplexing and demultiplexing capability, without increasing the array proportionally to the number of input lines. Further, the array size and the coupling means have been selected so that the programmable logic device of this invention achieves an optimum balance of functionality, silicon die size, and performance.

The segmented structure and performance of the programmable logic device of this invention is further enhanced by a switch matrix 101. Switch matrix 101 is connected to each of the logic circuits 106A, 106B, 106C, and 106D and is coupled by means 111 to dedicated input pins 102A. Switch matrix 101, described more completely below, provides a high speed programmable means for selectively transferring signals between logic circuits 106A–106D for selectively providing input signals to logic circuits 106A–106D, and for selectively feeding signals back to a logic circuit. Hence, switch matrix 101 (FIG. 8) performs a function similar to input multiplexers $I_1$, $I_2$ (FIG. 7). Effectively, the programmable logic device of this invention is an array of four programmable logic devices interconnected by switch matrix 101.

While the invention is described in terms of a programmable AND/OR array, the programmable AND/OR array is implemented in a preferred embodiment as a NOR.NOR array that is functionally equivalent to the programmable AND/OR array described herein. As discussed more completely below, logic circuit 106A may also be a programmable OR array/fixed AND array, a PLA (programmable AND array and a programmable OR array), a NOR.NOR array, or a NAND.NAND array, for example. Accordingly, the use of a programmable AND/OR logic array is illustrative only and is not intended to limit the scope of the invention.

In the previous embodiment, the programmable logic quadrants 100A, 100B, 100C and 100D were diagonally symmetric, i.e. quadrants 100A and 100C were identical and quadrants 100B and 100D were identical. Each programmable logic quadrant 100A–100D included a programmable array 106, buried cells, output cells, input cells, feedback cells, and switch matrix cells. See for example FIGS. 7A, 7B, 8A, and 8B of U.S. Pat. No. 4,963,768.

This architecture provides significant flexibility, high speed performance, and better silicon die efficiency than prior art programmable logic device structures. While the above embodiment provides significant advantages over prior art devices, further enhancement in silicon die efficiency, speed, and flexibility are achieved by utilizing symmetric programmable logic blocks rather than only diagonally symmetric quadrants as in the above embodiment. In the embodiment described below, the product term flexibility is further enhanced.

In one embodiment, electrically programmable logic device 400 (FIG. 9) includes a plurality of identical programmable logic blocks 402, arranged in an array. Programmable logic blocks 402 are interconnected through programmable switch matrix 401. Programmable logic blocks 402 communicate with each other only through switch matrix 401. Moreover, programmable logic blocks 402 receive all input signals from switch matrix 401. Thus, programmable logic blocks 402 may be viewed as independent programmable logic devices on the same integrated circuit chip.

Each programmable logic block 402 may receive a first plurality of input signals from a plurality of input/output (I/O) pins 403 through switch matrix 401. The input signals, as explained more completely below, are passed through block 402 to switch matrix 401. Dedicated input pins 404 provide another plurality of input signals to switch matrix 401. The input signals processed by any logic block 402 are the signals received on input lines 426 from switch matrix 401. Each programmable logic block 402 may also provide a first plurality of output signals for I/O pins 403.

Each of programmable logic blocks 402 may include a PLA circuit, a PAL circuit, a programmable NAND.NAND circuit, or a programmable NOR.NOR circuit for example.

In one embodiment, each programmable logic block 402 includes a programmable AND/OR logic array based PAL circuit. Each programmable logic block 402 has the same fixed number of input lines from switch matrix 401 which drive on the order of eighty product terms.

This segmented structure, like the other embodiments described above, retains the benefits of a traditional PAL circuit such as the wide input decoding, multiplexing and demultiplexing capability, without increasing the array proportionally to the number of input lines. Further, the array size and switch matrix 401 have been selected so that programmable logic device 400 of this invention achieves an optimum balance of functionality, silicon die size, and performance, in particular speed performance.

An important aspect of this invention is the fixed number of input lines to each programmable logic block 402 from switch matrix 401. As described more completely below, this feature maintains the speed performance of the device as the input/output capability is increased and this feature enhances the designer's ability to migrate a design to other devices in the family of programmable logic device 400.

Prior art devices typically provide to the programmable logic array one input line for each logic macrocell in the programmable logic block and one input line to the programmable logic array for each dedicated input pin. Each input line to the programmable logic array typically drives two lines within the array. Hence, in these prior art devices, as the number of physical pins increases the number of macrocells increases and consequently the number of input lines to the programmable logic array. As the number of input lines increases, the programmable logic array size increases. The larger array size results in poor speed performance and poor utilization of the array. Also, increasing the size of the programmable logic array limits migrating designs to other devices with enhanced input/output capability.

Figure 9:
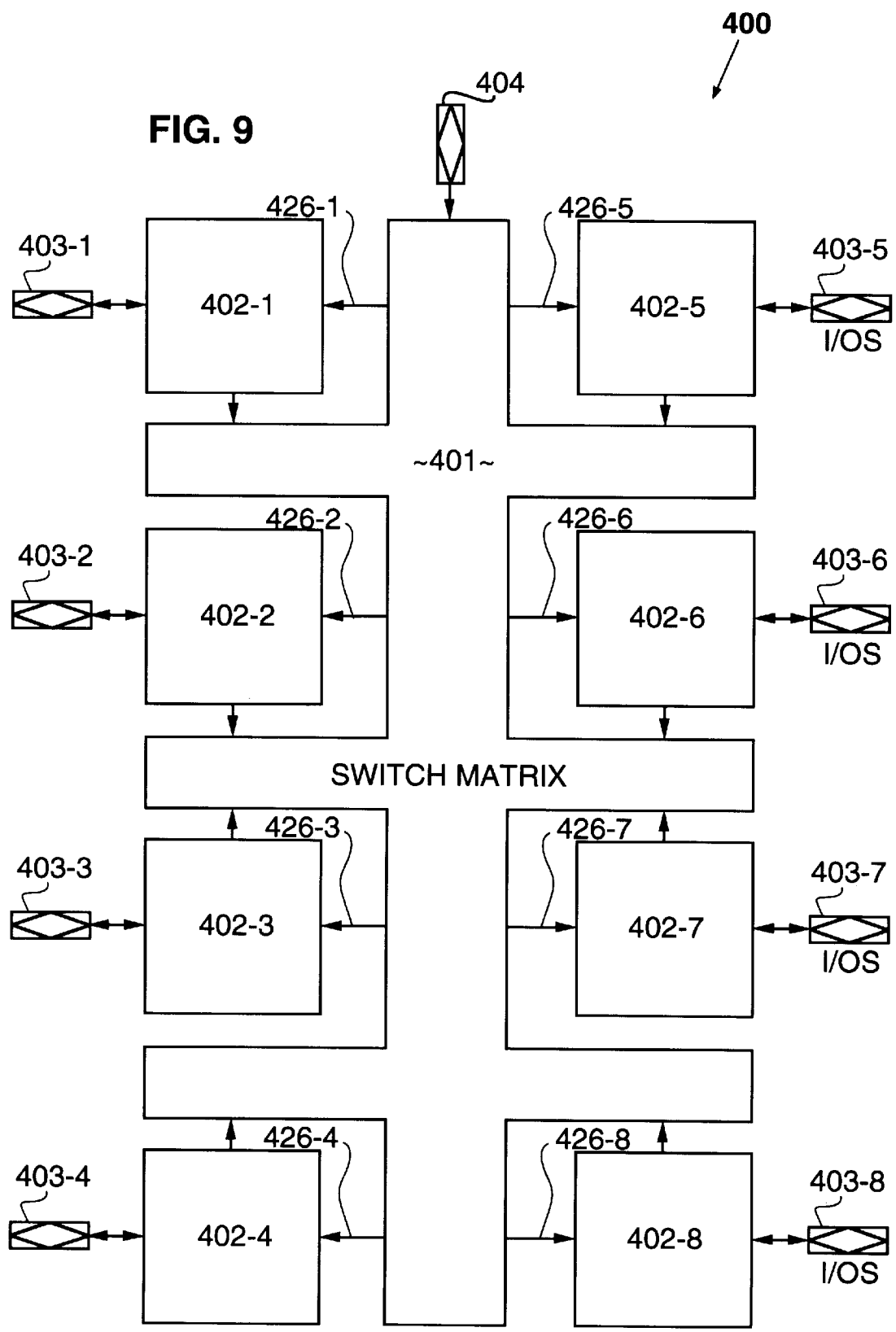
FIG. 9 is a conceptual block diagram of an embodiment of a programmable logic device having complete symmetry according to the principles of this invention.

Another important aspect in one embodiment of this invention is the complete symmetry of programmable logic device 400. Each of the programmable logic blocks 402 in device 400 are identical. Moreover, programmable logic blocks 402 in programmable logic device 400 are preferably arranged symmetrically around switch matrix 401 (FIG. 9). The symmetry simplifies the development of the silicon die by the silicon chip designer and the design of a system using the PLD of this invention by the system designer. Also, without the inherent symmetry, the development of software tools for the PLD is more difficult.

Switch matrix 401 provides a means for selecting input signals for each programmable logic block 402. Switch matrix 402 can route signals from one block to another block, signals from the dedicated input pins to a block or blocks and a signal from a block back to that block. Signal transfer through this switch matrix is very rapid and signal path flexibility through the switch matrix for each programmable logic block provides numerous combinations of input signals to each programmable logic block of the device, as described more completely below. Also, switch matrix 4.01 provides a fixed, path independent, uniform, predictable and deterministic time delay for signals routed through switch matrix 401.

In one embodiment, switch matrix 401 is implemented using programmable multiplexers. As described more completely below, multiple configurations of switch matrix 401 are feasible using programmable multiplexers. The number of multiplexers and size of each multiplexer is a tradeoff between the size of the die, silicon utilization, and speed performance. A preferred embodiment is described below and in view of this discussion other embodiments will be apparent to those skilled in the art.

Figure 10:
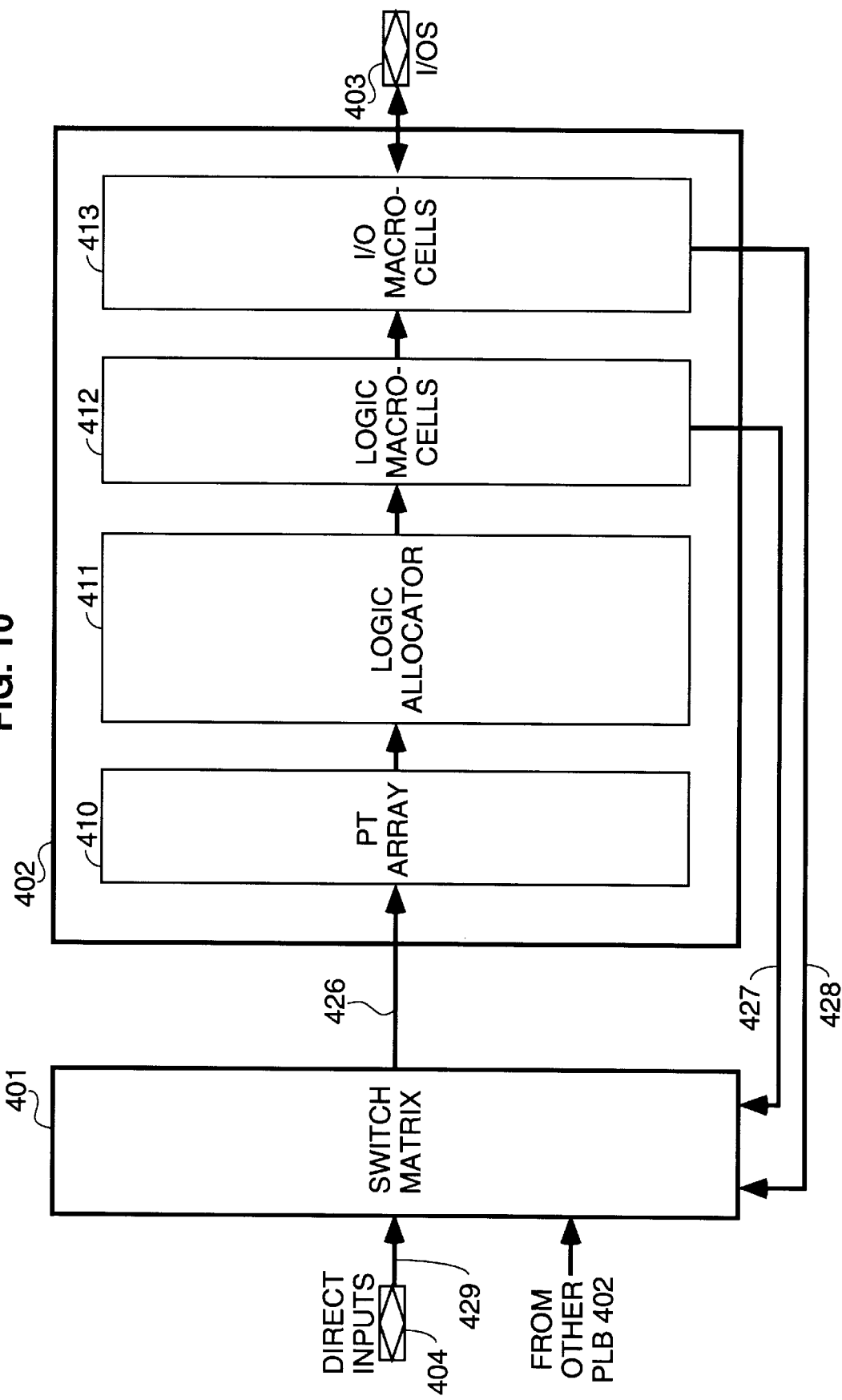
FIG. 10 is a more detailed block diagram of the programmable logic block of this invention.

As illustrated in more detail in FIG. 10, each programmable logic block 402 contains a programmable logic array, for example a product-term array 410, a logic allocator 411, programmable logic macrocells 412, and I/O macrocells 413. Product-term array 410 generates the basic logic using signals provided only by switch matrix 401.

While programmable logic array 410 is described in terms of a programmable AND/OR array, the programmable AND/OR array is implemented in a preferred embodiment as a NOR.NOR array that is functionally equivalent to the programmable AND/OR array described herein. As discussed more completely below, product term array 410 may also be a programmable OR array/fixed AND array, a PLA (programmable AND array and a programmable OR array), a NOR.NOR array, or a NAND.NAND array, for example. Accordingly, the use of a programmable AND/OR logic array is illustrative only and is not intended to limit the scope of the invention.

Logic allocator 411 is programmable so that product terms from array 410 are distributed to logic macrocells 412 as required by the user of device 400. Logic macrocells 412 configure the signals from logic allocator 411 as explained more completely below. Each logic macrocell includes a programmable storage element.

The output signals from logic macrocells 412 are provided to I/O macrocells 413 and fedback to switch matrix 401 over lines 427. Each logic macrocell that may be used to generate an output signal is coupled to an I/O macrocell. I/O macrocells 413 selectively deliver the output signals from macrocells 413 to I/O pins 403. Alternatively, I/O macrocells 413 provide input signals from I/O pins 403 to switch matrix 401 over lines 428. If an I/O cell is used to configure an I/O pin as an input pin, the logic macrocell associated with that I/O cell can function as a buried logic macrocell. Hence, as explained more completely below, the architecture of programmable logic device 400 is designed for efficient use of all the resources within the device.

Each programmable logic block 402 additionally contains, in one embodiment, an asynchronous reset product term and an asynchronous preset product term. These product terms are used to initialize all flip-flops within programmable logic block 402. In addition, in one embodiment, each programmable logic block 402 contains two output enable product terms for every eight I/O macrocells in the block. In another embodiment, each programmable logic block 402 contains two output enable product terms for every six I/O macrocells in the block. In each programmable logic block 402, I/O macrocells 413 are divided into banks where each bank, in this embodiment, contains either eight or six I/O macrocells. Each bank of I/O macrocells 413 receives two of the output enable product terms.

Thus, each programmable logic block 402, in this embodiment, has a multiplicity of product terms in product term array 410 which provide control functions to all macrocells in block 402. In contrast, most prior art EPLDs had a plurality of control product terms associated with each macrocell. In most synchronous registered applications, the prior art plurality of control product terms were not completely utilized. Thus, prior art devices with a plurality of control product terms per macrocell were typically very inefficient. Consequently, the die size and the cost of the prior art devices were larger than required. In contrast, the control product terms of this invention provide functionality equivalent to that typically implemented with prior art devices while eliminating the inefficient use of resources within the device.

As described more completely below, programmable interconnections within each programmable logic block 402 are used to decouple product-term array 410 from switch matrix 401, macrocells 412, 413 and I/O pins 403. This decoupling provides greater flexibility than was available in the prior art programmable logic devices and allows device 400 to be efficiently and quickly configured for a user application. Another significant advantage of this architecture is that switch matrix 401 provides a fixed, path independent uniform predictable and deterministic time delay for all signals that are passed through switch matrix 401. Hence, in many circumstances, the performance of a design is design-independent and is known before the design is even begun.

In addition, switch matrix 401 allows optimized global connectivity and high silicon efficiency. In this embodiment, the delay time through switch matrix 401 for connecting one programmable logic block to another programmable logic block is in the range of about one to two nanoseconds. However, this delay time is technology dependent and a switch matrix implemented using a new advanced technology should have even less time delay. In contrast, prior art centralized programmable interconnect array based architectures had an interblock delay time in the range of from 13 to 16 nanoseconds. The high internal speed of switch matrix 401 of this invention allows a programmable logic block to communicate with other programmable logic blocks without the normal output buffer delays.

The decoupling of the internal resources within a programmable logic block 402 is in sharp contrast to the prior art programmable logic device families. Historically, two of the most popular synchronous programmable logic device families have been the industry standard low complexity 16R8/16V8 architecture programmable logic devices and the medium complexity 22V10 architecture programmable logic devices. Each of these device architectures includes a programmable AND-OR array.

In each of these three industry standard synchronous programmable logic devices, i.e., the 16R8, 16V8 and 22V10 devices, the AND-OR array is strongly coupled with the macrocells, i.e., the product terms associated with each of the macrocells belong to that particular macrocell only. The macrocells are also strongly coupled with the I/O pins. If the I/O pin is used as the input pin then the register associated with the I/O pin is lost. These devices do not provide the capability of operating the storage elements as buried registers. Also, a dedicated output enable product term for each of the I/O pins results in inefficient product term array utilization.

The major shortcomings of the existing synchronous programmable logic devices have been (i) complete coupling of macrocells with the AND-OR array and I/O pins, (ii) static allocation of product terms with macrocells, (iii) the absence of T-type flip-flops within the macrocells for building counters, (iv) the lack of flexible clock source selection, (v) the dedication of individual output enable product terms for each I/O pin; (vi) a limited number of I/O pins; and (vii) a limited number of macrocells.

Moreover, complete coupling of macrocells to the programmable array and the I/O pins with fixed, static allocation of product terms for logic and control function results in poor silicon efficiency and speed degradation. Also, migration of the architecture into high density structures becomes extremely difficult. In particular, prior art devices, which have increased numbers of I/O pins and macrocells, typically have poor speed performance and the architecture is not amenable to increased density because, as explained above, the product term array is further enlarged as the number of macrocells increases.

In contrast, programmable logic blocks 402 (FIG. 10) of this embodiment provide a simple high performance, yet flexible dense and scalable architecture. Programmable logic blocks 402 include the best features of the popular industry standard programmable logic devices as described above, such as architectural simplicity with a single programmable logic array and macrocell structures, along with decoupled elements and an optimized global connectivity with fixed high speed predictable delays. Programmable logic blocks 402 eliminate the poor silicon efficiency of the prior art devices.

In one embodiment, programmable logic device 400 of this invention is implemented with 0.8 micron double metal, electrically erasable CMOS technology. Further, for this technology, device 400 has about a 15 nanosecond worst case pin-to-pin signal propagation delay time with a 50 Mhz external system clock. However, it is anticipated that with new technology, the architecture of this invention will have even faster speed performance, e.g., a 12 nanosecond propagation time delay with external system clock in the range of 66 to 80 MHz and possibly even faster. Moreover, according to the principles of this invention, the logic macrocells, both output and buried, are decoupled from the product term array by the switch matrix and the logic allocator. As the number of macrocells is increased, the product term array is not proportionally affected. Therefore, unlike the prior art devices, the product term array of this invention does not degrade speed performance as the density of macrocells is increased.

In fact, as the logic macrocell density is increased, the pin-to-pin signal propagation delay time remains about constant because the switch matrix provides a fixed known delay, and the product term array size is maintained. Thus, a design implemented with one device of this invention is easily migrated to a device having more macrocell capability. As explained more completely below, with this architecture there is no longer a need to trade device speed for macrocell density.

Symmetric programmable logic device 400 with programmable switch interconnect matrix 401, in this embodiment, is further subdivided into two families. A first family 400A (Table 1) includes 44, 68, and 84 pin devices with 32, 48 and 64 logic macrocells respectively. This family, with a high pin-to-logic ratio, is targeted to address I/O intensive applications.

Conversely, a second family 400B (Table 1), with a high logic-to-pin ratio, is targeted to address logic intensive applications. The second family offers twice the logic capability of the first family in the same package. The use of two families provides a convenient way for migrating designs up or down with little difficulty. The I/O and logic intensive nature of the families offers system designers broader options, allowing them to suit their designs to appropriate devices.

The features for several embodiments of each family are given in Table 1.

TABLE 1

|  | Pins | Logic Macrocells | I/O Macrocells | Max Inputs | Max Outputs | Max F/Fs |
| --- | --- | --- | --- | --- | --- | --- |
| Family 1 |  |  |  |  |  |  |
| | 110 | 44 | 32 | 32 | 38 | 32 | 32 |
| | 120 | 68 | 48 | 48 | 56 | 48 | 48 |
| | 130 | 84 | 64 | 64 | 70 | 64 | 64 |
| Family 2 |  |  |  |  |  |  |
| | 210 | 44 | 64 | 32 | 38 | 32 | 64 |
| | 220 | 68 | 96 | 48 | 56 | 48 | 96 |
| | 230 | 84 | 128 | 64 | 70 | 64 | 128 |

The column "Pins" in Table 1 is the total number of pins for the package containing programmable logic device 400. The columns "Max Inputs" and "Max Outputs" correspond to the total number of pins available for input signals and output signals, respectively. In this embodiment, each of the devices has either six or eight dedicated input pins. Further, as explained below, in PLDs 110 and 210, two of the dedicated input pins may function either as clock sources or input sources, while in PLDs 120, 130, 220, and 230, four of the dedicated input pins may function either as clock sources or input sources. The column "Max F/Fs" represents the maximum number of flip-flops in the PLD and as explained more completely below, in this embodiment each logic macrocell in both families includes one programmable storage element.

FIGS. 11, 12A, 12B, 13A and 13B are block diagrams illustrating the first family 400A of programmable logic devices 110, 120 and 130, respectively, according to the principles of this invention. (In the figures, a component with "A1" in the reference numeral is a component in device 110, with "A2" in the reference numeral is a component in device 120, and with "A3" in the reference numeral is a component in device 130.)

Figure 11:
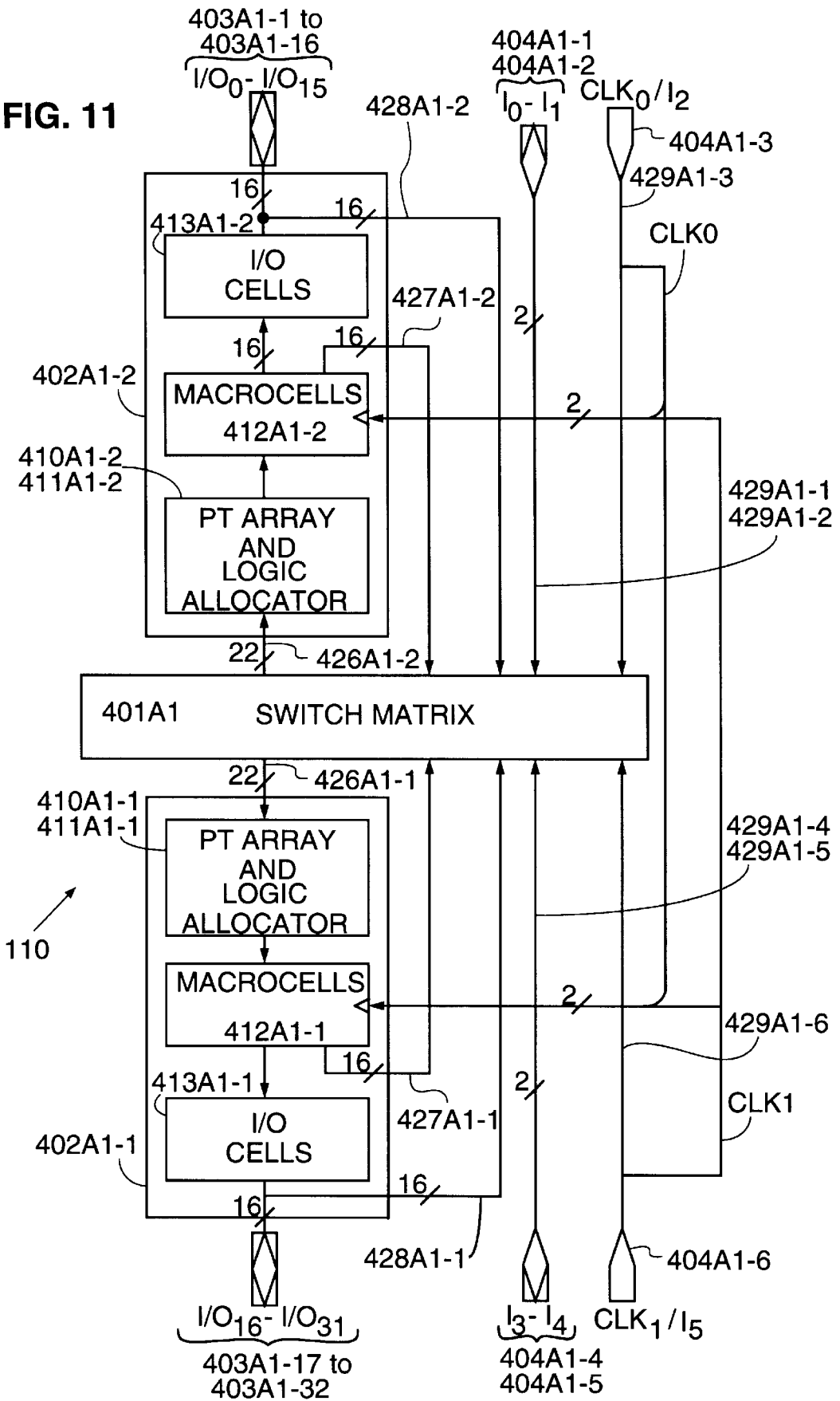
FIG. 11 is a more detailed block diagram of a first embodiment of a programmable logic device in the first family of programmable logic device according to the principles of this invention.

FIG. 11 illustrates 44 pin device 110 which has 32 I/O pins 403A1-1 to 403A1-32 and six dedicated direct input pins 404A1-1 to 404A1-6. As previously described, each of programmable logic blocks 402A1-1, 402A1-2 is identical and each includes a programmable product term array, preferably a 44×70 product term array 410A1-1, 410A1-2, a programmable logic allocator 411A1-1, 411A1-2, 16 programmable logic macrocells 412A1-1, 412A1-2, and 16 programmable I/O macrocells 413A1-1, 413A1-2. Notice that in FIGS. 11, 12A, 12B, 13A and 13B, product term array 410A and logic allocator 411A have been combined and are represented by a single box 410A–411A.

In the figures, a line with a slash through the line and then a number N is used to indicate that the line represents N lines. Hence, switch matrix 401A1 provides twenty-two input signals to product term array 410A1-1 over twenty-two input lines 426A1-1. Similarly, logic macrocells 412A1-1 provide feedback signals to switch matrix 401A1 over sixteen lines 427A1-1 and I/O macrocells 413A1-1 provide I/O pin feedback signals to switch matrix 401A1 over sixteen lines 428A1-1. The other block 402A-2 is similarly configured.

In FIG. 11, two dedicated input pins 404A1-3, 404A1-6 are either a dedicated input pin, a dedicated clock pin, or a clock/input pin. Pins 404A1-3, 404A1-6 are coupled to switch matrix 401A1 and to logic macrocells 412A1.

Hereinafter for all PLDs of this invention, any pin that provides a clock signal may also provide a latch enable signal. The actual signal on the pin is determined by the configuration of the programmable storage element in the logic macrocell, as explained more completely below. Therefore, any reference, such as "CLK0", is actually "CLK0/LE0", but in most cases only the label "CLK0" is shown for simplicity. Herein, "/" is used to indicate a multiple function capability. The labeling such as "CLK0" is not intended to limit the operation of the dedicated input pins. In view of this disclosure, the operative signal required on each dedicated input pin for proper functioning of the programmable storage elements in the logic macrocells will be apparent to those skilled in the art.

Figure 12A:
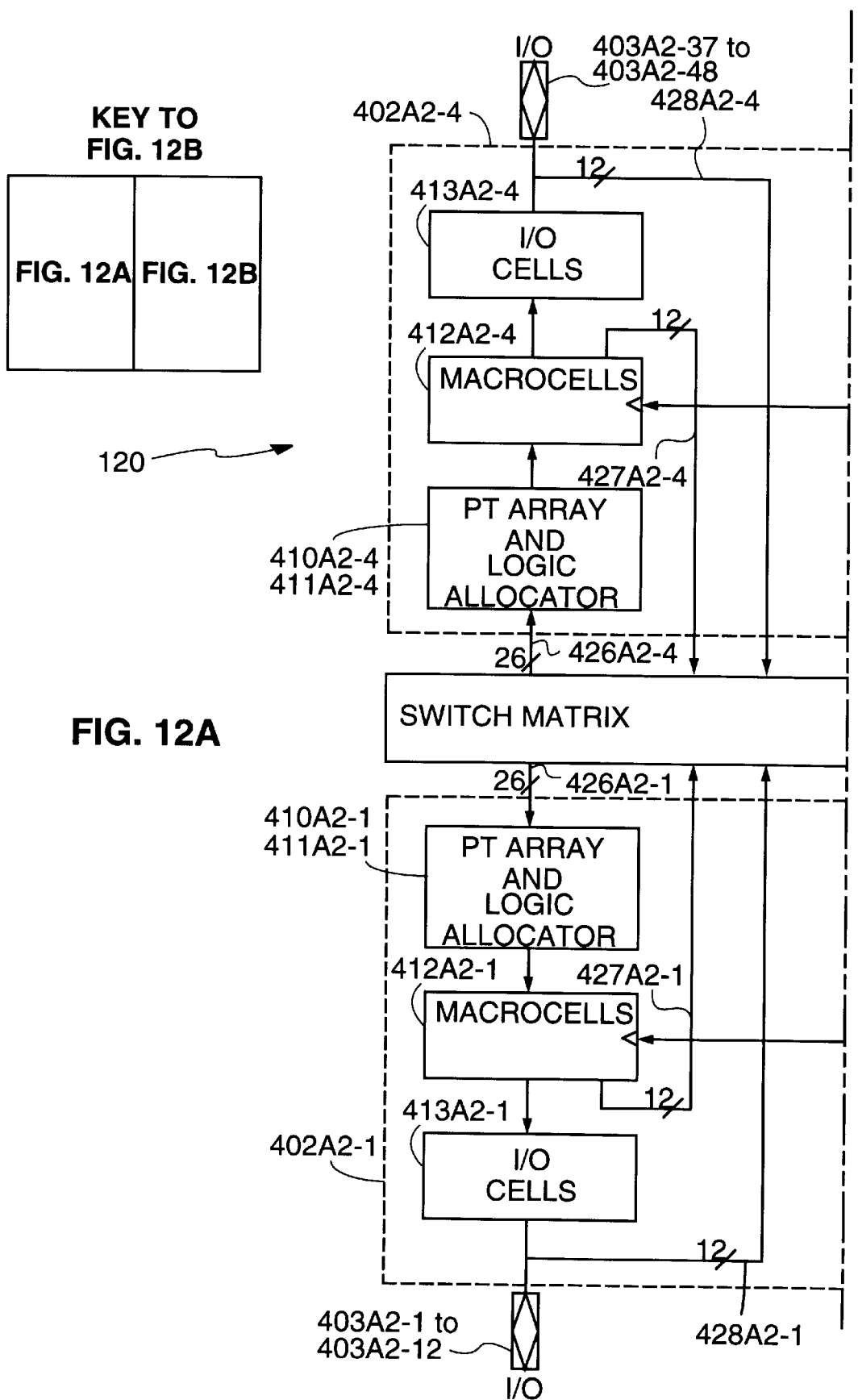
FIGS. 12A and 12B are a more detailed block diagram of a second embodiment of a programmable logic device in the first family of programmable logic device according to the principles of this invention.
Figure 12B:
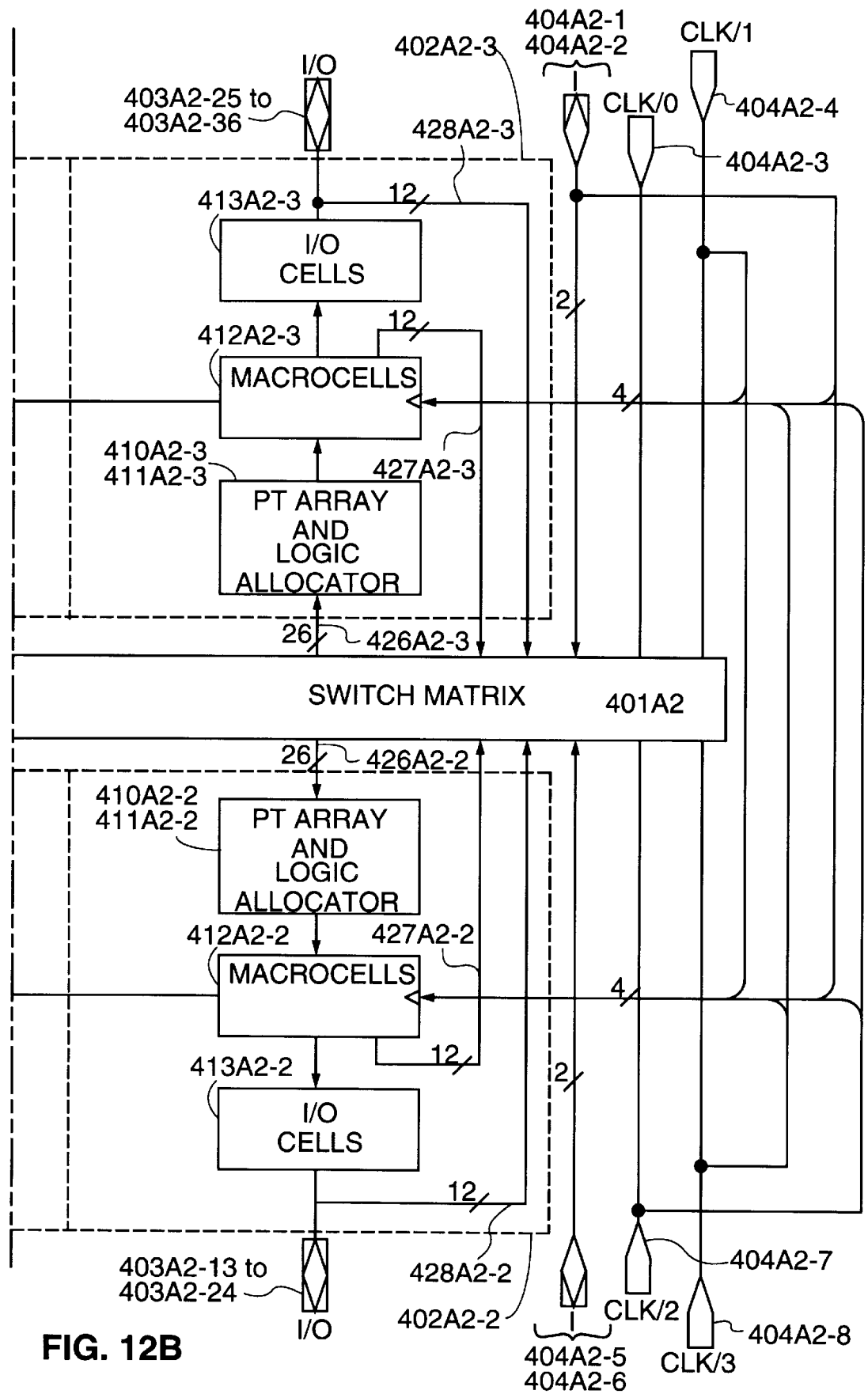

FIG. 12A and 12B are similar to FIG. 11 but in this embodiment, programmable logic device 120 includes four identical programmable logic blocks 402A2 and has eight dedicated input pins, four of which may be used as either dedicated clock signal input pins, dedicated direct input pins, or dedicated clock/input pins.

Specifically, FIGS. 12A and 12B illustrates 68 pin device 120 which has 48 I/O pins 403A2-1 to 403A2-48 and eight dedicated direct input pins 404A2-1 to 404A2-8. As previously described, each of the programmable logic blocks 402A2-1 to 402A2-4 is identical and each includes a programmable product term array, preferably a 52×54 product term array 410A2-1 to 410A2-4, a programmable logic allocator 411A2-1 to 411A2-4, 12 programmable logic macrocells 412A2-1 to 412A2-4, and 12 programmable I/O macrocells 413A2-1 to 413A2-4.

A second embodiment 401A2 of switch matrix 401 provides twenty-six input signals to product term array 410A2-1 over twenty-six input lines 426A2-1. Similarly, logic macrocells 412A2-1 provide feedback signals to switch matrix 401A2 over twelve lines 427A2-1 and I/O macrocells 413A2-1 provide I/O pin feedback signals to switch matrix 401A2 over twelve lines 428A2-1. The other blocks in PLD 120 are similarly configured. In FIGS. 12A and 12B, four dedicated input pins 404A2-3, 404A2-4, 404A2-7 and 404A2-8 are used either as a dedicated input pin, a dedicated clock pin, or a clock/input pin. Pins 404A2-3, 404A2-4, 404A2-7 and 404A2-8 are coupled to switch matrix 401A2 and to logic macrocells 412A2.

Figure 13A:
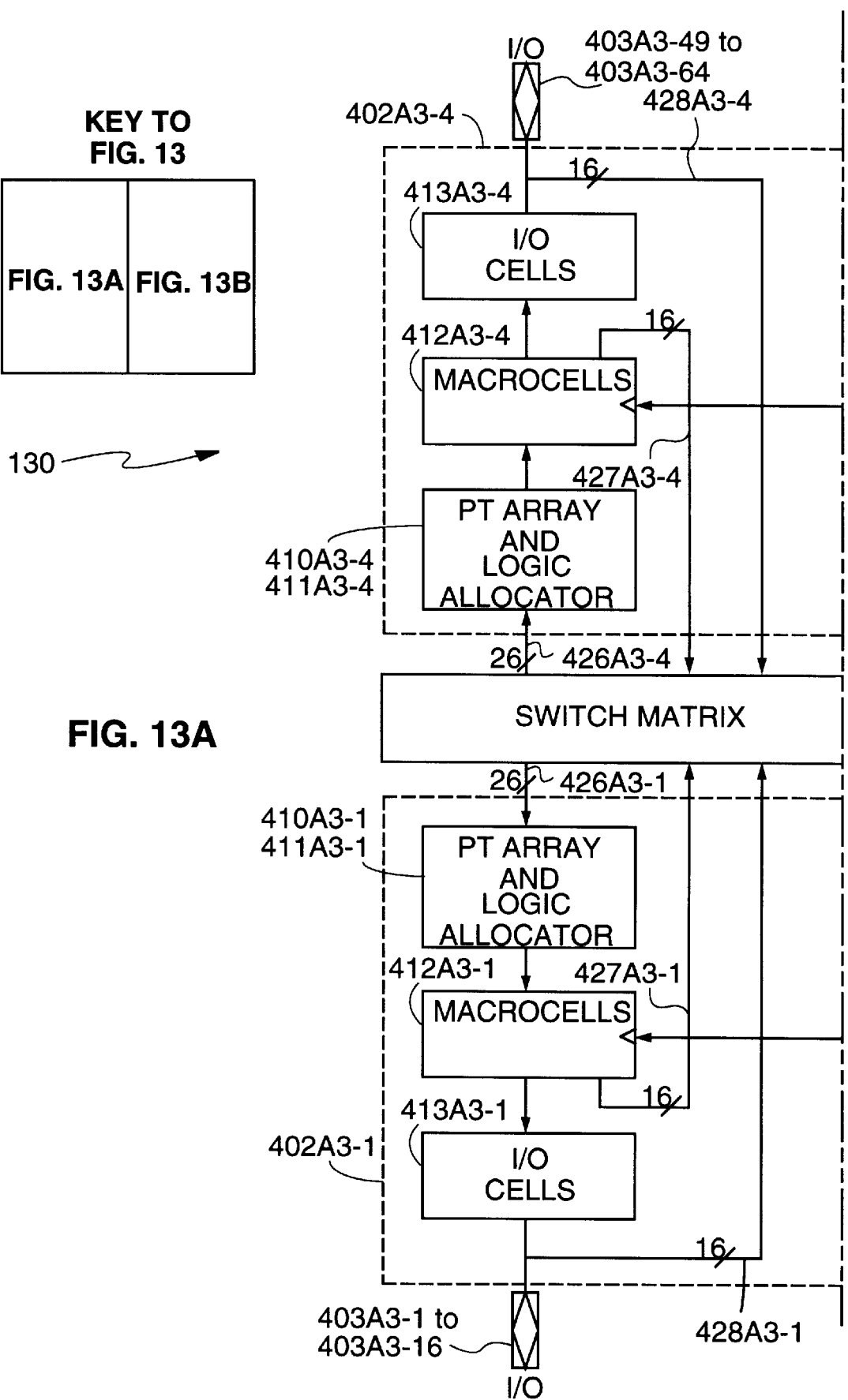
FIGS. 13A and 13B are a more detailed block diagram of a third embodiment of a programmable logic device in the first family of programmable logic device according to the principles of this invention.
Figure 13B:
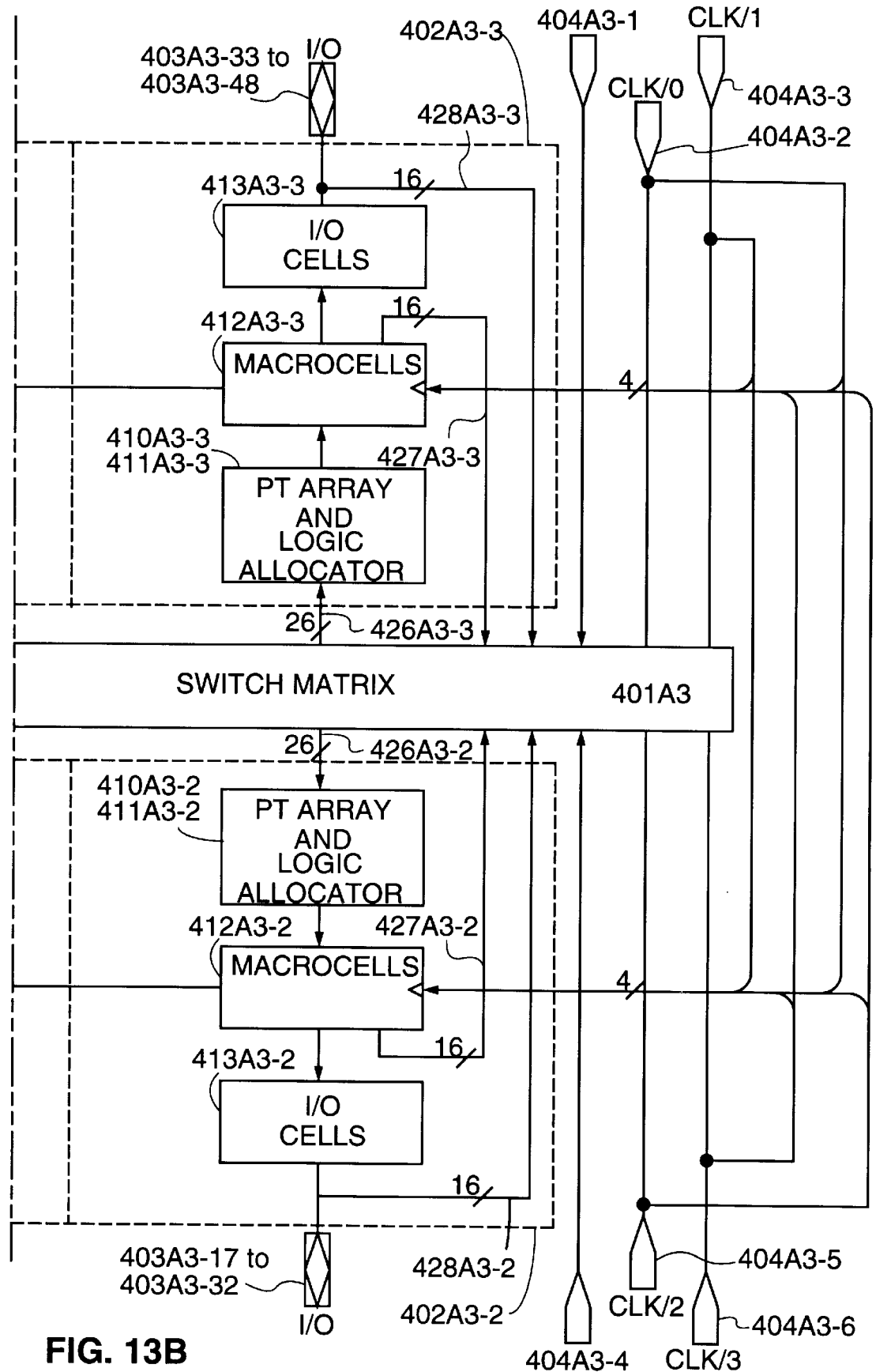

FIGS. 13A and 13B are similar to FIGS. 12A and 12B, but in this embodiment, programmable logic device 130 includes four identical programmable logic blocks 402A3 and has six dedicated input pins, four of which may be used as dedicated clock signal input pins, dedicated direct input pins, or clock/input pins.

Specifically, FIGS. 13A and 13B illustrate 84 pin device 130 which has 64 I/O pins 403A3-1 to 403A3-64 and six dedicated direct input pins 404A3-1 to 404A3-6. As previously described, each of the programmable logic blocks 402A3-1 to 402A3-4 is identical and each includes a programmable product term array, preferably a 52×70 product term array 410A3-1 to 410A3-4, a programmable logic allocator 411A3-1 to 411A3-4, 16 programmable logic macrocells 412A3-1 to 412A3-4, and 16 programmable I/O macrocells 413A3-1 to 413A3-4.

A third embodiment 401A3 of switch matrix 401 provides twenty-six input signals to product term array 410A3-1 over twenty-six input lines 426A3-1. Similarly, logic macrocells 412A3-1 provide feedback signals to switch matrix 401A3 over sixteen lines 427A3-1 and I/O macrocells 413A3-1 provide I/O pin feedback signals to switch matrix 401A3 over sixteen lines 428A3-1. Each of the other programmable logic blocks is similarly configured.

Four dedicated input pins 404A3-2, 404A3-3, 404A3-5 and 404A3-6 are either a dedicated input pin, a dedicated clock pin, or a clock/input pin. Pins 404A3-2, 404A3-3, 404A3-5 and 404A3-6 are coupled to switch matrix 401A3 and to logic macrocells 412A3.

FIGS. 14A through 16D are block diagrams of PLDs 210, 220, and 230 respectively of second family 400B of programmable logic devices according to the principles of this invention. As previously described, this family 400B of logic devices has a higher logic to pin ratio than the first family 400A. Thus, in one embodiment, each programmable logic block 402B has only eight I/O pins 403B. In another embodiment, each programmable logic block 402B has only six I/O pins 403B. Product term array 410B, logic allocator 411B and logic macrocells 412B in programmable logic block 402B are similar to the corresponding components in programmable logic block 402A. However, as explained more completely below, logic macrocells 412B include output logic macrocells 412BA and buried logic macrocells 412BB.

Figure 14A:
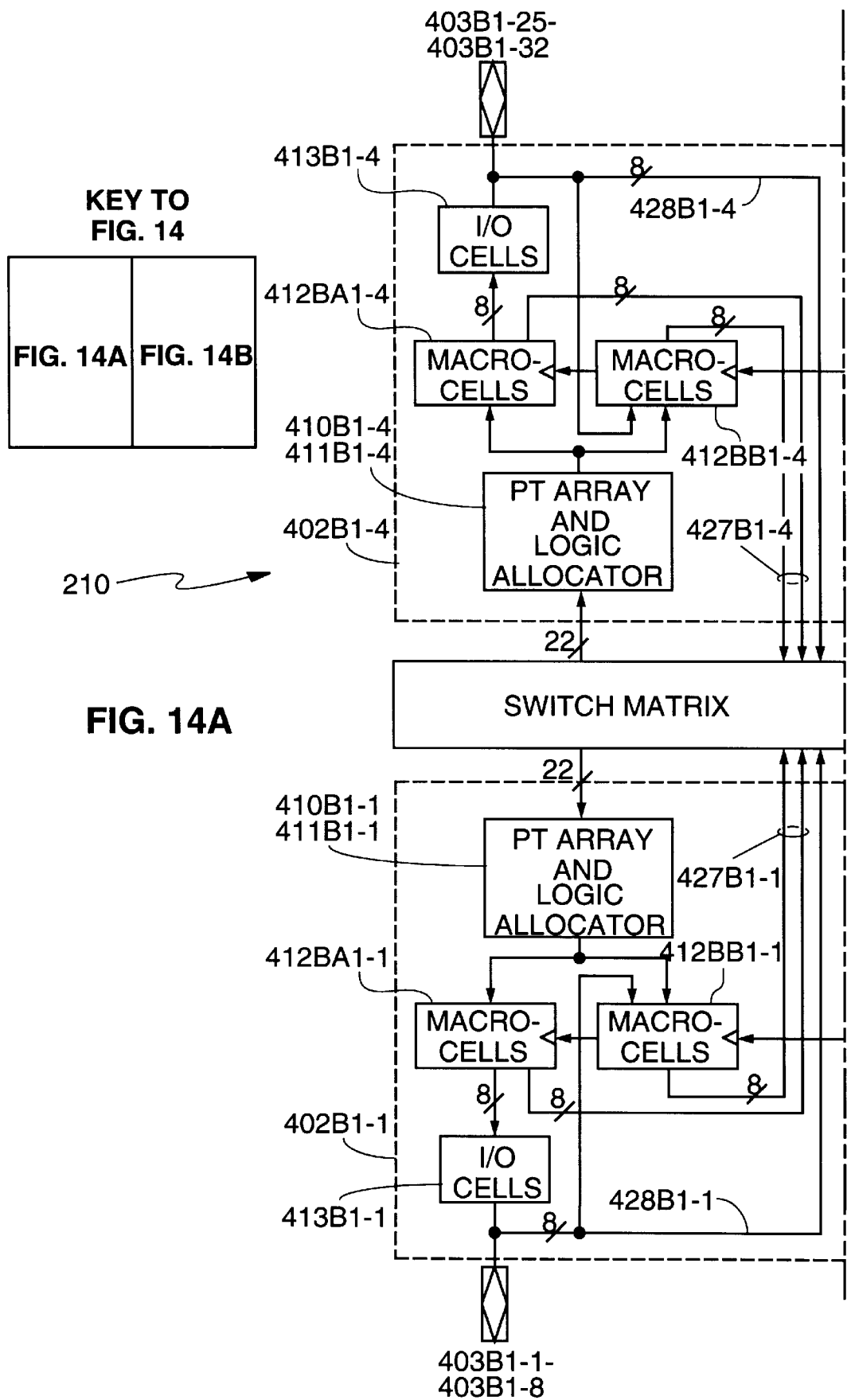
FIGS. 14A and 14B are a more detailed block diagram of a first embodiment of a programmable logic device in the second family of programmable logic device according to the principles of this invention.
Figure 14B:
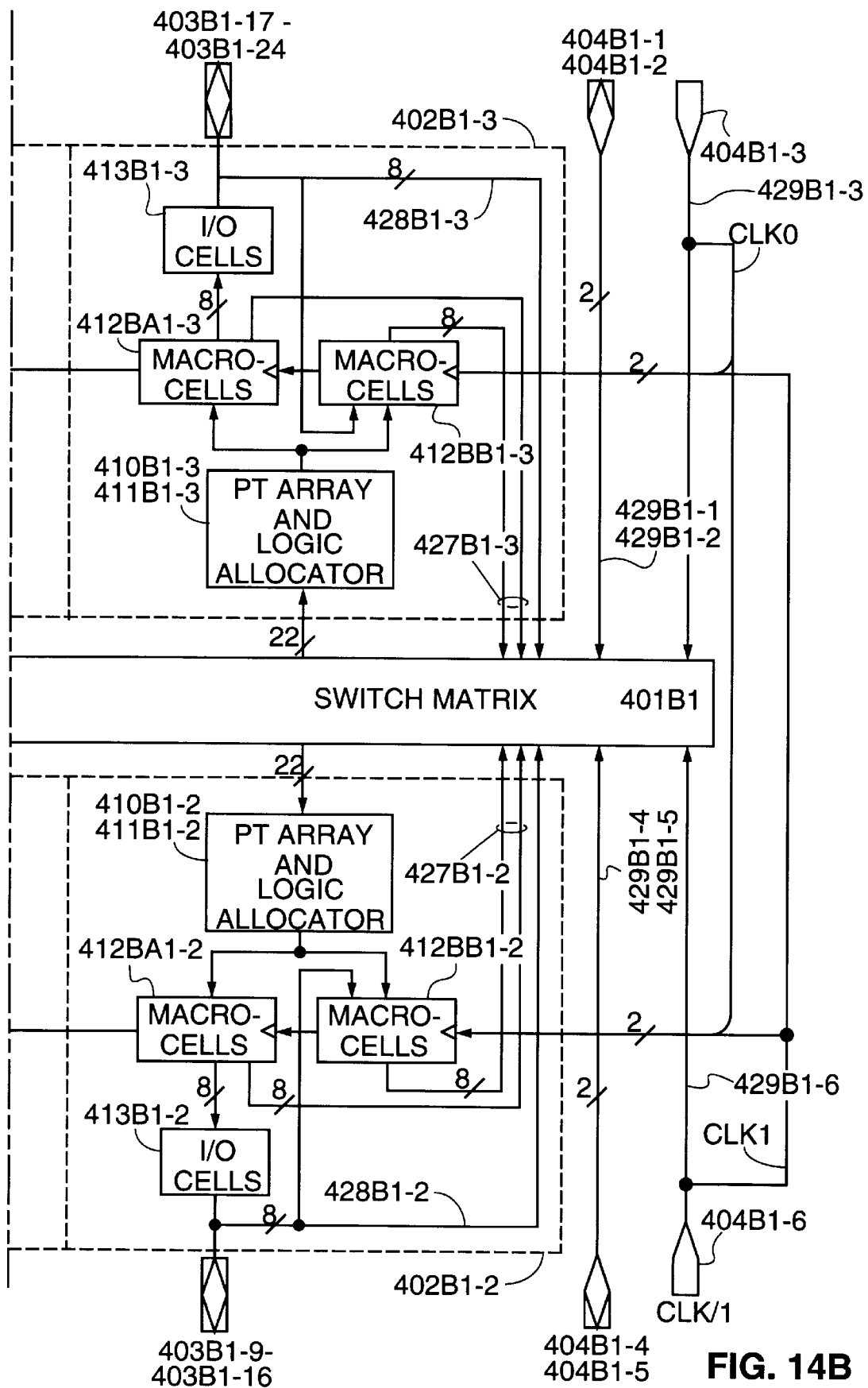
Figure 15A:
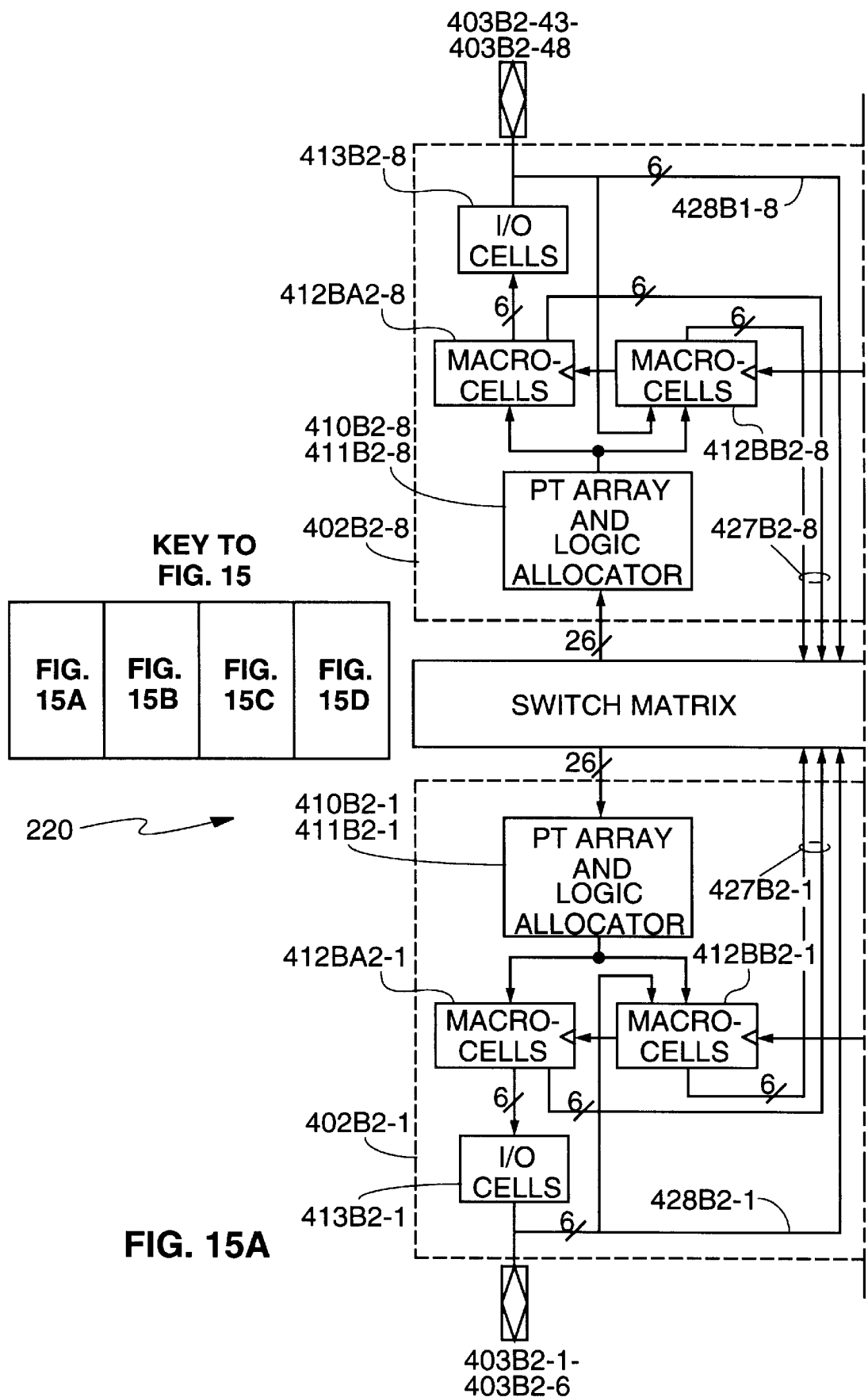
FIGS. 15A to 15D are a more detailed block diagram of a second embodiment of a programmable logic device in the second family of programmable logic device according to the principles of this invention.
Figure 15B:
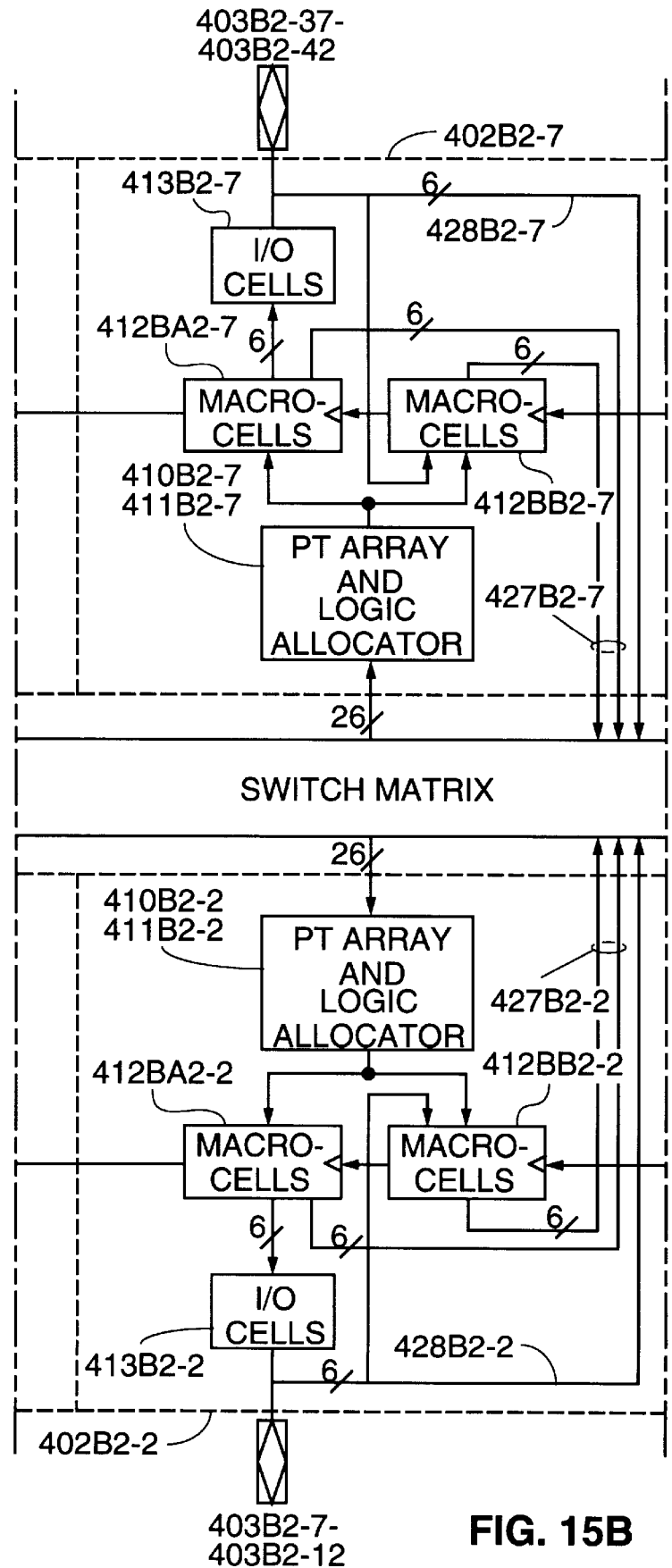
Figure 15C:
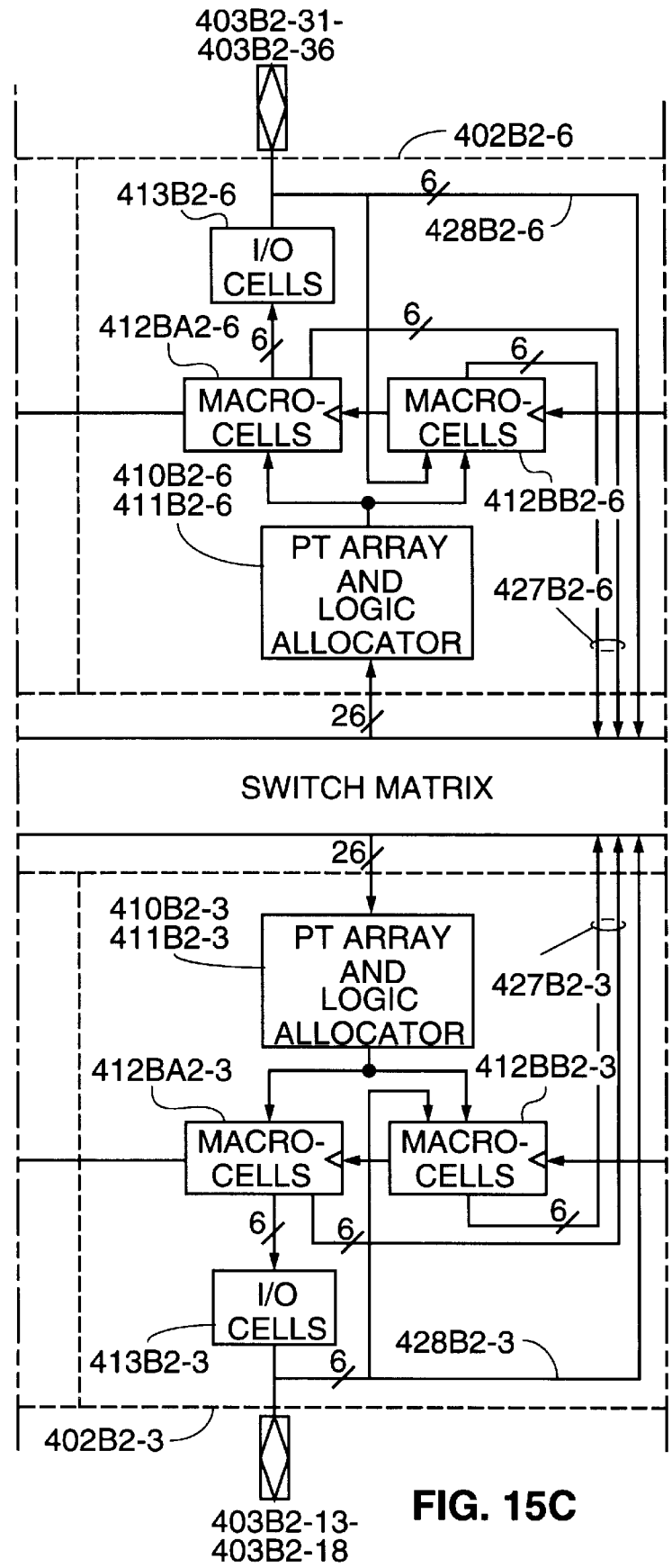
Figure 15D:
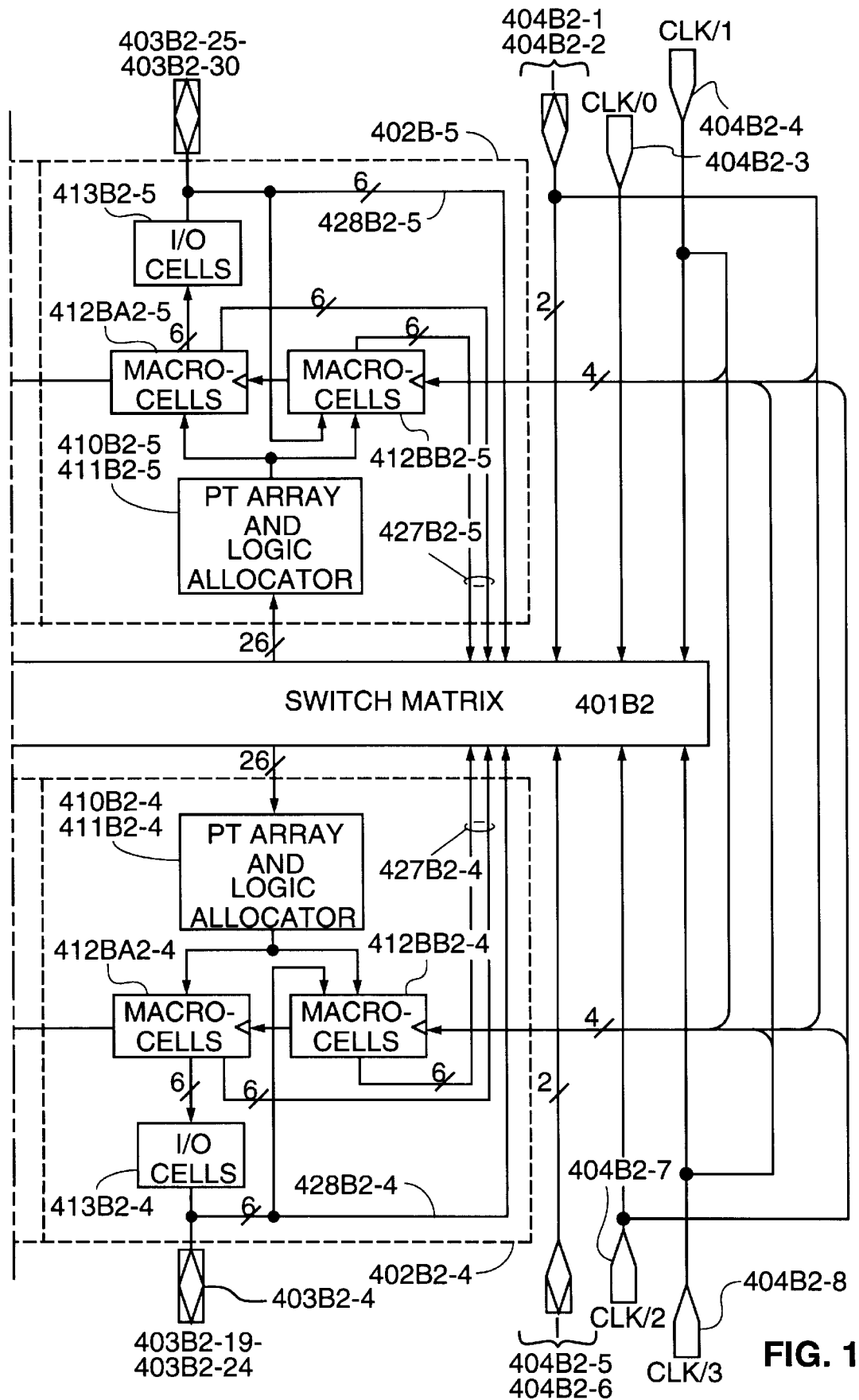
Figure 16A:
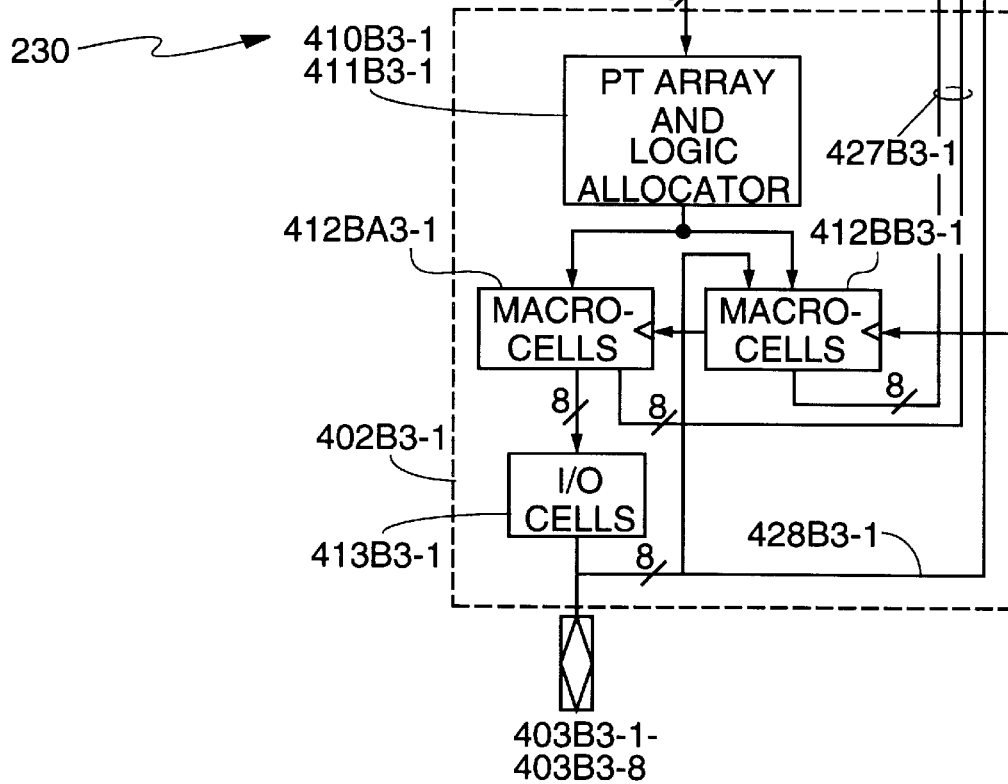
FIGS. 16A to 16D are a more detailed block diagram of a third embodiment of a programmable logic device in the second family of programmable logic device according to the principles of this invention.
Figure 16B:
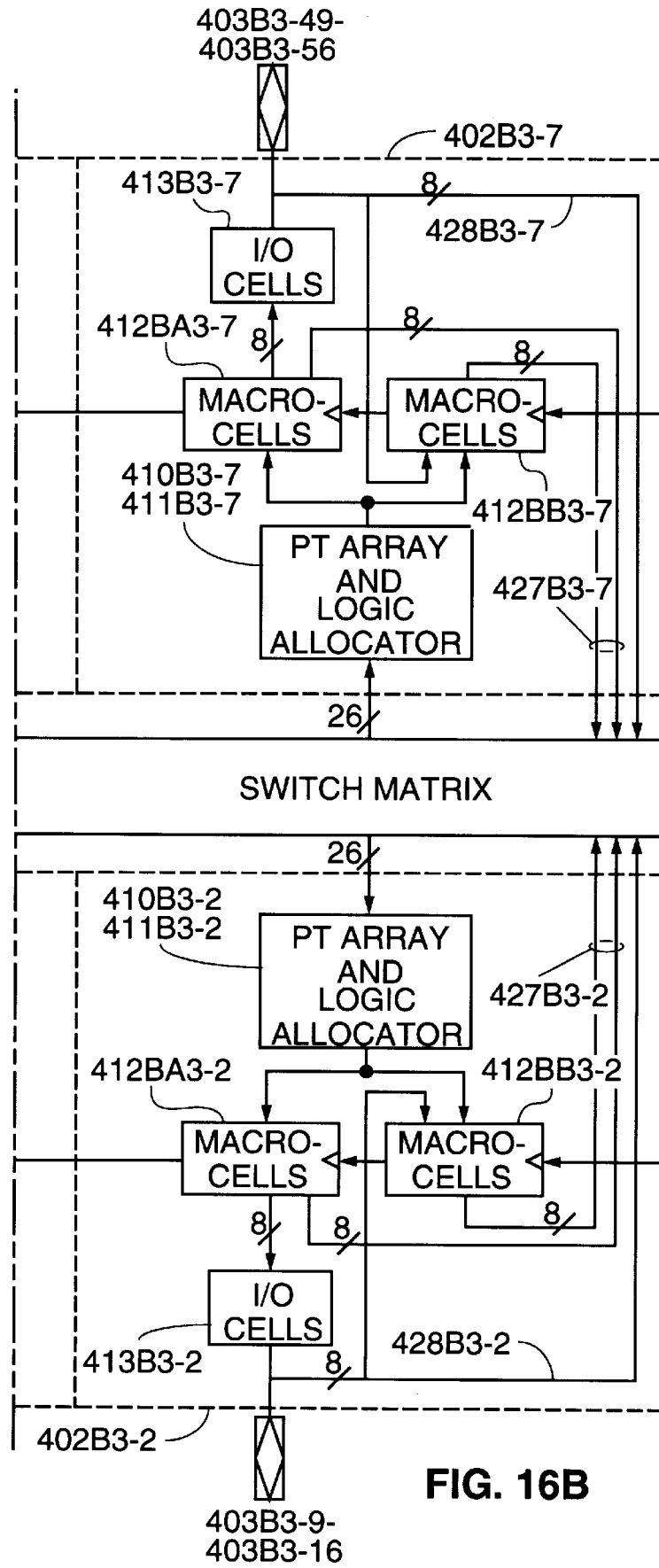
Figure 16C:
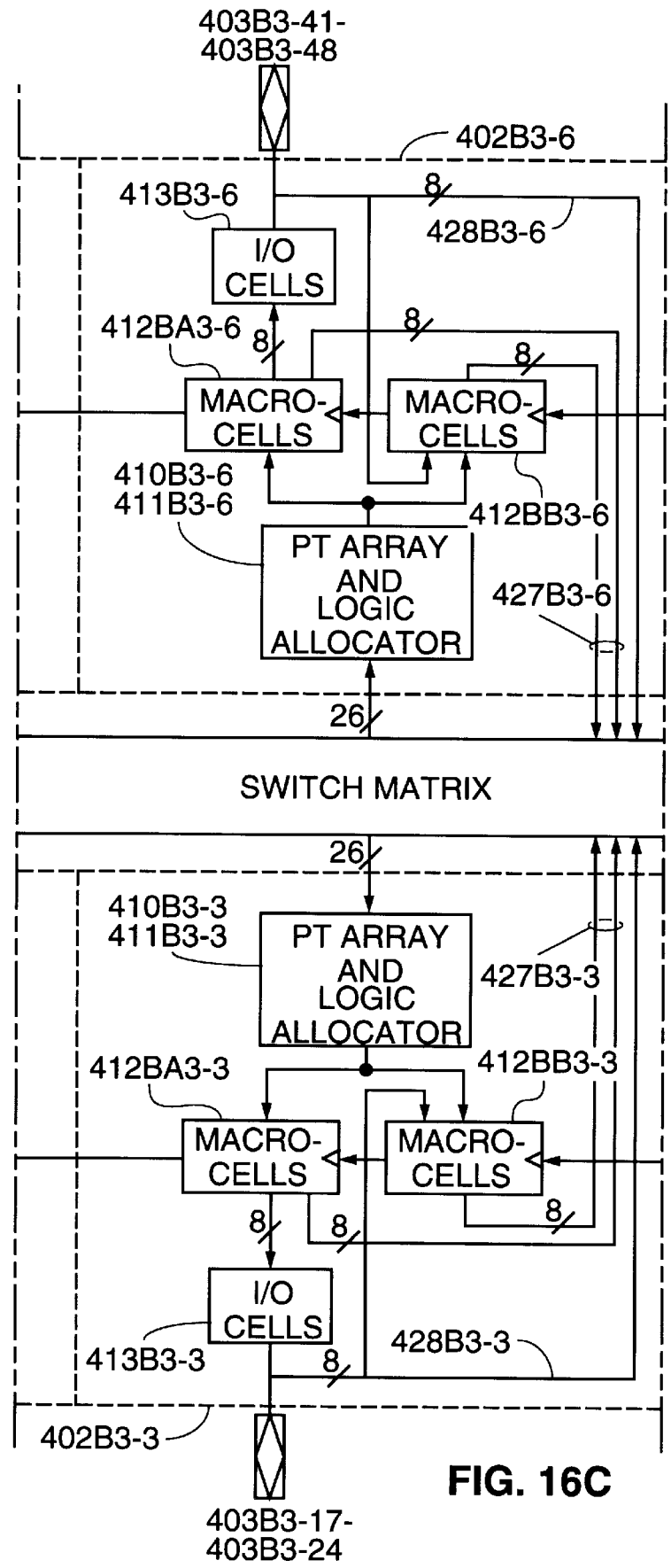
Figure 16D:
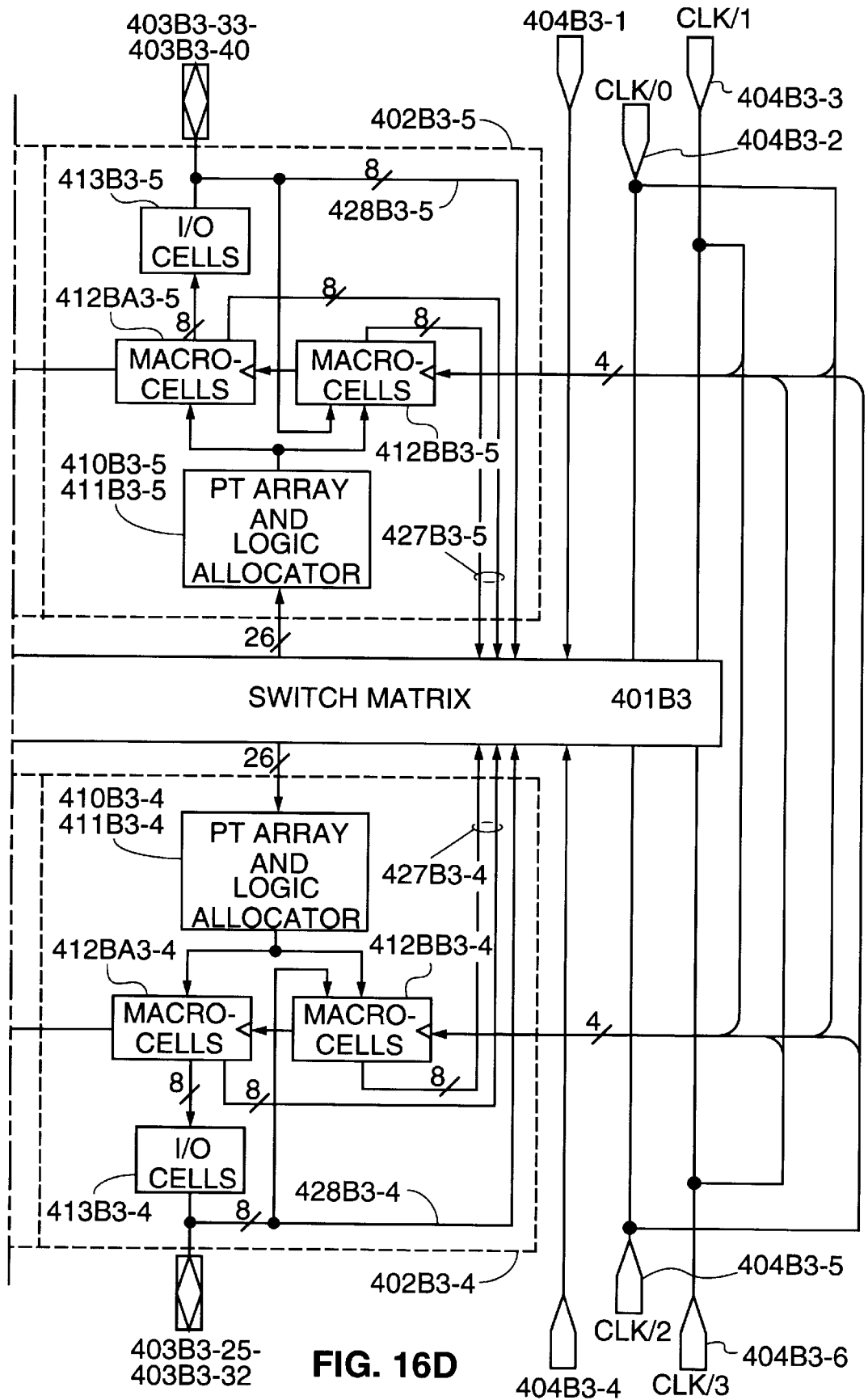

FIGS. 14A and 14B illustrate 44 pin device 210 which has 32 I/O pins 403B1-1 to 403B1-32 and six dedicated direct input pins 404B1-1 to 404B1-6. As previously described, each of programmable logic blocks 402B1-1 to 402B1-4 is identical and each includes a programmable product term array, preferably a 44×68 product term array 410B1-1 to 410B1-4, a programmable logic allocator 411B1-1 to 411B1-4, 16 programmable logic macrocells divided into eight programmable logic macrocells 412BA1-i-1 to 412BA1-i-8 and eight buried programmable logic macrocells 412BB1-i-1 to 412BB1-i-8 where i represents the programmable logic block. Notice that as in the previous figures, product term array 410B and logic allocator 411B have been combined and are represented by a single box 410B–411B.

A fourth embodiment 401B1 of switch matrix 401 provides 22 input signals to product term array 410B1-1 over 22 input lines 426B1-1. Similarly, programmable logic macrocells 412BA1-1 provide eight feedback signals to switch matrix 401B1 over eight lines in lines 427B1-1 and buried programmable logic macrocells 412BB1-1 provide another eight feedback signals to switch matrix 401B1 over another eight lines in lines 427B1-1. I/O macrocells 413B1-1 provide I/O pin feedback signals to switch matrix 401B1 over eight lines 428B1-1. The other blocks in device 210 are similarly configured. In FIGS. 14A and 14B, two dedicated input pins 404B1-3, 404B1-6 are either a dedicated input pin, a dedicated clock pin, or a clock/input pin. Pins 404B1-3, 404B1-6 are coupled to switch matrix 401B1 and to logic macrocells 412BA and 412BB.

FIGS. 15A to 15D illustrate 68 pin device 220 which has 48 I/O pins 403B2-1 to 403B2-48 and eight dedicated direct input pins 403B2-1 to 403B2-8. As previously described, each of the programmable logic blocks 402B2-1 to 402B2-8 is identical and each includes a programmable product term array, preferably a 52×52 product term array, 410B2-1 to 410B2-8, a programmable logic allocator 411B2-1 to 411B2-8, 12 programmable logic macrocells divided into a first group of six programmable logic macrocells 412BA2-i-1 to 412BA2-i-6 and a second group of six buried programmable logic macrocells 412BB2-i-1 to 412BB2-i-6, where i represents the programmable logic block.

A fifth embodiment 401B2 of switch matrix 401 provides 26 input signals to product term array 410B2-1 over 26 input lines 426B2-1. Similarly, programmable logic macrocells 412BA2-1 provide six feedback signals to switch matrix 401B2 over six lines in lines 427B2-1 and six buried programmable logic macrocells 412BB2-1 provide another six feedback signals to switch matrix 401B2 over another six lines in lines 427B2-1. I/O macrocells 413B2-1 provide I/O pin feedback signals to switch matrix 401B2 over six lines 428B2-1. The other blocks in device 220 are similarly configured. In FIGS. 15A to 15D, four dedicated input pins 404B2-3, 404B2-4, 404B2-7 and 404B2-8 are either a dedicated input pin, a dedicated clock pin, or a clock/input pin. Pins 404B2-3, 404B2-4, 404B2-7 and 404B2-8 are coupled to switch matrix 401B2 and to logic macrocells 412BA and 412BB.

FIGS. 16A to 16D illustrate 84 pin device 230 which has 64 I/O pins 403B3-1 to 403B3-64 and six dedicated direct input pins 403B3-1 to 403B3-6. As previously described, each of programmable logic blocks 402B3-1 to 402B3-8 are identical and each includes a programmable product term array, preferably a 52×68 product term array, 410B3-1 to 410B3-8, a programmable logic allocator 411B3-1 to 411B3-8, 16 programmable logic macrocells divided into a first group of eight programmable logic macrocells 412BA3-i-1 to 412BA3-i-8 and a second group of eight buried programmable logic macrocells 412BB3-i-1 to 412BB3-i-8.

A sixth embodiment 401B3 of switch matrix 401 provides 26 input signals to product term array 410B3-1 over 26 input lines 426B3-1. Similarly, eight programmable logic macrocells 412BA3-1 provide eight feedback signals to switch matrix 401B3 over eight lines in lines 427B3-1 and eight buried programmable logic macrocells 412BB3-1 provide another eight feedback signals to switch matrix 401C over another eight lines in lines 427B3-1. I/O macrocells 413B3-1 provide I/O pin feedback signals to switch matrix 401B3 over eight lines 428B3-1. The other blocks in device 230 are similarly configured. In FIGS. 16A to 16D, four dedicated input pins 404B3-2, 404B3-3, 404B3-5 and 404B3-6 are either a dedicated input pin, a dedicated clock pin, or a clock/input pin. Pins 404B3-2, 404B3-3, 404B3-5, and 404B3-6 are coupled to switch matrix 401B3 and to logic macrocells 412BA and 412BB. Extension of the principles of second family 400B of programmable logic devices 400 to other logic macrocells to pin ratios, e.g. 3:1 or 4:1, will be apparent to those skilled in the art in view of this disclosure.

A programmable logic block 402A1-i of PLD 110 of this invention is shown in more detail in FIGS. 17A to 17D, where i=1, 2, 3 or 4. In particular, the interconnection of switch matrix 401A1, 44×70 product term array 410A1-i, logic allocator 411A1-i, a column of sixteen logic macrocells 412A1-i, a column of sixteen I/O macrocells 413A1-i and a column of sixteen I/O pins 403A1-i are illustrated. Product term array 410A1-i includes a 44 by 70 programmable AND logic array. Sixty-four of the product term lines are provided to logic allocator 411A1-i. In addition, product term array 410A1-i in this embodiment has six additional product term lines 410A1-i-65 through 410A1-i-70.

In FIGS. 17A to 17D, a single line is shown connecting logic allocator 411A1-i to each logic macrocell 412A1-i-n (n=1, . . . , 16). However, as explained more completely below, the line between logic allocator 411A1-i and each macrocell 412A1-i-n represents a multiplicity of lines, e.g. 3 to 4 lines.

Figure 17A:
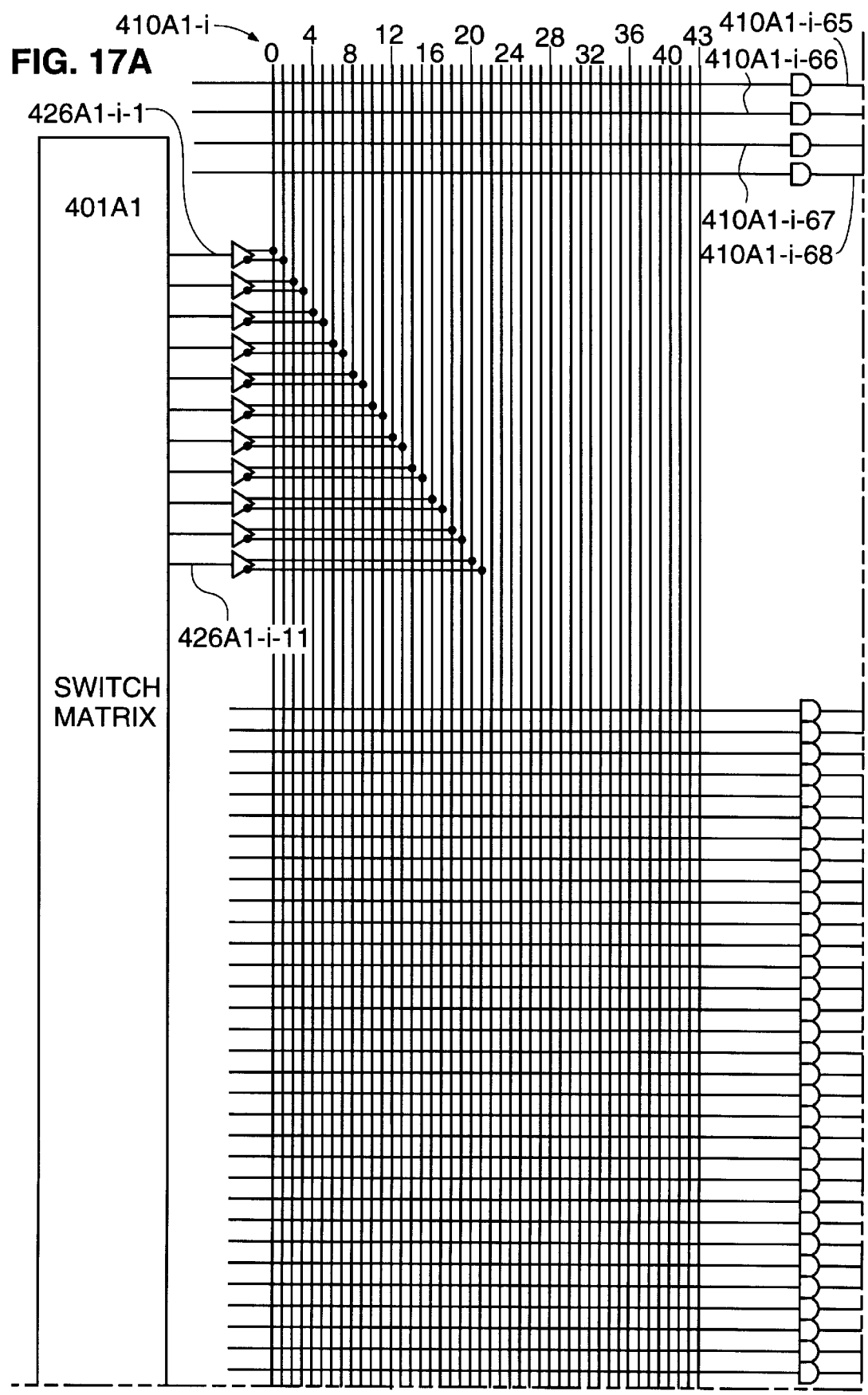
Figure 17B:
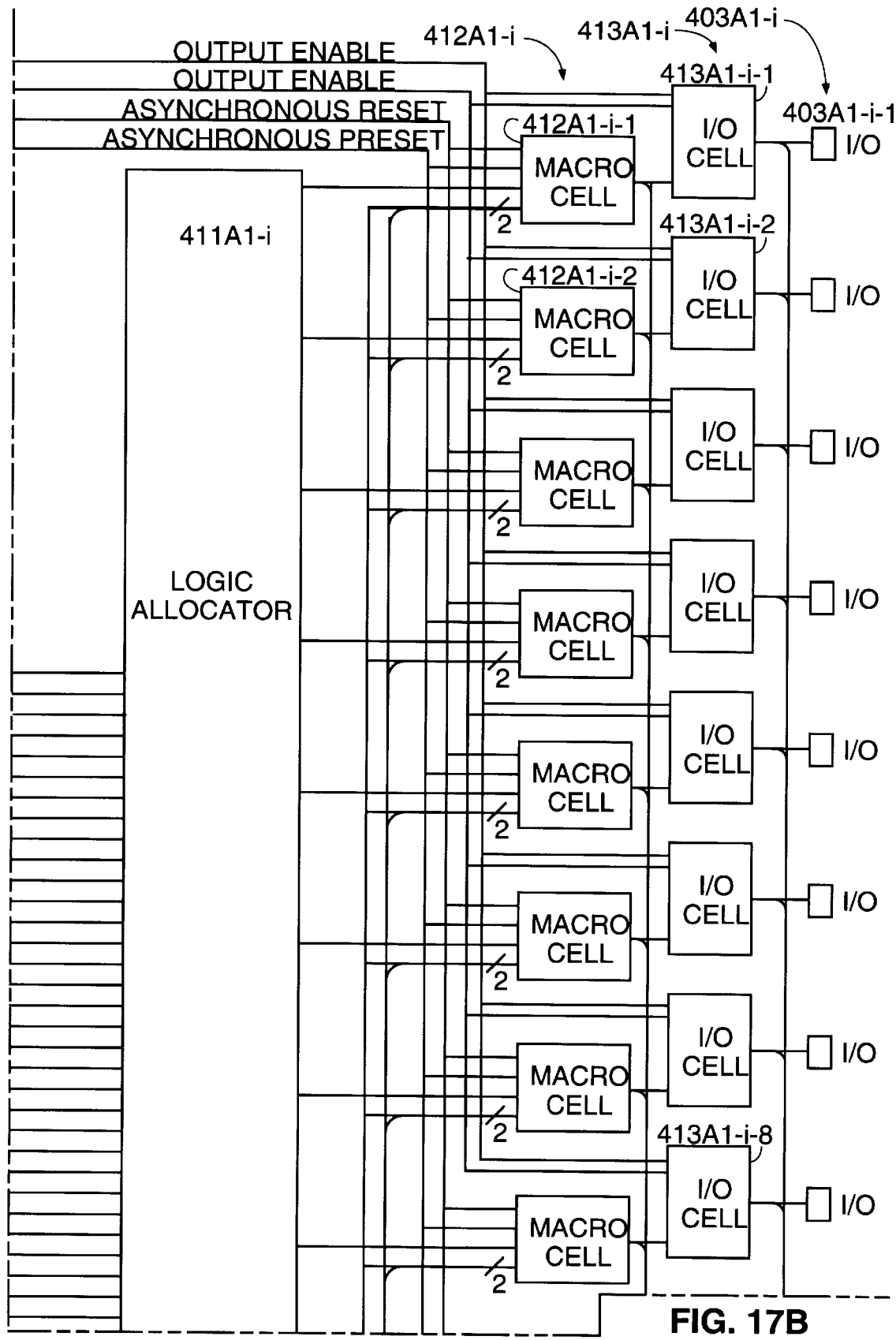
Figure 17D:
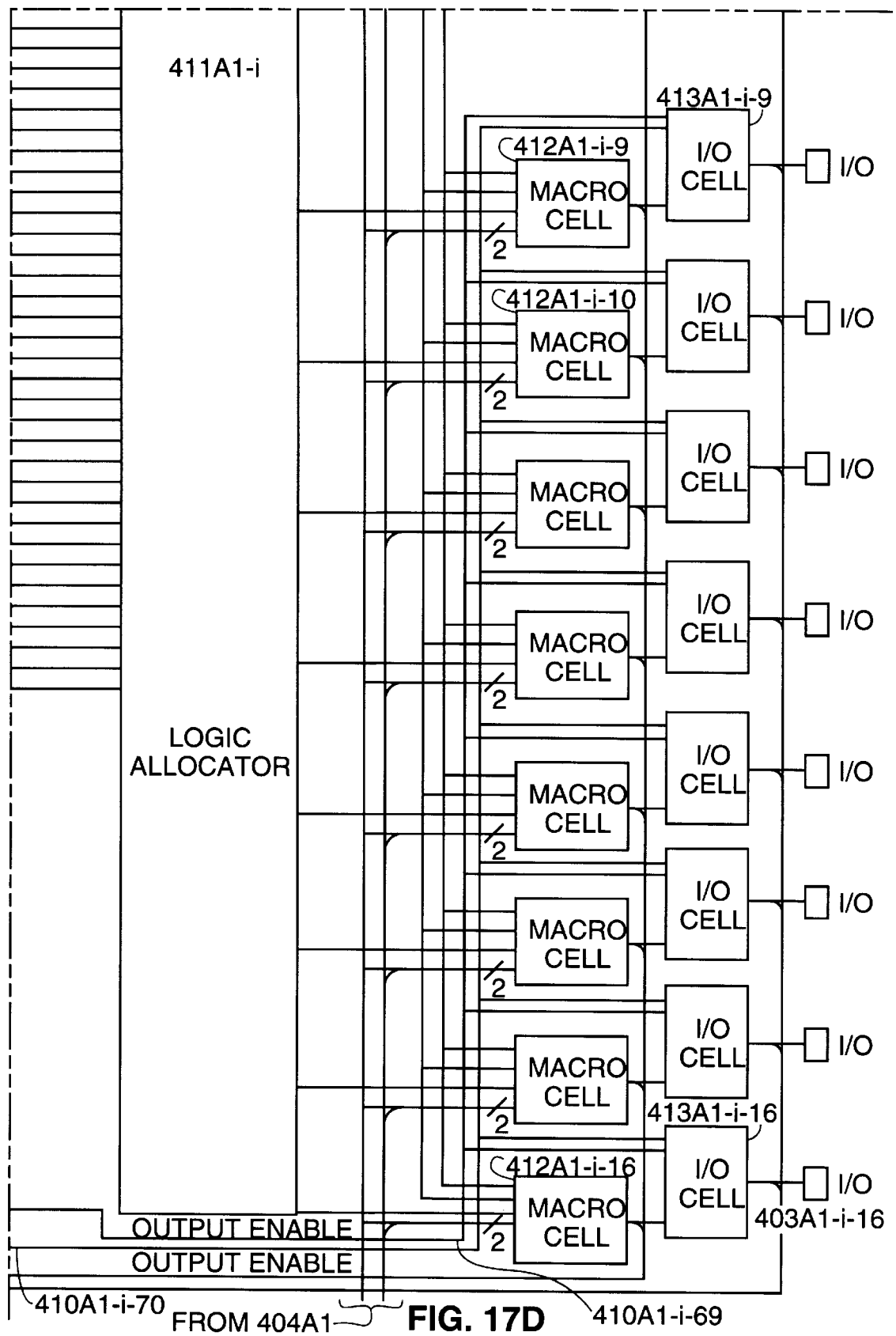

I/O macrocells 413A1-i, in this embodiment, are divided into two banks. The first bank of I/O macrocells 413A1-i is defined by I/O macrocells 413A1-i-1 to 413A1-i-8 that receive the signals on output enable product term lines 410A1-i-65 and 410A1-i-66. Similarly, the second bank of I/O macrocells 413A1-i is defined by I/O macrocells 413A1-i-9 to 413A1-i-16 that receive signals on output enable product term lines 410A1-i-69 and 410A1-i-70. The signals on lines CLK0, CLK1 from dedicated input pins 404A1-3, 404A1-6 (FIG. 12A) are provided to each logic macrocell 412A1-i (FIGS. 17B and 17D). Similarly, the product term on asynchronous reset line 410A1-i-67 and the product term on asynchronous preset line 410A1-i-68 are provided to each of logic macrocells 412A1-i.

Product term array 410A2 (FIGS. 12A and 12B) is a 52×54 programmable AND logic array. The 54 product terms include 48 logic product terms and six control product terms. Similarly, product term array 410A3 (FIGS. 13A and 13B) is a 52×70 programmable AND logic array with 64 logic product terms and six control product terms. Both arrays 410A2 and 410A3 are configured substantially as illustrated in FIGS. 17A to 17D when the different number of input lines from the switch matrix, the number of logic macrocells, and the two additional clock sources are considered. In addition, as described more completely below, the logic allocator and logic macrocells in PLDs 120, 130 provide even greater flexibility than that provided in PLD 110.

Extensive studies of the popular prior art PAL devices' usage pattern showed that for a given technology, the product term array degrades speed performance as the array becomes larger. As a result, each product term array 410A in this embodiment has either twenty-two or twenty-six input lines from switch matrix 401A. Each input line from switch matrix 401A is connected to a driver that provides both the signal on the input line and the complement of the signal on the input line to the product term array which in turn generates all the logic and control product terms for the programmable logic block.

The product term array size of this invention is sized between the product term arrays in the 16V8 architecture and the 22V10 architecture described above. Thus, the product term array is optimized to have the performance and cost structure of the 16V8 architecture with higher silicon efficiency than either the 16V8 or 22V10 architecture. In fact, the product term array of this invention has the equivalent logic functionality of the 22V16 or 26V16 PAL-like architecture, but this functionality is provided in a programmable logic device that is approximately one-half the size of the 22V10 block.

Programmable logic block 402B1-i for PLD 210 in second family 400B of programmable logic devices of this invention is shown in more detail in FIGS. 18A to 18D. In particular, the interconnection of switch matrix 401B1, product term array 410B1-i, logic allocator 411B1-i, a column of sixteen logic macrocells 412B1-i, which has eight output logic macrocells 412BA1-i and eight buried logic macrocells 412BB1-i, a column of eight I/O macrocells 413B1-i and a column of eight I/O pins 403B1-i are illustrated. Product term array 41031-i includes a 44×68 programmable AND logic array. Sixty-four of the product term lines are provided to logic allocator 411B1-i. In addition, product term array 41031-i in this embodiment has four additional product term lines 41031-i-65 through 410B1-i-68.

Product term array 410B2 (FIGS. 15A to 15D) is a 52×52 programmable AND logic array. The 52 product terms include 48 logic product terms and four control product terms. Similarly, product term array 410B3 (FIGS. 16A to 16D) is a 52×68 programmable AND logic array with 64 logic product terms and four control product terms. Both arrays 410B2 and 410B3 are configured substantially the same way as illustrated in FIGS. 18A to 18D when the different number of input lines from the switch matrix, the number of logic macrocells, and the two additional clock sources are considered.

Figure 18A:
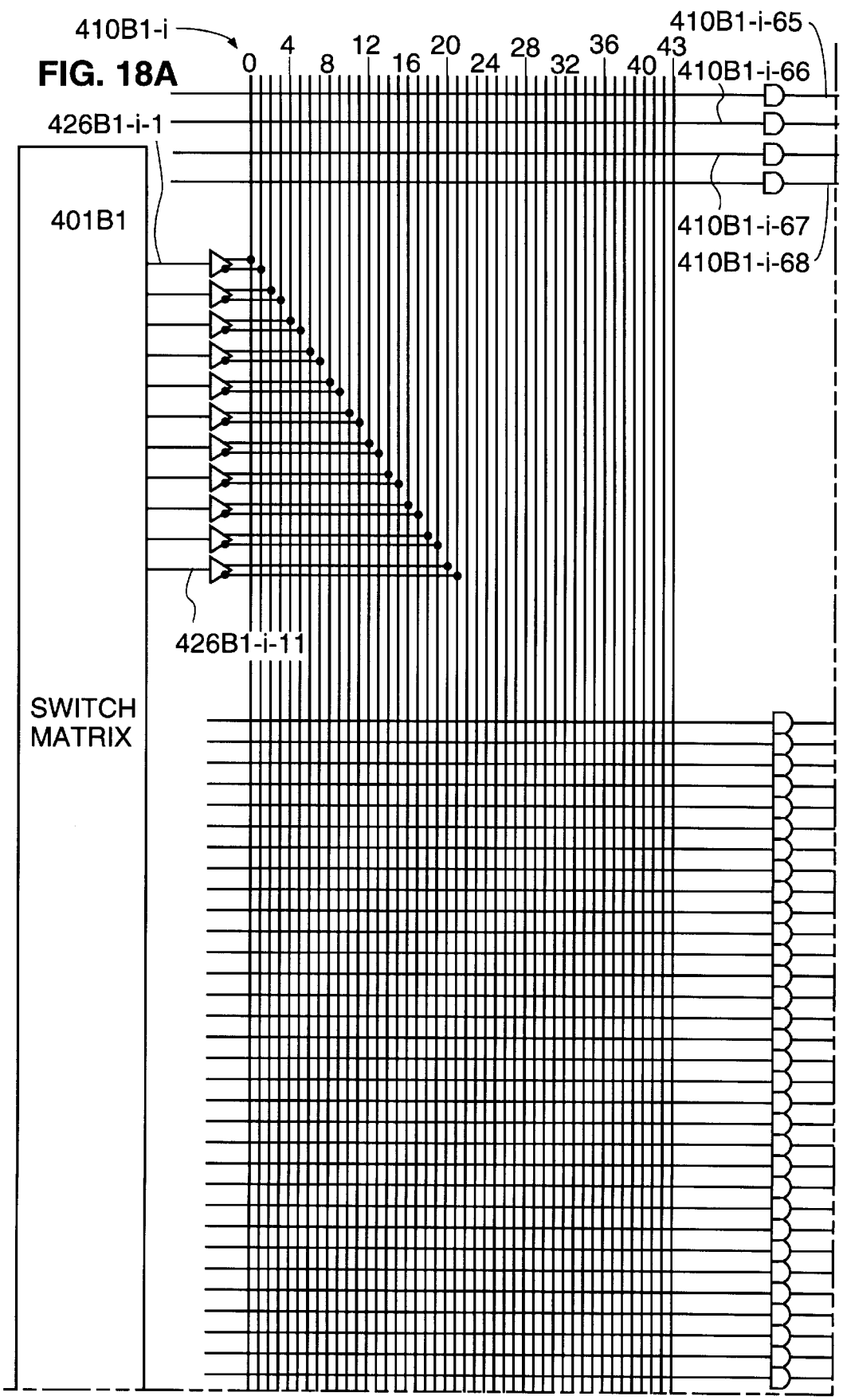
Figure 18B:
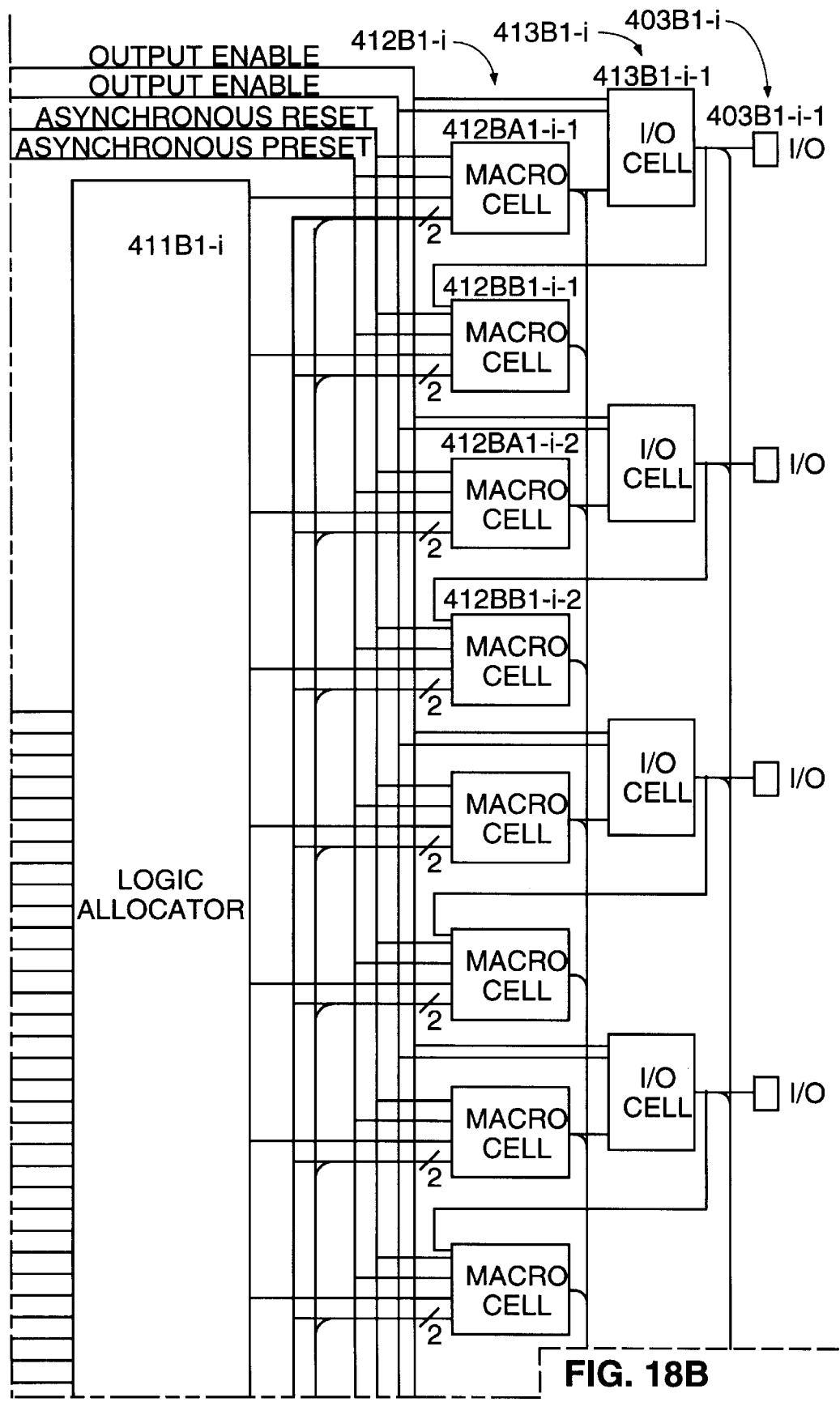
Figure 18D:
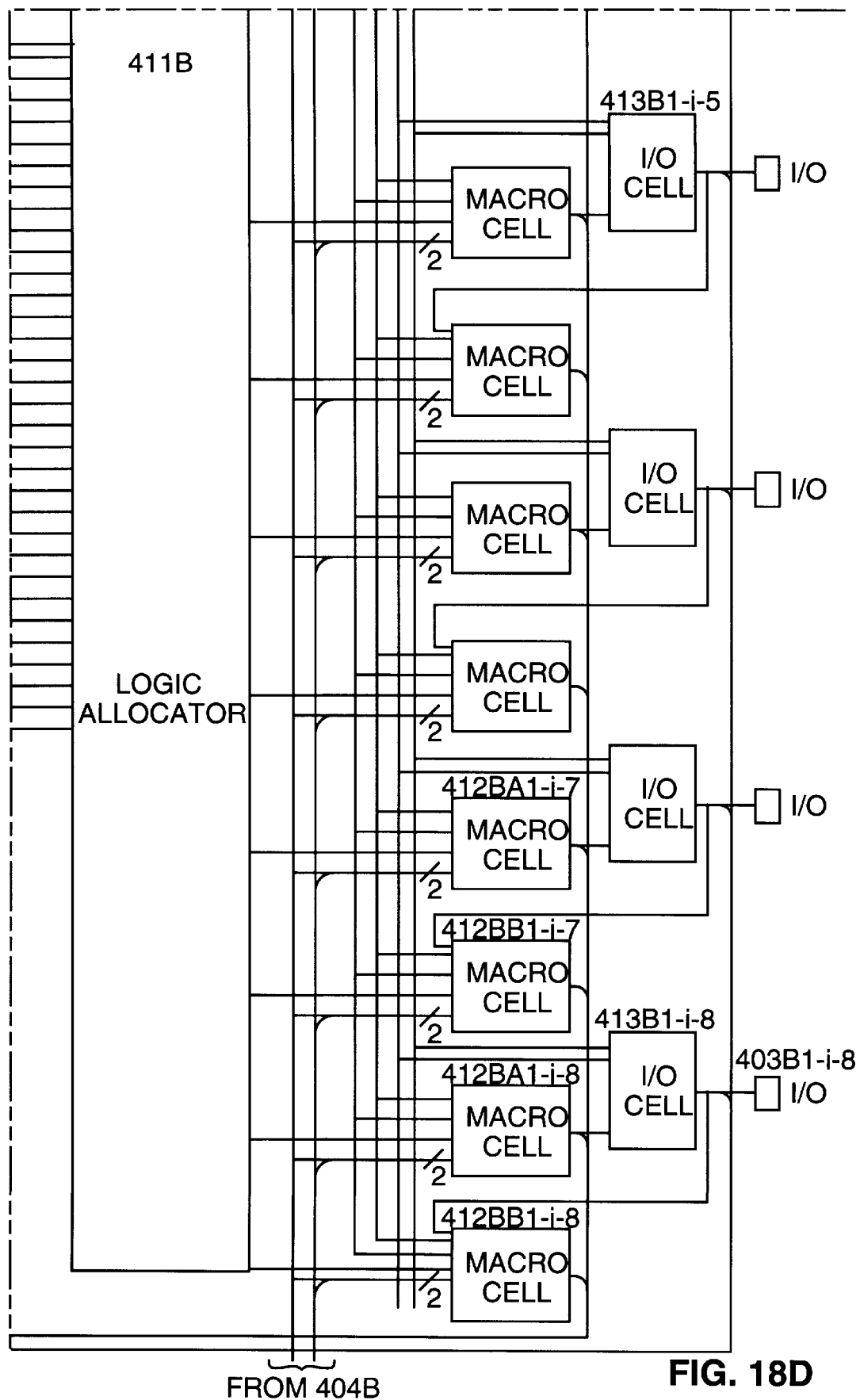

I/O macrocells 413B1-i, in this embodiment, receive the signals on output enable product term lines 410B1-i-65 and 410B1-i-66. The signals on lines CLK0, CLK1 from dedicated input pins 404B1-3, 404B1-6 (FIGS. 14A and 14B) are provided to each output logic macrocell 412BA1-i and buried logic macrocell 412BB1-i (FIGS. 18B and 18D). Similarly, the product term on asynchronous reset line 410B1-i-67 and the product term on asynchronous preset line 410B1-i-68 are provided to each output logic macrocell 412BA1-i and buried logic macrocell 412BB1-i.

Each I/O pin is connected to a buried logic macrocell so that, as explained more completely below, when the I/O pin is configured as an input pin, the input signal is supplied to both the buried logic macrocell and switch matrix 401B. Thus, the input signal may be either processed by the buried logic macrocell, i.e., may be a registered input signal, and then provided to switch matrix 401B or provided directly to switch matrix 401B as a simple combinatorial input signal.

Switch matrix 401B is coupled to programmable product term array 410B by either twenty-two or twenty-six input lines. As described above for switch matrix 401A, each input line from switch matrix 401B is connected to a driver that generates the signal on the input line and the complement of the signal on the input line.

Logic allocator 411 (FIG. 10) of this invention includes a multiplicity of router elements wherein each router element steers the sum of a selected number of sum of product terms from product term array 410 to a selected macrocell. The number of product terms per router element may be selected in numerous ways. In this embodiment, the selected number of product terms is four and there is one router element for each logic macrocell 412.

Hence, as described above, if a programmable logic block has sixteen logic macrocells, the product term array provides sixty-four product terms to logic allocator 411. Similarly, in the embodiment which has 12 logic macrocells per programmable logic block, the product term array provides forty-eight product terms to the logic allocator. The configuration of router elements described herein is illustrative only of a plurality of router elements with each router element steering a fixed number of product terms to a selected macrocell and is not intended to limit the invention to the specific configuration described.

Figure 19:
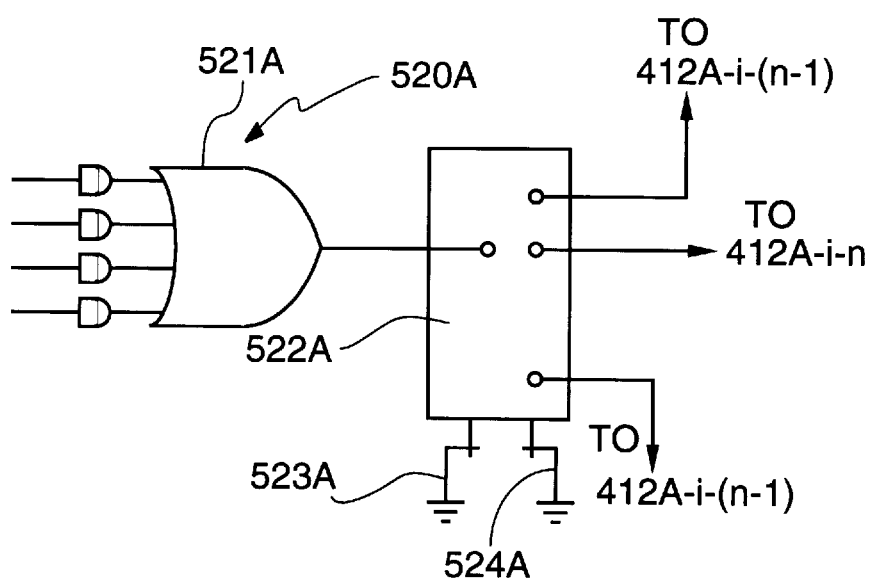
FIG. 19 illustrates a typical router element in the logic allocator of the first family of programmable logic devices of this invention.

In first family 400A of logic devices 400, logic allocator 411A in PLDs 110, 120 and 130 includes either sixteen or twelve router elements 520A (FIG. 19). Each router element 520A includes OR gate 521A, which is driven by signals from four product term lines in product term array 410A, and a programmable one-to-three demultiplexer 522A which has a single input terminal and three output terminals. Architectural configuration cells 523A, 524A are used to form a connection between the input terminal and only one of the output terminals, as explained more completely below. Cells 523A, 524A provide an output select signal to demultiplexer 522A so that the signal on the input line is passed therethrough to the selected output line. In this embodiment, OR gate 521A is included within router element 520A, but alternatively the OR gate could be included with the AND array so that a programmable AND-OR array generated signals for logic allocator 411A.

Figure 20A:
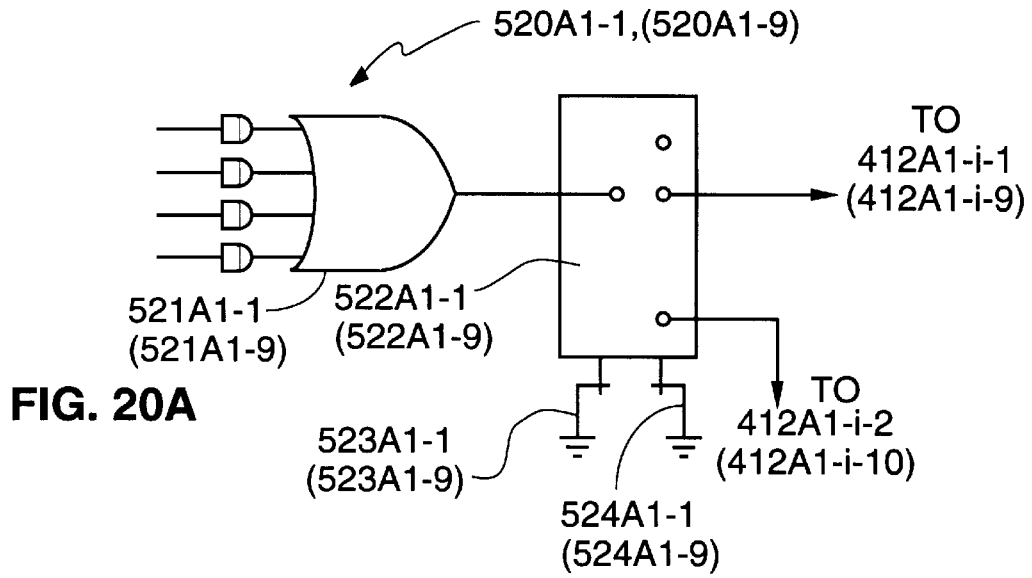
FIGS. 20A through 20C illustrate the router elements in the logic allocator of the first embodiment in the first family of programmable logic devices of this invention.
Figure 20B:
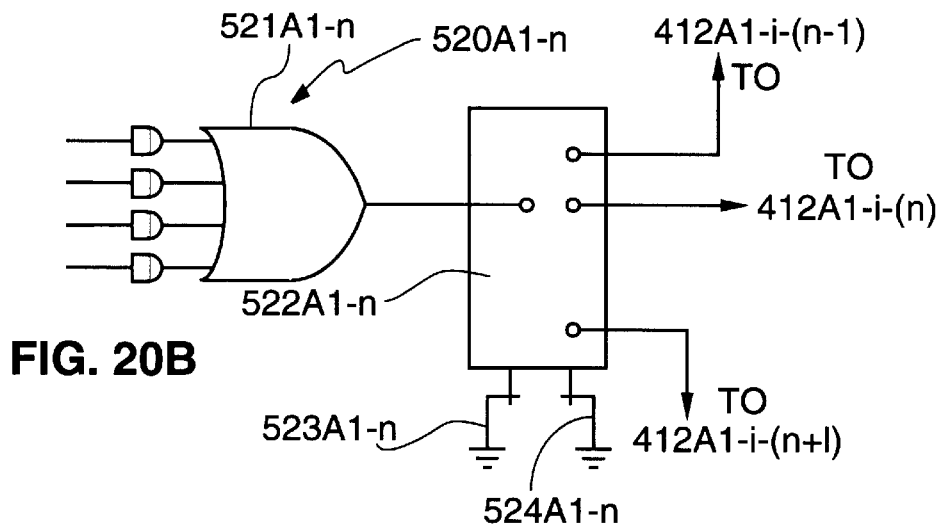
Figure 20C:
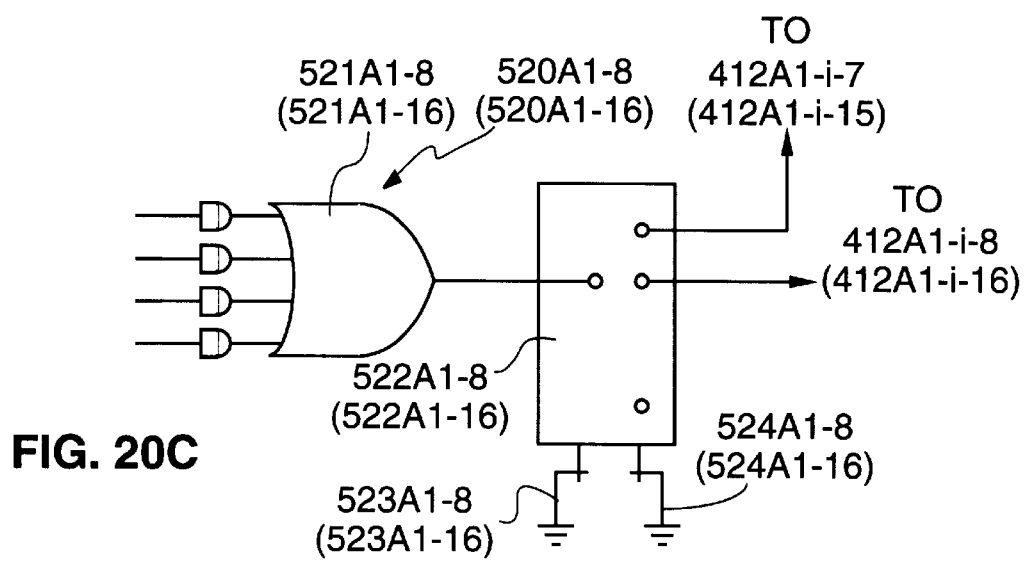

In PLD 110, two router elements 520A1-1, 520A1-9 (FIG. 20A) of logic allocator 411A1 may provide a signal to only two macrocells, e.g. router element 520A1-1 drives either logic macrocell 412A1-i-1 or logic macrocell 412A1-i-2 (FIG. 17B) and router element 520A1-9 drives either logic macrocell 412A1-i-9 or logic macrocell 412A1-i-10 (FIG. 17D). Similarly, router elements 520A1-8, 520A1-16 (FIG. 20C) in logic allocator 411A1 may provide a signal to only two macrocells. Element 520A1-16 drives either logic macrocell 412A1-i-15 or logic macrocell 412A1-i-16 (FIG. 17D) and element 520A1-8 drives either logic macrocell 412A1-i-7 or logic macrocell 412A1-i-8 (FIG. 17B). Each of the other twelve router elements 520A1-i-n (FIG. 20B) in logic allocator 411A1 may provide a signal to the macrocell 412A1-i-(n−1) or to macrocell 412A1-i-n, or to macrocell 412A1-i-(n+1), where n=2, 3, . . . , 7, 10, . . . , 15.

Thus, in this embodiment, logic macrocells 412A1-i-2 through 412A1-i-7 and 412A1-i-9 through 412A1-i-15 may receive up to a maximum of a sum of twelve product terms while logic macrocells 412A1-i-1 and 412A1-i-16 may receive up to a maximum of a sum of only eight product terms. Logic macrocells 412A1-i-1, 412A1-i-8, 412A1-i-9 and 412A1-i-16 receive only up to a sum of eight product terms because complete wraparound at the end of programmable logic block 402A1, e.g., providing a line from demultiplexer 522A1-16 to logic macrocell 412A1-i-1, is not supported. In one embodiment, complete wraparound is estimated to cause a degradation in speed performance of about one to two nanoseconds for signal propagation from an input pin through programmable logic device 110 to an output pin.

Figure 21:
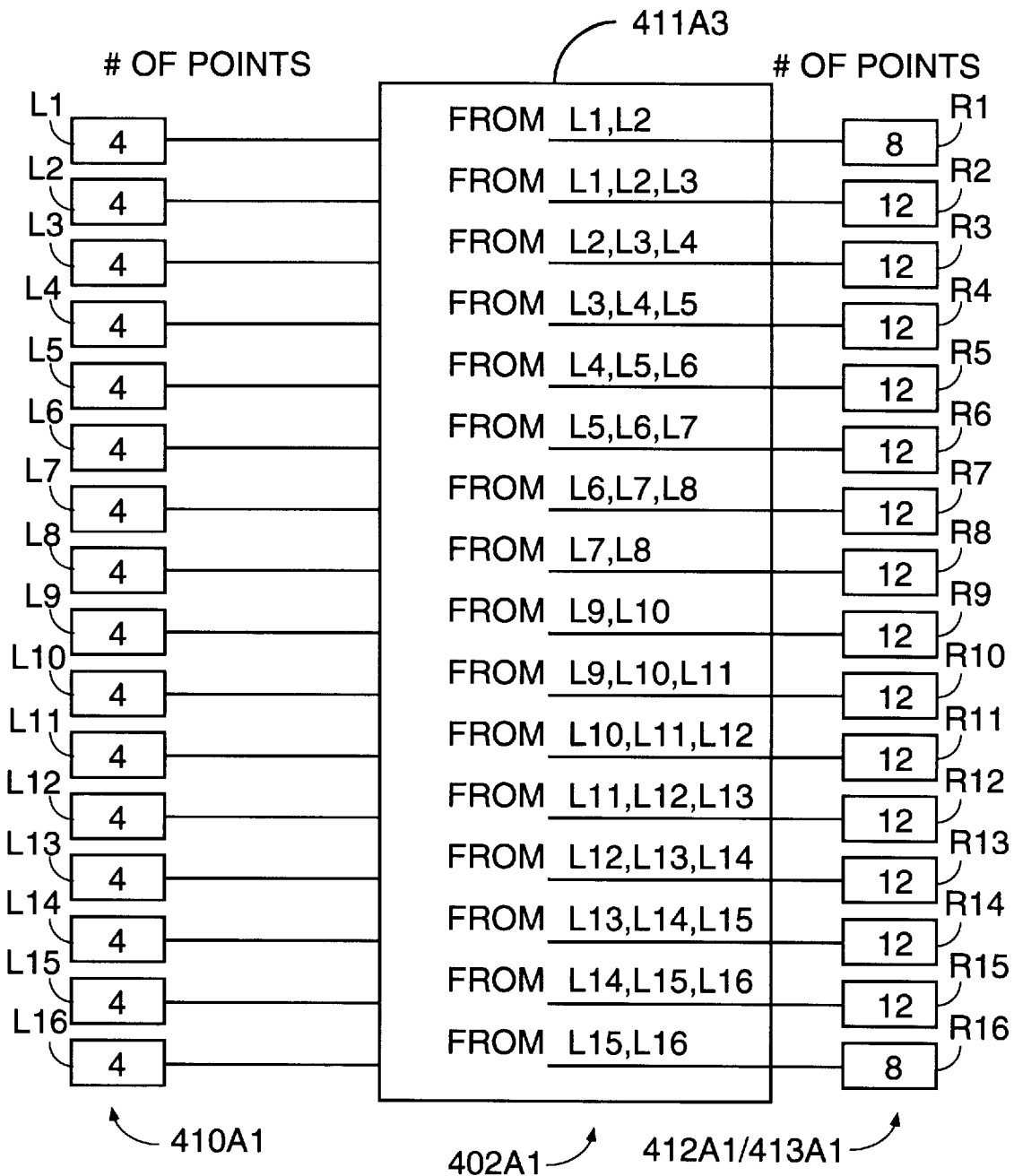
FIG. 21 illustrates the product term steering of logic allocator 411A1 of this invention.

The operation of logic allocator 411A1 is illustrated in FIG. 21. Boxes L1 through L16 on the left-hand side of the figure, each of which contains the numeral "4", represent the product term clumps, each of which has four product terms, in product term array 410A1. On the right-hand side of FIG. 21 are 16 boxes R1 through R16 which represent logic macrocells 412A1-i-1 to 412A1-i-16 respectively. The number within boxes R1 to R16 is the maximum number of product terms that logic allocator 411A1 can route to that logic macrocell. The numbers within logic allocator 411A1 represent the product terms as numbered on the left-hand side of the figure. Accordingly, FIG. 21 clearly illustrates the product term steering capability of logic allocator 411A1 of this invention.

It is important to note that no product term resources are permanently allocated to a specific macrocell by logic allocator 411A1. Accordingly, if an I/O pin that is coupled to a macrocell, for example the macrocell labeled R8 in FIG. 21, is used as an input pin and the buried register capability of macrocell R8 is not needed, the product terms from cells L7 and L8 in product term array may be utilized by macrocell R7. Thus, there are no wasted product terms associated with macrocell L8, when the macrocell is not utilized.

The signal passed from the output terminal of OR gate 521A (FIGS. 19, 20A, 20B and 20C) is provided to the input terminal of demultiplexer 522A and the output terminal of demultiplexer 522A that receives the input signal is determined by the configuration of architectural cells 523A and 524A. The possible values of the architectural cells 523A1 and 524A1 (FIGS. 20A to 20C) are shown in Table 2 along with the logic macrocell that receives the sum of product terms when the architectural cells have these values. The numbers n, n−1 and n+1 in Table 2 are as defined in FIG. 20B. The configuration of architectural cells in Table 2 as well as the other Tables herein is illustrative only and is not intended to limit the invention to the specific configuration given.

TABLE 2

Product Term steering

| Architectural Cell 523A | Architectural Cell 524A | output Signal Supplied to Logic Macrocell |
|---|---|---|
| 0 | 0 | reserved |
| 0 | 1 | 412A1-i-(n − 1) |
| 1 | 0 | 412A1-i-n |
| 1 | 1 | 412A1-i-(n + 1) |

In Table 2, a zero corresponds to a logic zero and is equivalent to a programmed state and a one corresponds to a logic one and is equivalent to an unprogrammed or erased state. Of course, as is known to those skilled in the art, alternative definitions of the programmed and unprogrammed states may be used with the principles of this invention to define alternative embodiments of the family of high performance, high density, programmable logic structures of this invention. The programming for router elements 520A1-1, 520A1-8, 520A1-9, and 520A1-16 is also given by Table 2, where n=1, 8, 9 and 16 respectively where (i) the logic macrocell 412A1-i-(n−1) is reserved for router elements 520A1-1 and 520A1-9; and (ii) the logic macrocell 412A1-i-(n+1) is reserved for router elements 520A1-8 and 520A1-16.

Figure 22:
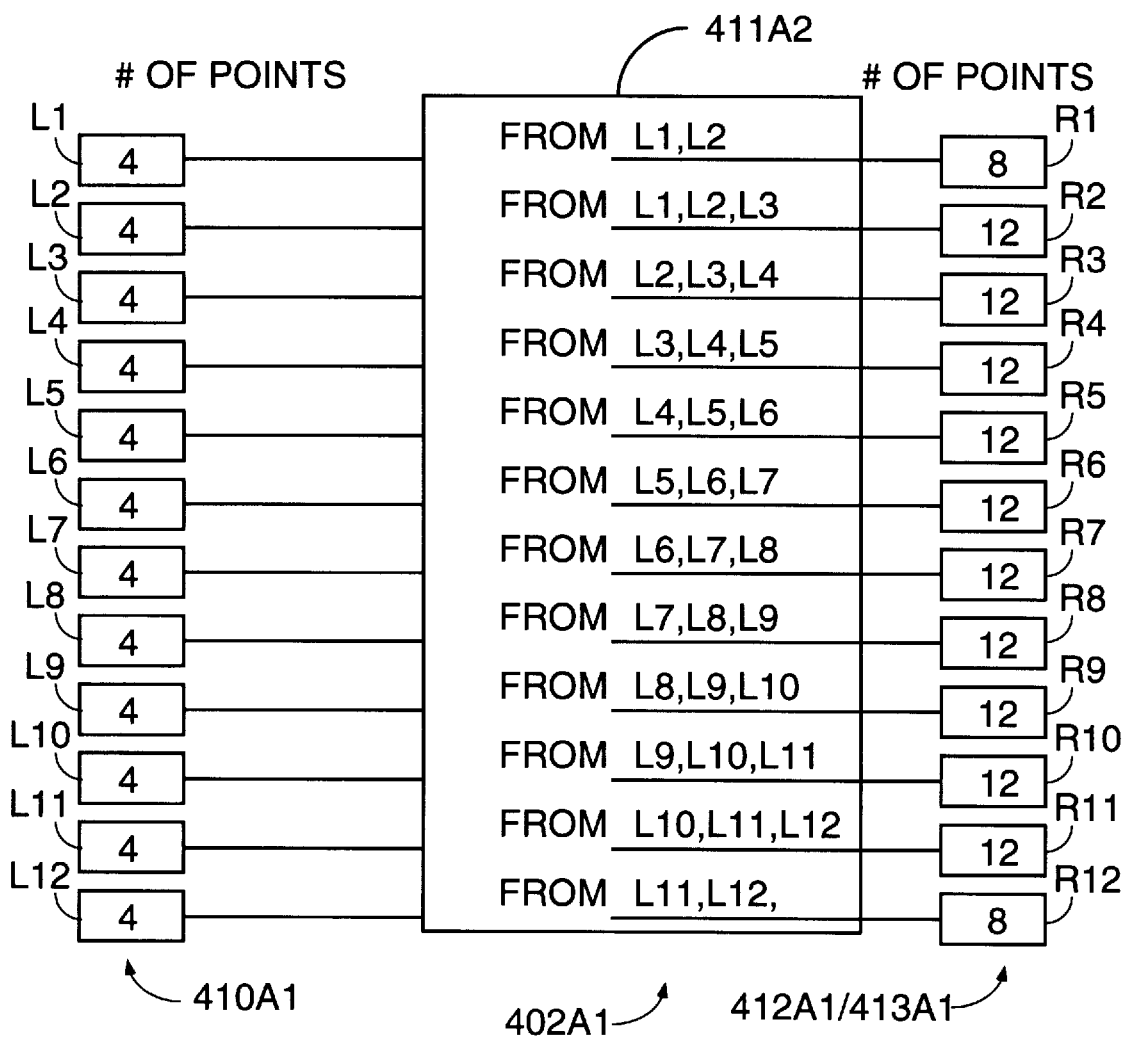
FIG. 22 illustrates the product term steering of logic allocator 411A2 of this invention.
Figure 23:
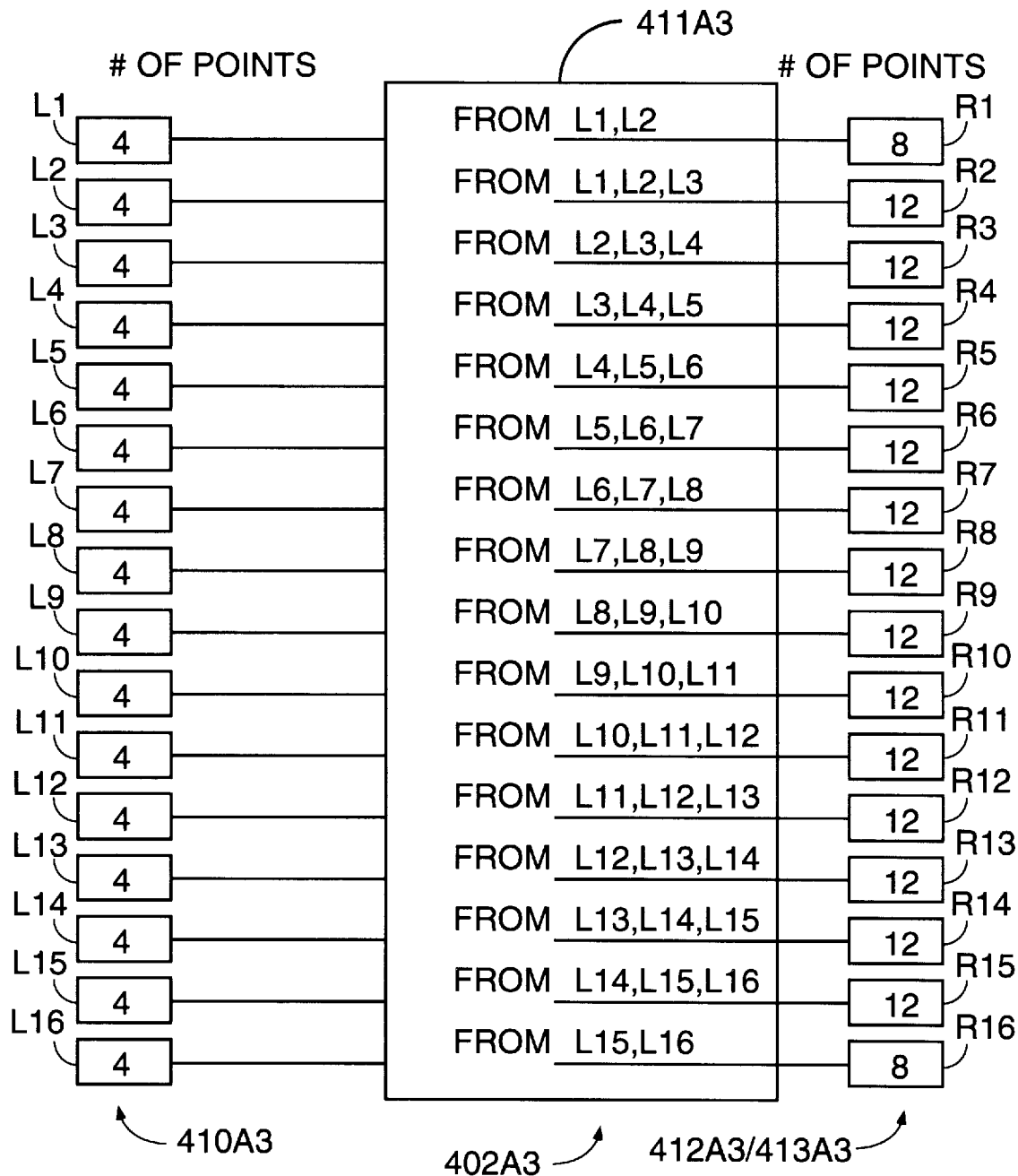
FIG. 23 illustrates the product term steering of logic allocator 411A3 of this invention.

PLDs 120 and 130 include in logic allocators 411A2 and 411A3 respectively router elements 520A (FIG. 19). The configuration of the router elements within these logic allocators is substantially similar to that described for logic allocator 411A1 except for the router elements corresponding to router elements 520A1-8 and 520A1-9. Router elements 520A1-8 and 520A1-9 effectively divided logic allocator 411A1 in PLD 110 into two banks, but in PLDs 120 and 130 all of the router elements except the first and the last router element can steer the sum-of-product terms to three different logic macrocells. The operation of logic allocator 411A2 is illustrated in FIG. 22. Boxes L1 through L12 and boxes R1 through R12 and the numbers within the logic allocator are defined in a manner similar to those in FIG. 21. Similarly, the operation of logic allocator 411A3 is illustrated in FIG. 23. Thus, FIGS. 21 to 23 clearly show that the first and last logic macrocell in each programmable logic block receive only up to a sum of eight product terms because complete wraparound at the end of the programmable logic block is not supported. All other programmable logic macrocells in PLDs 120 and 130 receive up to a sum of twelve product terms.

Figure 24:
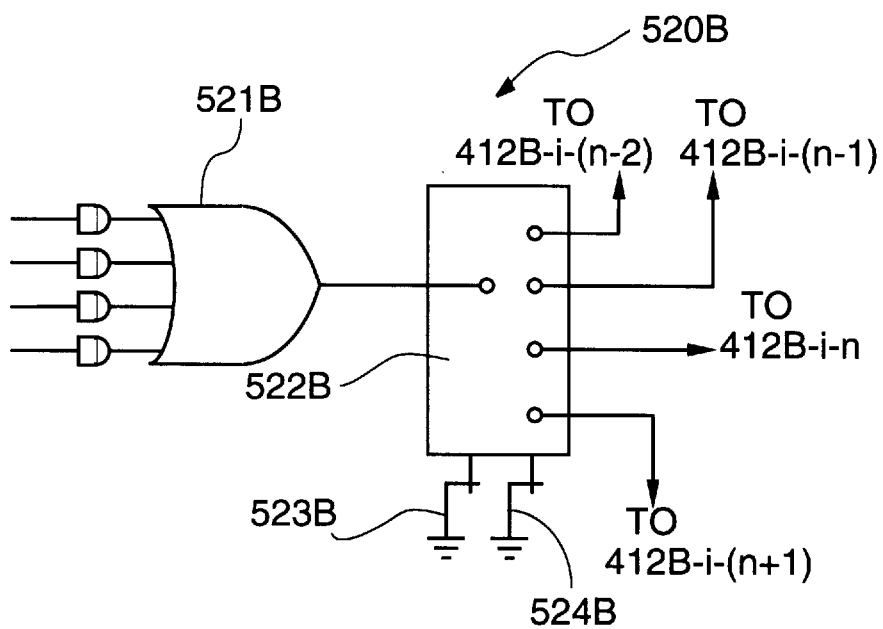
FIG. 24 illustrates a typical router element in the logic allocator of the second family of programmable logic devices of this invention.

In the second family 400B of logic devices, logic allocator 411B includes either sixteen or twelve router elements 520B (FIG. 24). Each router element 520B includes OR gate 521B, which is driven by signals from four product term lines in product term array 410B, and a programmable one-to-four demultiplexer 522B which has a single input terminal and four output terminals. Architectural configuration cells 523B, 524B are used to form a connection between the input terminal and only one of the output terminals, as explained more completely below.

Figure 25A:
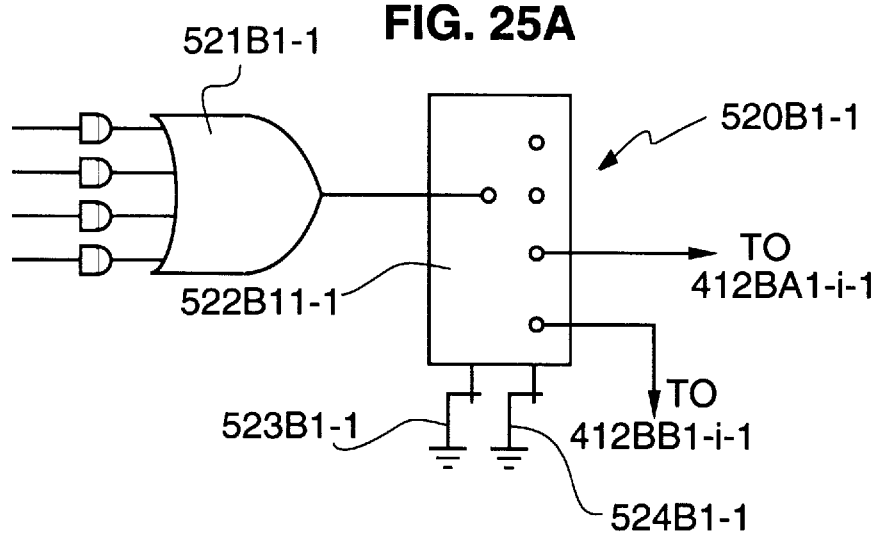
FIGS. 25A, 25B, 25C, and 25D illustrate the router elements in the logic allocator of the first embodiment in the second family of programmable logic devices of this invention.
Figure 25B:
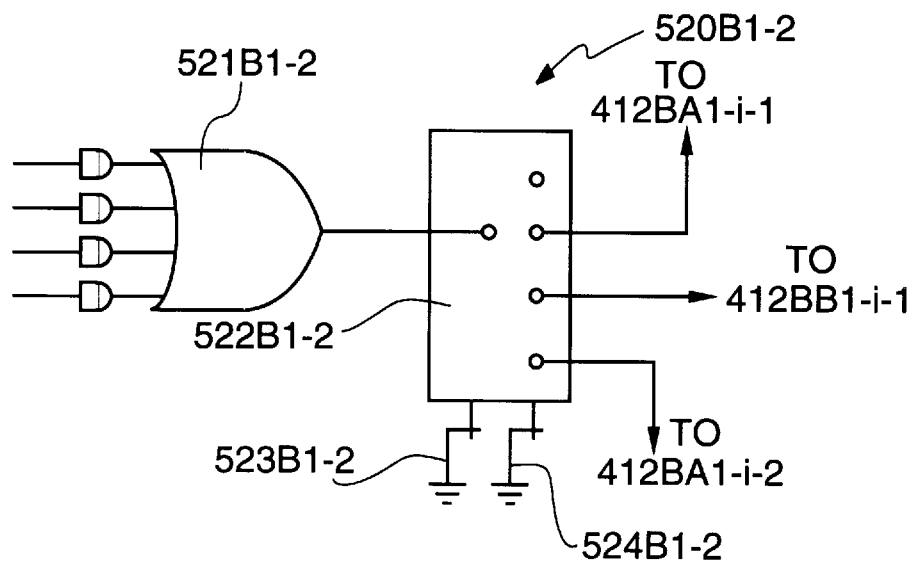
Figure 25C:
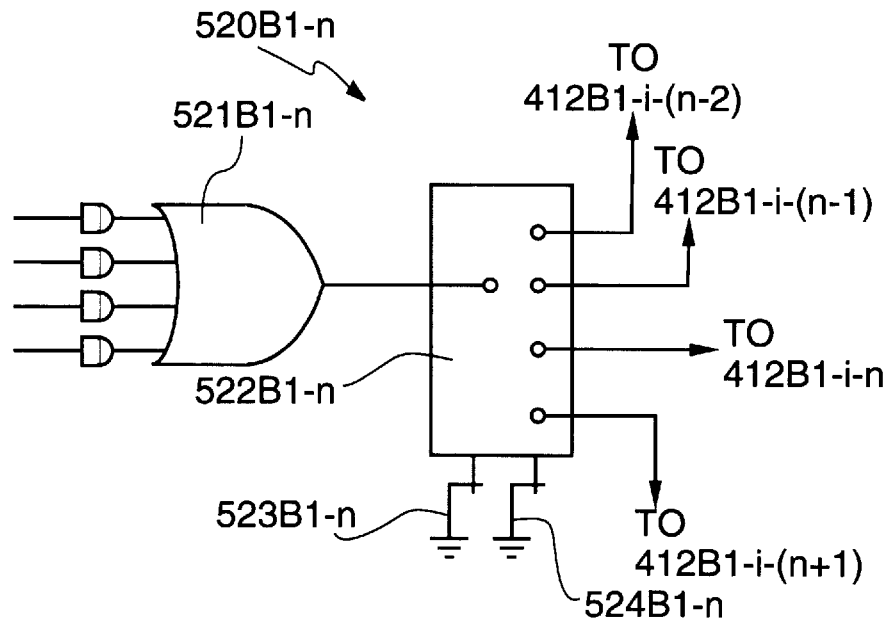
Figure 25D:
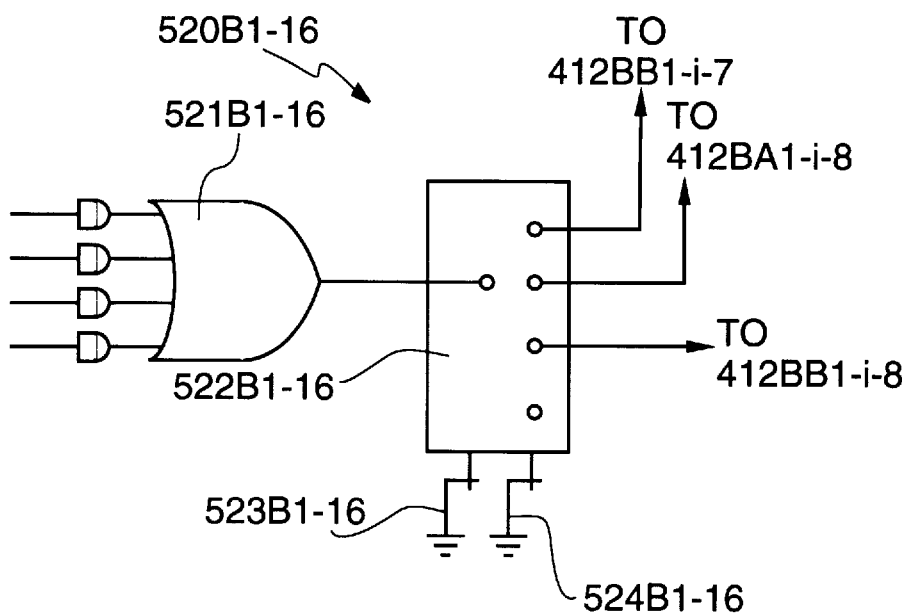

First router element 520B1-1 (FIG. 25A) of logic allocator 411B1 may provide a signal to either output logic macrocell 412BA1-i-1 (FIG. 18B), or buried logic macrocell 412BB1-i-1. Second router element 520B1-2 (FIG. 25B) may provide a signal to either output logic macrocell 412BA1-i-1 (FIG. 18B), buried logic macrocell 412BB1-i-1 or output logic macrocell 412BA1-i-2. Last router element 520B1-16 (FIG. 25D) in logic allocator 411B1 may provide a signal to buried logic macrocell 412BB1-i-7 (FIG. 18D), output logic macrocell 412BA1-i-8, or buried logic macrocell 412BB1-i-8.

Each of the other thirteen router elements 520B1-n (FIG. 25C) in logic allocator 411B1 may provide a signal to one of four logic macrocells. The four output lines from demultiplexer 522B1-n are given as lines to macrocells 412B1-i-(n−2), 412B1-i-(n−1), 412B1-i-(n), and 412B1-i-(n+1) where n=3,4, . . . , 15. Here, n represents the position of router element 520B1-n in the column of router elements within logic allocator 411B1-i. To locate the output logic macrocells and buried logic macrocells 412B1-i-(n−2), . . . , 412B1-i-(n+1) to which the output lines n−2, . . . , n+1 from programmable demultiplexer 522B1-n are connected, column 412B1-i of output logic macrocells 412BA1-i and buried logic macrocells 412BB1-i (FIGS. 18B and 18D) are numbered consecutively from one to sixteen where output logic macrocell 412BA1-i-1 is one and buried logic macrocell 412BB1-i-8 is sixteen, i.e., n=1 . . . 16. Line n is then connected to the nth logic macrocell in column 412B1-i.

For example, consider n=6, i.e., router element 520B1-6. The sixth macrocell in column 412B1-i (FIG. 18B) is output logic macrocell 412BB1-i-3. Thus, line n from router element 520B1-6 is connected to output logic macrocell 412BB1-i-3. Line n−1 is connected to buried logic macrocell 412BA1-i-3 and line n−2 is connected to output logic macrocell 412BB1-i-2. Line n+1 is connected to buried logic macrocell 412BA1-i-4.

Thus, in this embodiment, logic macrocells 412B1-i-2 through 412B1-i-14 may receive up to a maximum of a sum of sixteen product terms while logic macrocells 412B1-i-1 and 412B1-i-15 may receive up to a maximum of a sum of twelve product terms. Macrocell 412B1-i-16 may receive only up to a sum of eight product terms. Again, complete wraparound at the end of programmable logic block 402B is not supported.

The operation of logic allocator 411B1 is illustrated in FIG. 26. Boxes L1 through L16 on the left-hand side of the figure, each of which contains the numeral "4", represent the product term clumps, each of which has four product terms, in product term array 410B1. On the right-hand side of FIG. 26 are 16 boxes R1 through R16 where boxes R1, R3, . . . , R15 represent output logic macrocells and boxes R2, R4, . . . , R16 represent buried logic macrocells. The number within boxes R1 to R16 is the maximum number of product terms that logic allocator 411B1 can route to that logic macrocell. The numbers within logic allocator 411B1 represent the product terms as numbered on the left-hand side of the figure. Accordingly, FIG. 26 clearly illustrates the product term steering capability of logic allocator 411B1 of this invention.

It is important to note that no product term resources are permanently allocated to a specific macrocell by logic allocator 411B1. Thus, in this embodiment, as previously described for logic allocator 411A, there are no wasted product terms associated with a macrocell when the macrocell is not utilized.

The signal passed from the output terminal OR gate 521B1 is provided to the input terminal of demultiplexer 522B1 and the output terminal that receives the input signal is determined by the configuration of architectural cells 523B1 and 524B1. The possible values of the architectural cells 523B1 and 524B1 are shown in Table 3 and the numbers n, n−1, n−2, and n+1 are as defined in FIG. 25C. Again, the architectural cell values in Table 3 are illustrative only, as described above for Table 2, and are not intended to limit the invention to the particular values shown.

TABLE 3

Product Term Steering

| Architectural Cell 523B | Architectural Cell 524B | output Signal Supplied to Logic Macrocell |
|---|---|---|
| 0 | 0 | (n − 2) |
| 0 | 1 | (n − 1) |
| 1 | 0 | n |
| 1 | 1 | (n + 1) |

In Table 3, a zero corresponds to a logical zero and is equivalent to a programmed state and a one corresponds to a logical one and is equivalent to an unprogrammed or erased state. The programming for cells 520B1-1, 520B1-2 and 520B1-16 is also given by Table 3 where n=1, 2 and 16 respectively.

Figure 27:
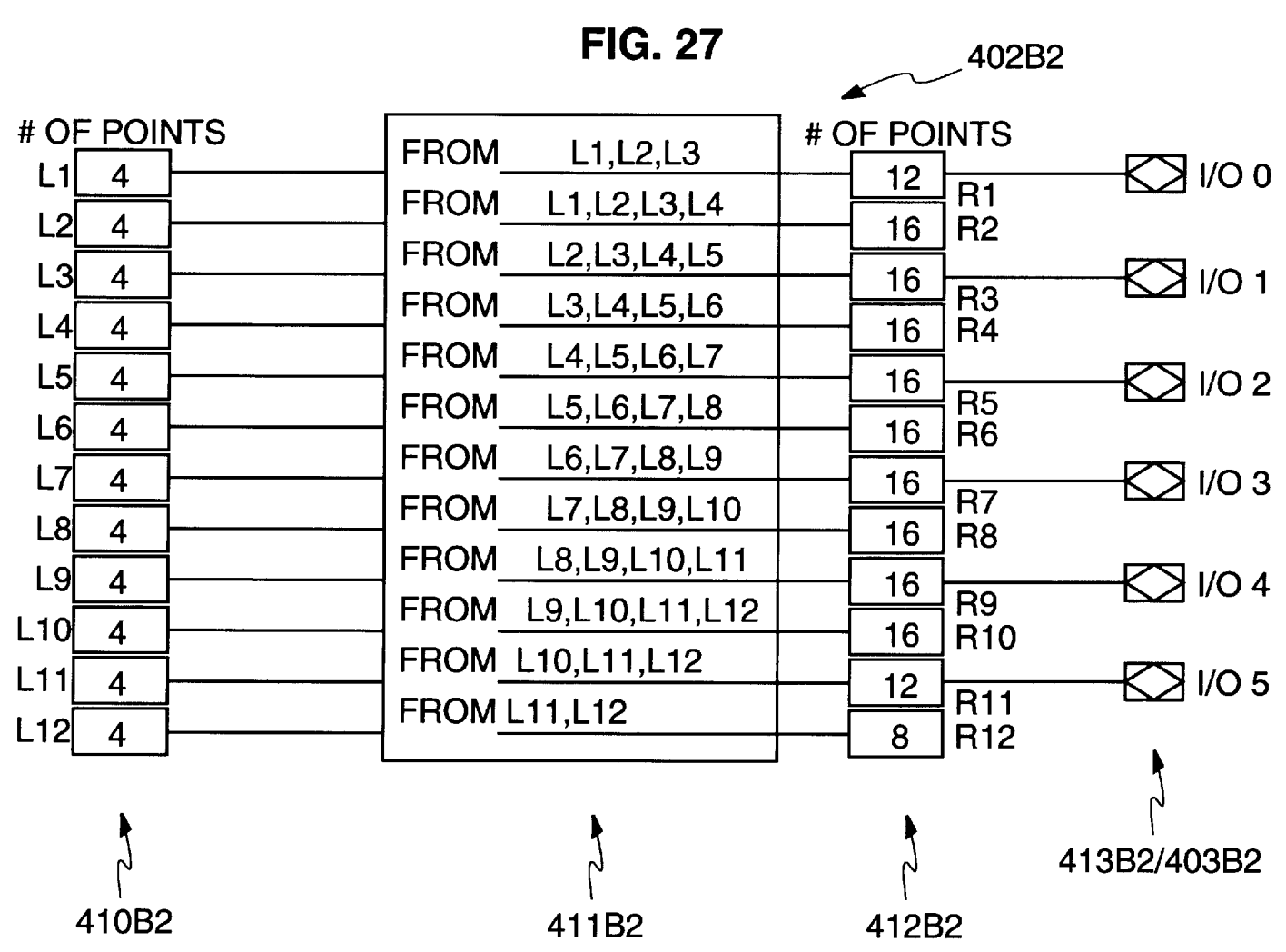

PLDs 220 and 230 include in logic allocators 411B2 and 411B3 respectively router elements 520B (FIG. 24). The configuration of the router elements within these logic allocators is substantially similar to that described for logic allocator 411B1. The operation of logic allocator 411B2 is illustrated in FIG. 27. Boxes L0 through L11 and boxes R0 through R11 and the numbers within the logic allocator are defined in a manner similar to those in FIG. 26. Similarly, the operation of logic allocator 411B3 is illustrated in FIG. 28.

Thus, according to the principles of this invention, the numbers of sums of logical product terms for each macrocell 412 in programmable logic block 402 are variable and may range from a one sum of four product terms to four sums of four product terms, i.e., sixteen product terms, for each logic macrocell. Unlike most of the conventional industry standard programmable logic devices where product terms are preassigned and fixed with each macrocell either in an equal fixed distribution pattern, such as in the 16R8/16V8 architecture, or in a variable but fixed distribution pattern, such as the 22V10 architecture, according to the principles of this invention the product term resources are allocated to a specific macrocell as needed. This flexibility in allocation of product terms to macrocells results in significant increased utilization of the programmable AND array capability. Further, logic device 400 offers higher speed and lower cost over prior art equivalent high density devices.

One of the main reasons associated with the prior art low density PAL structures' silicon inefficiency was fixed product term allocation for each macrocell. Most of the synchronous PAL devices have a fixed overhead of seven or more logic product terms and less than one or two control product terms for each output pin. Although fixed allocation of product terms allows flexibility in having product terms available when needed, the product terms are wasted if the application for which the device is used requires less than the fixed allocated resources. The fixed allocation of product terms to macrocells along with fixed coupling of the macrocells to the I/O pins or I/O cells, as explained previously, results in significant silicon inefficiency and difficulty in migrating the architecture to higher densities.

Extensive studies of the most popular PAL device usage patterns have shown that a device with four to sixteen product terms per macrocell that contains either a D- or T-type flip-flop would address 90–95% of the high density synchronous programmable logic application needs. Any fixed allocation of product terms per macrocell, even two to three product terms per macrocell, may be wasteful. Thus, programmable logic device 400 has overcome these limitations by having no fixed allocation of product terms per logic macrocell, but yet device 400 through logic allocator 411 has four to sixteen product terms programmably available for each logic macrocell 412.

Also, we have discovered that 85–95% of synchronous logic applications of PAL device structures do not require individual control product terms, such as RESET, PRESET, output enable or clock, for each logic macrocell. Hence, prior art devices with a plurality of control product terms for each macrocell are not silicon efficient when used for synchronous applications because the majority of the control product terms are wasted. Further, as described above, for maximum silicon efficiency, the logic macrocells must be decoupled from both the product term array and the I/O pins.

However, simply decoupling the logic macrocells from the I/O pins is not sufficient for maximum silicon efficiency. While the decoupling of the logic macrocells from the I/O pins restores the usage of a logic macrocell as a buried register, such decoupling does not address the scalability problem. The more important problem is decoupling the product term array from the macrocells so that as the number of macrocells is increased, the product term array size remains constant or nearly constant, i.e. changes by about one to five input lines.

Logic allocator 411 allocates, as described above, product term resources in a variable distribution among all macrocells 412 in a programmable logic block 402. Thus, logic allocator 411 essentially decouples unused macrocells 412 from product term array 410 and allocates up to twelve to sixteen product terms per used logic macrocell 412 with minimal speed penalty, i.e., the pin to pin signal delay time, which includes the signal delay time of logic allocator 411, is smaller than equivalent density prior art devices.

Logic allocator 411 contrasts sharply with the expander array concept of second generation EPLDs family. More particularly to solve the fixed allocation product term inefficiency problem, some of the second generation mid-density EPLDs opted for the concept of an expander product term array. The expander array concept, which is a variation of folded NANDs array concept, is one attempt to solve the fundamental problem of a fixed overhead of at least seven to eight product terms per output pin. The expander product term array is a collection of unallocated product terms that are available for expanding logic capability of the programmable logic device.

However, since the expander array overhead is an addition to the fixed overhead of eight product terms per macrocell (three to four logic product terms plus four control product terms), this approach appears to degrade the product term overhead problems rather than solve the problems. Further, the expander array introduces a significant speed delay because the time for a signal to traverse the array was about 13–16 nanoseconds for logic requiring more than three product terms.

Thus, the expander array concept not only imposes a significant performance penalty on logic intensive applications of more than three product terms, but also the concept imposes a significant cost penalty in the fixed overhead associated with the expander array and consequently larger die size for less logic intensive functions. Hence, unlike the expander array, logic allocator 411 of this invention not only decouples product term array 410 from logic macrocells 412 but also results in elimination of the large speed degradation for logic intensive applications while providing silicon die efficiency. Specifically, fixed resources are not wasted upon configuration of device 400 for a specific application.

Each logic macrocell 412A1 of this invention in PLD 110 is identical so that logical output macrocell 412A1 (FIG.

29A) is representative of any logical macrocell 412A1 in this embodiment. In logical macrocell 412A1, a plurality of logic terms from logic allocator 411A1 are supplied on the n input lines to OR gate 500. The output line of OR gate 500 is connected to a first input terminal of a two-to-one programmable output path selection multiplexer 505 and to the input terminal of a rising-edge triggered programmable D or T type flip-flop 503 with asynchronous preset and asynchronous reset input terminals, i.e., a programmable storage element. Asynchronous preset line 410A1-i-68 is connected to the asynchronous preset terminal of flip-flop 503 and asynchronous reset product term line 410A1-i-67 is connected to the asynchronous reset terminal of flip-flop 503.

As previously described and illustrated in FIGS. 17A to 17D and 18A to 18D, in each of the programmable logic devices of this invention, each programmable logic block 402 within the device has an asynchronous preset product term line and an asynchronous reset product term line which are connected to the appropriate terminals of each flip-flop 503 in the logic macrocells, including the buried logic macrocells, described more completely below.

Lines CLK0 and CLK1 from dedicated input pins 404A1-3, 404A1-6 are connected to the first and second input terminals respectively of a programmable two-to-one clock selection multiplexer 501. The state of programmable multiplexer 501 is determined by architectural cell 502. When cell 502 is programmed to a logic 0, the signal on line CLK0 is provided to the output line of multiplexer 501, which is connected to the clock input terminal of flip-flop 503. Conversely, when cell 502 is set to a logic 1, the signal on line CLK1 is provided to the clock input terminal of flip-flop 503.

Architectural configuration cell 504 is used to configure flip-flop 503 either as a D type flip-flop or a T type flip-flop. Output terminal Q of flip-flop 503 is connected to a second input terminal of programmable output path selection multiplexer 505. Architectural cell 506 configures multiplexer 505 so that either the signal on the first input terminal, a combinatorial signal, or the signal on the second input terminal, a registered signal, is provided to the output terminal of multiplexer 505.

Figure 29A:
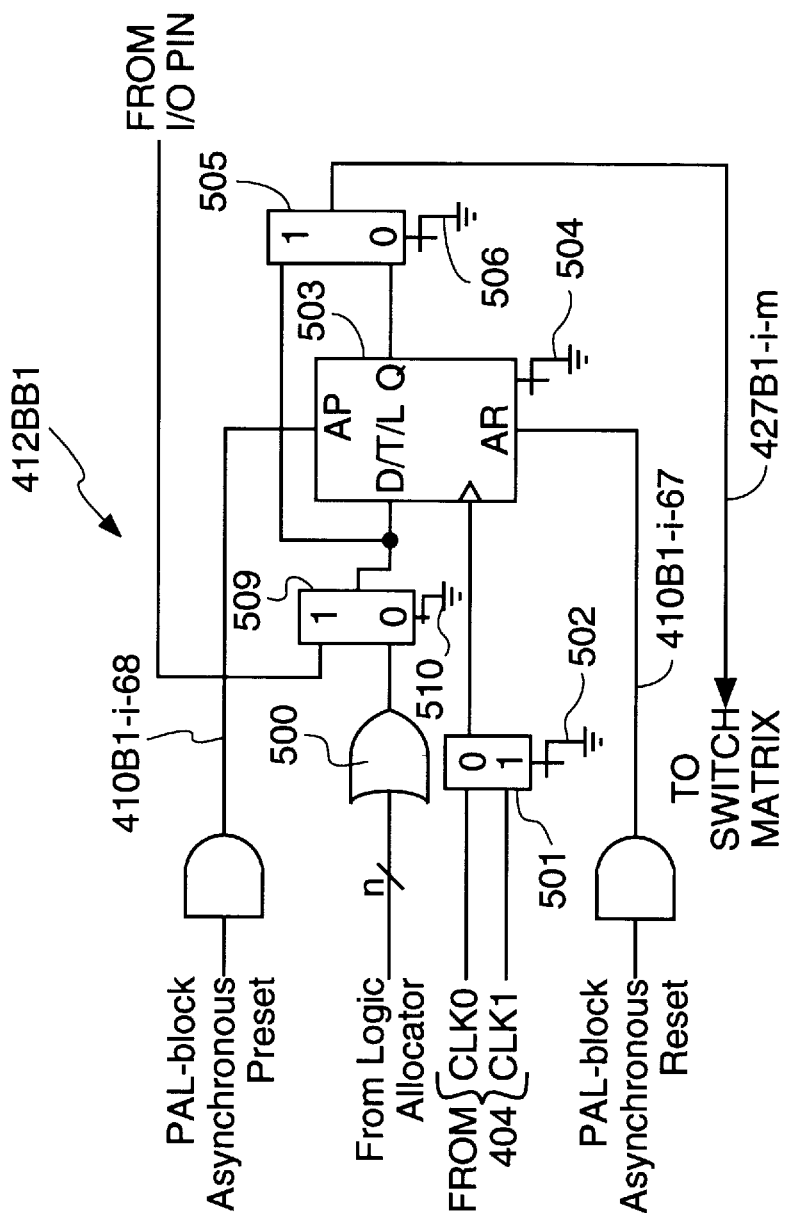
FIG. 29A is a schematic diagram of a programmable logic macrocell in the first embodiment of the first family of programmable logic devices according to the principles of this invention.
Figure 30A:
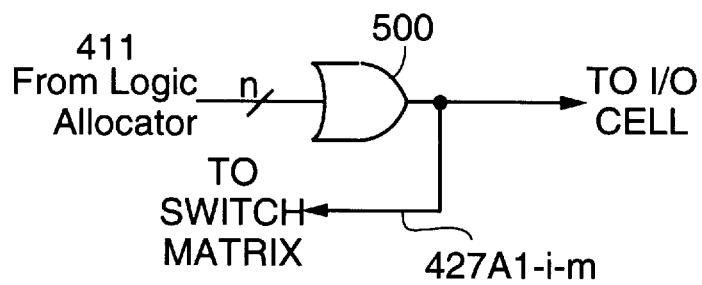
FIGS. 30A through 30F illustrate possible configurations of the programmable logic macrocell in FIG. 29.
Figure 30B:
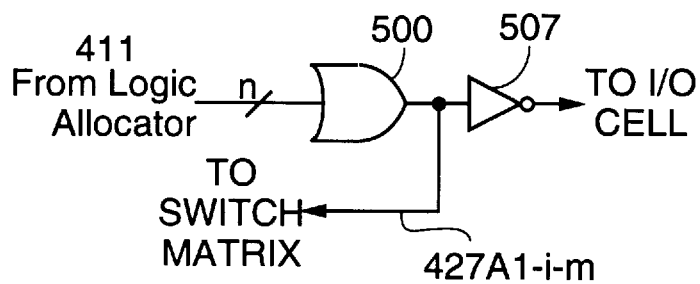

As illustrated in FIGS. 30A and 30B, when architectural cell 506 is programmed to a logic 1, the signal on the first input terminal from OR gate 500 is supplied to the output terminal of multiplexer 505 so that logic macrocell 412A1 provides a combinatorial output. Conversely, when architectural cell 506 is programmed to a logic 0, the output signal from flip-flop 503 is provided on the output terminal of multiplexer 505 so that logic macrocell 412A1 functions as a registered cell (FIGS. 30C–30F). The signal on the output terminal of multiplexer 505 (FIG. 29A) is provided to line 427A1-i-m which, as previously described, is one of the feedback lines to switch matrix 401A1.

The final structure in logic macrocell 412A1 (FIG. 29A) is a programmable two-to-one polarity selection multiplexer 507 which has a first input terminal connected to the output terminal of multiplexer 505 and a second input terminal, which contains an inverter, that is also connected to the output terminal of multiplexer 505. Architectural cell 508 controls the operation of multiplexer 507.

When cell 508 is programmed to a logic 1, multiplexer 507 provides the signal from multiplexer 505 to the I/O cell. Conversely, when architectural cell 508 is programmed to a logic 0, the inverter inverts the signal from the output terminal of multiplexer 505 so that the complement of the signal from multiplexer 505 is provided to the I/O cell. Therefore, multiplexer 505 determines the polarity of the output signal from logic macrocell 412A1.

In another embodiment (not shown) multiplexer 507 is not included within the logic macrocell. Rather, an Exclusive OR gate, which is placed in the input line to storage element 503 just before the connection in the input line to multiplexer 505, is used to control output signal polarity. Hence, the important aspect is that logic macrocell 412A1 includes a means for controlling the logic signal polarity.

Thus, a logic macrocell, according to this invention, may be configured so that the output signals are either registered or combinational with an active high or an active low polarity. When the logic macrocell is used as a register, the logic macrocell can be further configured as a D type or T type flip-flop. Programmable polarity along with the built in T type flip-flop capability minimizes the number of product terms required for implementing some logic functions.

Figure 30C:
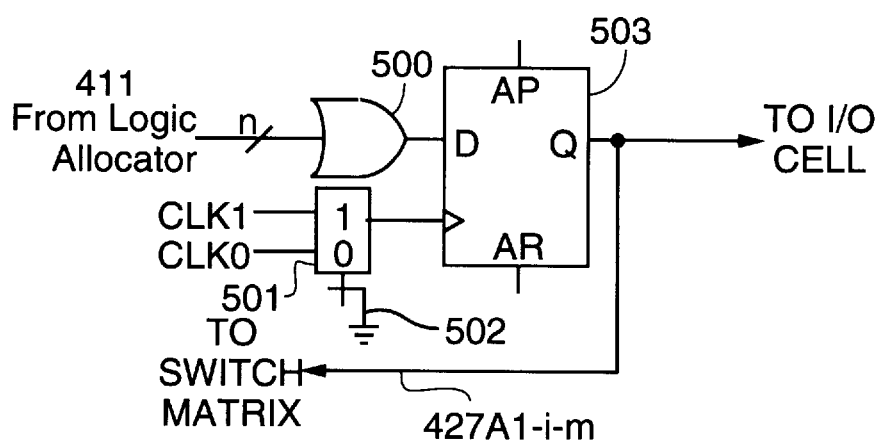
Figure 30D:
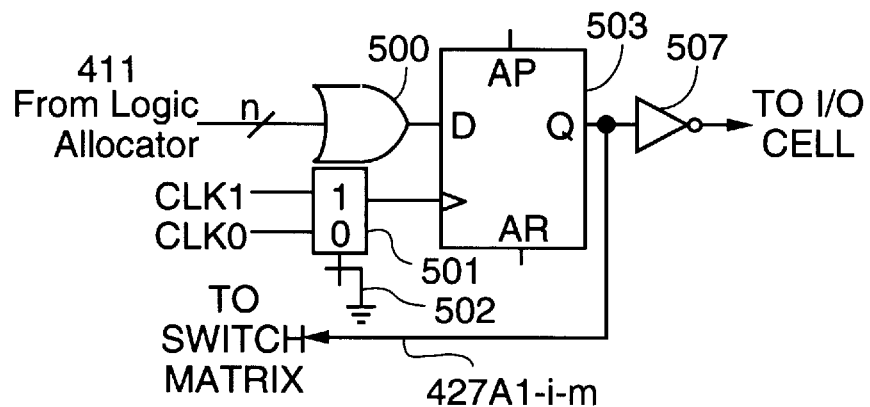
Figure 30E:
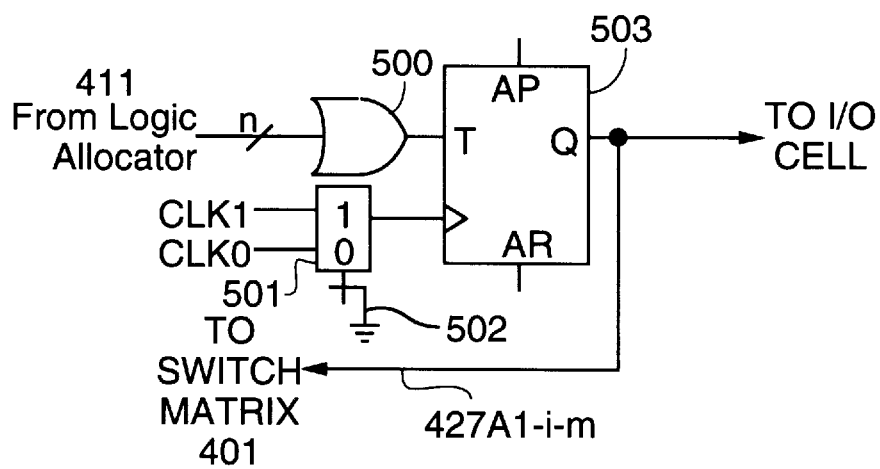
Figure 30F:
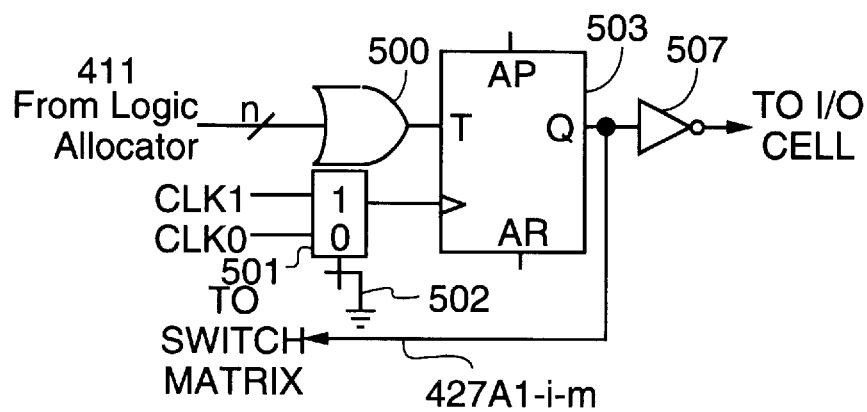

The possible configurations of logic macrocell 412A1 are shown in more detail on FIGS. 30A through 30F. FIG. 30A illustrates the cell configured as combinatorial cell with an active high polarity while FIG. 30B illustrates the cell configured as a combinatorial cell with an active low polarity. FIGS. 30C and 30D illustrate the cell configured as a registered cell with a D type flip-flop and active high and active low polarity respectively while FIGS. 30E and 30F illustrate the cell as a T type flip-flop with active high and active low polarity respectively.

In FIGS. 30C through 30F, the signals on line CLK0 or line CLK1 may be selected by multiplexer 501 so each of these figures actually represent two possible configurations. Thus, in this embodiment, there are a total of ten possible configurations obtained with the four programmable architectural cells in logic macrocell 412A1, but the four programmable architectural cells can support a total of sixteen possible configurations.

Each output logic macrocell 412A1 provides an output signal to an I/O cell and also sends the output signal to switch matrix 401A1 via dedicated internal feedback line 427A1. The feedback signal is provided for either a registered or a combinatorial signal and is always available regardless of I/O cell configuration, as described more completely below. Since the feedback signal may be either registered or combinatorial, the feedback signal allows for buried sequential or combinational functions and consequentially frees I/O pins for use as input pins only. As previously described, each logic macrocell is decoupled from an I/O pin by an I/O macrocell.

In another embodiment (FIG. 29B), programmable flip-flop 503 is replaced by a programmable storage element 503A that may be configured as any one of a D-type flip-flop, a T-type flip-flop or a latch. Architectural cells 504 and 506 are used to configure multiplexer 505 and the programmable storage element so that the signal on the output terminal of multiplexer 505 is one of: (i) a D-type flip-flop output signal; (ii) a T-type flip-flop output signal; (iii) a latch output signal; or (iv) a combinatorial output signal. This configuration is equivalent to the storage element in one embodiment of the macrocells of PLDs 210, 220 and 230.

In yet another embodiment (not shown), programmable flip-flop 503 is replaced with a programmable storage element which functions as one of a T-type flip-flop, a D-type flip-flop, a J-K flip-flop, an RS flip-flop, or a transparent latch. Since in this embodiment the storage element functions in one of four modes, two architectural cells are required for the storage element. Also, an additional input line or lines may be required to support the function of the J-K flip-flop or the RS flip-flop. The storage element operates as a T-type flip-flop when both cells provide a logical zero; as a D-type flip-flop when the first cell provides a logical one and the second cell provides a logical zero; as a J-K flip-flop when the first cell provides a logical zero and the second cell provides a logical one; and as RS flip-flop when both cells provide a logical one.

Figure 29B:
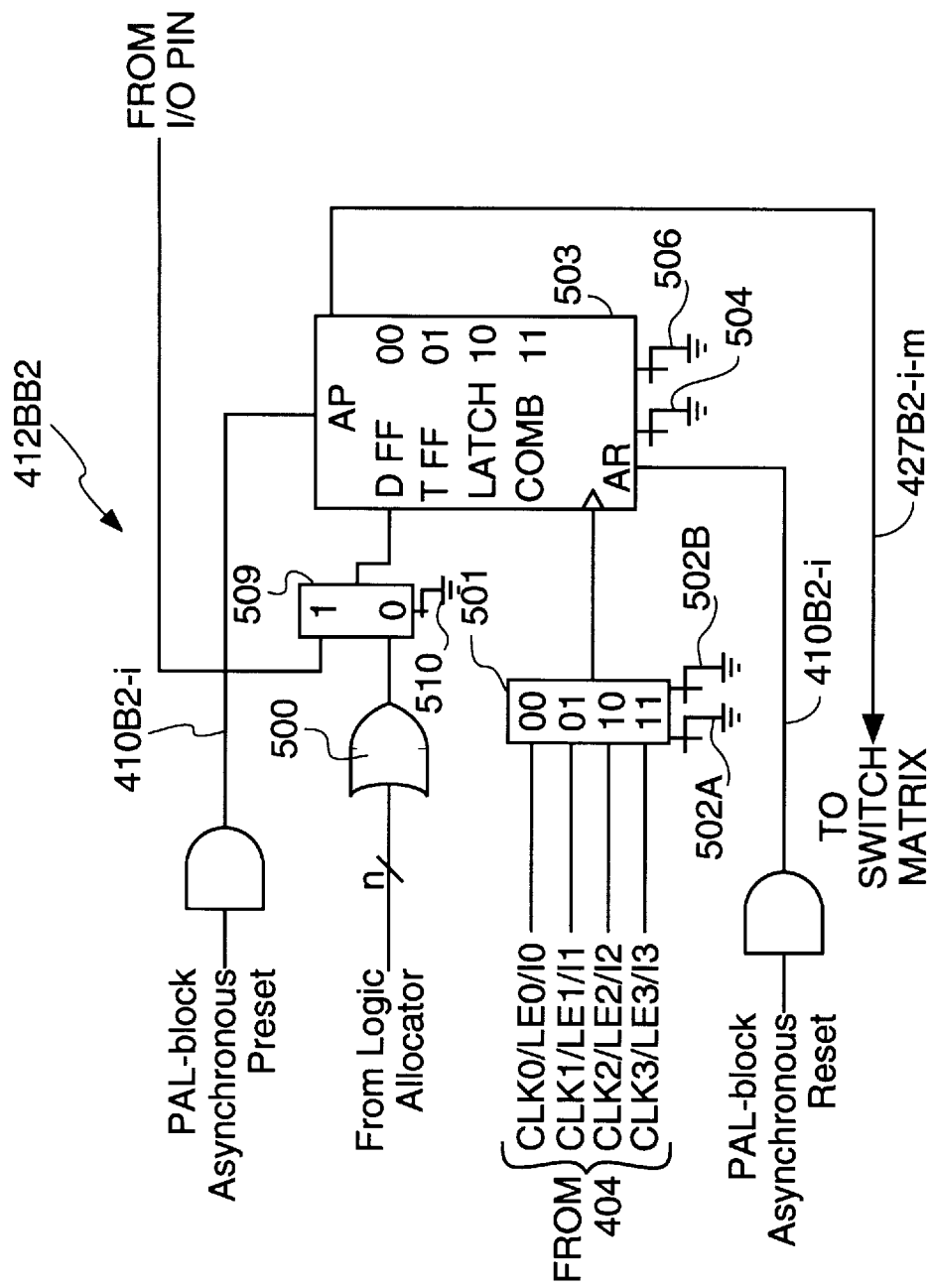
FIG. 29B is a schematic diagram of an alternative embodiment of a programmable logic macrocell in the first embodiment of the first family of programmable logic devices according to the principles of this invention.

Logic macrocells 412A2 and 412A3 (FIG. 29C) are similar to logic macrocell 412A1-A (FIG. 29B). However, two-to-one multiplexer 501 with one architectural cell in PLD 110 is replaced with a four-to-one multiplexer with two architectural cells in logic macrocells 412A2 and 412A3. Recall that in devices 120 and 130 four of the dedicated input pins may be used either as pins for a dedicated input signal or pins for a clock signal. Accordingly, logic macrocells 412A2 and 412A3 may be driven by any one of the four clock signals.

Thus, PLDs 120 and 130 provide significantly greater flexibility with respect to clocking than PLD 110 where each macrocell had only two available clock sources. The number of registers available in PLD 130 with the four clock sources for each register allows system designers to implement flexible and multiple state machines in a single device. Also, in PLDs 120 and 130, which contain logic macrocells 412A2 and 412A3 respectively, storage element 503 and multiplexer 505 are included in a single component 503A with two architectural cells, but the same combination of functions is provided as in logic macrocell 412A1.

As previously described, programmable logic block 402B of second family 400B of programmable logic devices 210, 220 and 230 of this invention includes a plurality of logic output macrocells 412BA and a plurality of buried logic macrocells 412BB. Logic macrocell 412BA1 for PLD 210, sometimes referred to as an output logic macrocell, is similar to logic macrocell 412A1-A (FIG. 29B) of PLD 110 and the description of macrocell 412A1-A is incorporated herein by reference.

Figure 31A:
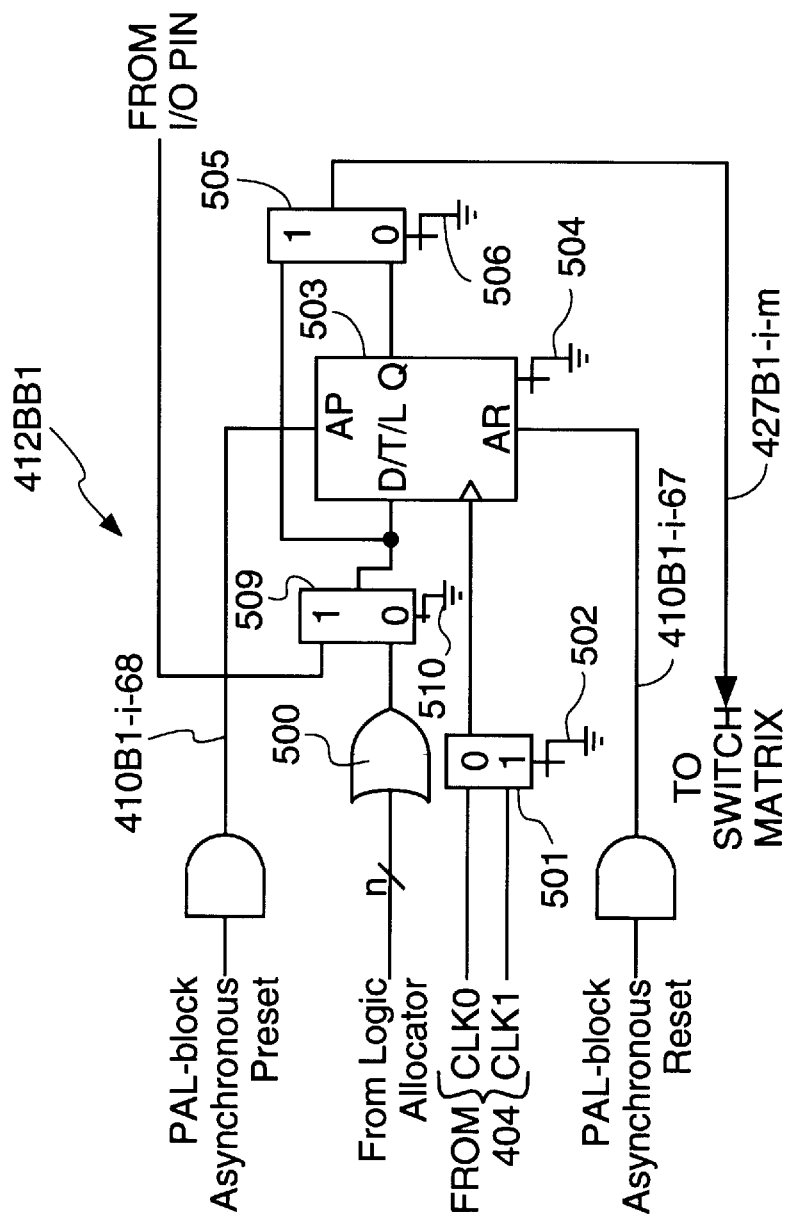
FIG. 31A is a schematic diagram of a programmable buried logic macrocell in the first embodiment of the second family of programmable logic devices according to the principles of this invention.

Buried logic macrocell 412BB1 (FIG. 31A) is also similar to output logic macrocells 412A1-A, 412BA1 (FIG. 29B) except buried logic macrocell 412BB does not have polarity control multiplexer 507. The output signal from buried logic macrocell 412BB1 (FIG. 31A) is an internal feedback signal on line 427B1-i-m to switch matrix 401B1. Buried logic macrocells 412BB1 of this invention increase the logic capability of programmable logic device 210 and provide higher silicon efficiency than would be obtained without the cells.

In buried logic macrocell 412BB1, OR gate 500 has an output line which is connected to a first terminal of a programmable input signal selection two-to-one multiplexer 509. The input line from I/O pin is connected to the second input terminal of programmable multiplexer 509. Architectural configuration cell 510 is used to configure multiplexer 509 so that either the signal from I/O pin or from OR gate 500 is provided to the output terminal of multiplexer 509.

The output terminal of multiplexer 509 is connected to the input terminal D/T/L of programmable storage element 503 and to the second input terminal of multiplexer 505. The remainder of buried logic macrocell 412BB is configured as previously described for output logic macrocell 412A1.

Figure 32A:
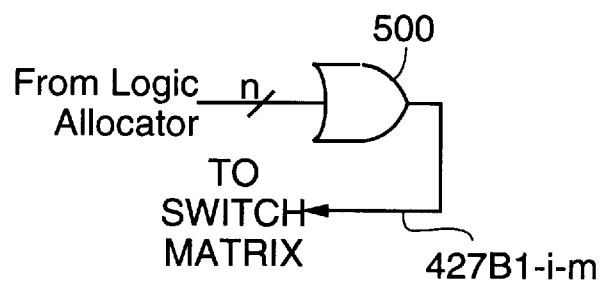
FIGS. 32A through 32H illustrate various configurations for the buried logic macrocell in FIG. 31.
Figure 32B:
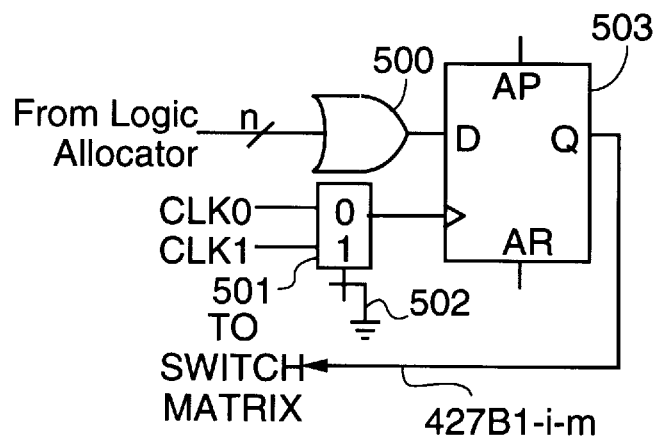
Figure 32C:
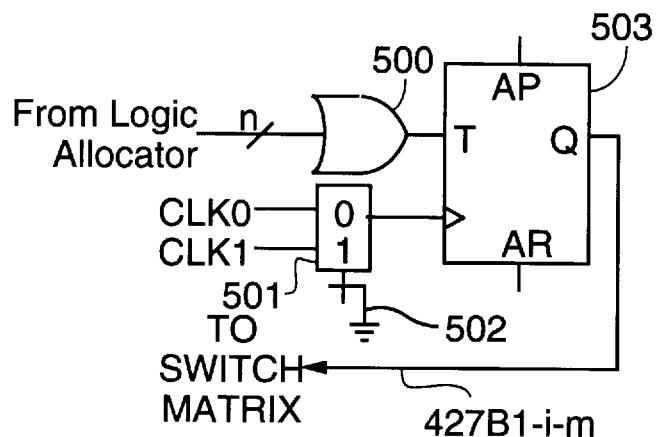
Figure 32D:
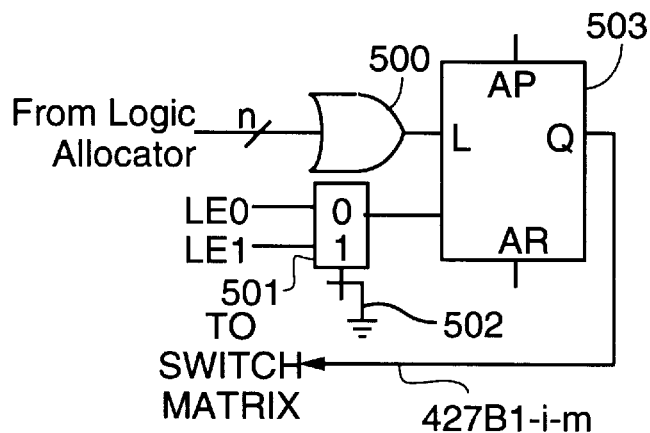

Buried logic macrocell 412BB1 has fourteen different configurations. Buried logic macrocell 412BB1 can provide (i) a combinatorial output from logic allocator 411B1 to switch matrix 401B1 (FIG. 32A), (ii) a registered D type flip-flop signal to switch matrix 401B1 from logic allocator 411B1 (FIG. 32B), (iii) a registered T type flip-flop signal to switch matrix 401B1 from logic allocator 411B1 (FIG. 32C), or (iv) a latched signal to switch matrix 401B1 from logic allocator 411B1 (FIG. 32D).

Figure 32E:
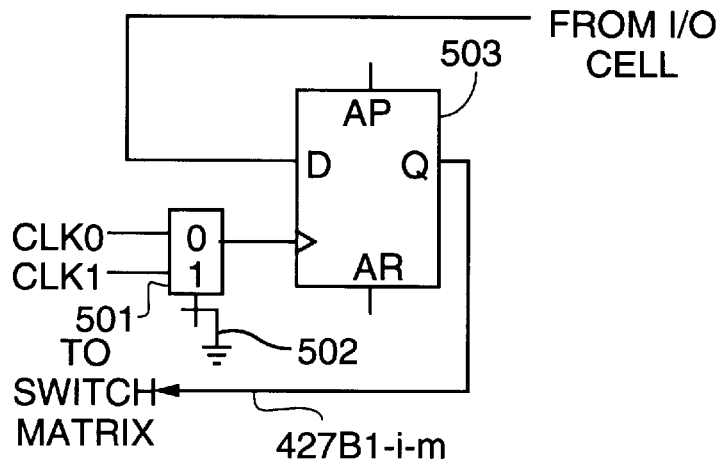
Figure 32F:
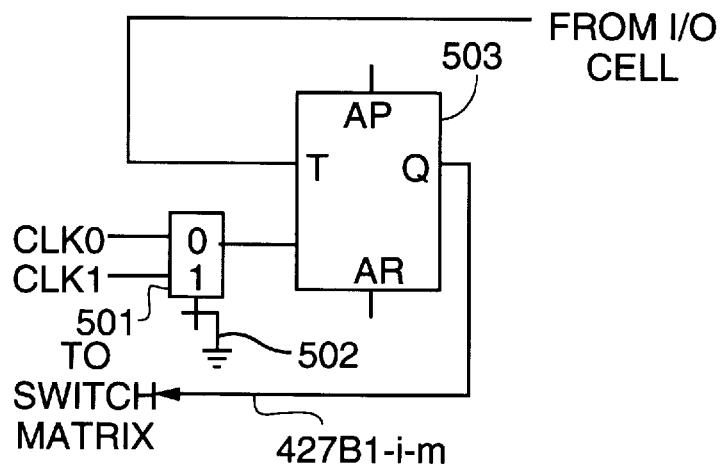
Figure 32G:
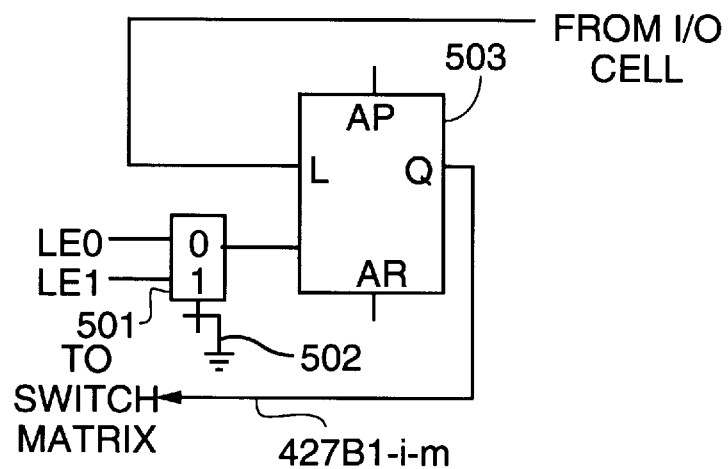
Figure 32H:

Similarly, the signal on the I/O pin can be selected by multiplexer 509 so that buried logic macrocell provides (i) a combinatorial input signal to switch matrix 401B1 (FIG. 32H), (ii) a registered input signal from a D type flip-flop to switch matrix 401B1 (FIG. 32E), (iii) a registered input signal from a T type flip-flop to switch matrix 401B1 (FIG. 32F), or a latched input signal to switch matrix 401B1 (FIG. 32G). Each of the registered and latched signals can be clocked/latched with either of the signals on lines CLK0/LE0, CLK1/LE1. Alternatively, buried logic macrocells 412BB1 could include the alternative storage elements described above for flip-flop 503 in logic output macrocell 412A1 and that description is incorporated herein by reference.

A significant feature of buried logic macrocell 412BB1 is the dual mode of operation, i.e., the buried logic macrocell's ability to function either as an output cell with feedback to switch matrix 401B1 or as a registered/latched input cell. Buried logic macrocell 412BB1 along with the bypassable registered/latched input increases significantly the utilization and silicon efficiency of programmable logic device 210B. Both dedicated input pin signals and buried logic macrocell feedback signals are available to switch matrix 401B at all times. This permits the simultaneous use of either the dedicated input pin signals and the registered/latched input signals from buried logic macrocells, or the dedicated input pin signals plus the buried registered/latched feedback signals.

Both output logic macrocells 412A1, 412BA1 and buried logic macrocells 412BB1 are clocked/latched on an individual macrocell basis by a signal from one of the two synchronous clock input pins. This clocking/latch enabling allows the user to implement flexible and multiple state machines in a single device. Further, even if either of the clock/latch enable input pins is used as a clock/latch enable signal source, the pin is still available as an input pin to the switch matrix.

Figure 29C:
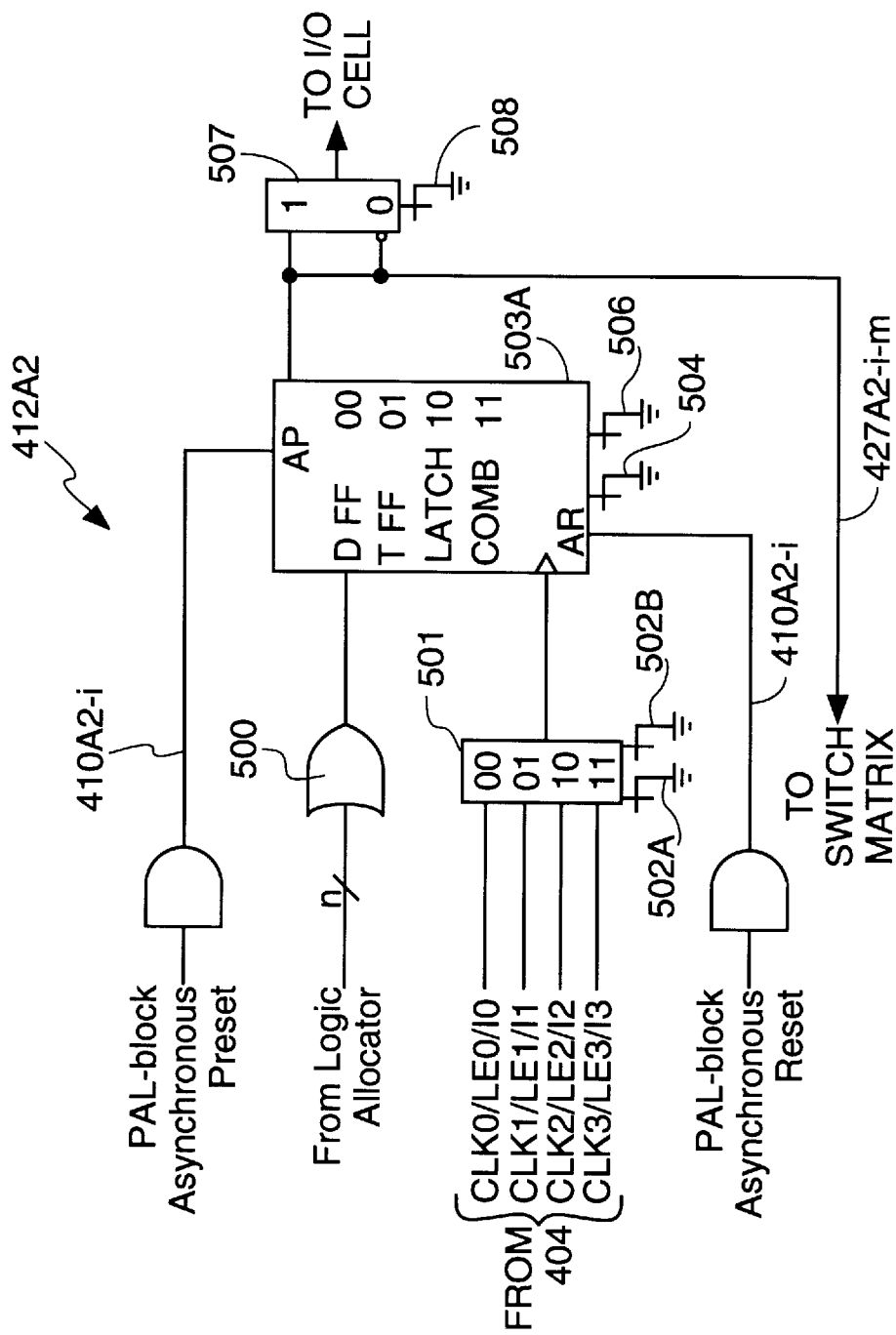
FIG. 29C is a schematic diagram of a programmable logic macrocell in the second and third embodiments of the first family of programmable logic devices according to the principles of this invention.
Figure 31B:
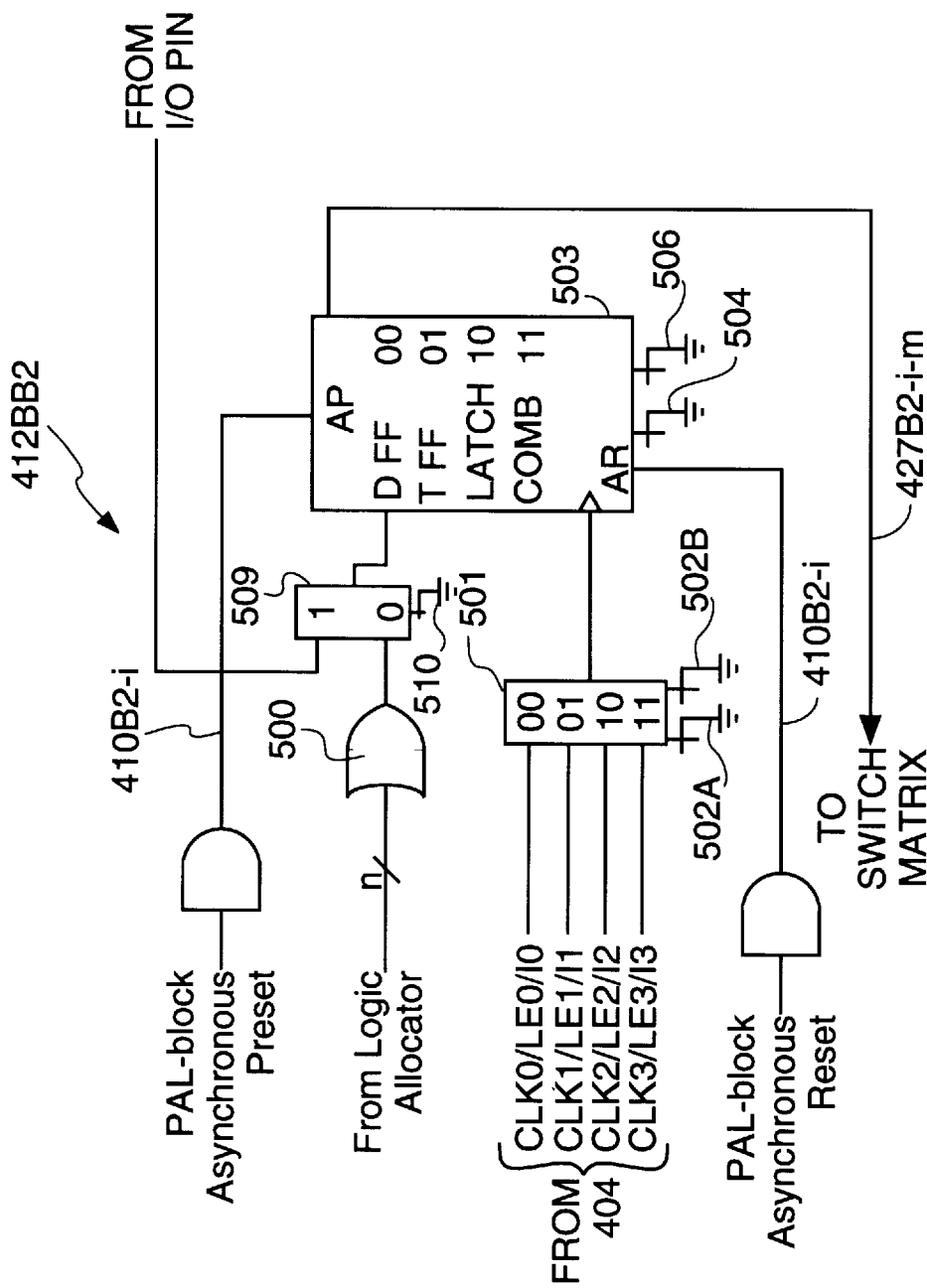
FIG. 31B is a schematic diagram of a programmable buried logic macrocell in the second and third embodiments of the second family of programmable logic devices according to the principles of this invention.

Buried logic macrocells 412BB2 and 412BB3 (FIG. 31B) are similar to logic macrocell 412BB1. However, two-to-one multiplexer 501 with one architectural cell in PLD 210 is replaced with a four-to-one multiplexer with two architectural cells in logic macrocells 412BB2 and 412BB3. Similarly output logic macrocells 412BA2 and 413BA3 are equivalent to logic macrocell 412A2 (FIG. 29C). Recall that in devices 220 (FIGS. 15A to 15D) and 230 (FIGS. 16A to 16D), four of the dedicated input pins may be used either as pins for a dedicated input signal or pins for a clock signal. Accordingly, logic macrocells 412BA2, 412BB2, 412BA3 and 412BB3 may be driven by any one of the four clock signals. Thus, PLDs 220 and 230 provide significantly greater flexibility with respect to clocking than PLD 210 where each macrocell had only two available clock sources.

In this embodiment, the latch in programmable element 503 has an input terminal, an output terminal, a latch enable terminal, an asynchronous preset terminal and an asynchronous reset terminal. The latch is a transparent latch. When the signal on the latch enable terminal is low, the latch is in the transparent mode, and the signal on the output terminal responds to the signal on the input terminal. When the signal on the latch enable terminal is high, the output signal is latched to retain the data set up on the input terminal. The signals on the preset terminal and the reset terminal dominate when either signal is active in conjunctin with a high signal on the latch enable terminal. The other modes of operation associated with other combinations of signals on the latch enable, preset, and reset terminals are defined as "other states" or "illegal states."

TABLE 4

| Mode # | Latch Enable (LE) | Asyn RESET (AR) | Asyn PRESET (AP) | Latch Mode |
|---|---|---|---|---|
| | | Allowed States | | |
| 1 | 0 | 0 | 0 | Transparent Mode |
| 2 | 1 | 0 | 0 | Latched Mode or Storage Mode |
| 3 | 1 | 0 | 1 | SET mode, Q = H |
| 4 | 1 | 1 | 0 | RESET mode, Q = L |
| | | Other States | | |
| 5 | 1 | 1 | 1 | RESET Dominates |
| 6 | 0 | 0 | 1 | SET Dominates, Q = H |
| 7 | 0 | 1 | 0 | Latch output follows Data Input |
| 8 | 0 | 1 | 1 | Latch output follows Data Input |

The particular bit sequences in Table 4 are illustrative only of one embodiment of this invention and are not intended to limit the invention to the particular embodiment disclosed. In view of this disclosure, those skilled in the art will be able to configure the programmable features of this invention using a variety of different values for the programming bits.

As previously described, all the logic macrocells including any buried logic macrocells in the programmable logic block are controlled by a common asynchronous reset product term and a common asynchronous preset product term. Thus, for each programmable logic block, all the flip-flops in the logic macrocells whether in an output logic macrocell or a buried logic macrocell are simultaneously initialized.

In this embodiment, the primary factors in the architecture are performance and cost in an optimal silicon efficient structure. For example, many programmable logic devices support both synchronous and asynchronous logic applications on a single chip. However, synchronous and asynchronous logic applications needs are different. While this configuration results in a more flexible structure, the configuration invariably requires compromise which in turn results in an inefficient structure in terms of use, speed, and silicon efficiency.

One specific example is the fixed allocation of individual reset, preset, clock, and output enable product terms per macrocell. While such an allocation of product terms provides a great deal of flexibility, a fixed allocation of four product terms per macrocells—a very expensive proposition for synchronous logic applications—is required. The control product terms essentially are wasted for synchronous logic applications. Also, individual product term allocation requires compromises for clock selection for logic macrocells because the macrocells are limited to only one clock signal from an external synchronous clock pin, which, in turn, restricts the device to a single synchronous state machine.

Figure 33:
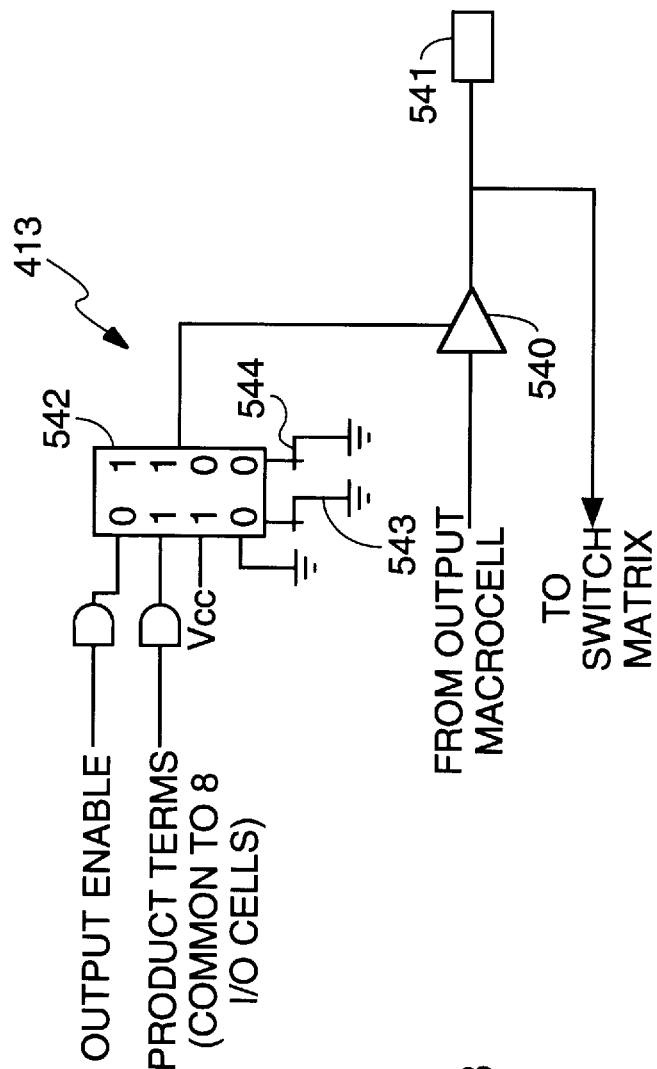
FIG. 33 is a schematic diagram of an I/O macrocell according to the principles of this invention.

I/O macrocell 413 of this invention is illustrated in FIG. 33. I/O macrocell 413 has a single three-state buffer 540 coupled to I/O pin 541. The input terminal of three-state buffer 540 is connected to output line from an output logic macrocell. The control terminal of buffer 540 is connected to the output line of a four-to-one programmable multiplexer 542. The output terminal of buffer 540 is also coupled to switch matrix 401A in the first family 400A of devices and to buried macrocell multiplexer 509 and switch matrix 401B in the second family 400B of devices.

Two output enable product terms are connected to the first two inputs of four-to-one multiplexer 542. The third input terminal is tied to power supply voltage $V_{cc}$ and the fourth terminal is grounded. Multiplexer 542 selectively provides an output enable signal to buffer 540.

Four-to-one multiplexer 542 has two architectural cells 543, 544. When first cell 543 is programmed to a logic 0 and second cell 544 is programmed to a logic 1, the first output enable product term is supplied to the control terminal of tristate buffer 540. When both architectural cells 543, 544 are programmed to a logic 1, the second output enable product term is supplied to the output control terminal of tristate buffer 540. When architectural cell 543 is programmed to a logic 1 and cell 544 to a logic 0, power supply voltage $V_{cc}$ is supplied to the terminal of buffer 540 and when both of the architectural cells 543, 544 are programmed to a logic 0 the terminal of tristate buffer 540 is grounded.

When power supply voltage $V_{cc}$ is supplied to tristate buffer 540, buffer 540 is permanently enabled for use as an output buffer and conversely when the control terminal is grounded, buffer 540 is tristated so that I/O pin 541 functions permanently as an input pin. When either of the output enable terms is applied to the control terminal, the I/O pin functions as a bidirectional I/O pin which is controlled by the product term.

As previously explained, the two product terms are common to a bank of eight I/O cells in one embodiment, and a bank of six I/O cells in another embodiment. In both embodiments, the two product terms permit the bank of I/O cells to be configured as two separate partial banks within the bank of I/O macrocells. One of the product terms controls the first partial bank of I/O macrocells and the other product term controls the second partial bank of I/O macrocells. Thus, the use of two product terms for each I/O macrocell significantly enhances the capability of the PLDs 400.

An important feature of the I/O cell structure of this invention is that this structure decouples logic macrocells 412 from I/O pins 403. The decoupling of logic macrocells 412 from I/O pins 403 has two major benefits. First, the decoupling provides dual feedback capability for programmable switch matrix 401 and second the decoupling moves the connectivity issue to switch matrix 401 where it belongs rather than prefixing at the pin. Dual feedback capabilities are beneficial for applications requiring large amounts of buried logic such as counters, shift registers, and complex state machines and I/O intensive applications requiring large amounts of pins, reserving the macrocell functions for buried logic.

Switch interconnect matrix 401 is arranged so that each signal passing through this matrix passes through a fixed number of interconnect elements within the switch matrix. This insures that the time delays for all signals passing through switch matrix 401 are substantially the same and allows resynchronization, if desired, of groups of contemporaneous signals passing through switch matrix 401. specifically, the time delay for a signal through the switch matrix is a fixed, uniform path independent delay irrespective of the signal's origin. Hence, a dedicated input pin signal, an I/O pin input signal, and a feedback signal, all see the same time delay in traversing through the switch matrix.

To achieve maximum speed through switch matrix 401, the matrix has been purposely not implemented as a full cross-point switch. The switch matrix could be implemented as a full cross-point switch to achieve enhanced functionality. However, the enhanced functionality of the full cross-point switch matrix results in diminished speed performance, an increased die size, and potentially wasted silicon.

Switch matrix 401 was selected to provide a balance between functionality, speed performance and die size. Switch matrix 401 is structured as a single, centralized switch to achieve the uniform, fixed delay time for all signal paths through switch matrix 401, as described above. However, switch matrix 401 may also be implemented as multiple hierarchial decentralized switches. In view of the description of switch matrix 401 of this invention and the full cross-point switch matrix, other switch matrices, having varying degrees of functionality, speed and die size, could be designed and implemented by those skilled in the art.

Figure 34:
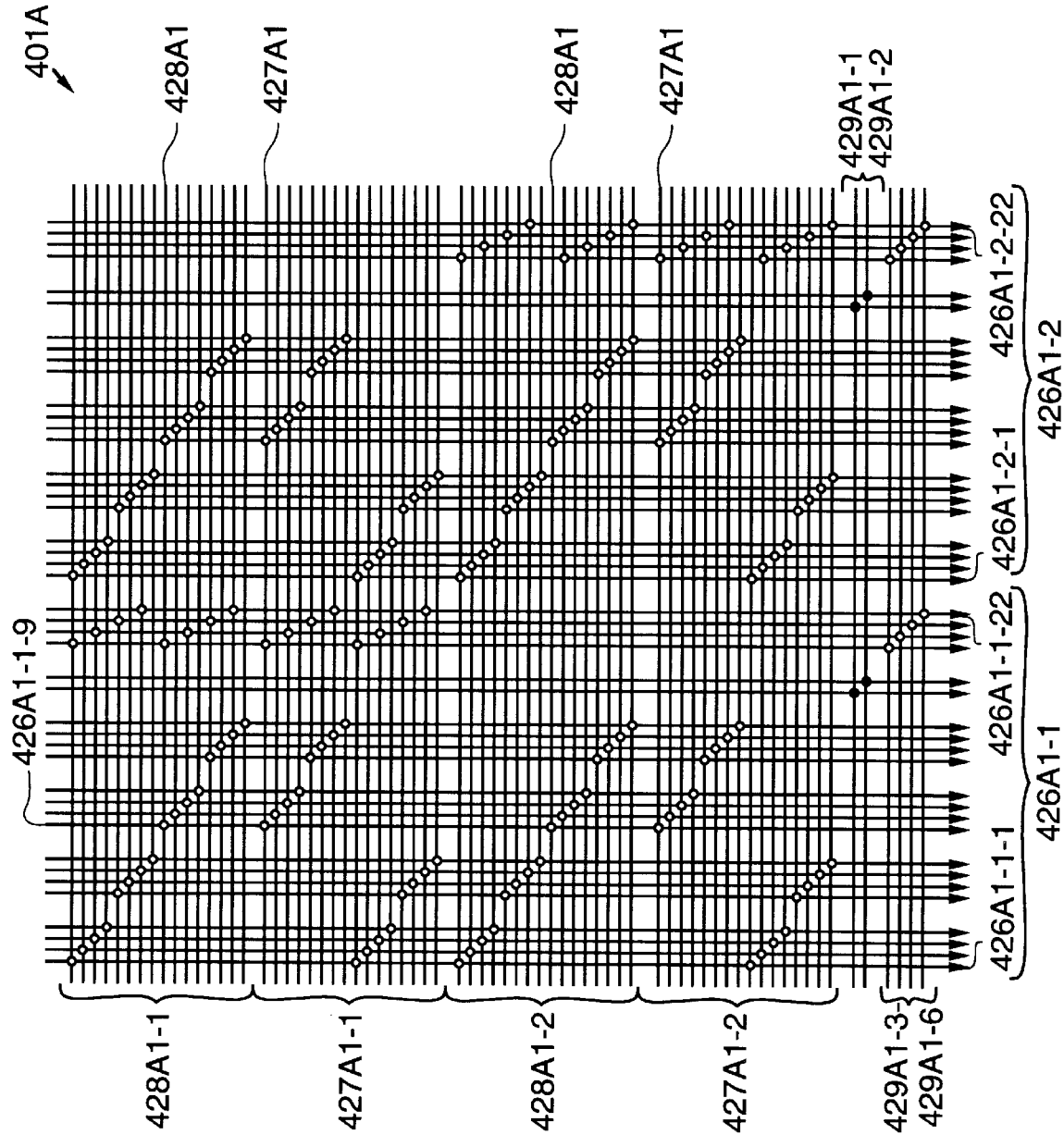
FIG. 34 is a diagram of the programmable multiplexers in switch matrix 401A1.

Switch matrix 401A1 for PLD 110 of programmable logic devices 400 of this invention is illustrated in FIG. 34. In FIG. 34, the horizontal lines represent signal input lines to switch matrix 401A1. The vertical lines represent the input lines to programmable logic blocks 402A1-1, 402A1-2. The circles at the intersections of the horizontal and vertical lines represent programmable connections. Specifically, as explained more completely below, switch matrix 401A1 includes a multiplicity of four-to-one programmable multiplexers and a multiplicity of five-to-one programmable multiplexers.

The upper most group of eight horizontal lines are lines 428A1-1 (FIG. 34) which provide input signals from I/O pins 403A1-17 to 403A1-32 (FIG. 11). The next group of sixteen horizontal lines are lines 427A1-1-1 to 427A1-1-16 (FIG. 34) from logic macrocells 412A1-1 (FIG. 11). Accordingly, these lines provide feedback signals to switch matrix 401A1 from logic macrocells 412A1-1. The third group of sixteen horizontal lines are lines 428A1-2 (FIG. 34) from I/O pins 403A1-1 to 403A1-16 (FIG. 11) and the fourth group of sixteen horizontal lines are lines 427A1-2 (FIG. 26) from logic macrocells 412A1-2. The next pair of lines are dedicated input lines from dedicated input pins 404A1-1 and 404A1-2. The bottom four horizontal lines are connected to the two dedicated input pins 404A1-4, 404A1-5 and the two clock/input pins 404A1-3 and 404A1-6.

The first twenty-two vertical lines 426A1-1-1 through 426A1-1-22 from the left-hand side of switch matrix 401A are connected to input lines 426A1-1 to programmable logic block 402A1-1. The other twenty-two vertical lines on the right-hand side of switch matrix 401A1 are input lines 426A1-2 of programmable logic block 402A1-2.

The portion of switch matrix 401A1 associated with a programmable logic block 402A1-i has a total of twenty programmable multiplexers, one which drives each input line of the product term array and which programmably couples selected switch matrix input lines, the horizontal lines in FIG. 34, to selected switch matrix output lines, the vertical lines in FIG. 34, which in turn are the input lines to a programmable logic block. Thus, switch matrix 401A1 consists of a total of forty programmable multiplexers.

In each group of twenty programmable multiplexers associated with the input lines of a programmable logic block, sixteen of the multiplexers are four-to-one multiplexers, and four are five-to-one multiplexers. Two of the input lines for each programmable logic block are connected directly to dedicated input pins by switch matrix 401A1. In FIG. 34, each vertical line is either an output line from one of the multiplexers or one of the two fixed lines. The circles on a vertical line represent programmable connections between the input lines and the output line of the particular multiplexer.

For example, the ninth vertical line from the left-hand side of the matrix is input line 426A1-1-9 to programmable logic block 402A1-1 and is the output line of a programmable four-to-one multiplexer in switch matrix 401A1. The input lines to this multiplexer are line 428A1-1-9 from the ninth I/O pin of programmable logic block 402A1-1, line 427A1-1-1 from the first logic macrocell 402A1-1 and the corresponding lines from the second programmable logic block 402A1-2.

Thus, sixteen of the input signals for both programmable logic blocks 402A1-1, 402A1-2 are derived from four different sources, i.e., two I/O pin sources and two macrocell feedback sources rotated to allow dual feedback capability.

More specifically, each four-to-one programmable multiplexer has two architectural cells which are used to the multiplexer so that only one of the input lines is connected to the output line. The architectural cells provide an input select signal to the multiplexer. The resource selection for each group of multiplexers is presented in Tables 5 and 6.

TABLE 5

Four-to-One Programmable Multiplexer Signal Selection in Switch Matrix 401A1 of Family 400A

| Architectural Cell 1 | Architectural Cell 2 | Global Signal Selections |
|---|---|---|
| 0 | 0 | I/O pin input signals from PLB 402A1-1 |
| 0 | 1 | Feedback signals from logic macrocells in PLB 402A1-1 |
| 1 | 0 | I/O pin input signals from PLB 402A1-2 |
| 1 | 1 | Feedback signal from logic macrocells in PLB 402A1-2 |

Note in Table 6, the multiplexers receive input signals from only a single programmable logic block so that only the multiplexers associated with block 402A1-1 are given in Table 6. The architectural cells configurations for block 402A1-2 is the same as that shown for block 402A1-1 except the sources are from block 402A1-2.

TABLE 6

Signal Selection for Five-to-One Programmable Multiplexer in Switch Matrix 401A1 of Family 400A.

| Architectural Cell 1 | Architectural Cell 2 | Architectural Cell 3 | Global Signal Selections |
|---|---|---|---|
| 0 | 0 | 0 | I/O pin input signals from PLB 402A1-1 |
| 0 | 1 | 0 | Feedback signals from logic macrocells in PLB 402A1-1 |
| 1 | 0 | 0 | I/O pin input signals from PLB 402A1-1 |
| 1 | 1 | 0 | Feedback signals from logic macrocells in PLB 402A1-1 |
| 0 | 0 | 1 | Signal from dedicated input pin |

The input signal sources to switch matrix 401A1 are appropriately rotated so that for any logic macrocell and the I/O pin associated with that logic macrocell, both the logic macrocell feedback signal and the signal on the corresponding I/O pin are available to each programmable logic block in device 110.

For example, the signal on the first I/O pin is an input to the first four-to-one multiplexer while the feedback signal is an input to the ninth four-to-one multiplexer. Thus, this rotation allows buried registered capability without increasing the size of the product term array. Hence, unlike prior art devices, the product term array size is independent of the number of logic macrocells.

Also notice that each programmable logic block may receive the same input signals or different input signals. This allows the structure to function either as a monolithic array with a maximum of twenty-two inputs common to each array or two separate relatively independent split arrays with a total maximum number of forty-two input signals.

An alternate representation of switch matrix 401A1 is illustrated in FIG. 35A and 35B. For ease of presentation, blocks 402A1-1 and 402A1-2 are represented as blocks "A" and "B" respectively. Similarly, logic macrocell 412A1-1-1 becomes A1 and logic macrocell 412A1-2-1 becomes B1 so that the macrocells in block 401A1-1 range from macrocell A1 to macrocell A16 and in block 402A1-2 from macrocell B1 to B16. The feedback lines are represented by the macrocell number. The I/O pin associated with a macrocell is represented by the macrocell number followed by a carat "^". Dedicated input pins 404A are numbered I1 to I6.

In programmable logic devices 110, switch matrix 401A1 drove twenty-two input lines for each programmable logic block in the device. The important aspect, as previously described, is that the number of input lines is fixed and does not change with changes in the number of logic macrocells or dedicated input pins.

The major thrust for the family of PLDs of this invention is speed. Hence, each of the components in the devices were optimized for speed, even at some expense of flexibility. In particular, interconnect architecture plays an extremely important role for the performance of high density PLDs. For the segmented block based PLD architecture of this invention, there are at least two approaches for implementing interconnects, a fully populated cross-point switch interconnect array or a sparsely populated switch matrix.

As previously described, a fully populated interconnect array causes significant speed degradation and also possibly results in higher die cost. Hence switch matrix 401 is a partially populated structure and in one embodiment is based on a series of multiplexers. Since switch matrix 401 is not implemented as a fully populated cross-point switch (or interconnect array), signal routing for the PLDs of this invention is essentially affected by two factors: the number of input lines to the programmable array in the programmable logic block and the switch matrix multiplexer size for each of such input lines.

As described above, PLD 110 has 22 input lines to the programmable logic block. Also, the switch matrix multiplexers for PLD 110 are implemented as 4:1 and 5:1 multiplexers. While this is acceptable for low-density PLDs, higher density PLDs 120, 130, 220, and 230 of this invention have even greater routability.

To ensure greater routability, both the number of programmable input lines and the switch multiplexer size are increased for these PLDS. However, both a larger number of programmable array input lines and larger switch matrix multiplexer size incur both a speed penalty and a die size penalty. For example, in one embodiment for the technology described above, increasing the number of programmable array input lines by 4 introduces a speed penalty of about 0.4 to 0.6 nanoseconds and a potential die size increase of about 6,000 to 7,000 square mils. Therefore, according to the principles of this invention, a balance is obtained between die size, speed and routability.

Preferably for high density PLDs 120, 130, 220 and 230 of this invention, each routable signal must have more than 2.5 ways to enter each programmable logic block, i.e., a routability factor of at least 2.5. More preferably, each signal is routable in at least 3 ways.

Obtaining the signal routability of at least 2.5 can be accomplished, for example, either by adjusting the number of input lines to the programmable array or the switch matrix multiplexer size. For a fixed number of programmable array input lines, i.e. 26 input lines, the switch matrix multiplexer size is selected to provide at least the 2.5 routability factor. Specifically, in this embodiment, the routability factor for switch matrix 401 is:

$$\text{Routability Factor} = \frac{\text{Total \# of potential signal routes}}{\text{Total \# of routable signals}}$$

$$= \frac{(\text{\# of programmable array input lines})(\text{mux size})}{\text{Total \# of routable signals}}$$

For PLDs 110, 120, 130, 210, 220 and 230 the total number of routable signals to switch matrix 401 is the sum of dedicated input pin signals, logic macrocell feedback signals and I/O pin signals, which is the maximum number of signal sources for the switch matrix. Table 7 gives the multiplexer size (mux size), number of programmable array input lines and the total number of routable signals for each of the PLDs of this invention.

TABLE 7

| Package Size | 110 44-pin | 210 44-pin | 120 68-pin | 220 68-pin | 130 64-pin | 230 84-pin |
|---|---|---|---|---|---|---|
| # of Input Lines/BLK | 22 | 22 | 26 | 26 | 26 | 26 |
| Switch Matrix (SM) Mux Size | 4:1 | 12:1 | 16:1 | 16:1 | 16:1 | 16:1 |
| # of IO signals | 32 | 32 | 48 | 48 | 64 | 64 |
| # of Dedicated Input signals | 6 | 6 | 8 | 8 | 6 | 6 |
| # of Macrocell Feedback Signals | 32 | 64 | 48 | 96 | 64 | 128 |
| Max # of Signal Sources for SM | 70 | 102 | 104 | 152 | 134 | 198 |
| # of Signal Sources used for SM | 70 | 102 | 104 | 152 | 134 | 150 |
| Max # of Ways a signal can be routed | 1.14 | 2.58 | 4.0 | 2.73 | 3.1 | 2.77 |

In PLD 120, switch matrix 401A2 routes 26 signals to each programmable logic block 402A2. The 26 signals are derived from a maximum of 104 global signals. Further, as shown in Table 7, each of the input signals provided by switch matrix 402A2 is derived from a 16 to 1 multiplexer. Thus, the 104 signal sources are grouped into 16 bands with approximately 6.5 signals in each band. One signal may be shared between two or more bands. Thus, for comparison of band structures, a fraction of the signal is assigned to each band that shares the signal. Thus, the signals in a band may include a fraction of a signal. FIG. 36 illustrates the set of signal bands that are used for all four programmable logic blocks in PLD 120.

For ease of representation, programmable logic blocks 402A2-1, 402A2-2, 402A2-3, and 402A2-4, are represented as blocks "A", "B", "C", and "D", respectively. Similarly, logic macrocell 412A2-1-1 becomes "A0", logic macrocell 412A1-1-12 becomes "A11", and logic macrocell 412A2-2-1 becomes "B0". Thus, the logic macrocells in block 402A2-1 range from macrocell A0 to macrocell A11, and block 402A2-2 from macrocell B0 to B11, and block 402A2-3 from macrocell C0 to C11, and in block 402A2-4 from macrocell D0 to D11. The feedback lines to switch matrix 401A2 are represented by the macrocell number. The I/O pin associated with the macrocell is represented by the macrocell number followed by a carat """. Dedicated input pins 404A2 are numbered I0 through I7 respectively.

Figure 37:
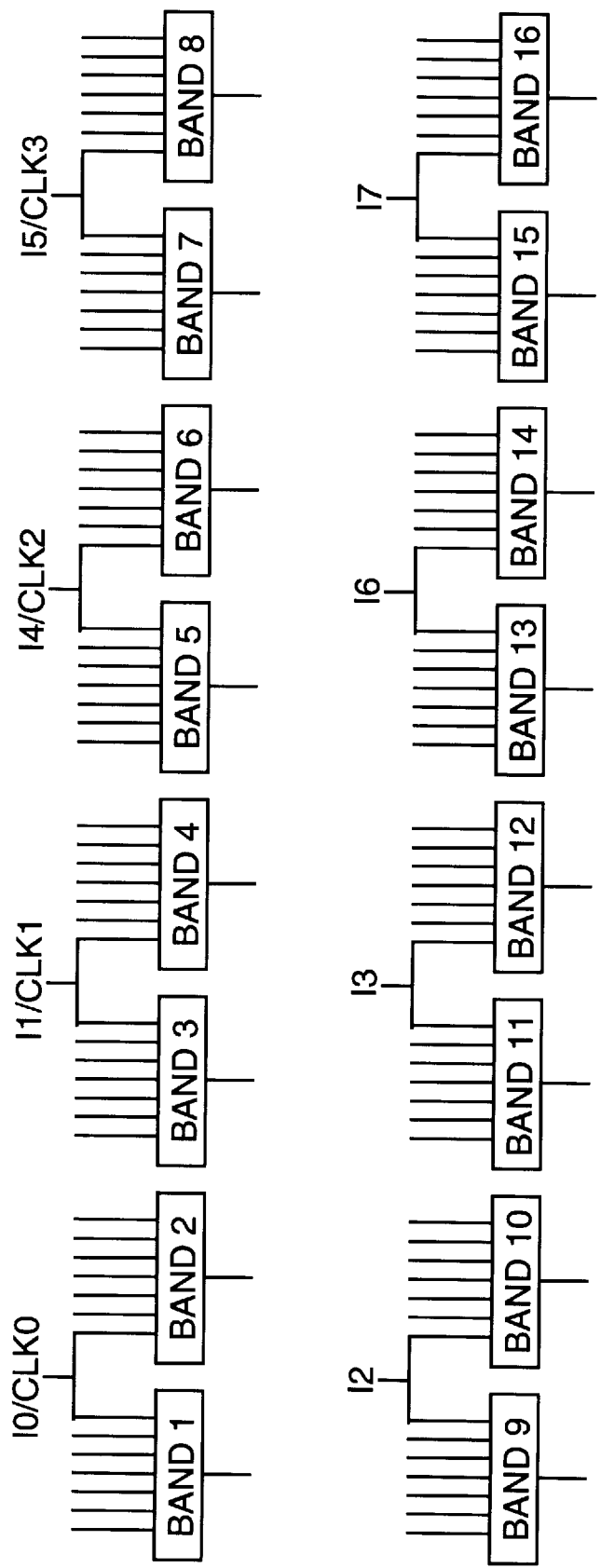
FIG. 37 is a graphical representation of the band structure used to generate the signals for the programmable 16:1 multiplexers in switch matrix 401A2 of this invention.

In one embodiment, the 104 signals are grouped into 16 signal bands and one signal from each band is programmably selectable as an input signal to one of the 16:1 multiplexers of switch matrix 401A2. FIG. 37 illustrates graphically the sixteen bands where each band has 6.5 signals and the output line from the band is an input line to a 16:1 multiplexer. The signals have been grouped in bands to maximize routability and to ease the layout of PLD 120. The signals in a band are selected based upon the physical locations of the dedicated input pins as well as layout considerations necessary to maintain speed performance and ease of manufacture.

Notice that the signal sources in a band are appropriately rotated to allow both the macrocell feedback and the corresponding I/O feedback to be available for each programmable logic block. This rotation allows the buried register capability without increasing the array size and is one of the important features of this invention. An important aspect of this invention is the arrangement of signals within a band and the rotation of signals in a band to allow maximum flexibility and routability for getting signals from dedicated input pins, I/O pins, macrocell feedback lines, and buried macrocell feedback lines simultaneously to a programmable logic block.

FIGS. 38A to 38D illustrate the actual switch matrix signal patterns for all four programmable logic blocks 402A2 of PLD 120. The columns in FIGS. 38A to 38D are the signals in the band which are rotated within the column, as described above, and each row is the input signals to a 16 to 1 multiplexer that provides the input signal on the input line indicated in the left hand column. Note, for ease of representation, FIGS. 38A to 38D include the input line column in each figure. However, only a single input signal is provided by each row of the table shown in the four figures.

According to the principles of this invention, the 26 input signals for each programmable logic block 402A2-i may be unique or the same for all four blocks. This allows PLD 120 to function either as a monolithic array with a maximum of 26 input signals, or four separate relatively independent split-arrays with a total maximum number of input signals of 104 at a given instant.

In PLD 130, switch matrix 401A3 also routes 26 signals to each programmable logic block 402A3. The 26 signals are derived from a maximum of 134 global signals. Further, as shown in Table 7, each of the input signals provided by switch matrix 402A3 is derived from a 16 to 1 multiplexer. Thus, the 134 signal sources are grouped into 16 bands with approximately 8.5 signals in each band. FIG. 39 illustrates the set of signal bands that are used for all four programmable logic blocks in PLD 130.

For ease of representation, programmable logic blocks 402A3-1, 402A3-2, 402A3-3, and 402A3-4, are represented as blocks "A", "B", "C", and "D", respectively. Similarly, logic macrocell 412A3-1-1 becomes "A0", logic macrocell 41231-1-16 becomes "A15", and logic macrocell 412A3-2-1 becomes "B0". Thus, the logic macrocells in block 402A3-1 range from macrocell A0 to macrocell A15, in block 402A3-2 from macrocell B0 to B15, in block 402A3-3 from macrocell C0 to C15, and in block 402A3-4 from macrocell D0 to D15. The feedback lines to switch matrix 401A3 are represented by the macrocell number. The I/O pin associated with the macrocell is represented by the macrocell number followed by a carat """. Dedicated input pins 404A3 are numbered I0 through I5 respectively.

Figure 40:
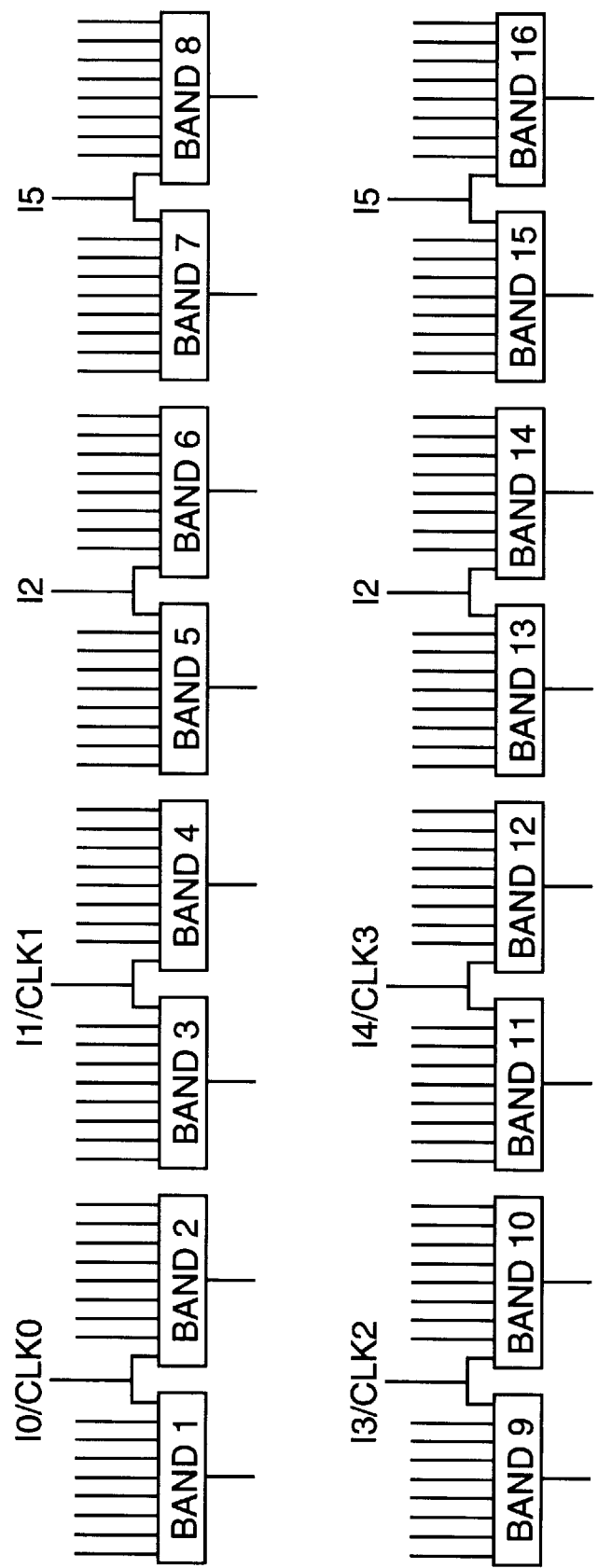
FIG. 40 is a graphical representation of the band structure used to generate the signals for the programmable 16:1 multiplexers in switch matrix 401A3 of this invention.

In one embodiment, the 134 signals are grouped into 16 signal bands and one signal from each band is an input signal to one of the 16:1 multiplexer of switch matrix 401A2. FIG. 40 illustrates graphically the sixteen bands with each having 8.5 signals. The output line from the band is an input line to a 16:1 multiplexer. The signals have been grouped in bands to maximize routability and to ease the layout of PLD 130. Notice that the signal sources in a band are appropriately rotated to allow both the macrocell feedback and the corresponding I/O feedback to be available for each programmable logic block. This rotation allows the buried register capability and signal routability without increasing the array size and is one of the important features of this invention.

FIGS. 41A to 41D illustrate the actual switch matrix signal patterns for all four programmable logic blocks 402A3 of PLD 130. The columns in FIGS. 41A to 41D are the signals in the band which are rotated within the column, as described above, and each row is the input signals to a 16 to 1 multiplexer that provides the input signal on the input line indicated in the left hand column. Note, for ease of representation, FIGS. 41A to 41D include the input line column in each figure. However, only a single input signal is provided for each row of the table as shown in the four figures.

According to the principles of this invention, the 26 input signals for each programmable logic block 402A3-i may be unique or the same for all four blocks. This allows PLD 130 to function either as a monolithic array with a maximum of 26 input signals, or four separate relatively independent split-arrays with a total maximum number of 104 input signals out of a possible 134 signals at a given instant.

As described above PLDs 120, 130, 220 and 230 have an increased number of input lines to programmable array 410 and a switch matrix 402 with 16:1 multiplexers to provide a rotability factor of at least 2.5 for these high density devices. However, PLD 210 is a lower density device compared to the other devices of this invention and so in PLD 210, switch matrix 401B1 routes 22 signals to each programmable logic block 402B1. The 22 signals are derived from a maximum of 102 global signals. Further, as shown in Table 7, each of the input signals provided by switch matrix 402B1 is derived from a 12 to 1 multiplexer. Thus, the 102 signal sources are grouped into 12 bands with approximately 8.5 signals in each band. FIG. 42 illustrates the set of signal bands that are used for all four programmable logic blocks in PLD 210.

For ease of representation, programmable logic blocks 402B1-1, 402B1-2, 402B1-3, and 402B1-4, are represented as blocks "A", "B", "C", and "D", respectively. Similarly, logic macrocell 412BA1-1-1 becomes "A0", buried logic macrocell 412BB1-1-1 becomes "A1" logic macrocell 412BB1-1-8 becomes "A15", and logic macrocell 412BA1-2-1 becomes "B0". Thus, the logic macrocells in block 402B1-1 range from macrocell A0 to macrocell A15, and block 402B1-2 from macrocell B0 to B15, and block 402B1-3 from macrocell C0 to C15, and in block 402B1-4 from macrocell D0 to D15 where the even numbers are output logic macrocells and the odd numbers are buried logic macrocells. The feedback lines to switch matrix 401B1 are represented by the macrocell number. The I/O pin associated with the output logic macrocell is represented by the macrocell number followed by a carat "^". Dedicated input pins 404B1 are numbered I0 through I5 respectively.

Figure 43:
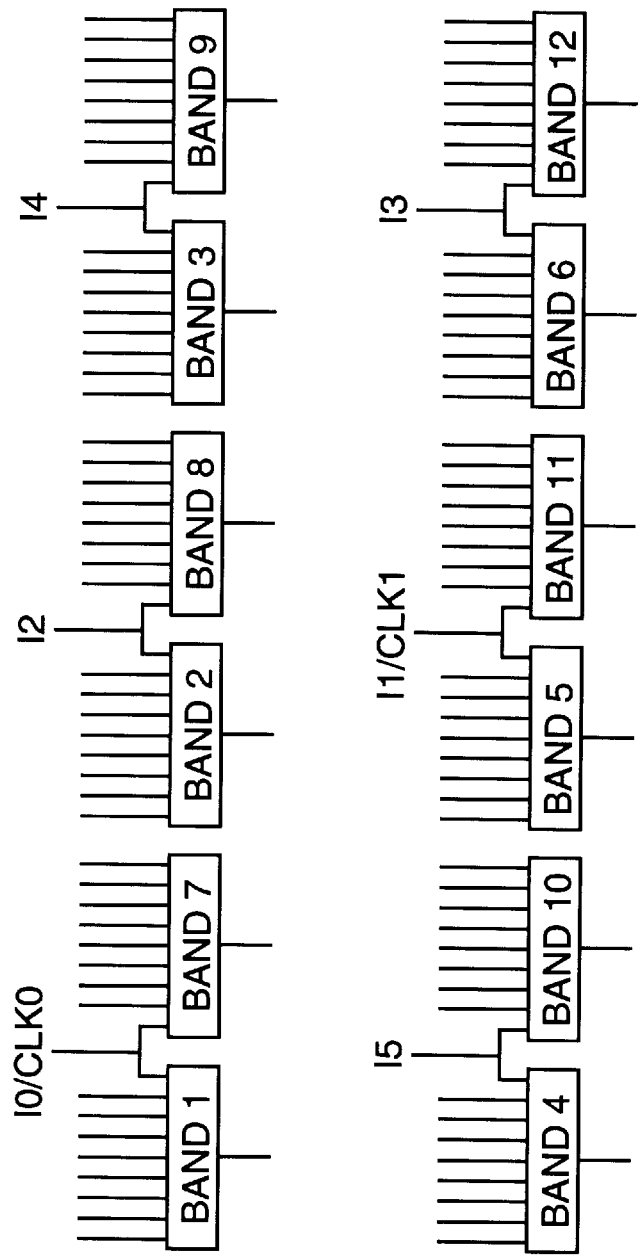
FIG. 43 is a graphical representation of the band structure used to generate the signals for the programmable 12:1 multiplexers in switch matrix 401B1 of this invention.

In one embodiment, the 102 signals are grouped into 12 signal bands and one signal from each band is an input signal to one of the 12:1 multiplexers of switch matrix 401B1. FIG. 43 illustrates graphically the twelve bands with each band having 8.5 signals. The output line from the band is an input line to a 12:1 multiplexer. The signals have been grouped in bands to maximize routability and to ease the layout of PLD 210. Notice that the signal sources in a band are appropriately rotated to allow both the macrocell feedback and the corresponding I/O feedback to be available for each programmable logic block. This rotation allows the buried register capability without increasing the array size and is one of the important features of this invention.

FIGS. 44A to 44C illustrate the actual switch matrix signal patterns for all four programmable logic blocks 402B1 of PLD 210. The columns in FIGS. 44A to 44C are the signals in the band which are rotated within the column, as described above, and each row is the input signals to a 12 to 1 multiplexer that provides the input signal on the input line indicated in the left hand column. Note, for ease of representation FIGS. 44A to 44C includes the input line column in each figure. However, only a single input signal is provided by each row of the table shown in the four figures.

According to the principles of this invention, the 22 input signals for each programmable logic block 402B1-i may be unique or the same for all four blocks. This allows PLD 210 to function either as a monolithic array with a maximum of 22 input signals, or four separate relatively independent split-arrays with a total maximum number of 88 input signals out of a possible 102 signals.

In PLD 220, switch matrix 401B2 routes 26 signals to each programmable logic block 402B2. The 26 signals are derived from a maximum of 152 global signals. Further, as shown in Table 7, each of the input signals provided by switch matrix 402B2 is derived from a 16 to 1 multiplexer. Thus, the 152 signal sources are grouped into 16 bands with approximately 9.5 signals in each band. FIG. 45 illustrates the set of signal bands that are used for all eight programmable logic blocks in PLD 220.

For ease of representation, programmable logic blocks 402B2-1, 402B2-2, . . . , 402B2-8, are represented as blocks "A", "B", . . . , "H", respectively. Similarly, logic macrocell 412BA2-1-1 becomes "A0", buried logic macrocell 412BB2-1-1 becomes "A1", logic macrocell 412BB2-1-6 becomes "A11", and logic macrocell 412BA2-2-1 becomes "B0". Thus, the logic macrocells in block 402B2-1 range from macrocell A0 to macrocell A11, in block 402B2-2 from macrocell B0 to B11, . . . , and in block 402B2-8 from macrocell H0 to H11 where the even numbers are output logic macrocells and the odd numbers are buried logic macrocells. The feedback lines to switch matrix 401B2 are represented by the macrocell number. The I/O pin associated with the output logic macrocell is represented by the macrocell number followed by a carat "^". Dedicated input pins 404B2 are numbered I0 through I7 respectively.

Figure 46:
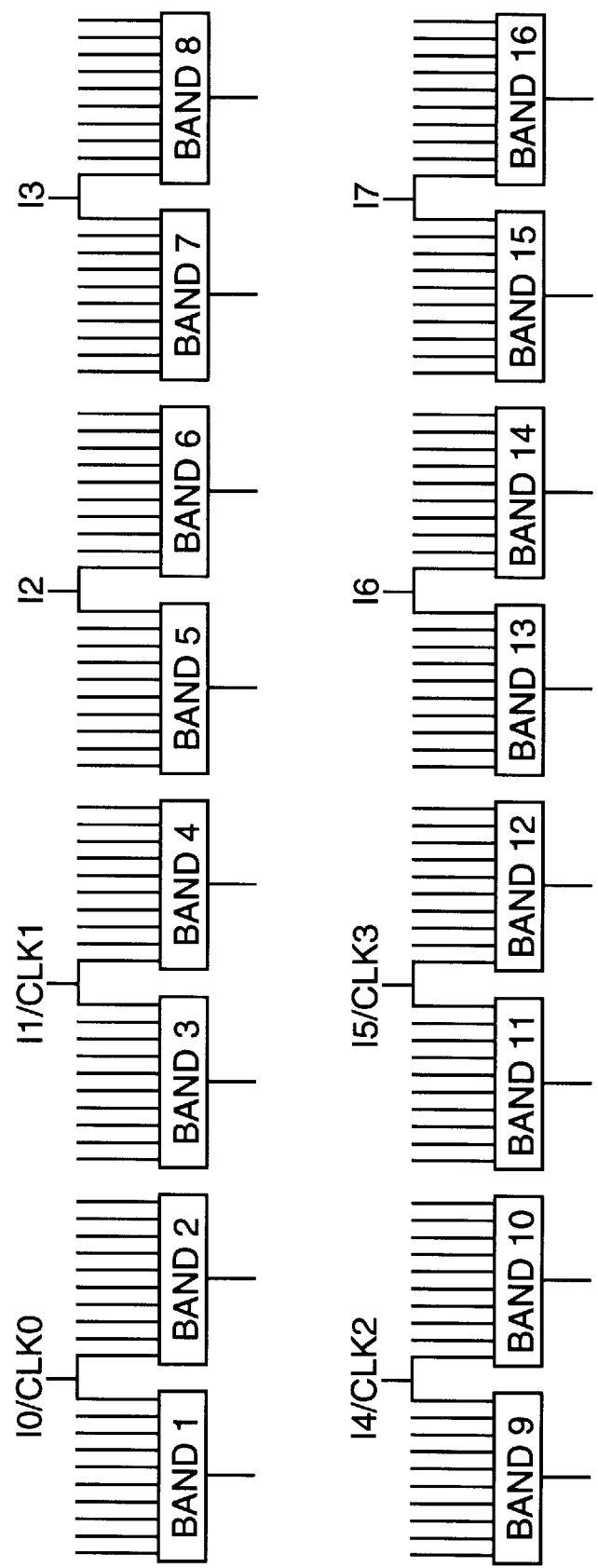
FIG. 46 is a graphical representation of the band structure used to generate the signals for the programmable 16:1 multiplexers in switch matrix 401B2 of this invention.
Figure 52A:
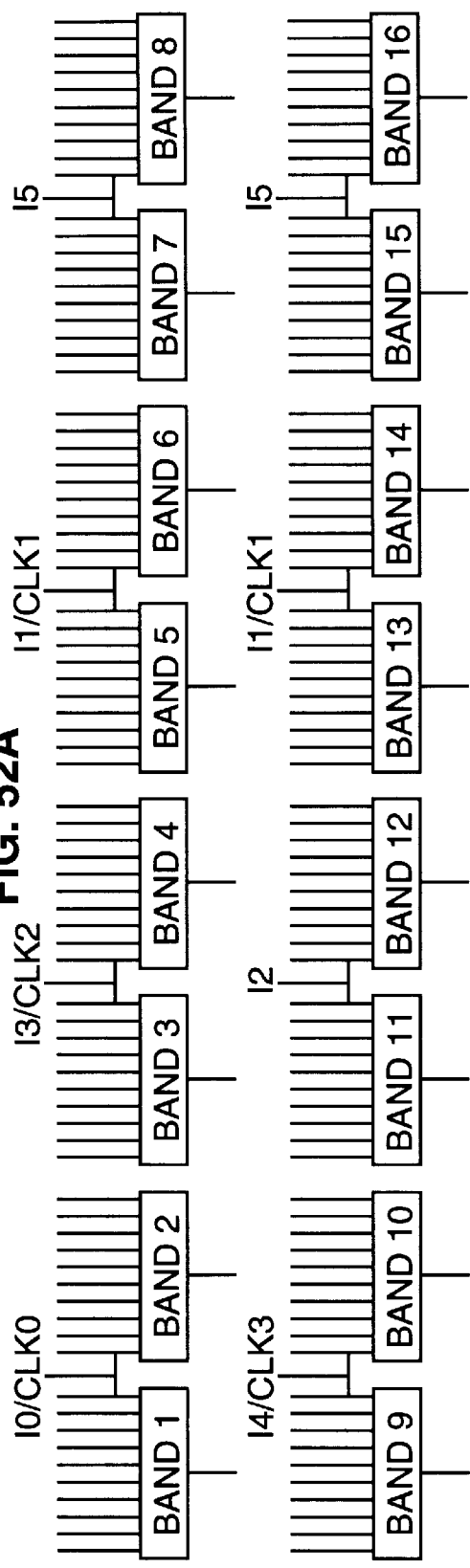
FIGS. 52A to 52D is a graphical representation of the band structure used to generate the signals for the programmable 16:1 multiplexers in switch matrix 401B3 of this invention.
Figure 52B:
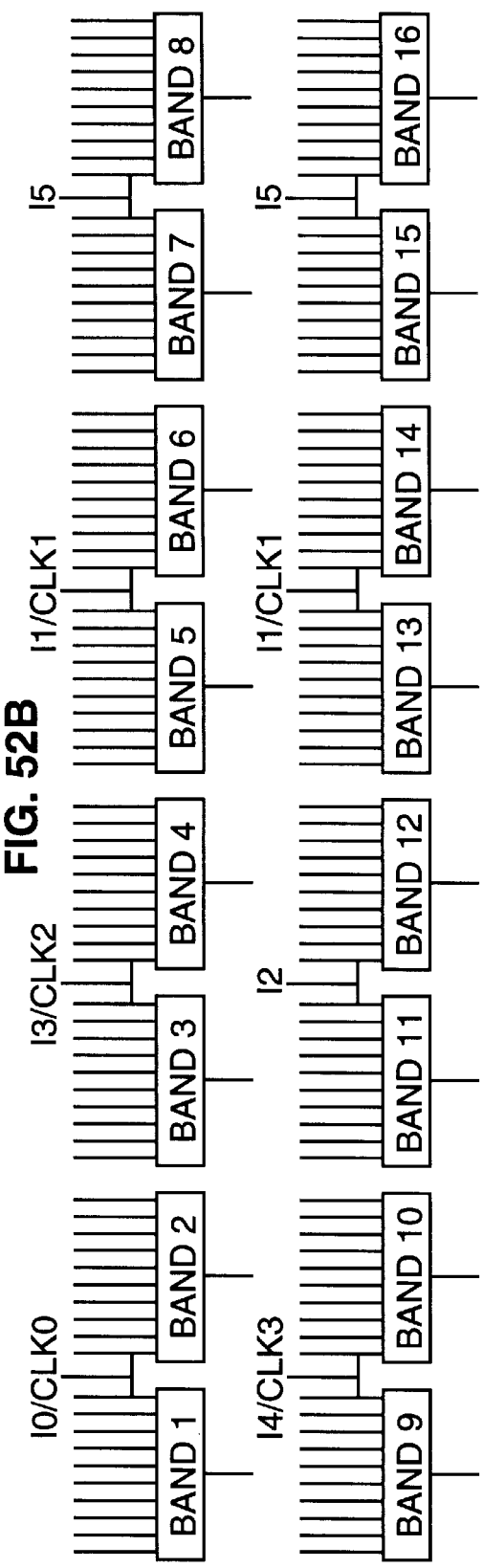
Figure 52C:
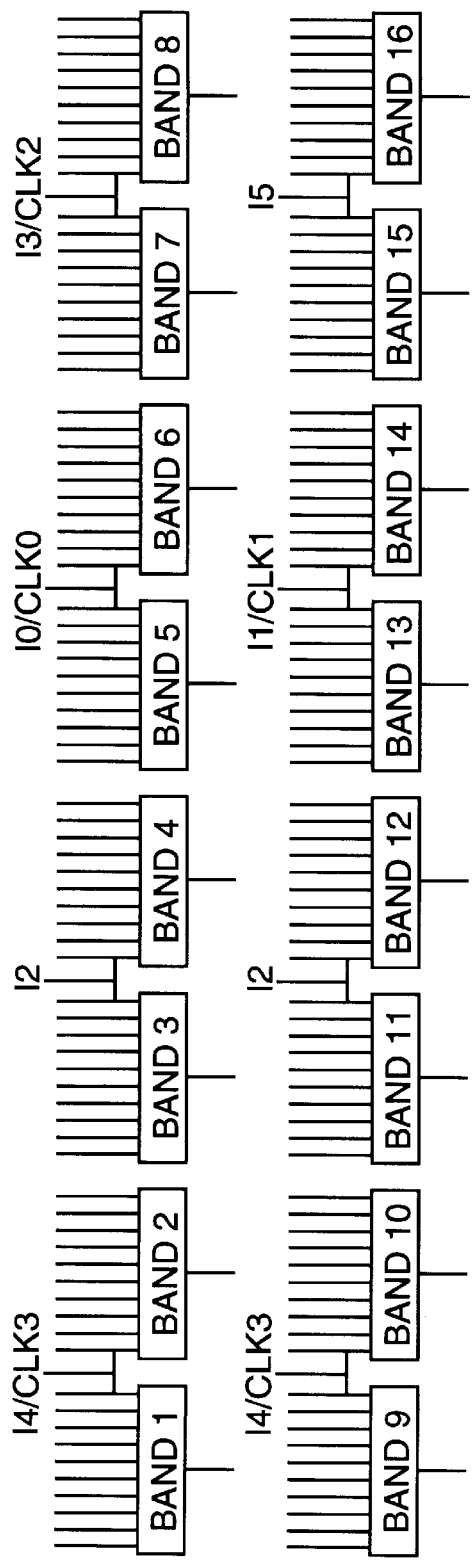
Figure 52D:
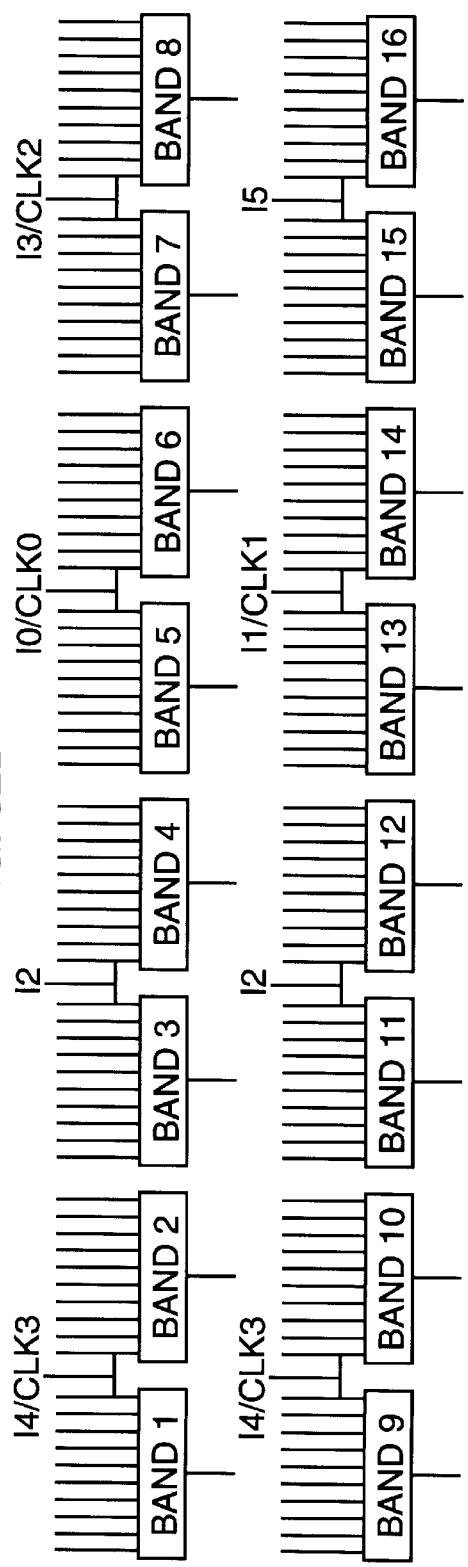

In one embodiment, the 152 signals are grouped into 16 signal bands and one signal from each band is an input signal to one of the 16:1 multiplexers of switch matrix 401B2. FIG. 46 illustrates graphically the sixteen bands each have 9.5 signals and the output from the band is an input line to a 16:1 multiplexer. The signals have been grouped in bands to maximize routability and to ease the layout of PLD 220. Notice that the signal sources in a band are appropriately rotated to allow both the macrocell feedback and the corresponding I/O feedback to be available for each programmable logic block. This rotation allows the buried register capability without increasing the array size and is one of the important features of this invention.

FIGS. 47A to 50D illustrate the actual switch matrix signal patterns for all eight programmable logic blocks 402B2 of PLD 220. The columns in FIGS. 47A to 50D are the signals in the band which are rotated within the column, as described above, and each row is the input signals to a 16 to 1 multiplexer that provides the input signal, on the input line indicated in the left hand column. Note, for ease of representation FIGS. 47A to 50D includes the input line column in each figure. However, only a single input signal is provided by each row of the table as shown in the four figures representing this portion of switch matrix 402B2.

In particular, FIG. 47A to FIG. 47D represent the portions of the switch matrix that drive programmable logic block 402B2-1 and 402B2-8. FIG. 48A to FIG. 48D represent the portions of the switch matrix that drive programmable logic blocks 402B2-2 and 402B2-7. FIG. 49A to FIG. 49D represent the portions of the switch matrix that drive programmable logic blocks 402B2-3 and 402B2-6. FIG. 50A to FIG. 50D represent the portions of the switch matrix that drive programmable logic blocks 402B2-4 and 402B2-5.

According to the principles of this invention, the 26 input signals for each programmable logic block 402B2-i may be unique or the same for all eight blocks. This allows PLD 220 to function either as a monolithic array with a maximum of 26 input signals, or eight separate relatively independent split-arrays with a total maximum number of input signals of 152 at a given instant.

In PLD 230, switch matrix 401B3 routes 26 signals to each programmable logic block 402B3. The 26 signals are derived from a maximum of 150 global signals rather than the 198 possible signals. Further, as shown in Table 7, each of the input signals provided by switch matrix 402B3 is derived from a 16 to 1 multiplexer. Thus, the 150 signal sources are grouped into 16 bands with approximately 9.5 signals in each band.

For ease of representation, programmable logic blocks 402B3-1, 402B3-2, . . . , 402B3-8, are represented as blocks "A", "B", . . . , "H", respectively. Similarly, logic macrocell 412BA2-1-1 becomes "A0", buried logic macrocell 412BB2-1-1 becomes "A1" logic macrocell 412BB2-1-8 becomes "A15", and logic macrocell 412BA2-2-1 becomes "B0". Thus, the logic macrocells in block 402B2-1 range from macrocell A0 to macrocell A15, in block 402B2-2 from macrocell B0 to B15, . . . , and in block 402B2-8 from macrocell H0 to H15 where the even numbers are output logic macrocells and the odd numbers are buried logic macrocells. The feedback lines to switch matrix 401B3 are represented by the macrocell number. The I/O pin associated with the output logic macrocell is represented by the macrocell number followed by a carat "^". Dedicated input pins 404B3 are numbered I0 through I5 respectively.

FIG. 51A illustrates the set of signal bands that are used for programmable logic blocks 402B3-1 and 402B3-8. FIG. 51B illustrates the set of signal bands that are used for programmable logic blocks 402B3-2 and 402B3-7. FIG. 51C illustrates the set of signal bands that are used for programmable logic blocks 403B3-3 and 402B3-6 while FIG. 51D illustrates the set of signal bands for programmable logic blocks 403B3-4 and 402B3-5. Thus, there are four sets of signal bands for PLD 230, one set for each pair of blocks. This arrangement of bands was used because each programmable logic block derives the 26 input signals from a maximum of 150 signals rather than all 198 possible signals. The smaller number of signals was used to maintain the speed performance of PLD 230. The 150 signals provide adequate flexibility and are chosen to provide a routability factor of at least 2.5.

As illustrated in FIGS. 51A to 51D, the 150 signal sources for the bands have 134 common signal sources for the programmable logic blocks consisting of six dedicated input pin signals, 64 I/O pin feedback signals and 64 output macrocells feedback signals. The other 16 signal sources are different for each pair of programmable logic blocks. These 16 signals are the 8 buried macrocell feedback signals from each block in the pair of programmable logic blocks.

In one embodiment, the 150 signals are grouped into 16 signal bands and one signal from each band is an input signal to one of the 16:1 multiplexers of switch matrix 401B3. FIGS. 52A-52D illustrate graphically the sixteen bands with each band having 9.5 signals. The output line from the band is an input line to a 16:1 multiplexer. The signals have been grouped in bands to maximize routability and to ease the layout of PLD 230. Notice that the signal sources in a band are appropriately rotated to allow both the macrocell feedback and the corresponding I/O feedback to be available for each programmable logic block. This rotation allows the buried register capability without increasing the array size and is one of the important features of this invention.

FIGS. 53A to 56D illustrate the actual switch matrix signal patterns for all eight programmable logic blocks 402B3 of PLD 230. The columns in FIGS. 53A to 56D are the signals in the band which are rotated within the column, as described above, and each row is the input signals to a 16 to 1 multiplexer that provides the input signal on the input line indicated in the left hand column. Note, for ease of representation FIGS. 53A to 56D include the input line column in each figure. However, only a single input signal is provided by each row of the table shown in the four figures representing one portion of switch matrix 402B3.

In particular, FIG. 53A to FIG. 53D represent the portions of the switch matrix that drive programmable logic block 402B3-1 and 402B3-8. FIG. 54A to FIG. 54D represent the portions of the switch matrix that drive programmable logic blocks 402B3-2 and 402B3-7. FIG. 55A to FIG. 55D represent the portions of the switch matrix that drive programmable logic blocks 402B3-3 and 402B3-6. FIG. 56A to FIG. 56D represent the portions of the switch matrix that drive programmable logic blocks 402B3-4 and 402B3-5.

Switch matrix 401B3 for PLD 230 provides eight sets of 26 input lines—one set for each PLB 402B3. Each of these 26 input lines are derived from a 16:1 multiplexer set. The 26 input signals can be unique or the same for each PLB 402B3. This allows device 230 to function as a monolithic array with a maximum of 26 inputs out of the 134 or eight separate, relatively independent split-arrays with a total maximum number of inputs of 198 (out of possible 198), or alternatively 4 pairs of devices. Thus, as described above, programmable logic devices 110, 120, 130, 210, 220, and 230 of this invention have a plurality of programmable connections. The programmable connections are controlled by a multiplicity of electrically erasable cells. The number of cells depend upon the specific implementation, but the number of cells for each device are given in Tables 8 to 13 respectively. The number of cells are illustrative of the embodiments described above. In view of this disclosure, one skilled in the art can design PLDs according to the principles of this invention with differing numbers of erasable cells. Accordingly, the following Tables are illustrations only and are not intended to limit the invention to the number of cells indicated.

TABLE 8

Device 110

| | | | |
|---|---|---|---|
| $E^2$ cells for the AND-OR array | 2 × 44 × 70 | = | 6,160 |
| $E^2$ cells for the programmable logic macrocells | 2 × 16 × 4 | = | 128 |
| $E^2$ cells for the programmable input/output macrocells | 2 × 2 × 16 | = | 64 |
| $E^2$ cells for the logic allocator | 2 × 2 × 16 | = | 64 |
| $E^2$ cells for the switch matrix | 2 × 3 × 4 2 × 2 × 16 | = = | 24 64 |
| | | TOTAL | 6,504 |

TABLE 9

Device 120

| | | | |
|---|---|---|---|
| $E^2$ cells for the AND-OR array | 4 × 52 × 54 | = | 11,232 |
| $E^2$ cells for the programmable logic macrocells | 4 × 12 × 5 | = | 240 |
| $E^2$ cells for the programmable input/output macrocells 2 | 4 × 2 × 12 | = | 96 |
| $E^2$ cells for the logic allocator | 4 × 2 × 12 | = | 96 |
| $E^2$ cells for the switch matrix | 4 × 4 × 26 | = | 416 |
| | | TOTAL | 12,080 |

TABLE 10

Device 130

| | | | |
|---|---|---|---|
| $E^2$ cells for the AND-OR array | 2 × 52 × 70 | = | 14,560 |
| $E^2$ cells for the programmable logic macrocells | 4 × 16 × 5 | = | 320 |
| $E^2$ cells for the programmable input/output macrocells | 4 × 2 × 16 | = | 128 |
| $E^2$ cells for the logic allocator | 4 × 2 × 16 | = | 128 |
| $E^2$ cells for the switch matrix | 4 × 4 × 26 | = | 416 |
| | | TOTAL | 15,552 |

TABLE 11

Device 210

| | | | |
|---|---|---|---|
| $E^2$ cells for the AND-OR array | 4 × 44 × 68 | = | 11,968 |
| $E^2$ cells for the programmable logic macrocells | 4 × 16 × 4 | = | 256 |
| $E^2$ cells for the programmable input/output macrocells | 4 × 2 × 8 | = | 64 |
| $E^2$ cells for the logic allocator | 4 × 2 × 16 | = | 128 |
| $E^2$ cells for the switch matrix | 4 × 4 × 22 | = | 352 |
| | | TOTAL | 12,704 |

TABLE 12

Device 220

| | | | |
|---|---|---|---|
| $E^2$ cells for the AND-OR array | 8 × 52 × 52 | = | 21,632 |
| $E^2$ cells for the programmable logic macrocells | 8 × 12 × 5 | = | 480 |
| $E^2$ cells for the programmable input/output macrocells | 8 × 2 × 6 | = | 96 |
| $E^2$ cells for the logic allocator | 8 × 2 × 12 | = | 192 |
| $E^2$ cells for the switch matrix | 8 × 4 × 26 | = | 832 |
| | | TOTAL | 23,232 |

TABLE 13

Device 230

| | | | |
|---|---|---|---|
| $E^2$ cells for the AND-OR array | 8 × 52 × 68 | = | 28,288 |
| $E^2$ cells for the programmable logic macrocells | 8 × 16 × 5 | = | 640 |
| $E^2$ cells for the programmable input/output macrocells | 8 × 2 × 8 | = | 128 |
| $E^2$ cells for the logic allocator | 8 × 2 × 16 | = | 256 |
| $E^2$ cells for the switch matrix | 4 × 8 × 26 | = | 832 |
| | | TOTAL | 30,144 |

In the preceding discussion, for ease of expression, only programmable architectural cells have been described. The cells in these applications may be fuses, EPROM cells, EEPROM cells, RAM cells, or CMOS antifuse technology in accordance with the invention. The architectural cells are a means for providing either an input select signal or an output select signal to a programmable component so that the component passes a desired signal therethrough.

The preceding discussion has described a programmable AND/OR array as an assembly of AND gates used to form products of logical variables, followed by an assembly of OR gates to form sums of such product terms. However, using logical transforms known to those skilled in the art, in a preferred embodiment the programmable AND, fixed OR array (AND/OR array) is replaced by a programmable NOR, fixed NOR array. The use of NOR logic provides enhanced speed over the equivalent programmable AND/OR array, but the logic functions of the two arrays are equivalent.

The AND/OR array also may include inverters that form complements ($\overline{A}$) of the input signals (A). The AND/OR array may also be arranged as an assembly of OR gates to form sums of logical variables, followed by an assembly of AND gates to form products of such sums, by utilizing the DeMorgan theorems $$\overline{A \cdot B} = \overline{A} + \overline{B},$$

$$\overline{A + B} = \overline{A} \cdot \overline{B}$$

in a manner well known to those of ordinary skill in the art. For example, the sum of logical product terms A·B+C·D+ E·F·G may be written as the complement of the product of sums of complemented variables, viz $$A \cdot B + C \cdot D + E \cdot F \cdot G = \overline{(\overline{A} + \overline{B}) \cdot (\overline{C} + \overline{D}) \cdot (\overline{E} + \overline{F} + \overline{G})}$$

For ease of reference, a logical sum of logical products and a logical product of logical sums are collectively referred to herein as "logical sum/product terms."

The gate configuration illustrated in FIGS. 17A to 18D for example is expressed in the PAL mode, where the AND gates are normally programmable and the OR gates are normally fixed. Using the DeMorgan theorems applied above and incorporating signal inverters in the signal paths, one can also express the gate configuration in terms of programmable OR gates and fixed AND gates. More generally, one may configure the gates in a PLA mode, wherein both AND gates and OR gates are programmable.

The switching characteristics of the programmable logic device 400 of this invention are given in Tables 14 and 15 and the DC characteristics in Table 16. The parameter symbols and parameters definitions are described more completely in *PAL Device Data Book*, Advanced Micro Devices, Sunnyvale, Calif., pp. 5-533 to 5-535 (1988), which are incorporated herein by reference. The characteristics in Tables 14–16 are illustrative of one embodiment of this invention are not intended to limit this invention to the specific values disclosed.

TABLE 14

AC Characteristics of PLDs 110, 120 and 130 of this Invention

| Para-meter Symbol | Parameter Description | (−15) Min | (−15) Max | (−20) Min | (−20) Max | Units |
|---|---|---|---|---|---|---|
| COMBINATORIAL/REGISTERED OPERATION | | | | | | |
| $t_{PD}$ | Input or I/O to Combinatorial Output | | 15 | | 20 | ns |
| Output Register | | | | | | |
| $t_{SU}$ | Input or IO Pin to Output Register | 10 | | 13 | | ns |
| | D–FF Setup | 12 | | 15 | | ns |
| $t_{CO}$ | Clock to output | | 10 | | 12 | ns |
| $t_{COF}$ | Clock to feedback | | 6 | | 8 | ns |
| $t_{HOR}$ | Data Hold Time for Output Register | 0 | | 0 | | ns |
| Clocking and Frequency | | | | | | |
| $t_{CIS}$ | Register Feedback to output Register latch Setup | 16 | | 20 | | ns |
| $f_{MAXO}$ | MAX External Frequency $1/(t_{SU} + t_{CO})$ | | | | | |
| | D-type | 50 | | 40 | | MHz |
| | T-type | 45.5 | | 37 | | MHz |
| $f_{MAXI}$ | MAX Internal Frequency $1/(t_{CIS})$ | | | | | |
| | D-type | 62.5 | | 50 | | MHz |
| | T-type | 55.5 | | 43.5 | | MHz |
| $t_{CWH}$ | Clock Width High | 6 | | 8 | | ns |
| $t_{CWL}$ | Clock Width Low | 6 | | 8 | | ns |
| $f_{MAX}$ | MAX Clock Frequency | 83.3 | | 62.5 | | MHz |
| RESET/PRESET & OUTPUT ENABLE OPERATION | | | | | | |
| $t_{APO}$ | Input or I/O Pin to Output Register/Latch RESET/PRESET | | 20 | | 25 | ns |
| $t_{ARO}$ | Async. RESET/ PRESET to Output Register/Latch Recovery | 20 | | 25 | | ns |
| $t_{ARI}$ | Async. RESET/ PRESET to Input | 10 | | 15 | | ns |

TABLE 14-continued

AC Characteristics of PLDs 110, 120 and 130 of this Invention

| Parameter Symbol | Parameter Description | (−15) Min | (−15) Max | (−20) Min | (−20) Max | Units |
|---|---|---|---|---|---|---|
| | Register/Latch recovery | | | | | |
| $t_{AW}$ | Aysync. RESET/PRESET Pulse Width | 15 | | 20 | | ns |
| $t_{EA}$ | Output Buffer Enable | | 15 | | 20 | ns |
| $t_{ER}$ | Output Buffer Disable | | 15 | | 20 | ns |

TABLE 15

AC Characteristics of PLDs 210, 220 and 230 of this Invention

| Parameter Symbol | Parameter Description | (−15) Min | (−15) Max | (−20) Min | (−20) Max | Units |
|---|---|---|---|---|---|---|
| COMBINATORIAL/REGISTERED OPERATION | | | | | | |
| $t_{PD}$ | Input or I/O Pin to Combinatorial Output | | 15 | | 20 | ns |
| Output Register | | | | | | |
| $t_{SU}$ | Input or IO Pin to Output Register D–FF Setup | 10 | | 13 | | ns |
| | T-FF Setup | 12 | | 15 | | ns |
| $t_{CO}$ | Clock to output | | 10 | | 12 | ns |
| $t_{COF}$ | Clock to feedback | | 6 | | 8 | ns |
| $t_{HOR}$ | Data Hold Time for Output Register | 0 | | 0 | | ns |
| Input Register | | | | | | |
| $t_{SIRD}$ | Input or I/O Pin to Input Register D–FF Setup | 4 | | 5 | | ns |
| $t_{CIR}$ | Register Feedback Clock to Combinatorial Output | | 20 | | 30 | ns |
| $t_{HIR}$ | Data Hold Time for Input Register | 4 | | 5 | | ns |
| Clocking and Frequency | | | | | | |
| $t_{CIS}$ | Register Feedback to Output Register latch Setup | 16 | | 20 | | ns |
| $-f_{MAXO}$ | MAX External Frequency $1/(t_{SU} + t_{CO})$ | | | | | |
| | D-type | 50 | | 40 | | MHz |
| | T-type | 45.5 | | 37 | | MHz |
| $f_{MAXI}$ | MAX Internal Frequency $1/(t_{CIS})$ | | | | | |
| | D-type | 62.5 | | 50 | | MHz |
| | T-type | 55.5 | | 43.5 | | MHz |
| $t_{CWH}$ | Clock Width High | 6 | | 8 | | ns |
| $t_{CWL}$ | Clock Width Low | 6 | | 8 | | ns |
| $f_{MAX}$ | MAX Clock Frequency | 83.3 | | 62.5 | | MHz |

TABLE 15-continued

AC Characteristics of PLDs 210, 220 and 230 of this Invention

| Parameter Symbol | Parameter Description | (−15) Min | (−15) Max | (−20) Min | (−20) Max | Units |
|---|---|---|---|---|---|---|
| LATCH OPERATION | | | | | | |
| $t_{PD}$ | Input or I/O Pin to Combinatorial Output | | 15 | | 20 | ns |
| $t_{PTD}$ | Input or I/O Pin to Output via One Transparent Latch | | 20 | | 25 | ns |
| Output Latch | | | | | | |
| $t_{SOL}$ | Input or I/O Pin to Output Latch Setup | 10 | | 13 | | ns |
| $t_{GOL}$ | Latch Enable to Transparent Mode Output | | 10 | | 12 | ns |
| $t_{HOL}$ | Data Hold time for Output Latch | 0 | | 0 | | ns |
| Input Latch | | | | | | |
| $t_{SIL}$ | I/O Pin to Input Latch setup | 4 | | 5 | | ns |
| $t_{GIL}$ | Latch Feedback, Latch Enable Transparent Mode to Combinatorial Output | | 20 | | 25 | ns |
| $t_{HIL}$ | Data Hold Time for Input Latch | 4 | | 5 | | ns |
| Latch Enable | | | | | | |
| $t_{GIS}$ | Latch Feedback Transparent Mode to Output Register/Latch Setup | 20 | | 25 | | ns |
| $t_{GWH}$ | Latch Enable Width High | 8 | | 10 | | ns |
| $t_{GWL}$ | Latch Enable Width Low | 8 | | 10 | | ns |
| RESET/PRESET & OUTPUT ENABLE OPERATION | | | | | | |
| $t_{APO}$ | Input or I/O Pin to Output Register/Latch RESET/PRESET | | 20 | | 25 | ns |
| $t_{ARO}$ | Async. RESET/PRESET to Output Register/Latch Recovery | | 20 | | 25 | ns |
| $t_{ARI}$ | Async. RESET/PRESET to Input Register/Latch recovery | 10 | | 15 | | ns |
| $t_{AW}$ | Aysync. RESET/PRESET Pulse Width | 15 | | 20 | | ns |
| $t_{EA}$ | Output Buffer Enable | | 15 | | 20 | ns |
| $t_{ER}$ | Output Buffer Disable | | 15 | | 20 | ns |

TABLE 16

DC Characteristics of All PLDs of this Invention

| PARA-METER | DESCRIPTION | TEST CONDITIONS | MIN | TYP | MAX | UNITS |
|---|---|---|---|---|---|---|
| $V_{CC}$ | | | 4.75 | | 5.25 | Volts |
| $V_{OH}$ | Output HIGH Voltage | Vcc = Min<br>Vin = $V_{IH}$ or $V_{IL}$<br>$I_{OH}$ = −3.2 mA COM'l<br>$I_{OH}$ = −2 mA MIL | 2.4 | 3.5 | | Volts |
| $V_{OL}$ | Output LOW Voltage | Vcc = Min<br>Vin = $V_{IH}$ or $V_{IL}$<br>$I_{OL}$ − 16 mA COM'L<br>$I_{OL}$ − 12 mA MIL | | | 0.5 | Volts |
| $V_{IH}$ | Input HIGH | Guaranteed Logic HIGH for all Input Pins Voltage | 2.0 | | | Volts |
| $V_{IL}$ | Input LOW Voltage | Guaranteed Logic LOW for all input pins | | | 0.8 | Volts |
| $I_I$ | Input Leakage Current | Vin = 0 to 5.5 V<br>Vcc = Max | | | 10 | uA |
| $I_O$ | Output Leakage Current | Vin = 0 to 5.5 V<br>Vcc = MAX | | | 10 | uA |
| $I_{CCOP}$ | DC Current Supply | Outputs Open (Io = 0),<br>F = 0 MHz | | | 200 | mA |
| $I_{SC}$ | DC Short Circuit Current | VCC = MAX,<br>Vo = 5 V | | | −130 | mA |
| CAPACITANCE | | | | | | |
| CIN | Input Capacitance | Vcc = 5V,<br>TA = 25 deg. C.<br>Vin = 2 V | | 9 | | pF |
| COUT | Output Capacitance | Vout = 2V<br>@ f = 1 MHZ | | 11 | | pF |

The parameter $f_{MAX}$ is the maximum clock rate at which the device is guaranteed to operate. Because the flexibility inherent in programmable logic devices offers a choice of clocked flip-flop designs, parameter $f_{MAX}$ is specified for three types of synchronous designs.

The first type of design is a state machine with feedback signals sent off-chip. This external feedback could go back to the device input pins, or to a second device in a multi-chip state machine. The slowest path defining the period is the sum of the clock-to-output time and the input setup time for the external signals ($t_{SU}+t_{CO}$). The reciprocal, $f_{MAX}$, is the maximum frequency with external feedback or in conjunction with an equivalent speed device. This $f_{MAX}$ is designated "$f_{MAXO}$".

The second type of design is a single-chip state machine with internal feedback only. In this case, flip-flop inputs are defined by the device inputs and flip-flop outputs. Under these conditions, the period is limited by the internal delay from the flip-flop outputs through the internal feedback and logic to the flip-flop inputs ($t_{CIS}$). This $f_{MAX}$ is designated "$f_{MAXI}$".

The third type of design is a simple data path application. In this case, input data is presented to the flip-flop and clocked through; no feedback is employed. Under these conditions, the period is limited by the sum of the data setup time and the data hold time ($t_{SU}+t_{HOR}$). However, a lower limit for the period of each $F_{MAX}$ type is the minimum clock period ($t_{CWH}+t_{CWL}$). Usually, this minimum clock period determines the period for the third $f_{MAX}$, designated "$f'_{MAX}$".

The family of programmable logic devices 400 supports 50 MHz system clocks of the emerging high speed RISC and CISC microprocessor applications. As described above, the external $f_{MAX}$ for family 400 is 50 MHz. This 50 MHz frequency includes the clock to external pin delay time and the setup time of the flip-flop. Hence, a state machine can be implemented in device 400 running at a 50 MHz system clock frequency. Data signals can be sent off chip for communicating either to a second device or possibly externally feeding back to device 400 at 50 MHz clock rate.

In addition to supporting the 50 MHz external clock frequency in this embodiment, the family of devices 400 supports internal clock frequencies of 62.5 MHz and pipelined frequency of up to 83 MHz.

Fundamentally, the architecture of this invention has two simple time delay parameters, i.e., array delay and switch matrix delay. The input-to-output pin-to-pin delay for a single programmable logic block 402, including switch matrix 401 and programmable array time delays is about 15 ns for the worst case (including temperature, voltage). For signals traversing through multiple programmable logic blocks externally, the delay time is simple multiples of 15 ns. For example, the time delay for a signal traversing through two programmable logic blocks via switch matrix 401 is about 30 ns, three blocks time delay is about 45 ns. Delay computations for the devices of this invention are simple, fast, predictable and are internal path independent. This is unlike some of the complex, mid-density PLDs, where the delays are slow, variable, internal path dependent, and fairly tedious to compute. The family of devices 400 maintains the inherent simplicity and fixed time predictability of traditional PAL devices—offering designers fairly simple, predictable performance, prior to implementing designs.

The high performance architecture of devices 400 supports both gate intensive and register intensive functions at high speed. For example, 16-bit address decoder, 16-bit multiplexer or 4 to 16 demultiplexers (gate intensive functions) or 16-bit loadable up-down counters and 16-bit binary synchronous counters (register intensive functions) can be implemented at a maximum frequency of 50 MHz, enabling device 400 to be operated with up to 50 MHz RISC and CISC microprocessors.

Further, programmable logic block 402 structure with a high speed switch matrix 401 supports extremely logic intensive logic functions via two levels of fixed worst case time delays of 30 ns. In a programmable logic device 400 having four programmable logic blocks 402, such as device 400B, more than 192 product term logic functions can be incorporated with 30 ns time delays.

The simple programmable architecture of this invention requires simple, easy to use software for programming the device and obviates the need for an expensive, complex software package.

User designs for device 400 are entered via a variety of design entry mechanisms, for example, Boolean equation and State machines. Signals that need to be located on critical pins can be specified by the user. A software fitting means automatically allocates the resources of programmable logic device 400 to each of the logic equations in the user design.

As a result of the advanced synthesis and optimization techniques of the fitting means, designs are configured to architecture of this invention in minutes. The fitting means has intelligence and knowledge about optimal block partitioning (fitting user logic equations in a single programmable logic block) and routing signals to appropriate blocks via the switch matrix without any manual intervention. Hence, the designers do not have to worry about any manual routing or fitting of logic.

The software generates a JEDEC file for programming device 400. Device 400 can be programmed on conventional, industry standard PAL programmers with appropriate personality and socket adapter modules. One embodiment of the fitting means is described in copending, commonly filed, and commonly assigned U.S. patent application Ser. No. 07/490,817 entitled "An Apparatus and Method for Allocation of Resources in Programmable Logic Devices" of N. Schmitz, which is incorporated herein by reference in its entirety.

All programmable logic macrocells 412 have been designed to be reset during power-up. Following the power-up, all programmable logic macrocells 412 are cleared, setting the output signals to a logical zero. This feature is especially valuable in simplifying state machine initialization.

A security cell is provided on each device to prevent unauthorized copying of the user's proprietary logic design. Once programmed, the security cell disables the programming and verification modes. The only way to erase the protection cell is by charging the entire array architecture cells. This cell should preferably be programmed only after the rest of the device has been completely programmed.

Programmable logic device 400 is designed with super-voltage enabled preload circuitry that provides an easy method for testing the logic functionality.

The preload function allows any arbitrary state value to be loaded into macrocells 412. A typical functional test sequence would be to verify all possible state transitions for the device being tested. This requires the ability to set the state registers into an arbitrary "present state" and to set the device into an arbitrary "present input" value. Once this is done, the state machine is clocked into a new state, or next state which can be checked to validate the transition from the "present state". In this way, any particular state transition can be checked.

Since the preload function allows the device to go directly into any desired state, test sequences may be greatly shortened. Also, all possible values can be tested, thus greatly reducing both test time and development costs and guaranteeing proper in-system operation.

An observability mode allows the ability to observe the contents of internal state or output registers on corresponding I/O pins for testability. This observability mode is entered by applying a supervoltage to certain pins. Once this mode is entered, it suppresses the combinatorial output data from appearing on the I/O pins and allows the observation of the contents of output registers on the output pins corresponding to the programmable logic macrocells. This allows easy debugging and tracing of the buried registers.

While the present invention has been described in terms of an embodiment having programmable multiplexers with a specific number of input lines and a specific number of architectural configuration cells, these embodiments are illustrative only and not intended to limit the scope of the invention. Following the principles of this invention, one skilled in the art could implement various configurations of lines to the multiplexers and add or subtract configuration cells as previously described to achieve a flexibility not present in the prior art programmable devices.

Moreover, PLDs 400 were described in terms of synchronous applications. However, PLD 210, for example, through a metal mask option can be configured for asynchronous applications. Specifically, in one embodiment, the connections to each product term clump that in FIG. 16 is opposite a buried logic macrocell are redistributed so that this product term clump provides product control terms to the adjacent output logic macrocell. The buried logic macrocells are not utilized in this embodiment and in fact may not be included on the silicon die.

Thus, the principles of this invention, in particular the decoupling of the various components in programmable logic block, the symmetric layout and the high speed switch matrix, may be implemented in a wide variety of programmable logic devices. Accordingly, the embodiments described above are only exemplary of the principles of the invention and are not intended to limit the invention to the specific embodiments disclosed.

We claim:

1. A high density programmable logic device comprising:
   a programmable switch matrix having a plurality of input lines and a pluralities of output lines wherein said programmable switch matrix has programmable connections between each input line and a predetermined number of said output lines;
   a plurality of programmable logic blocks wherein each programmable logic block is connected to one plurality of said programmable switch matrix output lines, and each programmable logic block further comprises:
      a programmable-AND fixed-OR array having input lines coupled to said one plurality of said programmable switch matrix output lines, and a set of output lines;
      a programmable logic allocator connected to a set of output lines of said programmable-AND fixed OR-array and having a group of output lines
         wherein said programmable logic allocator programmably couples a line in said set of output lines of said programmable-AND fixed OR-array to one of said output lines in said group of logic allocator output lines;
         upon coupling said line in said set of output lines of said programmable-AND fixed OR-array, said line is decoupled from all remaining output lines in said group of logic allocator output lines; and
   a plurality of programmable logic macrocells wherein each logic macrocell includes an input line and an output line; and further wherein said macrocell input line is connected to one line in said group of logic allocator input lines.

2. A high density programmable logic device as in claim 1 further comprising:
   a plurality of I/O macrocells wherein each I/O macrocell has an input line connected to said output line of one programmable logic macrocell in said plurality of programmable logic macrocells, and an output line.

3. A high density programmable logic device as in claim 2 further comprising:
   a plurality of I/O pins wherein each I/O pin is connected to said output line of one I/O macrocell in said plurality of I/O macrocells.

4. A high density programmable logic device as in claim 2 wherein said programmable-AND fixed OR-array further comprises a plurality of control product terms.

5. A high density programmable logic device as in claim 2 wherein each I/O macrocell further comprises:
   a programmable multiplexer having:
      a first input terminal connected to a first product term in said plurality of control product terms;

a second input terminal connected to a first reference voltage; and an output terminal;

wherein in response to an input select signal, said programmable multiplexer passes therethrough a signal on a selected input terminal to said output terminal;

a three-state buffer having:

an input terminal connected to said I/O macrocell input line;

an enable terminal connected to said programmable multiplexer output terminal; and an output terminal connected to said I/O macrocell output line.

6. A high density programmable logic device as in claim 5 wherein said programmable multiplexer further comprises a third input terminal connected to a second product term in said plurality of control product terms.

7. A high density programmable logic device as in claim 6 wherein said programmable multiplexer further comprises a fourth input terminal connected to a second reference voltage.

8. A high density programmable logic device as in claim 5 wherein said reference voltage is a power supply voltage.

9. A high density programmable logic device as in claim 5 wherein said first reference voltage is ground.

10. A high density programmable logic device as in claim 5 wherein said programmable multiplexer further comprises a third input terminal connected to a second reference voltage.

11. A high density programmable logic device as in claim 5 where said I/O macrocell output line is connected to one input line in said plurality of programmable switch matrix input lines.

12. A high density programmable logic device as in claim 1 where said programmable macrocell output line is connected to one input line in said plurality of programmable switch matrix input lines.

13. A high density programmable logic device as in claim 1 wherein each of said programmable logic macrocells further comprises:

a programmable storage element having an input terminal coupled to said programmable logic macrocell input line and an output terminal wherein said programmable storage element is programmably configurable as any one of a plurality of storage elements;

a first programmable multiplexer comprising:

a first input terminal coupled to said programmable logic macrocell input line; and a second input terminal coupled to said programmable storage element output terminal; and an output terminal wherein said first programmable multiplexer programmably connects one of said first and second input terminals to said output terminal and disconnects the other of said first and second input terminal from said output terminal; and a signal polarity control element having an input terminal connected to said programmable multiplexer output terminal and an output terminal connected to said programmable logic macrocell output line.

14. A high density programmable logic device as in claim 13 wherein each of said programmable logic macrocells further comprises a feedback line connected to said programmable multiplexer output terminal and to one input line in said plurality programmable switch matrix input lines.

15. A high density programmable logic device as in claim 13 wherein said programmable storage element includes a clock terminal; and each of said programmable logic macrocells further comprises:

a first clock line; and a second programmable multiplexer comprising:

a first input terminal coupled to said first clock line; and a second input terminal; and an output terminal connected to said clock terminal wherein said second programmable multiplexer programmably connects one of said first and second input terminals to said output terminal and disconnects the other of said first and second input terminal from said output terminal.

16. A high density programmable logic device as in claim 15 wherein each of said programmable logic macrocells further comprises a second clock line connected to said second input terminal of said second programmable multiplexer.

17. A high density programmable logic device as in claim 13 wherein said programmable-AND fixed OR-array further comprises a plurality of control product terms.

18. A high density programmable logic device as in claim 17 wherein said programmable storage element further comprises:

an asynchronous preset terminal connected to a product term in said plurality of control product terms.

19. A high density programmable logic device as in claim 17 wherein said programmable storage element further comprises:

an asynchronous reset terminal connected to a product term in said plurality of control product terms.

20. A high density programmable logic device as in claim 13 wherein said signal polarity control element includes a second inverter terminal connected to said first programmable multiplexer output terminal.

21. A high density programmable logic device as in claim 13 wherein a set of said plurality of programmable logic macrocell comprise buried programmable logic macrocells.

22. A high density programmable logic device as in claim 13 wherein all of said plurality of programmable logic macrocells comprise output programmable logic macrocells.

23. A high density programmable logic device as in claim 13 wherein said plurality of storage elements includes a D-type flip-flop, a T-type flip-flop, and a latch.

24. A high density programmable logic device as in claim 1 wherein each of said programmable logic macrocells further comprises:

a programmable storage element having an input terminal coupled to said macrocell input line and an output terminal wherein said programmable storage element is programmably configurable as any one of a plurality of storage elements and a combinatorial signal path; and a signal polarity control element having an input terminal connected to said programmable storage element output terminal, and an output terminal connected to said macrocell output line.

25. A high density programmable logic device as in claim 24 wherein each of said programmable logic macrocells further comprises a feedback line connected to said programmable multiplexer output terminal and to one input line in said plurality programmable switch matrix input lines.

26. A high density programmable logic device as in claim 24 wherein said programmable storage element includes a clock terminal; and each of said programmable logic macrocells further comprises:

a first clock line; and a second programmable multiplexer comprising:

a first input terminal coupled to said first clock line; and a second input terminal; and an output terminal connected to said clock terminal wherein said second programmable multiplexer programmably connects one of said first and second input terminals to said output terminal and disconnects the other of said first and second input terminal from said output terminal.

27. A high density programmable logic device as in claim 26 wherein each of said programmable logic macrocells further comprises a second clock line connected to said second input terminal of said second programmable multiplexer.

28. A high density programmable logic device as in claim 24 wherein said programmable-AND fixed OR-array further comprises a plurality of control product terms.

29. A high density programmable logic device as in claim 28 wherein said programmable storage element further comprises:
   an asynchronous preset terminal connected to a product term in said plurality of control product terms.

30. A high density programmable logic device as in claim 28 wherein said programmable storage element further comprises:
   an asynchronous reset terminal connected to a product term in said plurality of control product terms.

31. A high density programmable logic device as in claim 24 wherein said signal polarity control element includes a second inverter terminal connected to said first programmable multiplexer output terminal.

32. A high density programmable logic device as in claim 21 wherein a set of said plurality of programmable logic macrocell comprise buried programmable logic macrocells.

33. A high density programmable logic device as in claim 21 wherein all of said plurality of programmable logic macrocells comprise output programmable logic macrocells.

34. A high density programmable logic device as in claim 21 wherein said plurality of storage elements includes a D-type flip-flop, a T-type flip-flop, and a latch.

35. A high density programmable logic device as in claim 1 wherein each of said programmable logic macrocells further comprises a storage element having an asynchronous reset terminal connected to a product term in said programmable-AND fixed OR-array.

36. A high density programmable logic device as in claim 1 wherein each of said programmable logic macrocells further comprises a storage element having an asynchronous preset terminal connected to a product term in said programmable-AND fixed OR-array.

37. A high density programmable logic device comprising:
   a programmable switch matrix having a plurality of input lines and a pluralities of output lines wherein said programmable switch matrix has programmable connections between each input line and a predetermined number of said output lines;
   a plurality of programmable logic blocks wherein each programmable logic block is connected to one plurality of said programmable switch matrix output lines, and each programmable logic block further comprises:
      a programmable-AND fixed OR-array having input lines coupled to said one plurality of said programmable switch matrix output lines, and a set of output lines; and
      a plurality of programmable logic macrocells wherein each logic macrocell includes an input line and an output line; and further wherein said macrocell input line is programmably coupled to, and decoupled from a group of lines in said set of said programmable-AND fixed OR-array output lines.

38. A high density programmable logic device as in claim 37 further comprising:
   a plurality of I/O macrocells wherein each I/O macrocell has an input line connected to said output line of one programmable logic macrocell in said plurality of programmable logic macrocells, and an output line.

39. A high density programmable logic device as in claim 38 further comprising:
   a plurality of I/O pins wherein each I/O pin is connected to said output line of one I/O macrocell in said plurality of I/O macrocells.

40. A high density programmable logic device as in claim 38 wherein said programmable-AND fixed OR-array further comprises a plurality of control product terms.

41. A high density programmable logic device as in claim 38 wherein each I/O macrocell further comprises:
   a programmable multiplexer having:
      a first input terminal connected to a first product term in said plurality of control product terms;
      a second input terminal connected to a first reference voltage; and
      an output terminal;
         wherein in response to an input select signal, said programmable multiplexer passes therethrough a signal on a selected input terminal to said output terminal; and
   a three-state buffer having:
      an input terminal connected to said I/O macrocell input line;
      an enable terminal connected to said programmable multiplexer output terminal; and
      an output terminal connected to said I/O macrocell output line.

42. A high density programmable logic device as in claim 41 wherein said programmable multiplexer further comprises a third input terminal connected to a second product term in said plurality of control product terms.

43. A high density programmable logic device as in claim 42 wherein said programmable multiplexer further comprises a fourth input terminal connected to a second reference voltage.

44. A high density programmable logic device as in claim 41 wherein said first reference voltage is a power supply voltage.

45. A high density programmable logic device as in claim 41 wherein said first reference voltage is ground.

46. A high density programmable logic device as in claim 41 wherein said programmable multiplexer further comprises a third input terminal connected to a second reference voltage.

47. A high density programmable logic device as in claim 41 where said I/O macrocell output line is connected to one input line in said plurality of programmable switch matrix input lines.

48. A high density programmable logic device as in claim 37 where said programmable macrocell output line is connected to one input line in said plurality of programmable switch matrix input lines.

49. A high density programmable logic device as in claim 37 wherein each of said programmable logic macrocells further comprises:
   a programmable storage element having an input terminal coupled to said programmable logic macrocell input line and an output terminal wherein said programmable storage element is programmably configurable as any one of a plurality of storage elements;
   a first programmable multiplexer comprising:
      a first input terminal coupled to said programmable logic macrocell input line; and
      a second input terminal coupled to said programmable storage element output terminal; and an output terminal wherein said first programmable multiplexer programmably connects one of said first and second input terminals to said output terminal and disconnects the other of said first and second input terminal from said output terminal; and a signal polarity control element having an input terminal connected to said programmable multiplexer output terminal and an output terminal connected to said programmable logic macrocell output line.

50. A high density programmable logic device as in claim 49 wherein each of said programmable logic macrocells further comprises a feedback line connected to said programmable multiplexer output terminal and to one input line in said plurality programmable switch matrix input lines.

51. A high density programmable logic device as in claim 49 wherein said programmable storage element includes a clock terminal; and each of said programmable logic macrocells further comprises:

a first clock line; and a second programmable multiplexer comprising:

a first input terminal coupled to said first clock line; and a second input terminal; and an output terminal connected to said clock terminal wherein said second programmable multiplexer programmably connects one of said first and second input terminals to said output terminal and disconnects the other of said first and second input terminal from said output terminal.

52. A high density programmable logic device as in claim 51 wherein each of said programmable logic macrocells further comprises a second clock line connected to said second input terminal of said second programmable multiplexer.

53. A high density programmable logic device as in claim 49 wherein said programmable-AND fixed OR-array further comprises a plurality of control product terms.

54. A high density programmable logic device as in claim 43 wherein said programmable storage element further comprises:

an asynchronous preset terminal connected to a product term in said plurality of control product terms.

55. A high density programmable logic device as in claim 45 wherein said programmable storage element further comprises:

an asynchronous reset terminal connected to a product term in said plurality of control product terms.

56. A high density programmable logic device as in claim 49 wherein said signal polarity control element includes a second inverter terminal connected to said first programmable multiplexer output terminal.

57. A high density programmable logic device as in claim 49 wherein a set of said plurality of programmable logic macrocell comprise buried programmable logic macrocells.

58. A high density programmable logic device as in claim 49 wherein all of said plurality of programmable logic macrocells comprise output programmable logic macrocells.

59. A high density programmable logic device as in claim 49 wherein said plurality of storage elements includes a D-type flip-flop, a T-type flip-flop, and a latch.

60. A high density programmable logic device as in claim 37 wherein each of said programmable logic macrocells further comprises:

a programmable storage element having an input terminal coupled to said macrocell input line and an output terminal wherein said programmable storage element is programmably configurable as any one of a plurality of storage elements and a combinatorial signal path; and a signal polarity control element having an input terminal connected to said programmable storage element output terminal, and an output terminal connected to said macrocell output line.

61. A high density programmable logic device as in claim 60 wherein each of said programmable logic macrocells further comprises a feedback line connected to said programmable multiplexer output terminal and to one input line in said plurality programmable switch matrix input lines.

62. A high density programmable logic device as in claim 60 wherein said programmable storage element includes a clock terminal; and each of said programmable logic macrocells further comprises:

a first clock line; and a second programmable multiplexer comprising:

a first input terminal coupled to said first clock line; and a second input terminal; and an output terminal connected to said clock terminal wherein said second programmable multiplexer programmably connects one of said first and second input terminals to said output terminal and disconnects the other of said first and second input terminal from said output terminal.

63. A high density programmable logic device as in claim 60 wherein each of said programmable logic macrocells further comprises a second clock line connected to said second input terminal of said second programmable multiplexer.

64. A high density programmable logic device as in claim 60 wherein said programmable-AND fixed OR-array further comprises a plurality of control product terms.

65. A high density programmable logic device as in claim 64 wherein said programmable storage element further comprises:

an asynchronous preset terminal connected to a product term in said plurality of control product terms.

66. A high density programmable logic device as in claim 64 wherein said programmable storage element further comprises:

an asynchronous reset terminal connected to a product term in said plurality of control product terms.

67. A high density programmable logic device as in claim 60 wherein said signal polarity control element includes a second inverter terminal connected to said first programmable multiplexer output terminal.

68. A high density programmable logic device as in claim 60 wherein a set of said plurality of programmable logic macrocell comprise buried programmable logic macrocells.

69. A high density programmable logic device as in claim 60 wherein all of said plurality of programmable logic macrocells comprise output programmable logic macrocells.

70. A high density programmable logic device as in claim 60 wherein said plurality of storage elements includes a D-type flip-flop, a T-type flip-flop, and a latch.

71. A high density programmable logic device as in claim 37 wherein each of said programmable logic macrocells further comprises a storage element having an asynchronous reset terminal connected to a product term in said programmable-AND fixed OR-array.

72. A high density programmable logic device as in claim 37 wherein each of said programmable logic macrocells further comprises a storage element having an asynchronous preset terminal connected to a product term in said programmable-AND fixed OR-array.

* * * * *